（12） United States Patent
Arneson et al.

(10) Patent No.: US 10,790,571 B2
(45) Date of Patent: Sep. 29, 2020

(54) INTEGRATED CIRCUIT CONTROLLED EJECTION SYSTEM (ICCES) FOR MASSIVELY PARALLEL INTEGRATED CIRCUIT ASSEMBLY (MPICA)

(71) Applicant: Matrics2, Inc., Warba, MN (US)

(72) Inventors: Michael R. Arneson, Warba, MN (US); William R. Bandy, Gambrills, MN (US)

(73) Assignee: Matrics2, Inc., Warba, MN (US)

( * ) Notice: Subject to any disclaimer, the term of this patent is extended or adjusted under 35 U.S.C. 154(b) by 0 days.

(21) Appl. No.: 16/290,561

(22) Filed: Mar. 1, 2019

(65) Prior Publication Data

US 2019/0273303 A1    Sep. 5, 2019

Related U.S. Application Data

(60) Provisional application No. 62/637,307, filed on Mar. 1, 2018.

(51) Int. Cl.
*H01Q 1/22* (2006.01)
*H01L 21/02* (2006.01)
*H01L 21/768* (2006.01)
*G06K 19/07* (2006.01)

(52) U.S. Cl.
CPC ....... *H01Q 1/2208* (2013.01); *G06K 19/0723* (2013.01); *H01L 21/02612* (2013.01); *H01L 21/76894* (2013.01)

(58) Field of Classification Search
CPC ...... H01Q 1/2208; H01Q 1/2225; H01Q 1/38; H01Q 1/70; H01L 21/02612; H01L 21/76894; H01L 25/00; H01L 22/32; H01L 2924/15153; G06K 19/07752; G06K 19/07749; G06K 19/0723
See application file for complete search history.

(56) References Cited

U.S. PATENT DOCUMENTS

| | | | | |
|---|---|---|---|---|
| 7,102,520 B2* | 9/2006 | Liu | ......... | G06K 19/07749 340/572.1 |
| 7,224,280 B2* | 5/2007 | Ferguson | ......... | G06K 19/07745 340/572.7 |
| 8,608,080 B2* | 12/2013 | Finn | ......... | B32B 37/1207 235/492 |
| 2016/0013090 A1* | 1/2016 | Arneson | ......... | H01L 21/67144 414/225.01 |

* cited by examiner

*Primary Examiner* — Haissa Philogene
(74) *Attorney, Agent, or Firm* — Fiala & Weaver P.L.L.C.

(57) ABSTRACT

Methods, systems, and apparatuses are described for integrated circuit-controlled ejection system (ICCES) for massively parallel integrated circuit assembly (MPICA). A unique Integrated Circuit (IC) die ejection head assembly system is described, which utilizes Three-Dimensional (3D) Printing/Etching to achieve very high-resolution manufacturing to meet the precision tolerances required for very small IC die sizes.

15 Claims, 133 Drawing Sheets

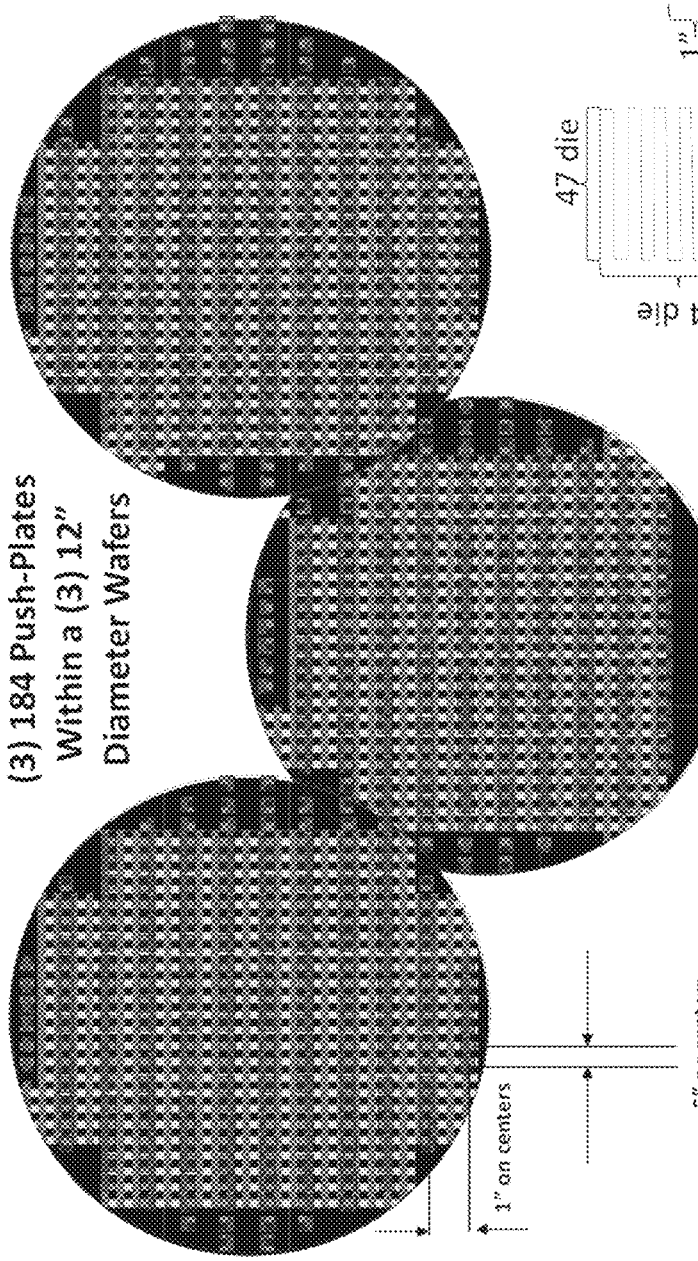
FIG. 7

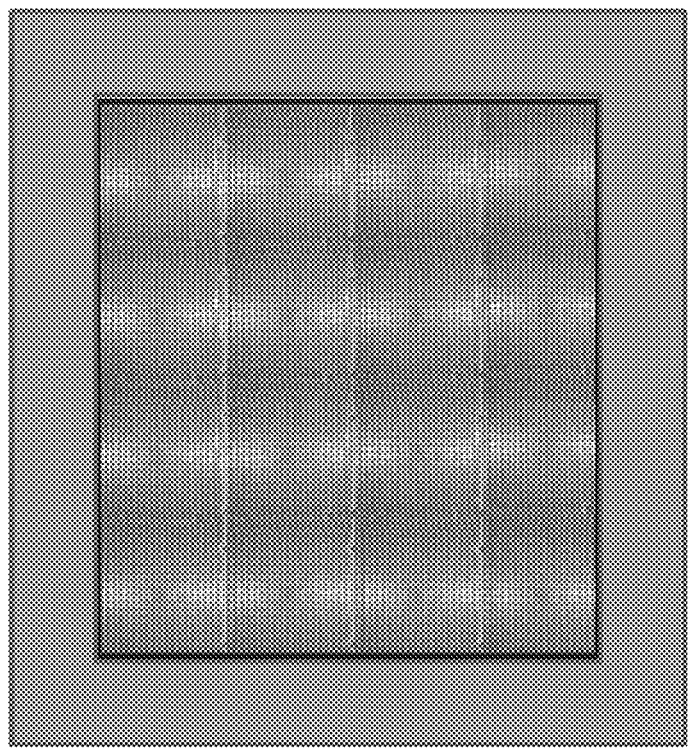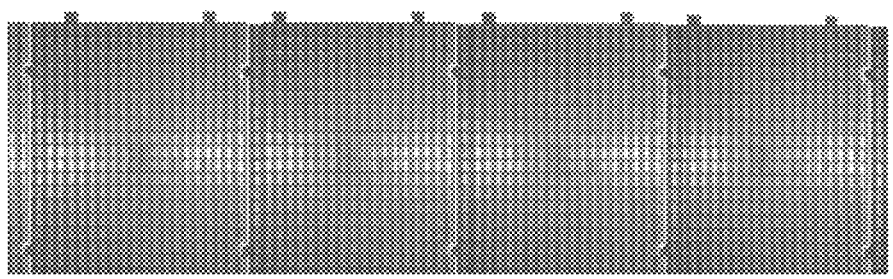
FIG. 21

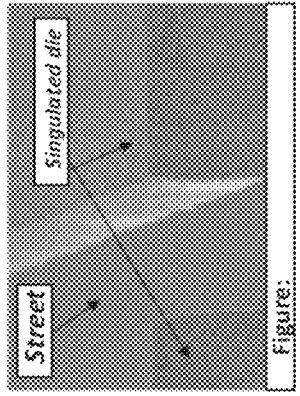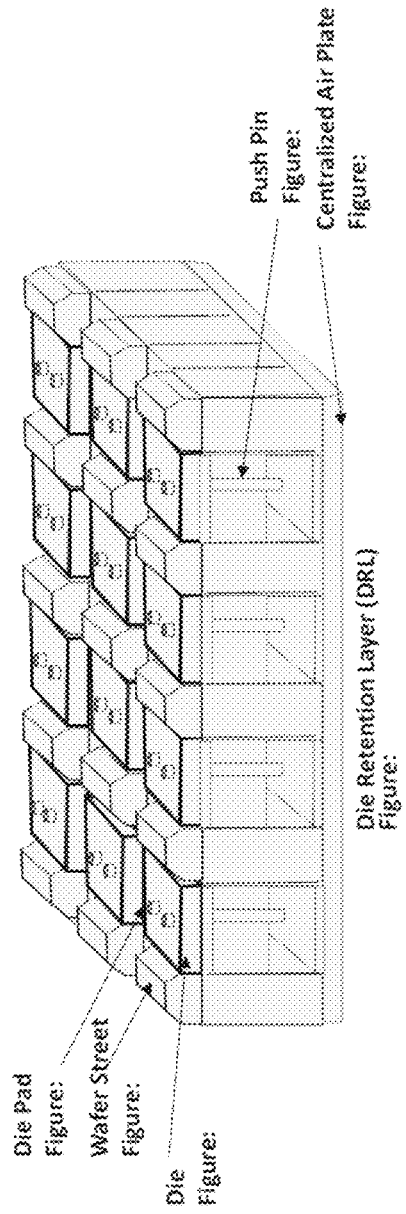
FIG. 45

FIG. 53

FIG. 61

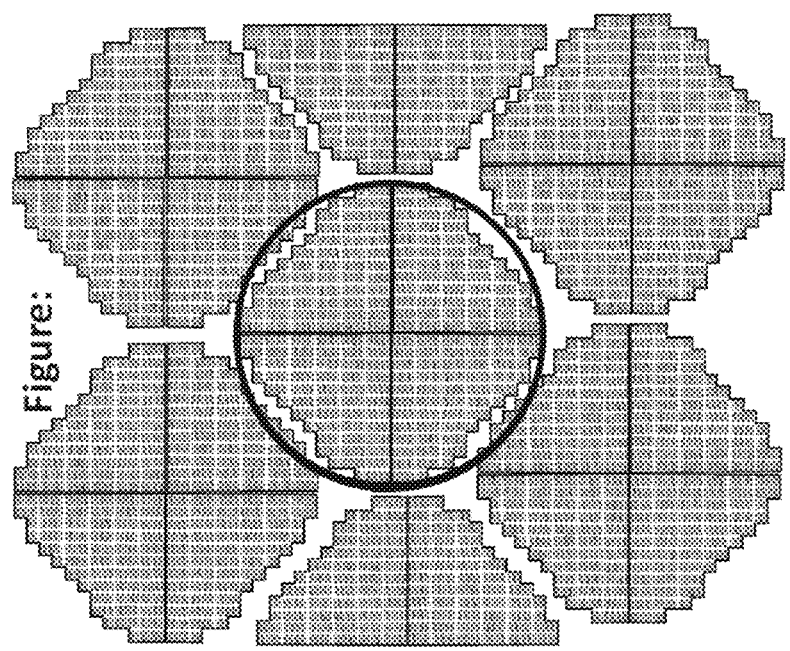
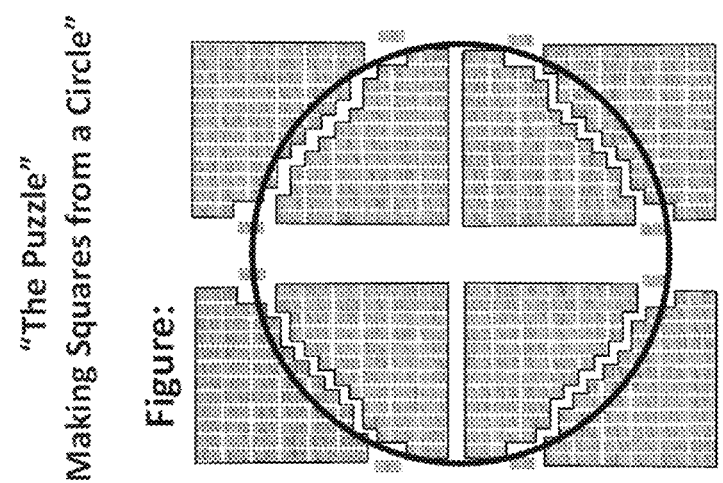
FIG. 63

FIG. 72

Print Antenna 1st then Strap

US 10,790,571 B2

INTEGRATED CIRCUIT CONTROLLED EJECTION SYSTEM (ICCES) FOR MASSIVELY PARALLEL INTEGRATED CIRCUIT ASSEMBLY (MPICA)

CROSS-REFERENCE TO RELATED APPLICATION(S)

This application claims the benefit of U.S. Provisional Patent Application No. 62/637,307, entitled "Integrated Circuit Controlled Ejection System (ICCES) for Massively Parallel Integrated Circuit Assembly (MPICA)," filed Mar. 1, 2018, which is hereby incorporated by reference in its entirety herein.

BACKGROUND

Technical Field

The embodiments herein relate to integrated circuit-controlled ejection system (ICCES) for massively parallel integrated circuit assembly (MPICA) and strap-interposers.

Background Art

A first parallel IC assembly system was built in 2004, which used a mechanical pushpin system to push multiple die in parallel onto an antenna substrate for the manufacture of RFID devices. This pushpin system was difficult and expensive to fabricate and was not scalable down to the smaller dimensions required for very small die sizes.

BRIEF SUMMARY

Methods, systems, and apparatuses are described for integrated circuit-controlled ejection system (ICCES) for massively parallel integrated circuit assembly (MPICA), substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make/use them.

Figure 1:
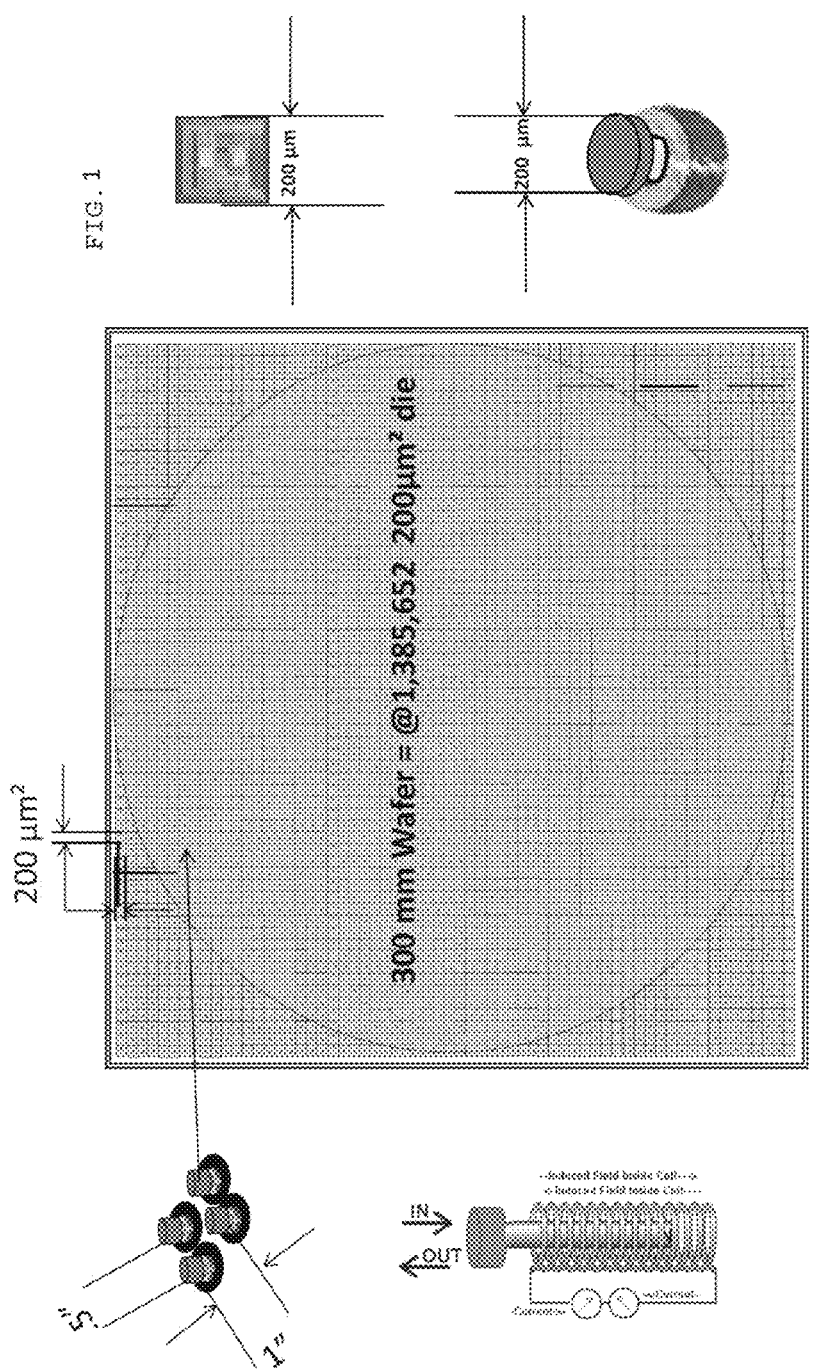
Figure 2:
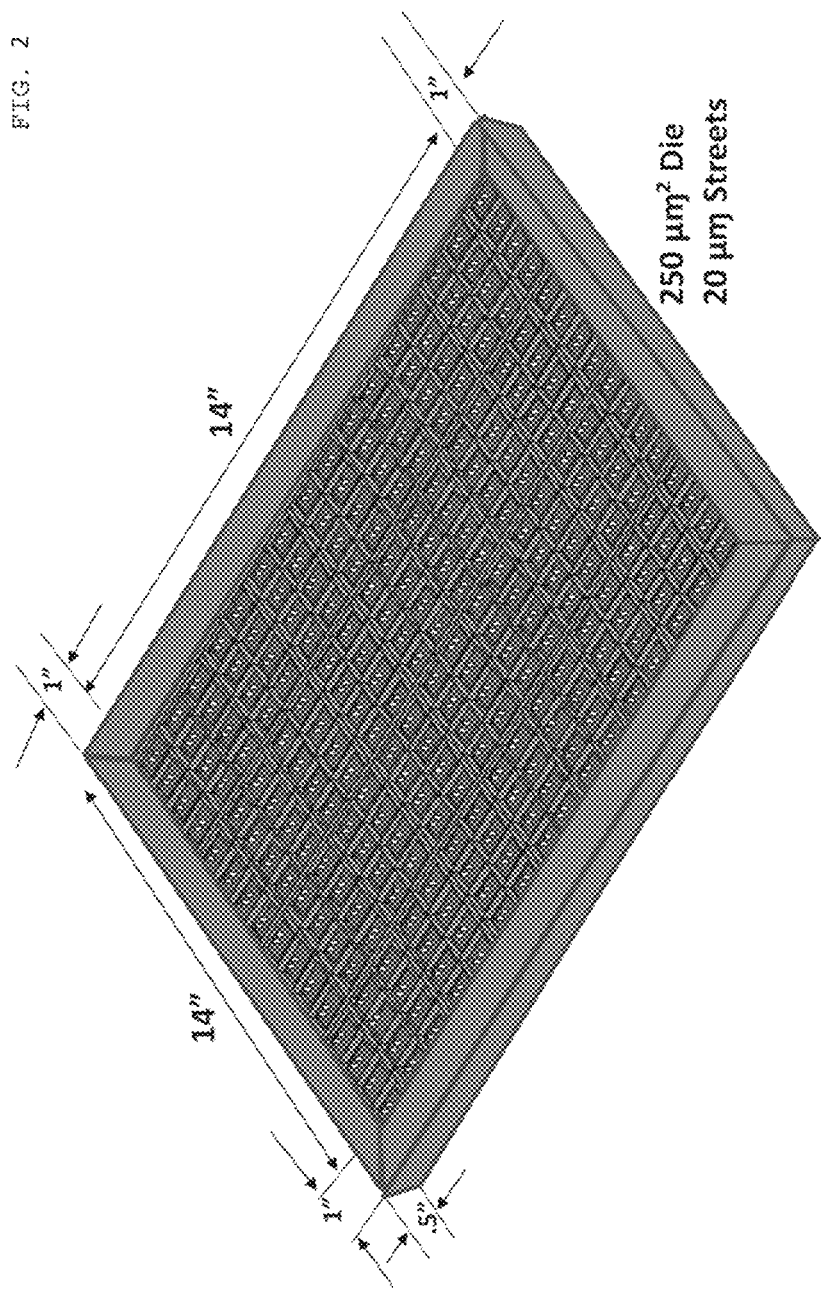
Figure 3:
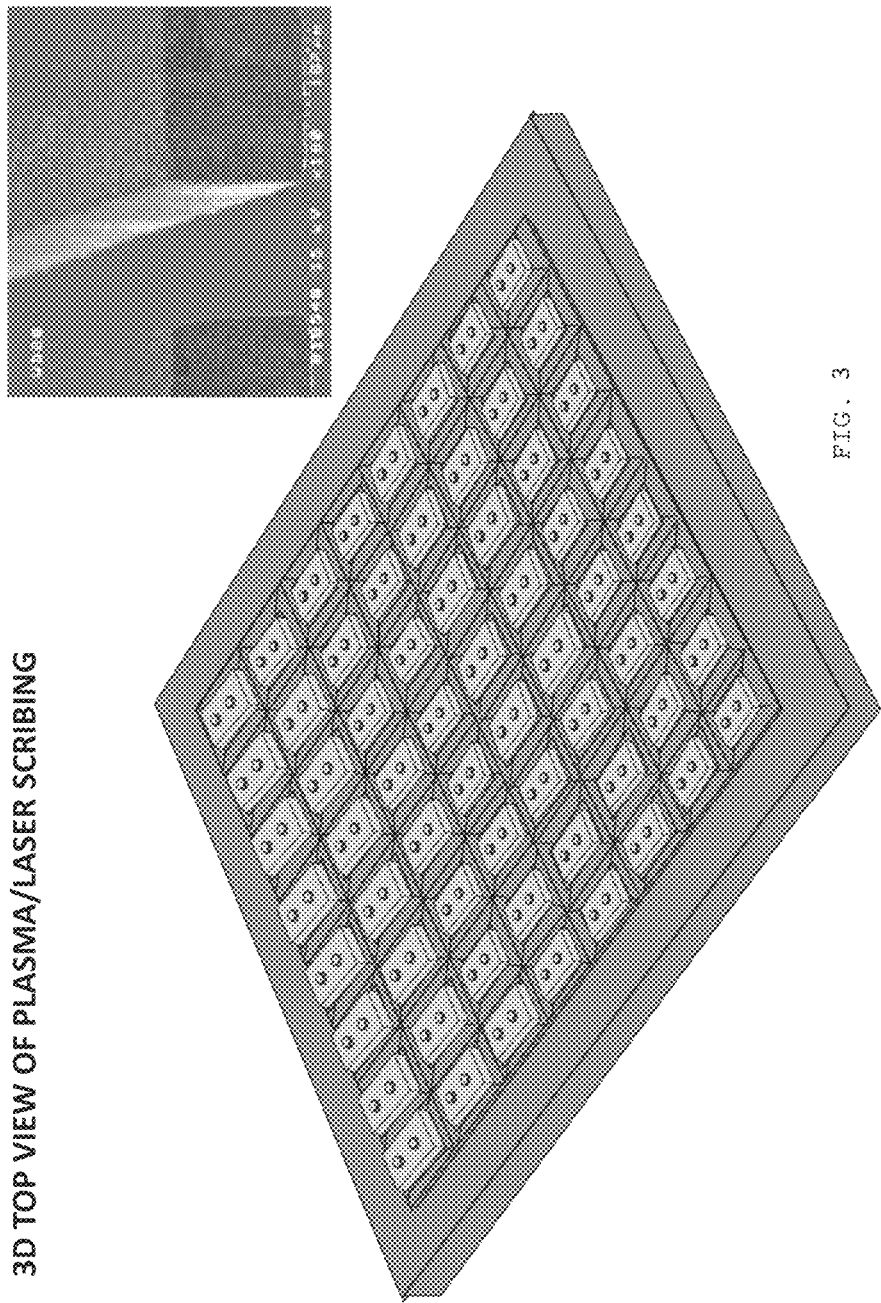
Figure 4:
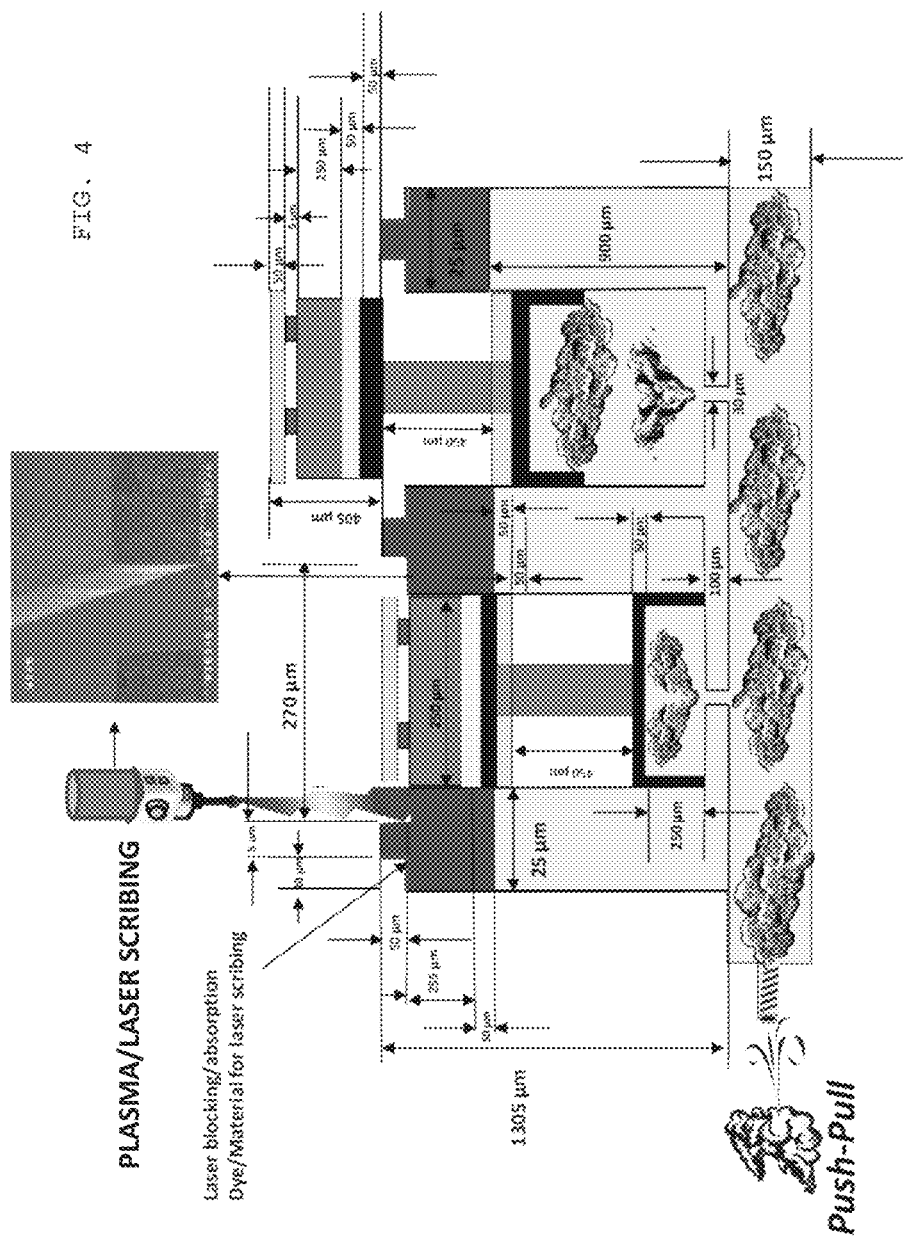
Figure 94:
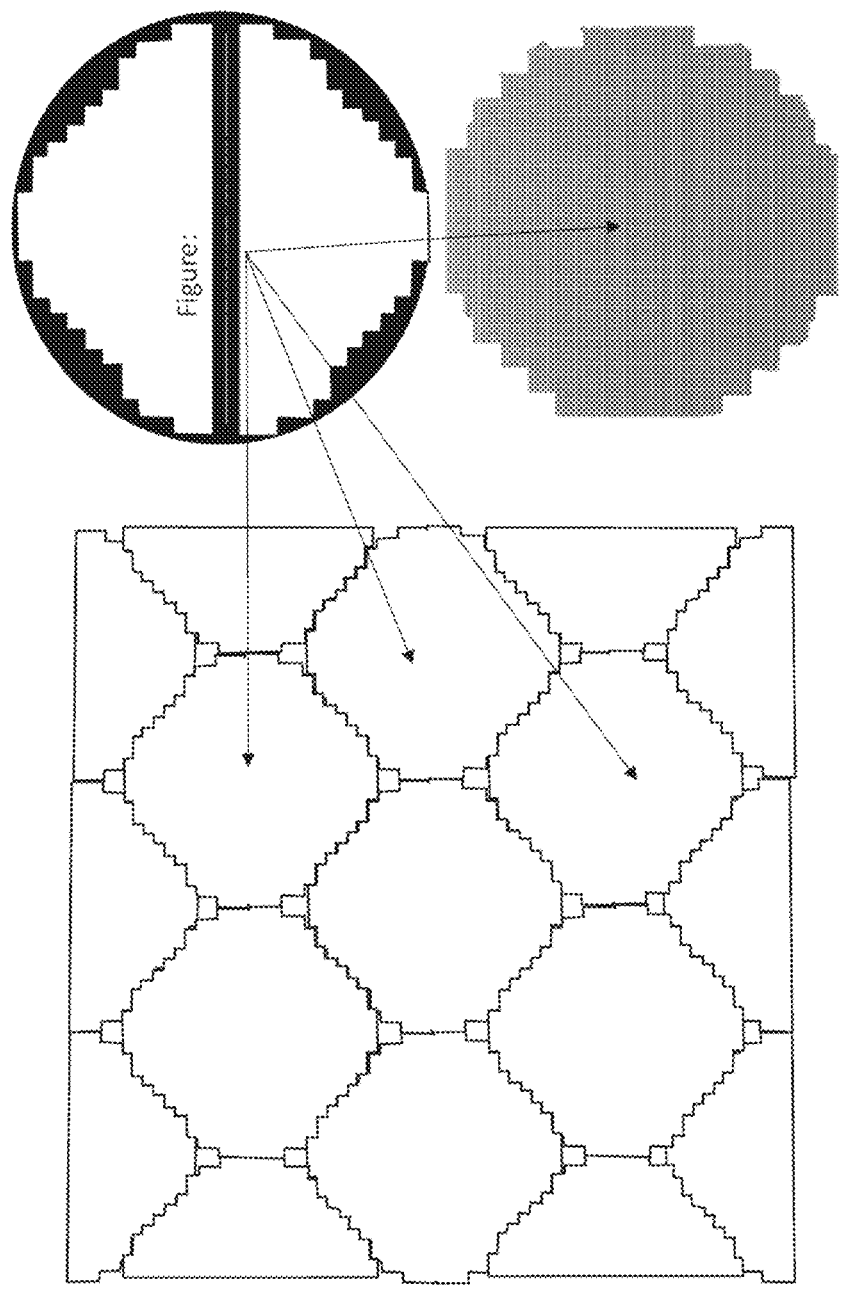
Figure 95:
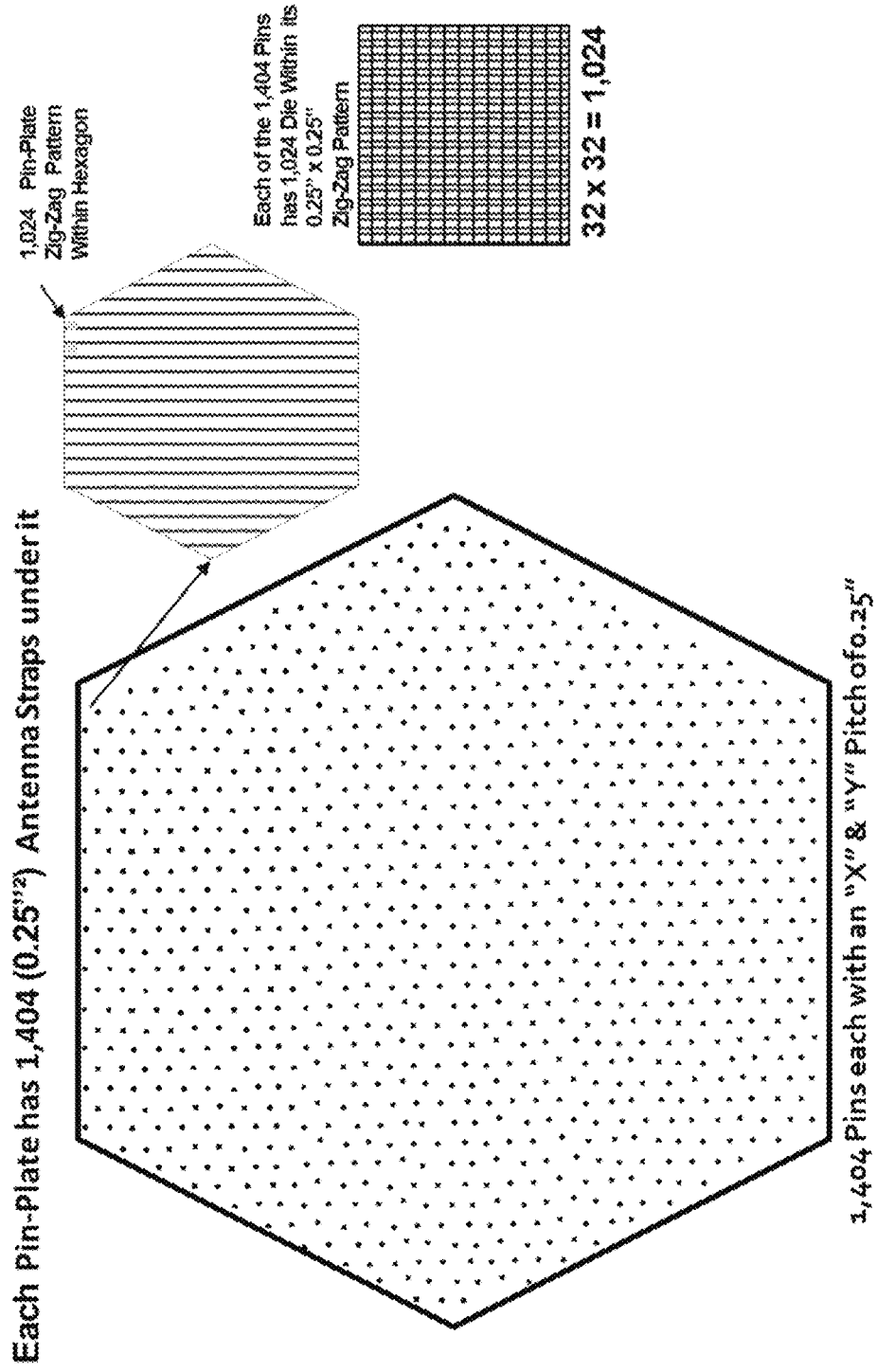
Figure 96:
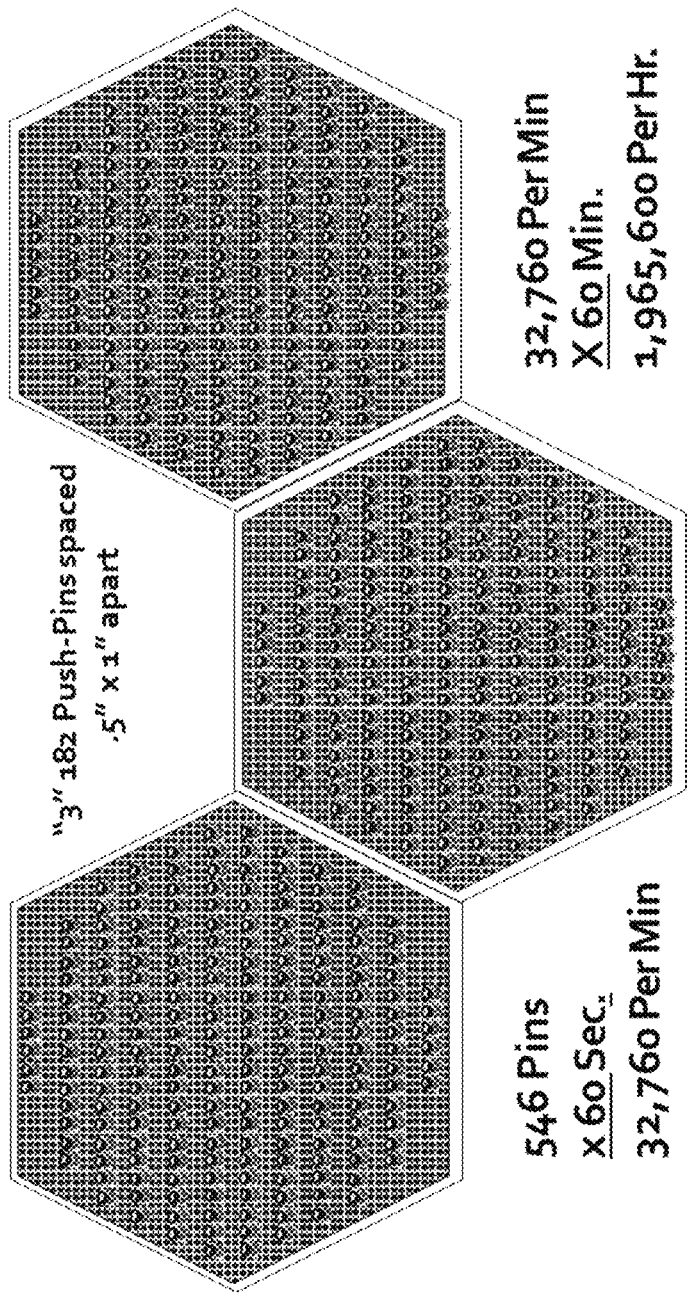
Figure 97:
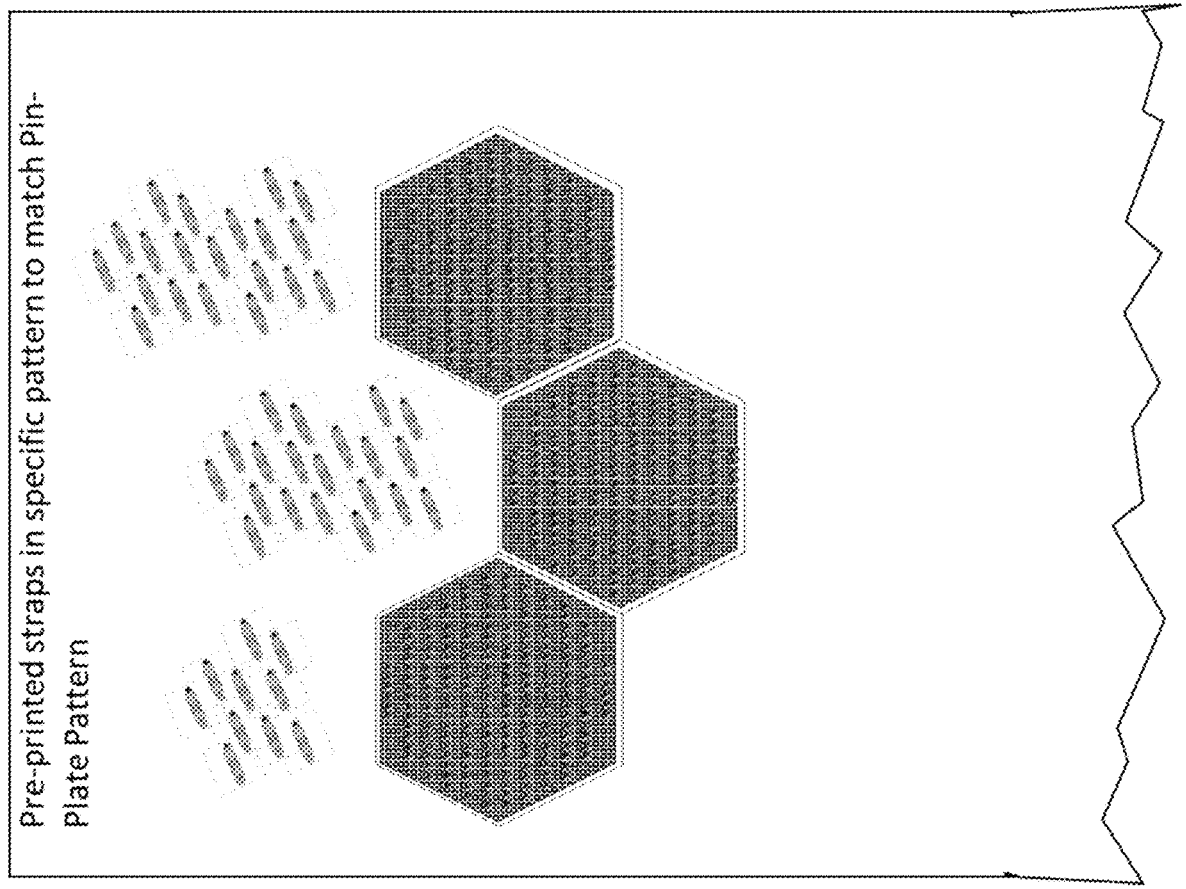
Figure 98:
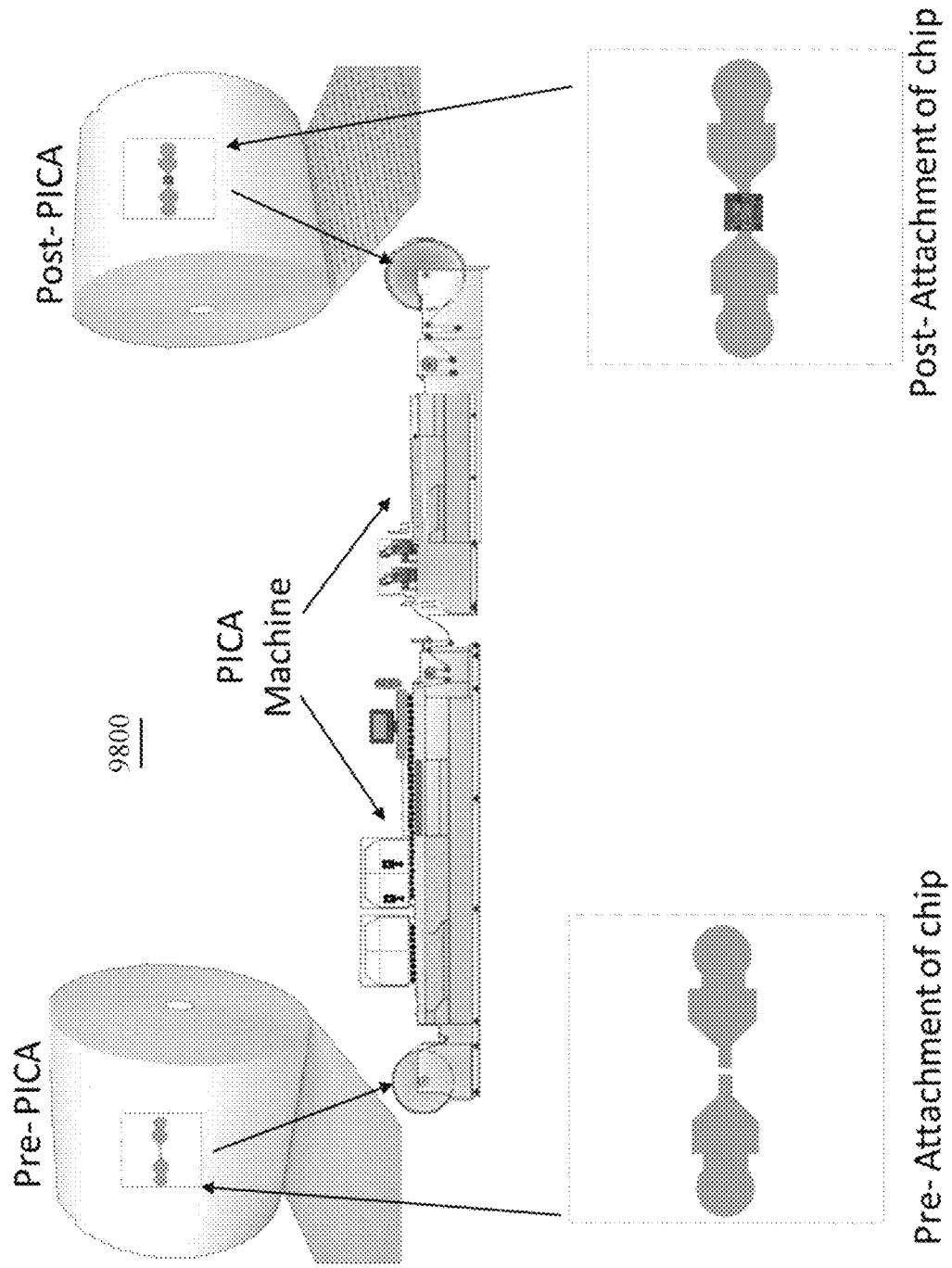
Figure 99:
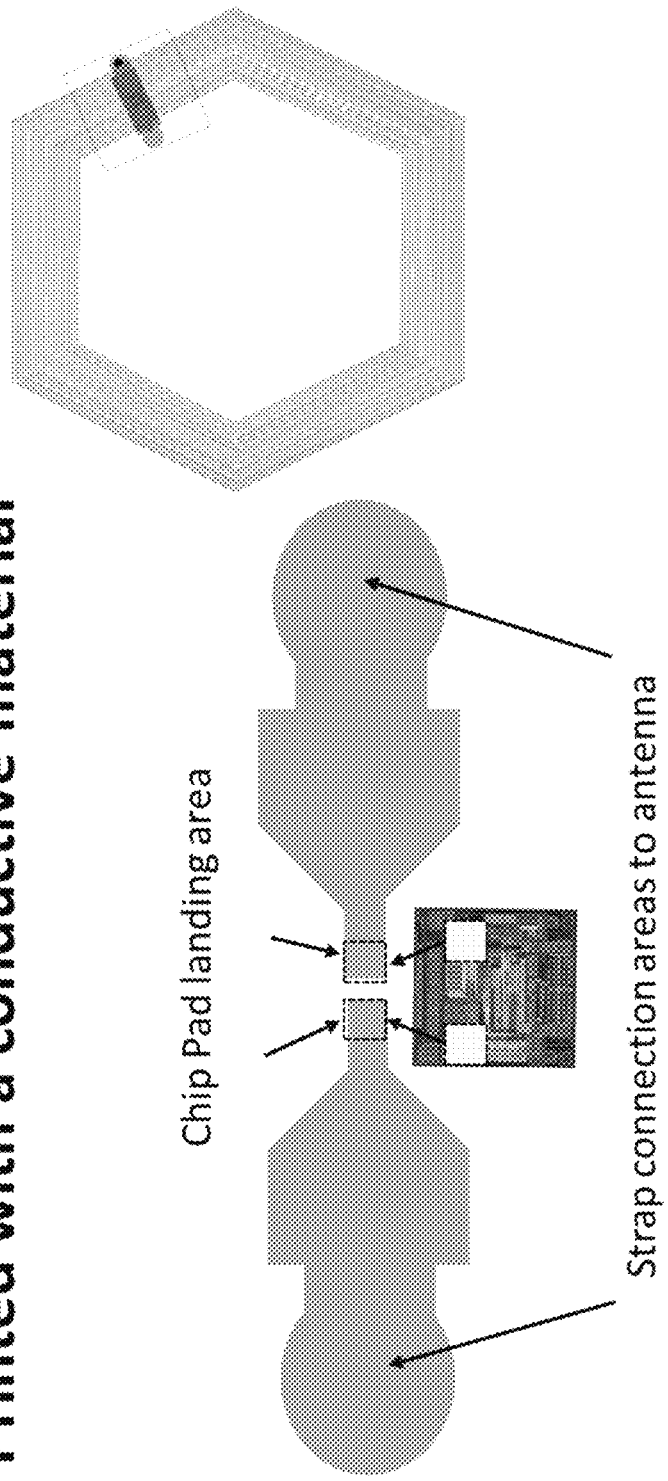
Figure 100:
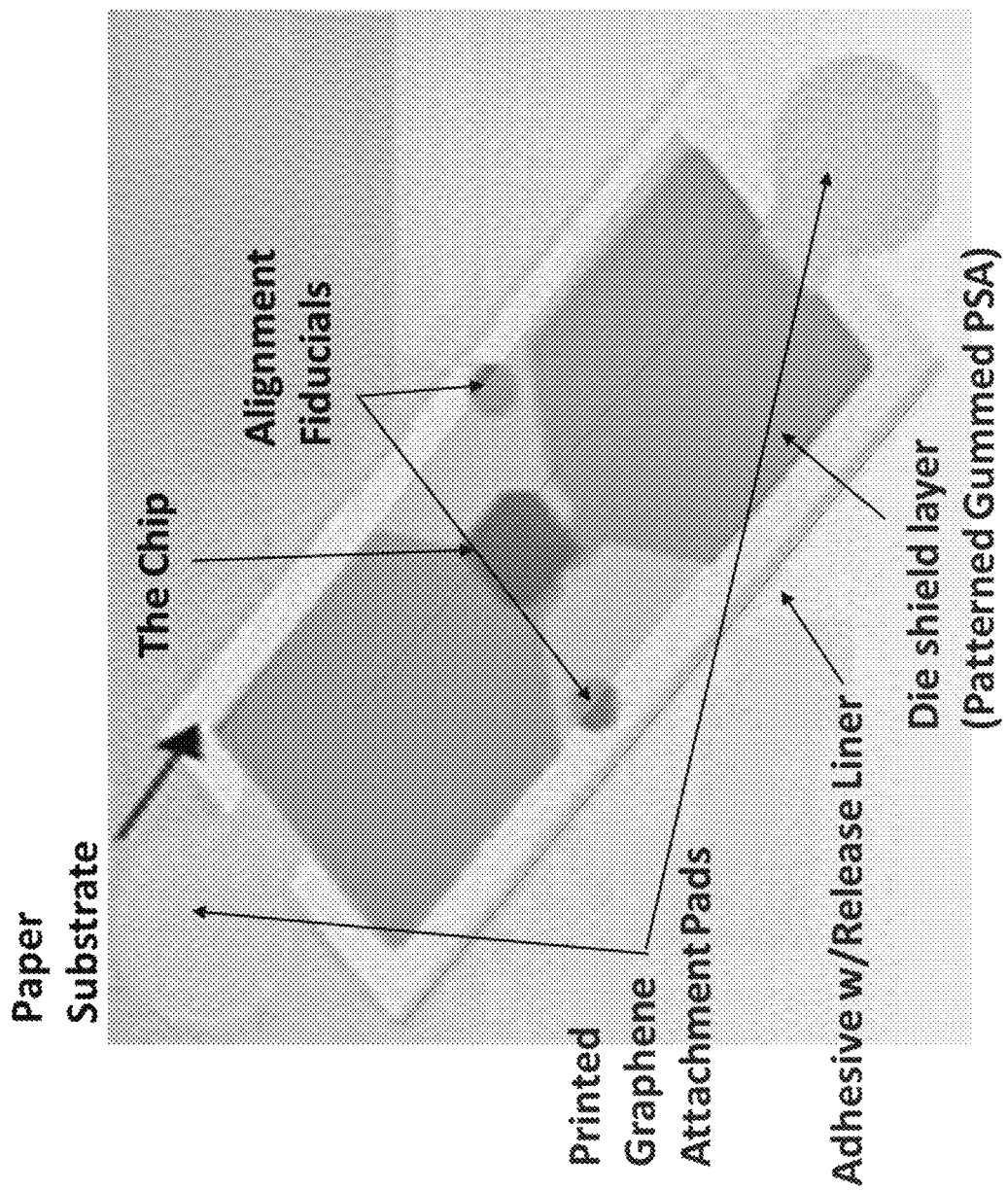

FIGS. 1-94 illustrate numerous structures and processes for parallel integrated circuit assembly, according to example embodiments. FIGS. 95-97 illustrate numerous structures and processes for a single "pin plate" layer with push pins, according to example embodiments. FIGS. 98-133 illustrate numerous structures and processes for strap-interposers and assemblies, according to example embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

The present specification discloses numerous example embodiments. The scope of the present patent application is not limited to the disclosed embodiments, but also encompasses combinations of the disclosed embodiments, as well as modifications to the disclosed embodiments. References in the specification to "one embodiment," "an embodiment," "an example embodiment," etc., indicate that the embodiment described may include a feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner. It is contemplated that different embodiments described herein may be implemented together in various combinations, as would be apparent to one of skill in the art having the benefit of this disclosure. That is, embodiments described herein are not mutually exclusive of each other and may be practiced alone, or in any combination. Numerous embodiments are described in the detailed description and figures provided.

Example Embodiments

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, e.g., antennas, capacitors, resistors, inductors, to form an electronic device.

Pick and place techniques involve complex robotic components and control systems that handle only one or two etc. die at a time. This has a drawback of limiting throughput volume. Furthermore, pick and place techniques have limited placement accuracy, and have a minimum die size requirement. One type of electronic device that may be assembled using pick and place techniques is any RFID "tag." RFID tags may be affixed to any item whose presence is to be detected and/or monitored.

With the presence and advancements of "The Internet of Things" (IoT) and it evolving to where every and all objects, animals or people will be provided with unique identifiers and have the ability to transfer data over a network without requiring human-to-human or human-to-computer interaction. The IoT evolved from the convergence of wireless technologies, micro-electromechanical systems (MEMS) and the Internet. These IoT advancements are leading to the affixing of a tag with a unique identifier to each and every item, and their checking and monitoring by devices known as "Smart Cell Phone readers."

As the market demand increases for products such as these unique identifiers tags, and with the advances of technology and die sizes shrinking, the need for high assembly throughput rates for very small die, and low production costs will be crucial in providing these commercially-viable products. Accordingly, what is needed for this requirement is a method and apparatus for the ultra-high-volume assembly of these electronic tags for the Internet of Things (IoT) and that is what is discussed and described here. As one browses through the Internet, one does not find any information about the implementation and manufacturing reality of this world changing Internet of Everything. This is what this disclosure answers with Massive Parallel Integrated Chip Assembly (MPICA) technology. MPICA enables the true reality of the Internet of Everything, and ultimately achieve total world connectivity. Why is MPICA important? There are no other technologies today that can produce a tag in the volumes or at the costs that allow companies to have a good Return on Investment (ROI). For example, the current cost of the Near Field Communication (NFC) microchips are driven by the area of the silicon in the microchip. The typical size of an NFC microchip is ~0.5 mm squared which means that the silicon microchip in very large quantities is priced at around 5 cents. When you have to add the cost for the copper coil, as well as the cost of attaching the coil to the microchip, the cost of the label and the integration into the label, it becomes obvious that even in large volumes (1 Trillion) an NFC tag is unlikely to be available for under 10 US cents. With MPICA we are capable of offering an NFC tag for only 1 US cent (or less) in volumes of trillions per year.

Proctor and Gamble ("P&G") in 2014 sold 41,500,000,000 products from only 23 different brands that year with @ $83,000,000,000 revenue from those sales. If you made them apply 1 tag @ a cost of 10 US cents on every one of those 41.5 billion products sold, it would have cost them @$4,150,000,000.00 to implement, which is about 5% of their net sales. With slim margins in today's world that percentage would be a non-starter. But, if you offered a 1 US penny tag to P&G, the cost to implement would be $415,000,000.00 which would be only @ 0.5 percent of net sales.

Proctor and Gamble's CEO announced that their 2015 yearly advertising budget would be $2,900,000,000.00 and of which $1,015,000,000.00 will exclusively be spent on digital advertising through the web and print. Which equates to 35% of their total advertising budget. If P&G used only 41% of their digital advertising budget for direct marketing through touch sales from smart phones that would be $416,150,000.00. With the tag cost to implement at only $416,150,000 and at only 41% of their digital advertising dollars it would pay for everything and create a huge ROI for P&G.

NFC will take mobile marketing to a whole new level. NFC enables the use of contactless communication between devices like smartphones or tablets that allows any user the ability to wave their personal communication device(s) over an NFC-compatible device to send information without needing to touch the devices together or go through multiple steps to set up a connection. The short-range wireless RFID technology will bring marketers and consumers together like never, bringing the capability for the real-time exchange of any content and/or data. How much is the Internet of everything worth? $19 trillion The Internet of Everything will have five to 10 times the impact on society as the Internet itself, says Cisco CEO John Chambers.

Cisco CEO John Chambers says a new tech market is coming that will generate an astounding $14 trillion in profits over the next decade: The Internet of Things (IoT). IoT is about putting all sorts of inanimate objects on the Internet like cars, door locks, appliances, smart meters, video surveillance, health care devices, and thermostats and so on. "The Internet of Things, I think will be the biggest leverage point for IT in the next 10 years, $14 trillion in profits from that one concept alone". He's basing this on Cisco's research. Cisco recently released its latest report on Internet trends. The report predicted that by 2017, there will be about 2.8 billion machines on the Internet, representing 30% of the devices connected to the internet worldwide, up from 960 million devices and 17% in 2012. These devices will lead to apps, services, support jobs and will cause businesses and service providers to upgrade their networks, too. Cisco has even coined its own phrase for this: the "Internet of Everything." The Internet of Everything will put a lot of money in a lot of company's pockets, Cisco among them.

NFC has such a broad range of applications that the much less sophisticated quick response (QR) codes (Barcode) pale in comparison. Although QR technologies can be effective for delivering information to consumers, NFC technologies take this concept beyond the stars, allowing unlimited information to be instantaneously transferred and exchanged between individuals and organizations. NFC has much greater functional uses and the potential to ultimately transform the way how all businesses are conducted. For example:

Data on all purchasing behavior collected through NFC exchanges will allow marketers to more effectively target and deliver the right type of marketing content to appeal to and engage with users. It will also make it easier to manage and promote customer loyalty and reward programs, and consumers will no longer need to carry around reward cards and coupons. Individuals will also be able to automatically spread the word about incentives and deals on social networks via automatic NFC-enabled sharing.

NFC tags will be placed in various print media, such as signage, magazines, product displays, and packaging. The tags are capable of reading the preferences and purchasing data of anyone with an NFC-enabled smartphone. This allows marketing messages to be customized to target and attract specific individual consumers.

Smart posters containing custom URL-programmed NFC tags enable seamless transactions with mobile users. Smart posters have been successfully used by businesses including Samsung, VH1, and Lipton. In addition to transferring digital media such as music and video, smart posters can deliver information like product availability and purchase locations.

NFC tags will also equip marketers with real-time analytics to track engagement with a campaign. Furthermore, geo-location mapping will provide specifics on the time and place of transactions and interactions. With data so precise and readily available, businesses will have a greater ability to refocus their efforts in real time and increase their ROI.

NFC has a number of other potential applications that could be far reaching, impacting the way business is done for transit systems, healthcare providers, banks, ticketing outlets, and more. It can also be used to provide things like electronic keyless entry. The potential for increased revenue and reduced expenses makes this technology very appealing for a variety of organizations.

NFC capabilities are currently being incorporated into the networks of mobile carriers, as this technology is set to become the new standard for location-based marketing and communications in the near future.

With the capabilities of NFC technology, every mobile device will become even more crucial to individuals than they already are today. It will become the standard of exchange for business transactions, eventually replacing credit cards and even cash for the average consumer.

Payment systems and marketing loyalty programs will be only the beginning for NFC technology. In addition to the mounting interest in NFC for mobile access control, this technology will empower more efficient, effective industrial applications. Specifically, combining NFC enabled smartphones with ruggedized RFID tags offers additional benefits when compared to traditional RFID solutions. When an application requires frequent interaction with tags at numerous process points by many different parties, the high expense of using traditional handheld readers is extremely cost prohibitive. By replacing handheld readers with NFC smartphones at data collection points, the ROI for the application increases.

Additionally, while the NFC standards for tags enable a broad variety of use cases and security, the concept of "trust" will allow for the ability to confer trust onto any item(s) that are the subject of transactions between individuals and organizations.

In embodiments, a unique Integrated Circuit (IC) die ejection head assembly system is described, which utilizes Three-Dimensional (3D) Printing/Etching to achieve very high-resolution manufacturing to meet the precision tolerances required for very small IC die sizes. Hundreds of thousands of die are retained in this head assembly system until they are selectively ejected in a very controlled and precise way onto an underlying substrate, which they are then attached to. An arbitrarily large number of die can be selected and ejected at a time until all the die are ejected from the head assembly system.

The Integrated Circuit Controlled Ejection System (IC-CES) embodiments provide a new approach for Massively Parallel Integrated Circuit Assembly (MPICA). The system is a complex die retention and ejection system that has the size and footprint of a standard silicon wafer on which the die are fabricated. For a die size of 250 microns on a side, there are about 900,000 such die on a 12-inch wafer.

The ICCES system embodiments may have several components, or system layers that are described below:

Die retention layer: this layer provides die retention "cubbies" in which the die resides until ejected onto an adjacent substrate. The cubbies are manufactured with 3D Printing/Etching to be a specified dimension larger than the die size and are placed exactly to correspond to the placement of the die on the wafer. At the bottom of the cubbies there is a hole of a specified diameter that connects to the push-piston assembly layer, to be described next. Through this hole is a pin with a radius of a specified dimension less than the hole radius, with a piston attached, with the same dimension as the die. The thickness of the piston is some specified dimension. The depth of the cubbie is the sum of this dimension and the die thickness. See FIGS. 1-94. In between the cubbies is a material that serves as a "stop" for standard industry laser scribing of the wafer. A "tacky" adhesive is applied to the backside of the wafer containing the die, specified to provide a sticking force of a value less than achieved when the die are attached to the target substrate. The wafer is then placed on the die retention surface with the die facing outward. The push pistons are deployed upward to touch the adhesive layer to secure the die onto the piston surface. See FIGS. 1-94. An anisotropic adhesive film, such as available from 3M, is placed over the wafer. This entire assembly is then scribed by standard industry laser scribing, to separate the die. During scribing, the pistons exert a specified downward force, pulling on the die, so when separated, the die are pulled into the cubbies, along with the anisotropic adhesive layer. Once in the cubbies, the adhesive keeps them retained.

Push Piston layer: this layer has either round, rectangular, or square chambers aligned with the cubbies. The piston pin hole connects a chamber to its corresponding cubby. The chambers have pistons connected to these pins, the radius being a specified dimension less than the radius of the chamber, or of the size being specified dimensions less than the rectangular or square dimensions of the chamber. The thickness of the piston is of some specified dimension. The chamber depth is the sum of this dimension and the die thickness. See FIGS. 1-94. The pistons are manufactured so that they move freely up and down, the total excursion being the same as the die thickness. At the opposite end of the chamber from the cubby piston hole, is a hole to the air manifold, to be described next. See FIGS. 1-94. This air manifold provides first positive pressure to push the chamber piston down to the cubby end, pushing the cubby piston up to meet the die underside surface when the die wafer is placed on the assembly as described above. Then is provides the negative pressure to pull the chamber piston up and away from the cubby side, pulling the cubby piston down to the bottom of the cubby, bring the attached die down into the cubby. When the target substrate is brought into near contact proximity to the cubby surface, positive air pressure is applied to once again move the chamber piston down to the cubby side, pushing the chamber piston up and the die out of the cubby, ejecting it onto the substrate where it is attached by the anisotropic adhesive. The attachment force is designed to be sufficient to pull the die off of the piston. Then negative air pressure is once more induced to withdraw the cubby piston into the cubby, leaving the die attached to the substrate.

Figure 5:
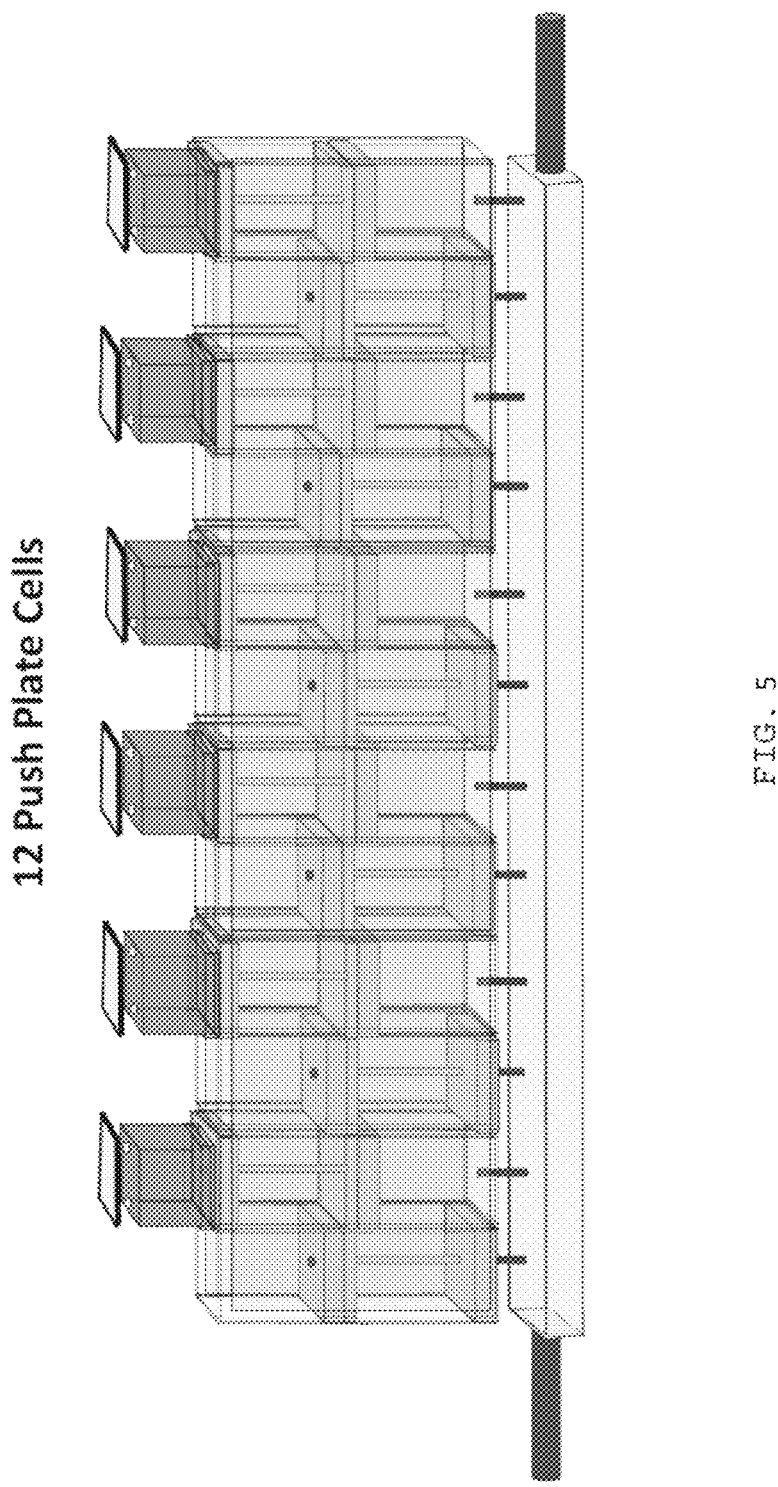
Figure 6:
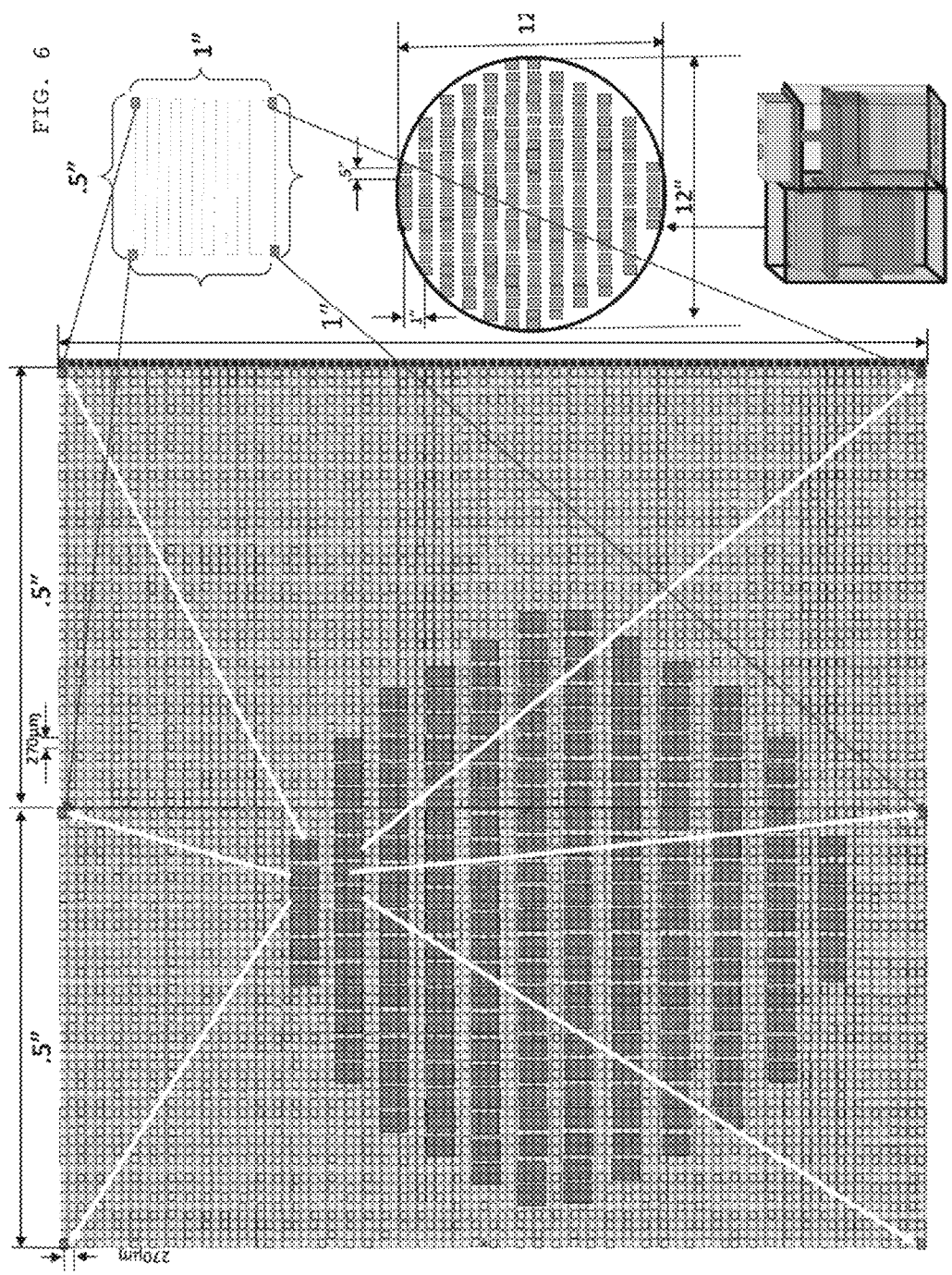
Figure 8:
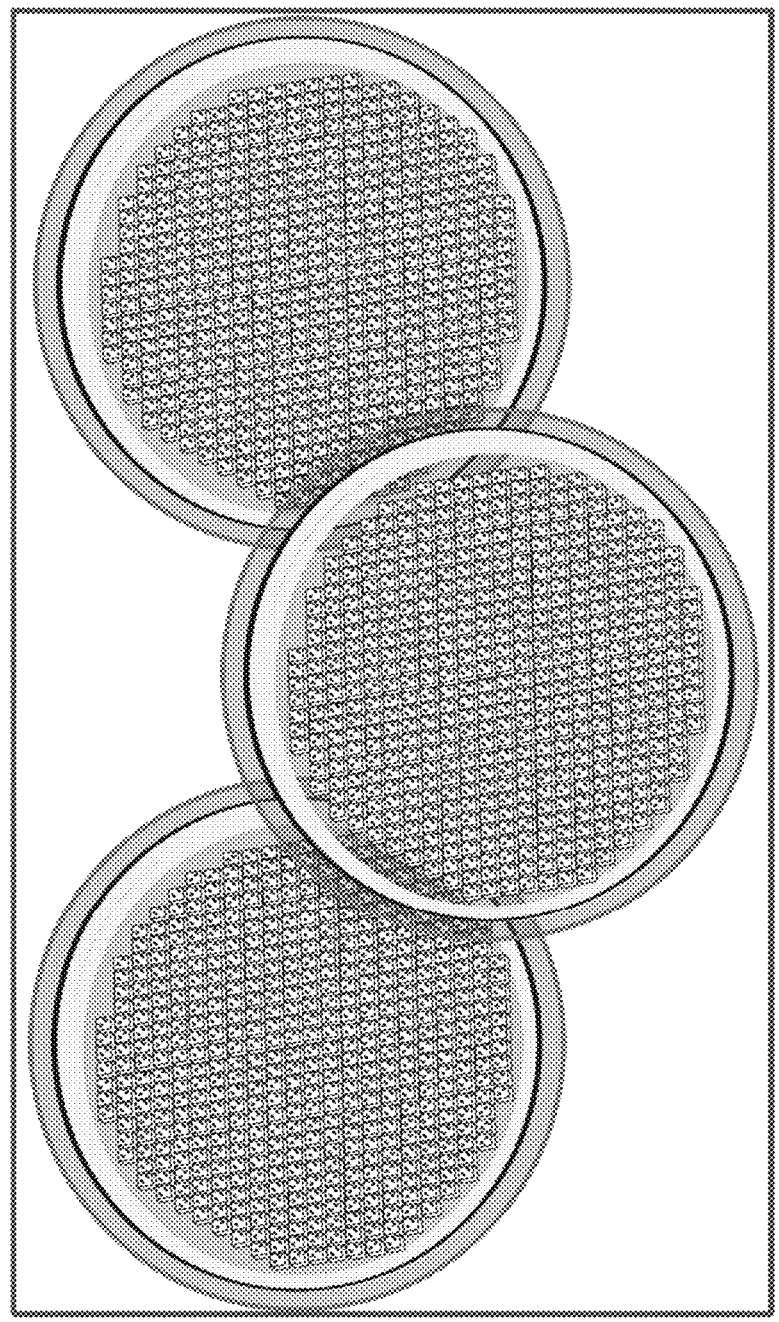
Figure 9:
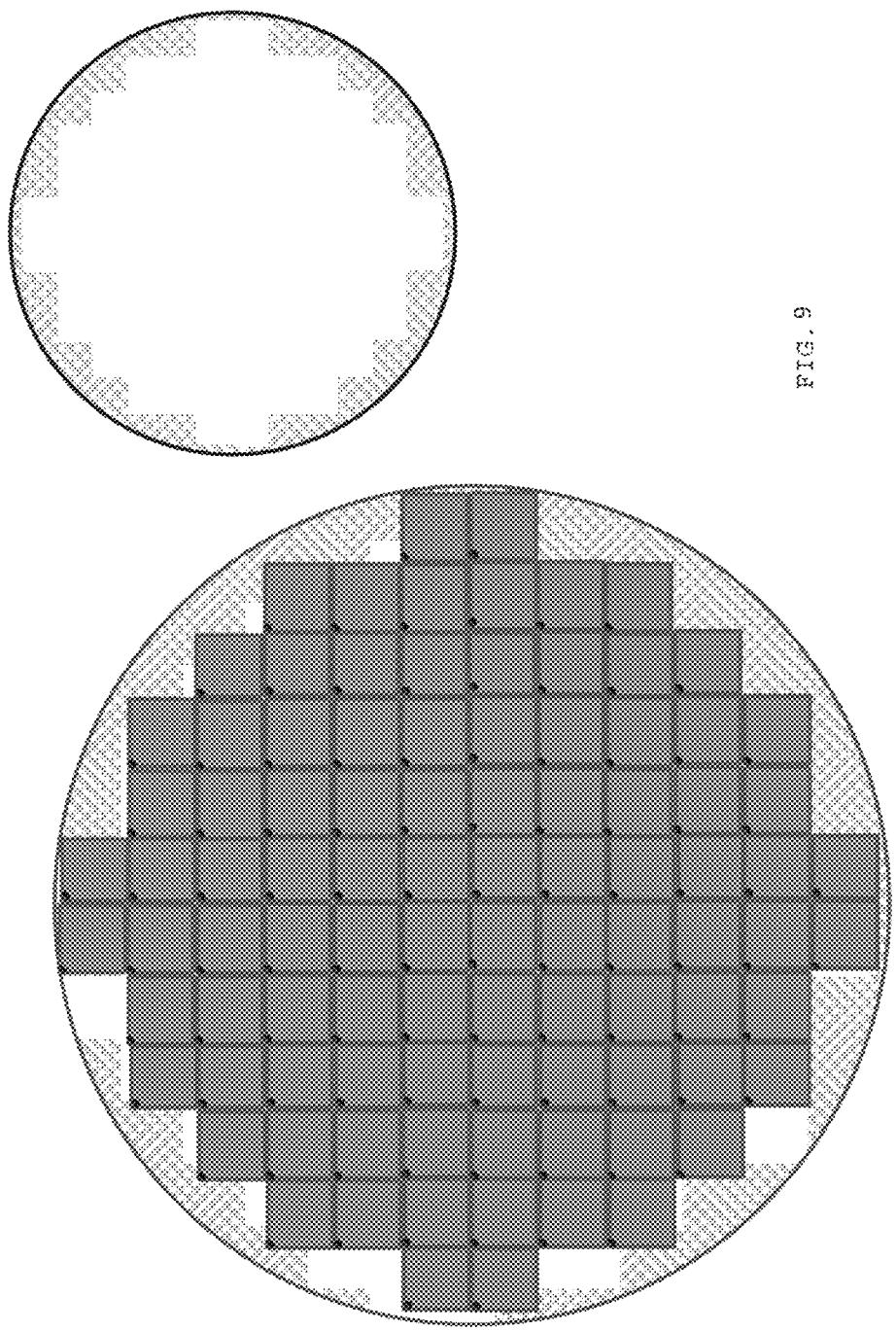
Figure 10:
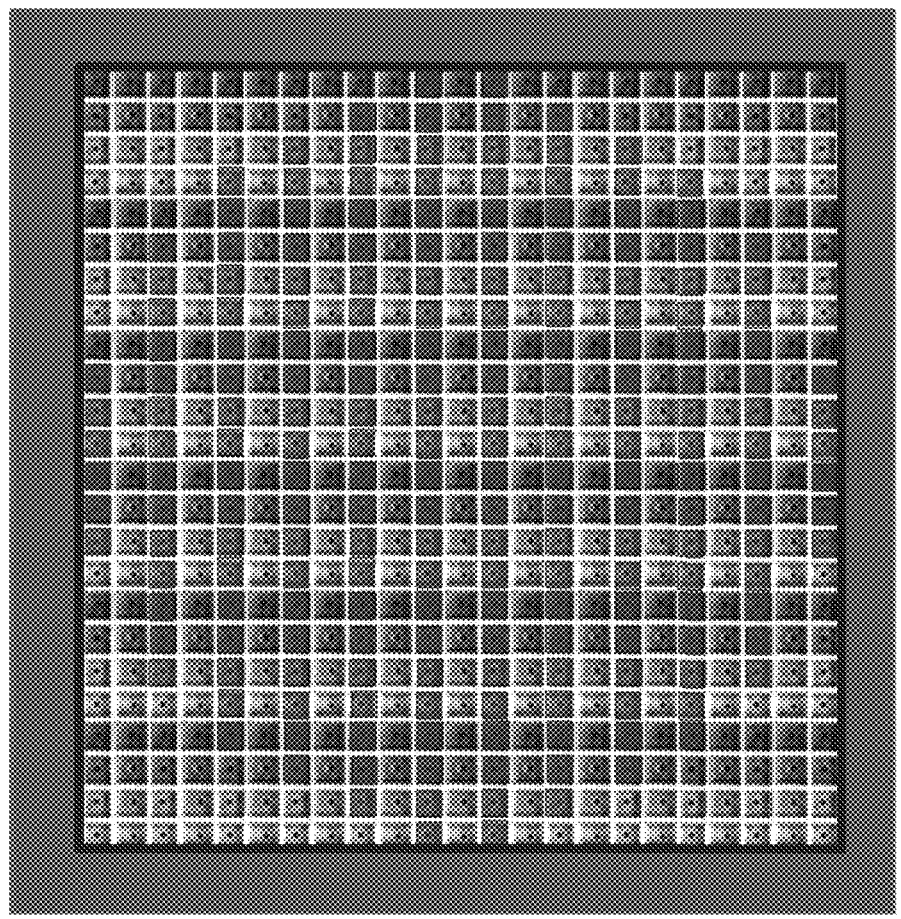
Figure 11:
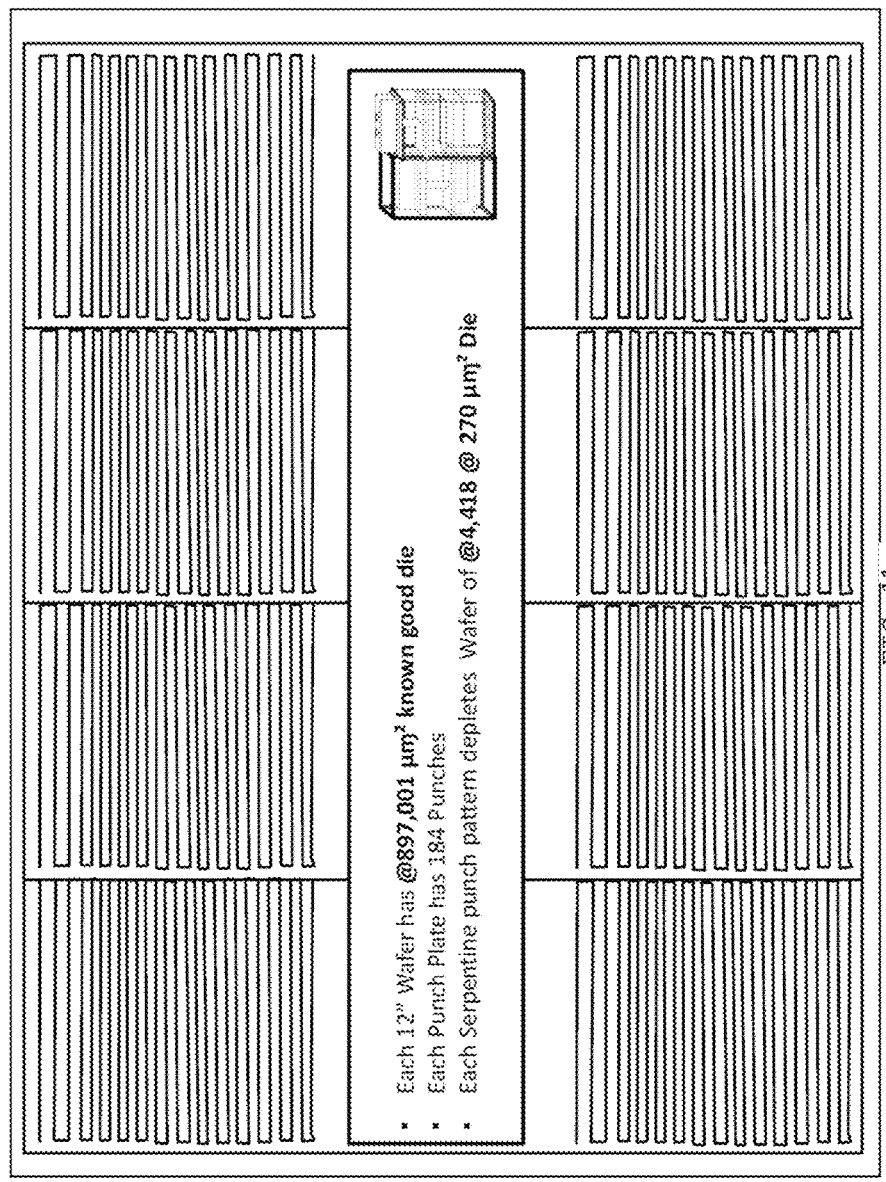
Figure 12:
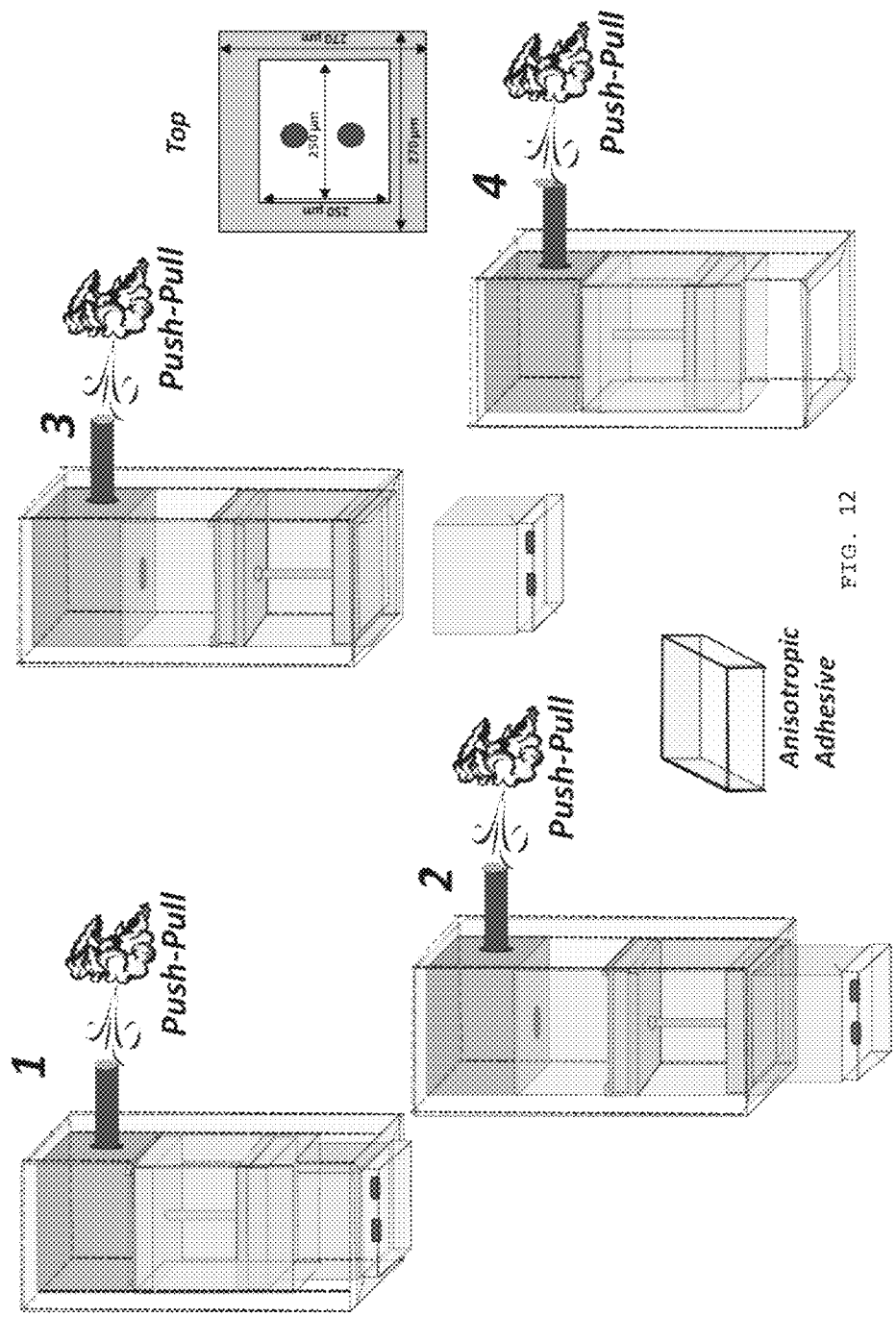
Figure 13:
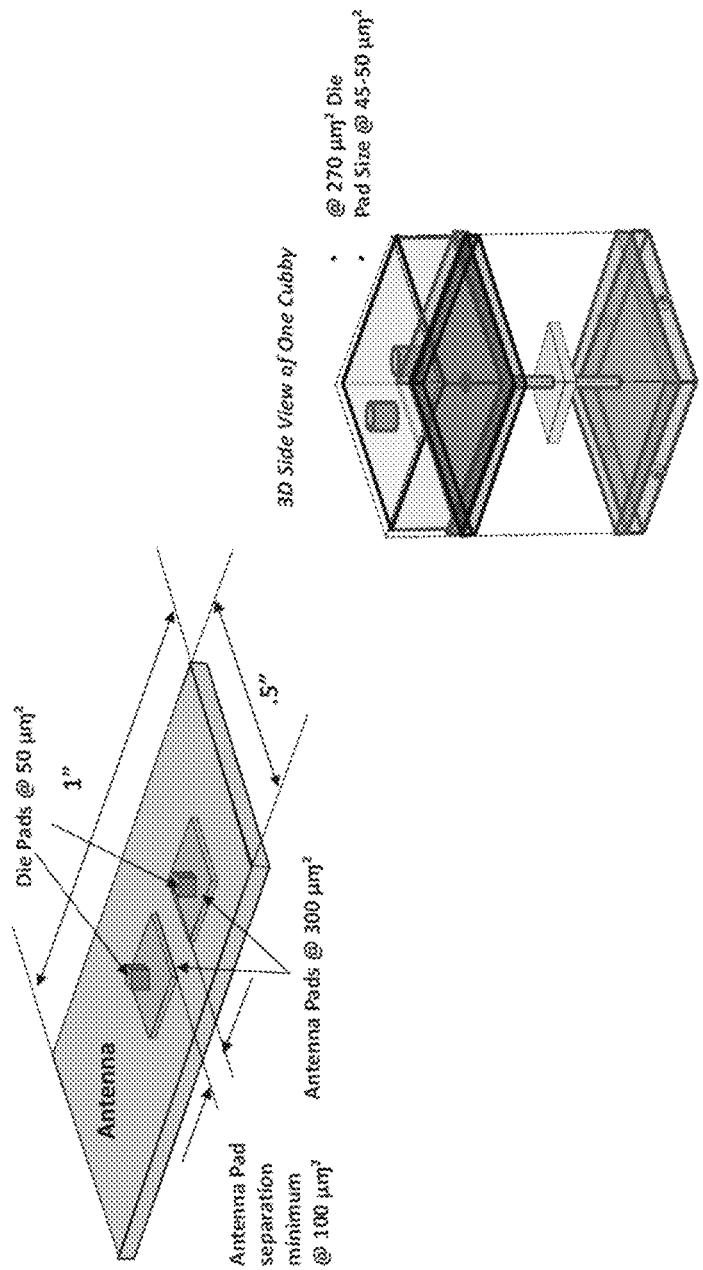
Figure 14:
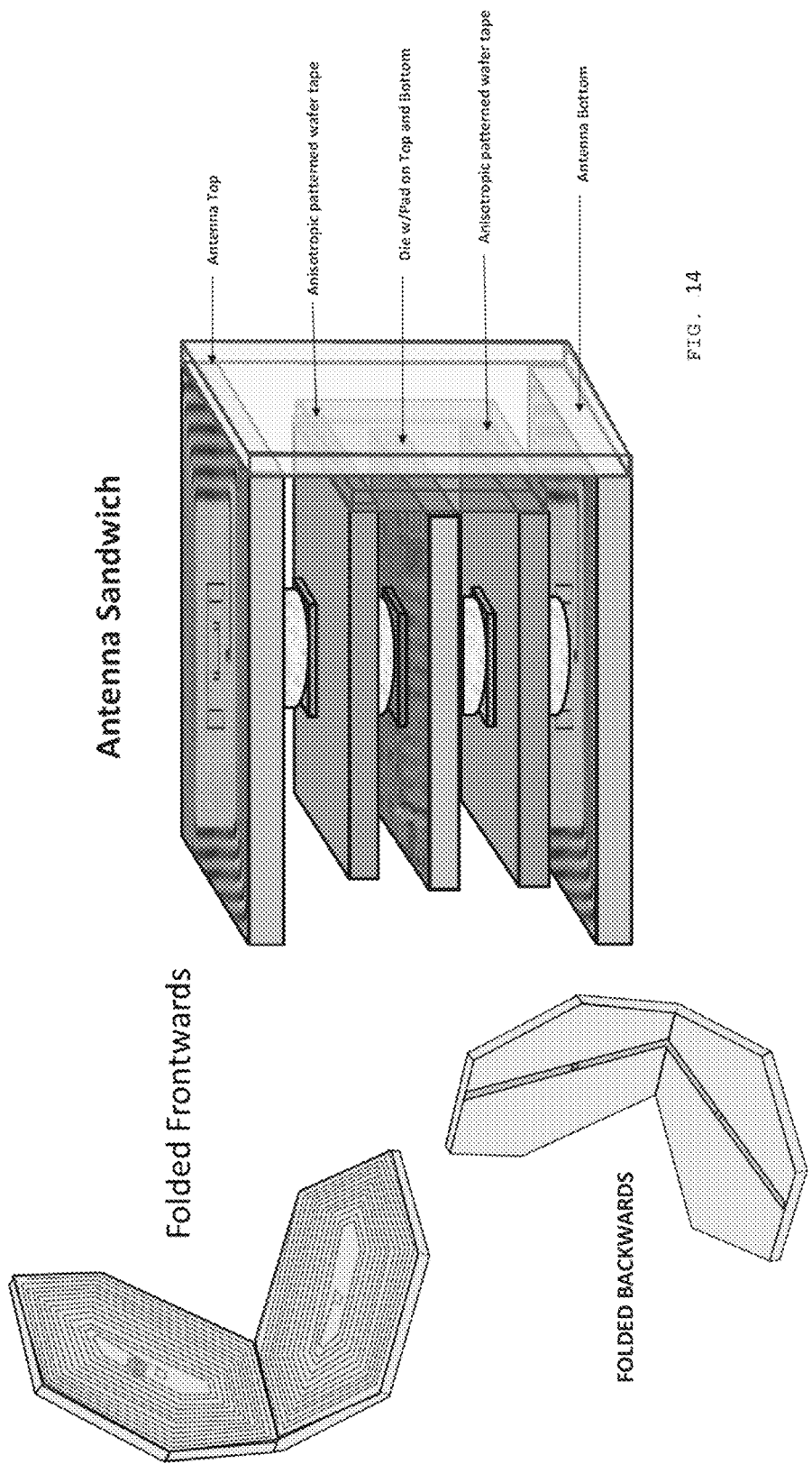
Figure 15:
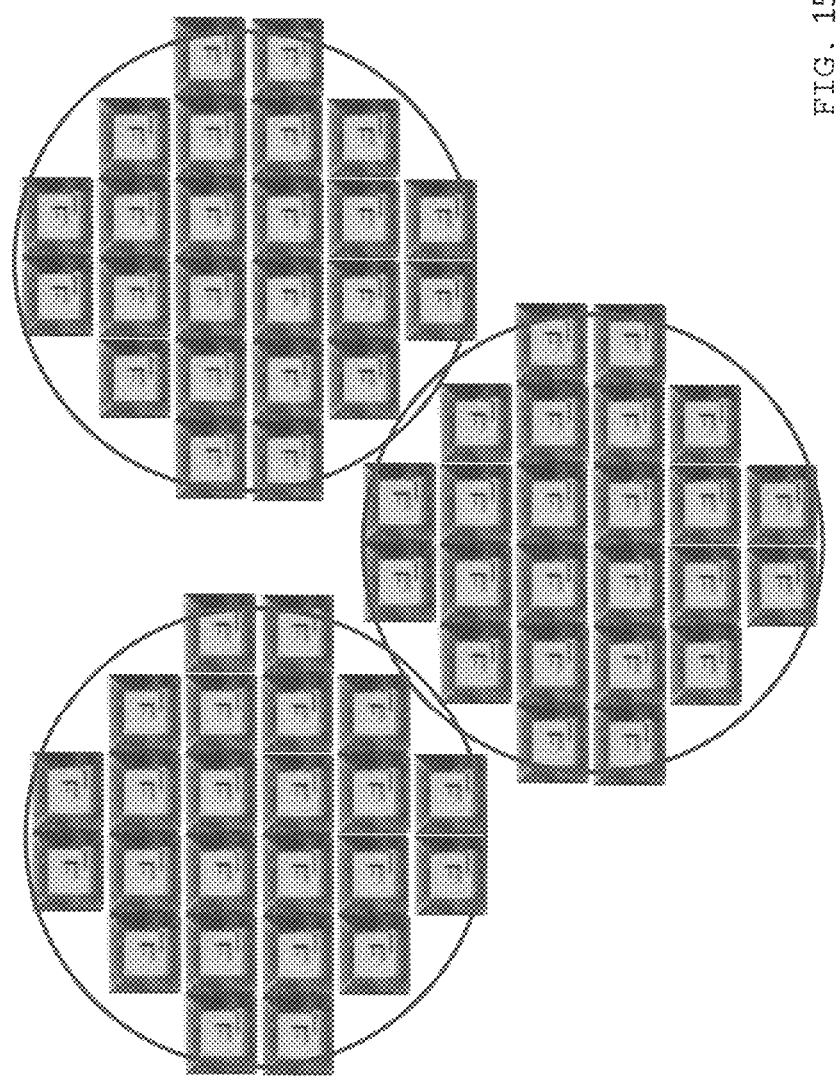
Figure 16:
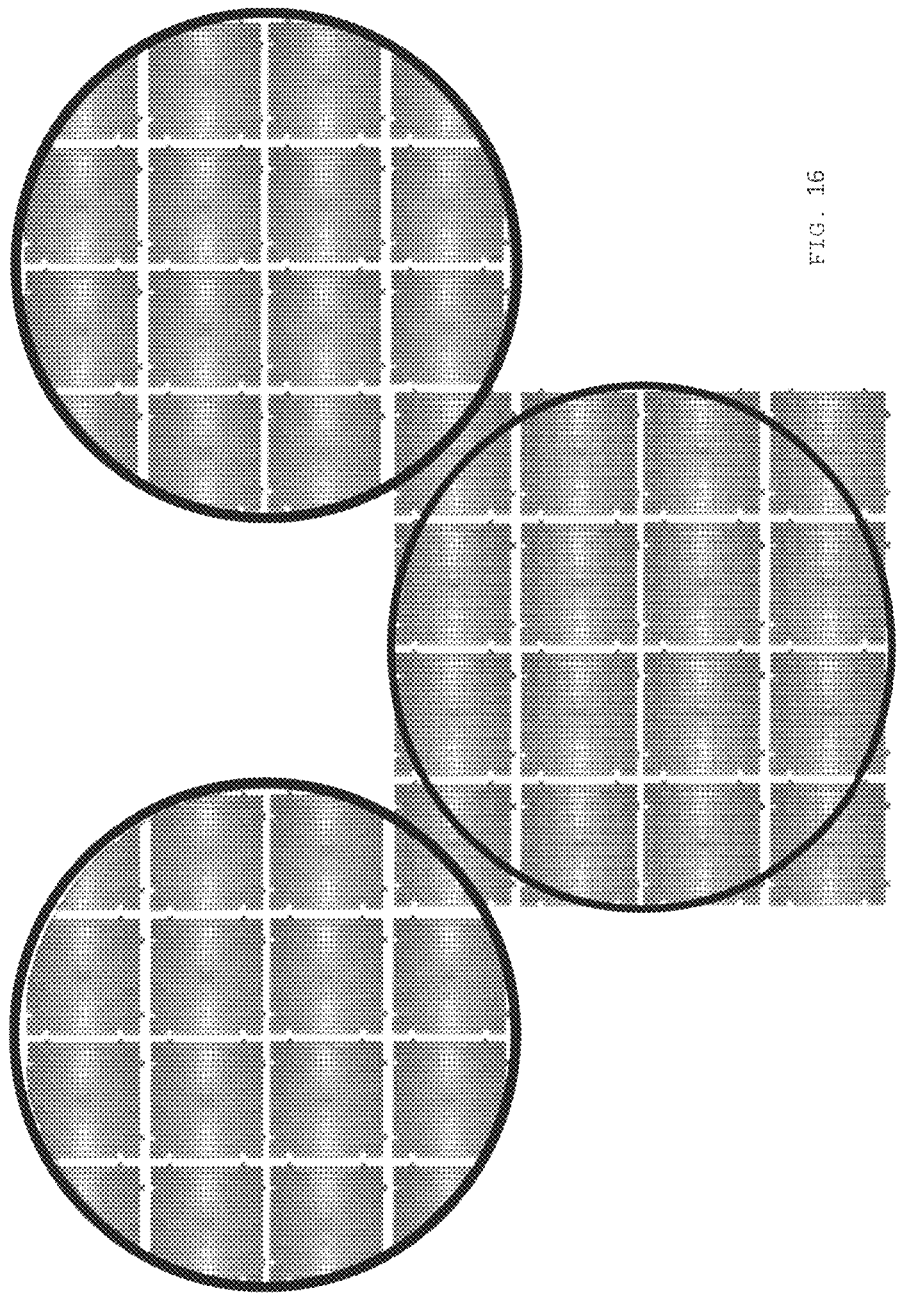
Figure 17:
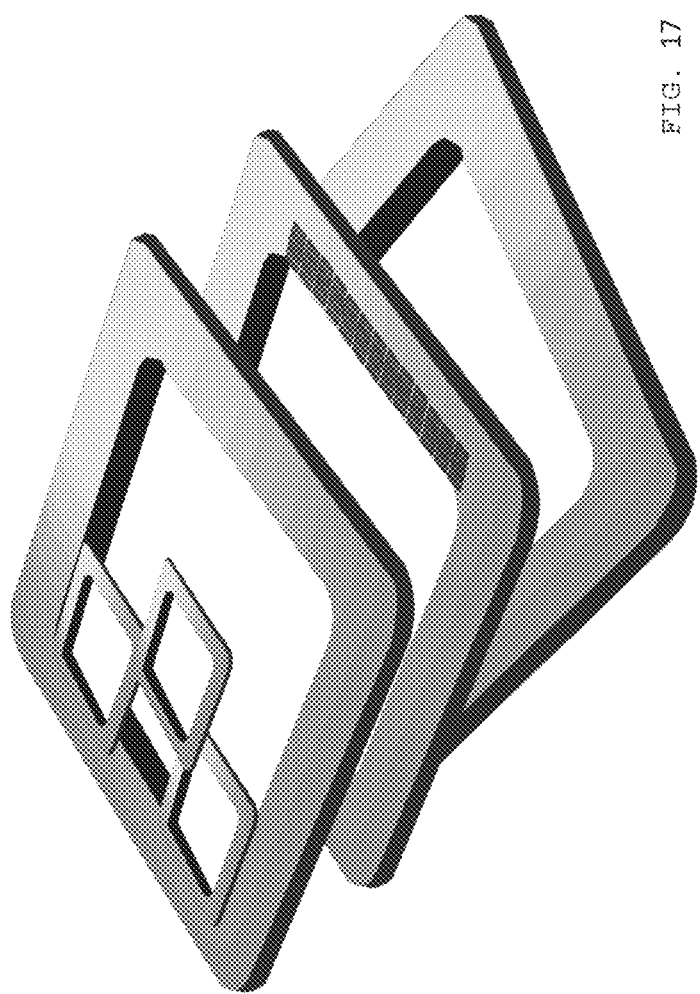
Figure 18:
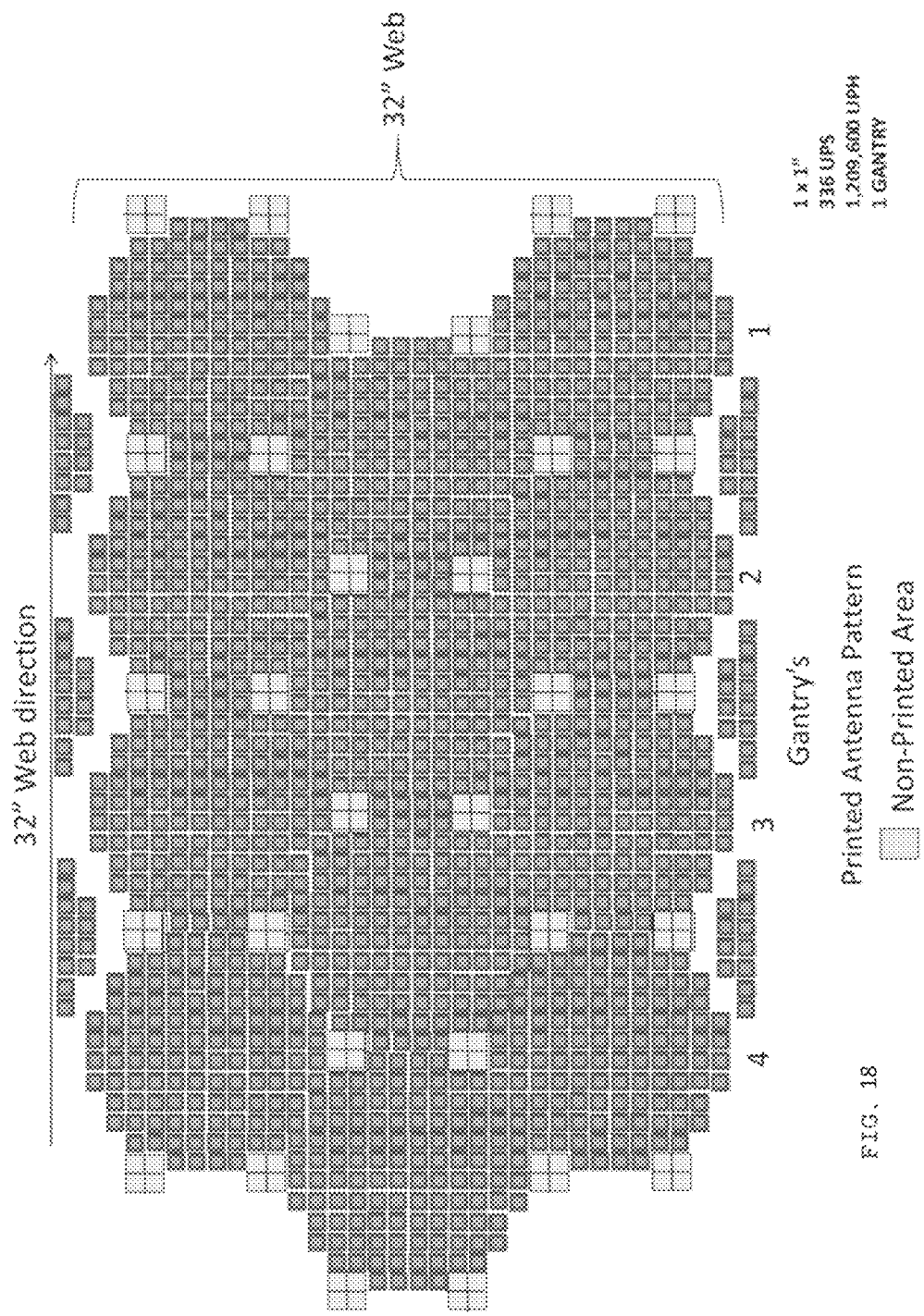
Figure 19:
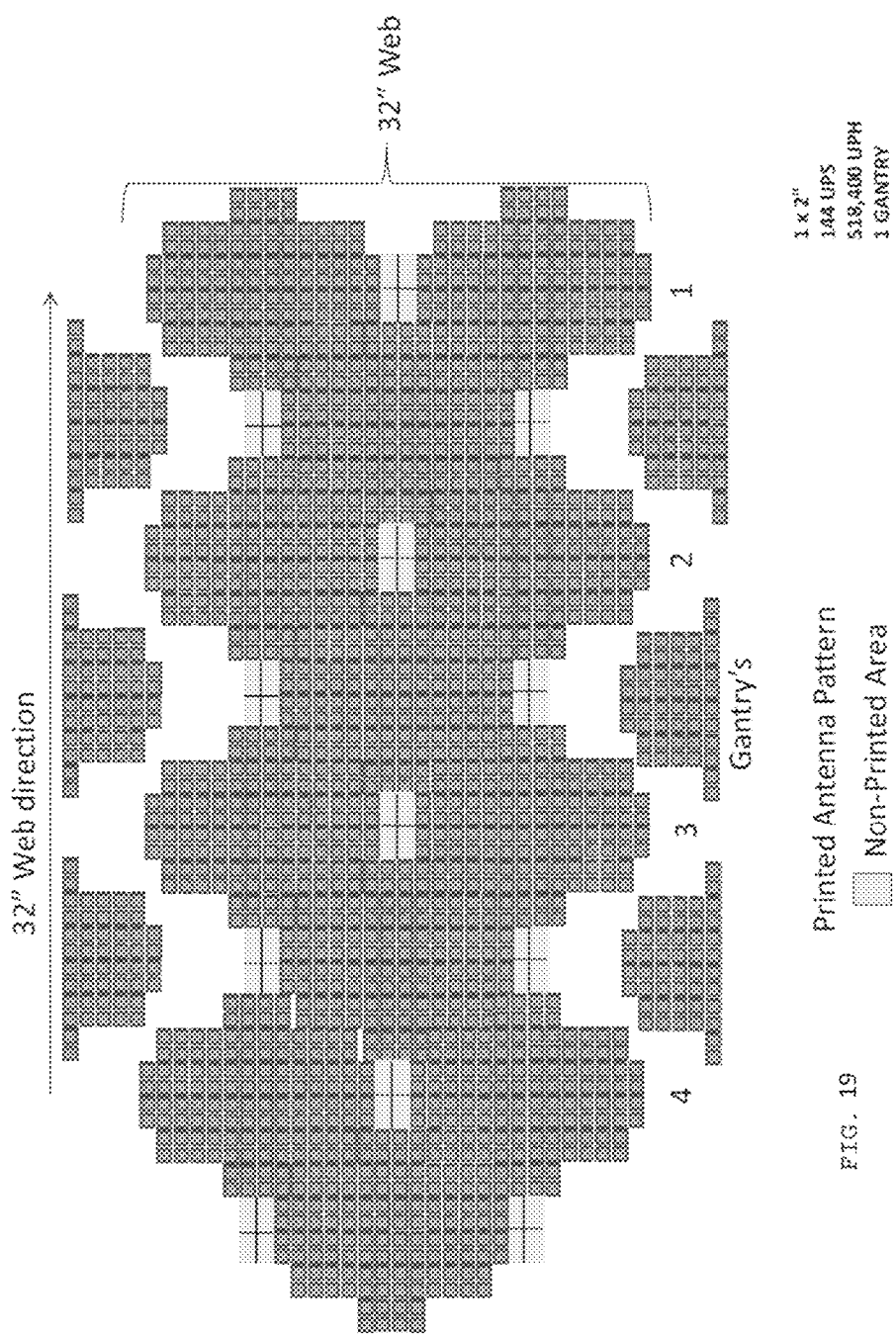
Figure 20:
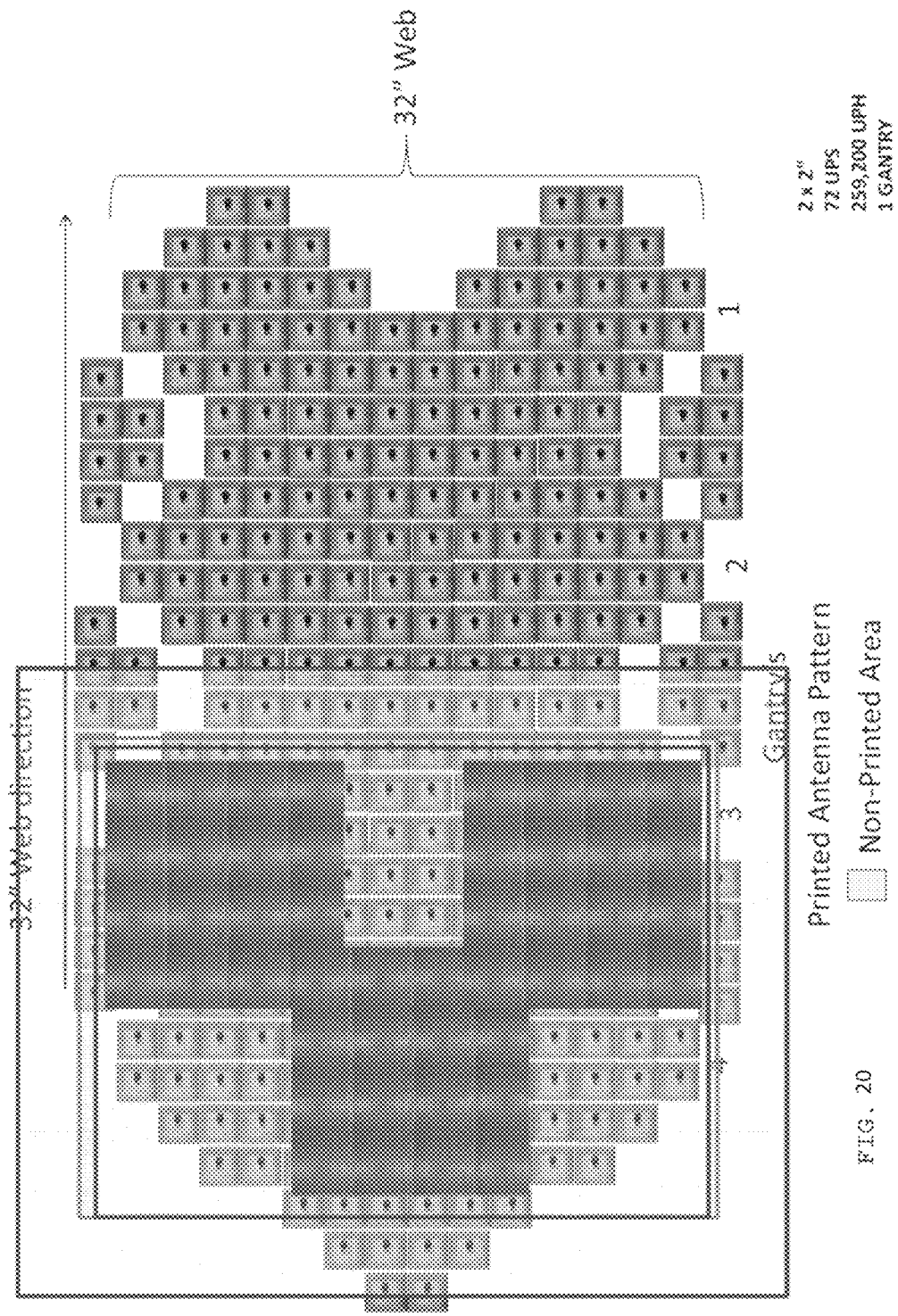
Figure 22:
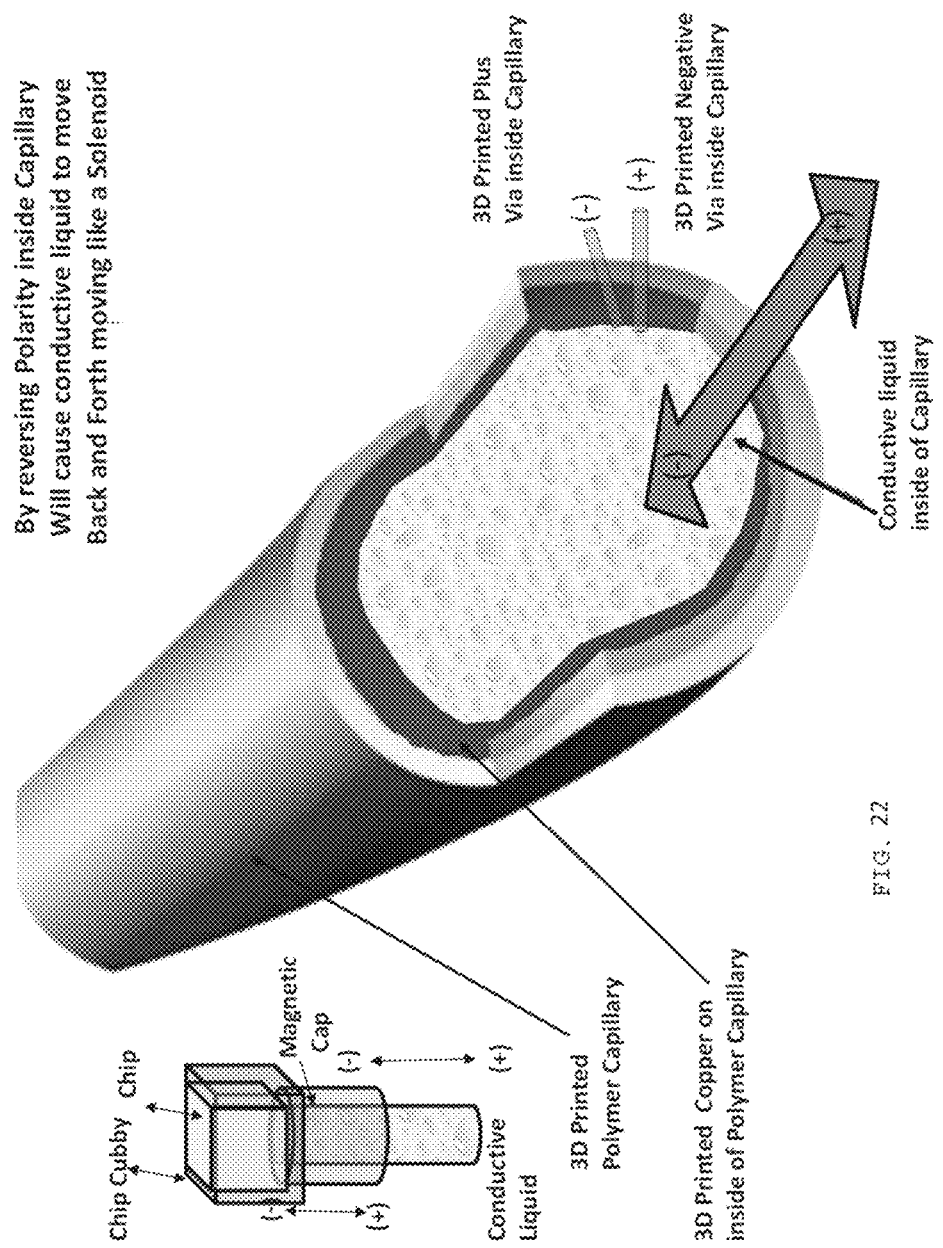
Figure 23:
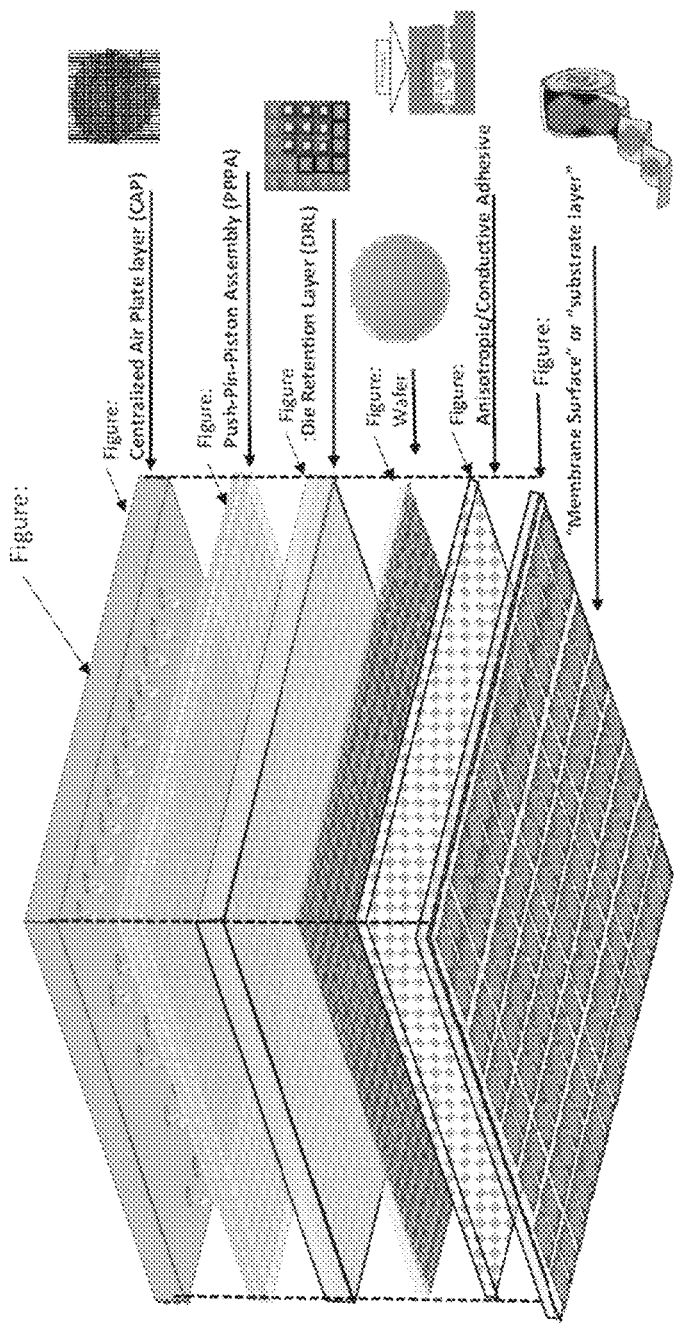
Figure 24:
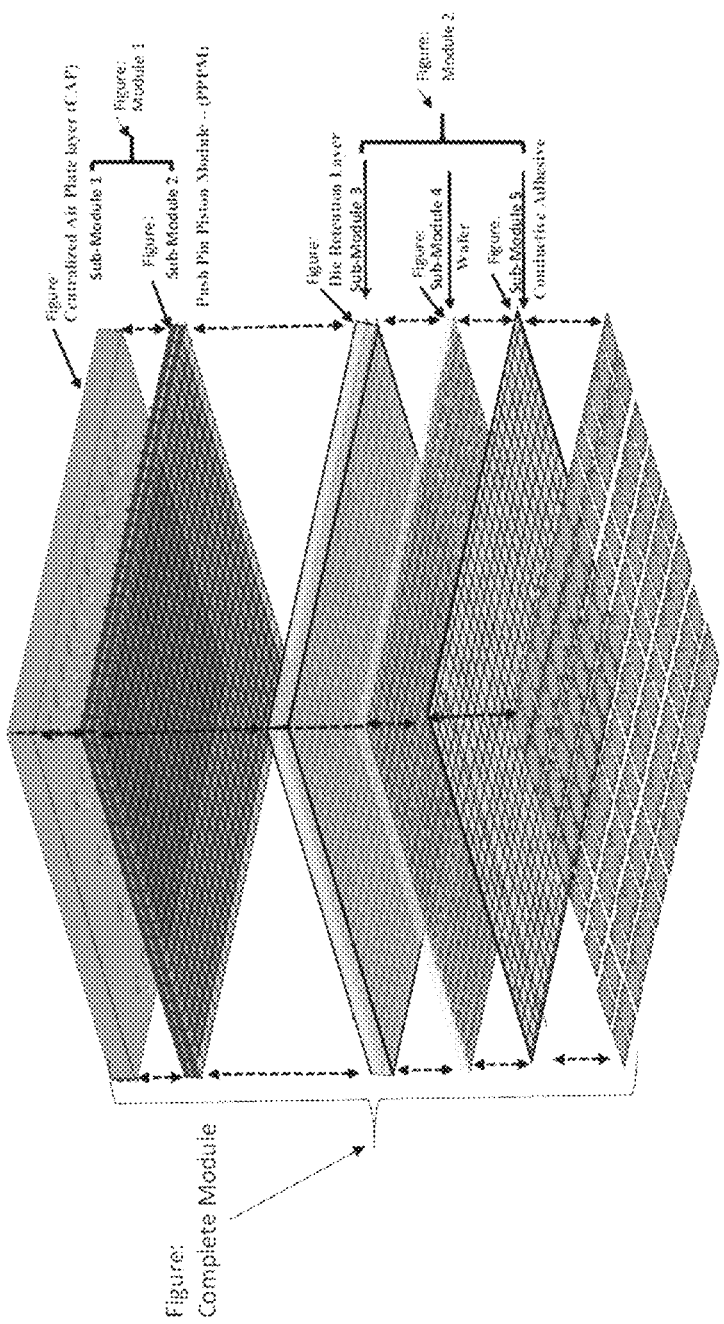
Figure 25:
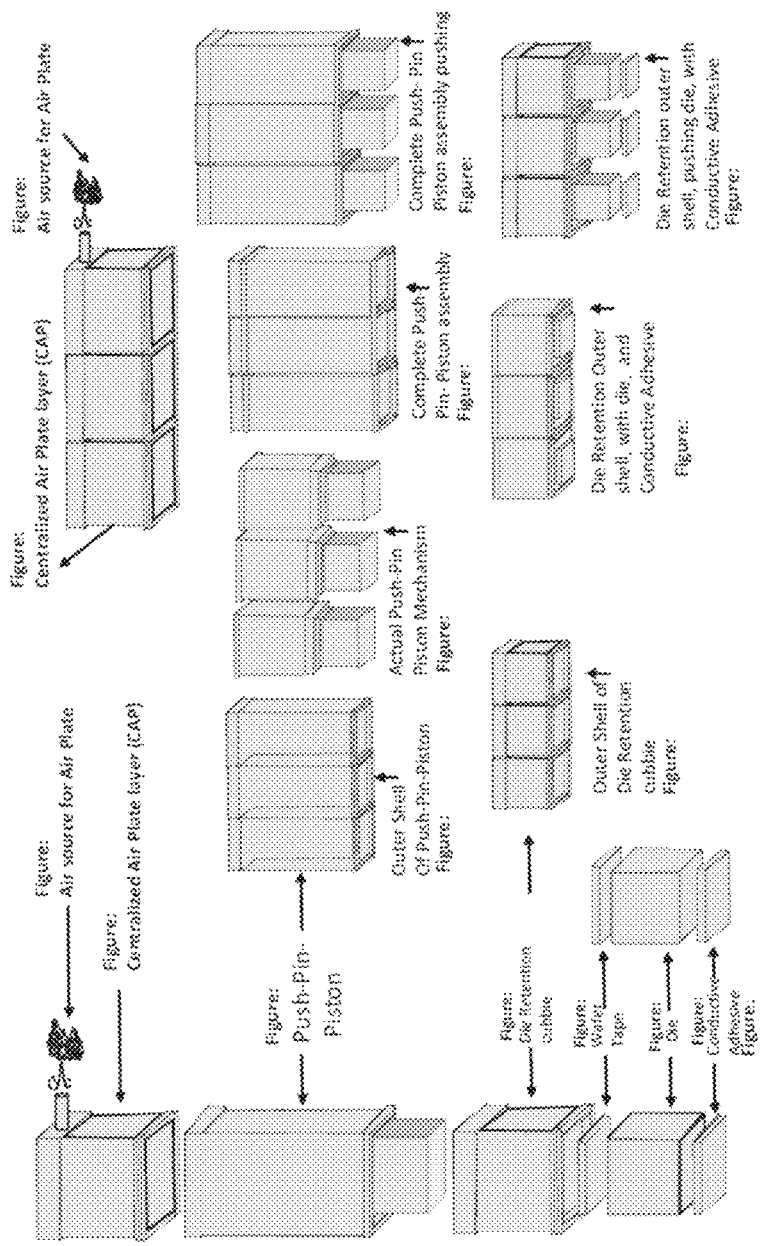
Figure 26:
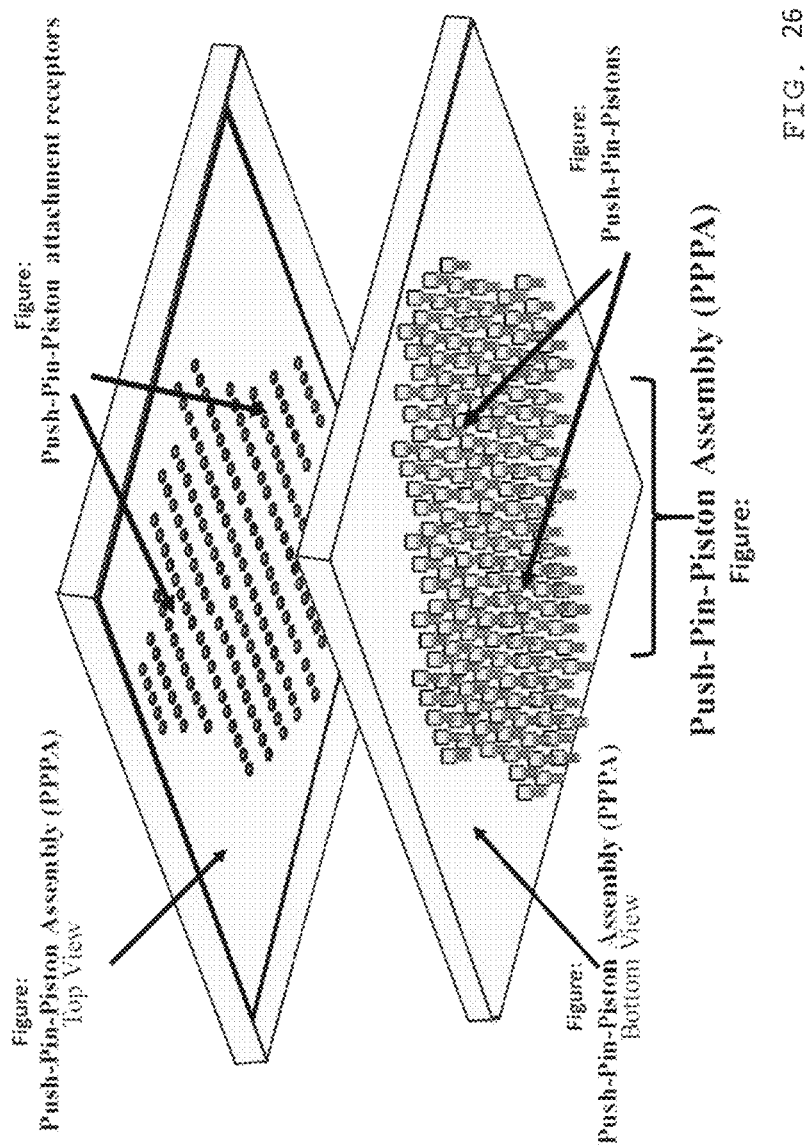
Figure 27:
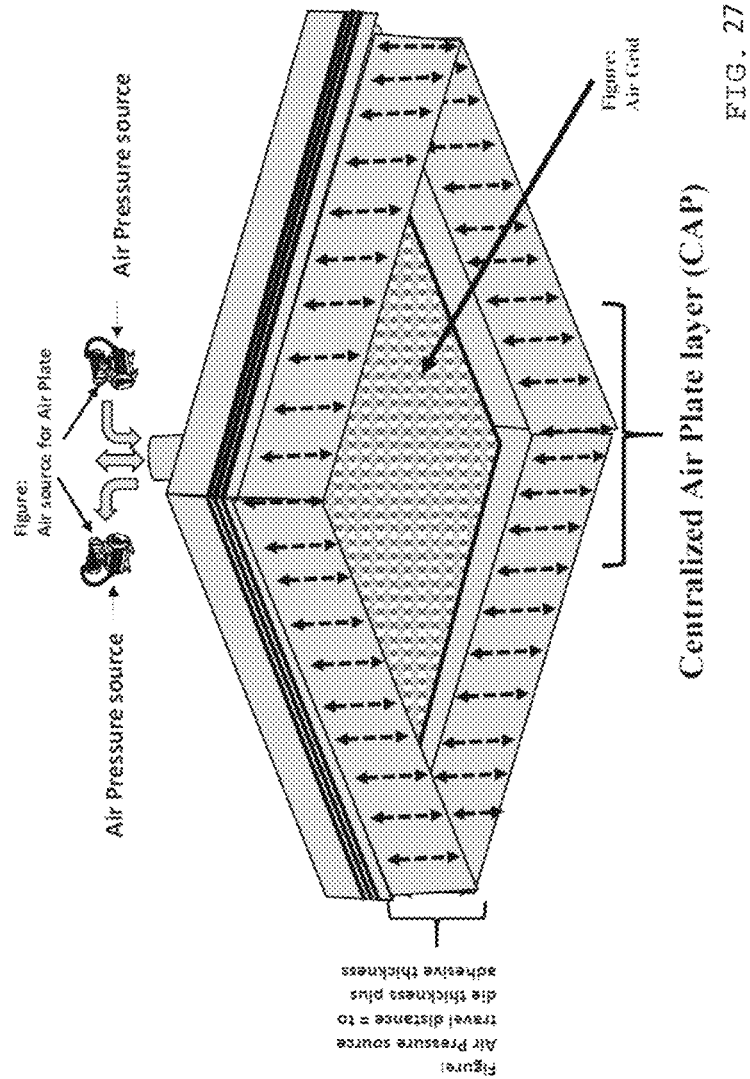
Figure 28:
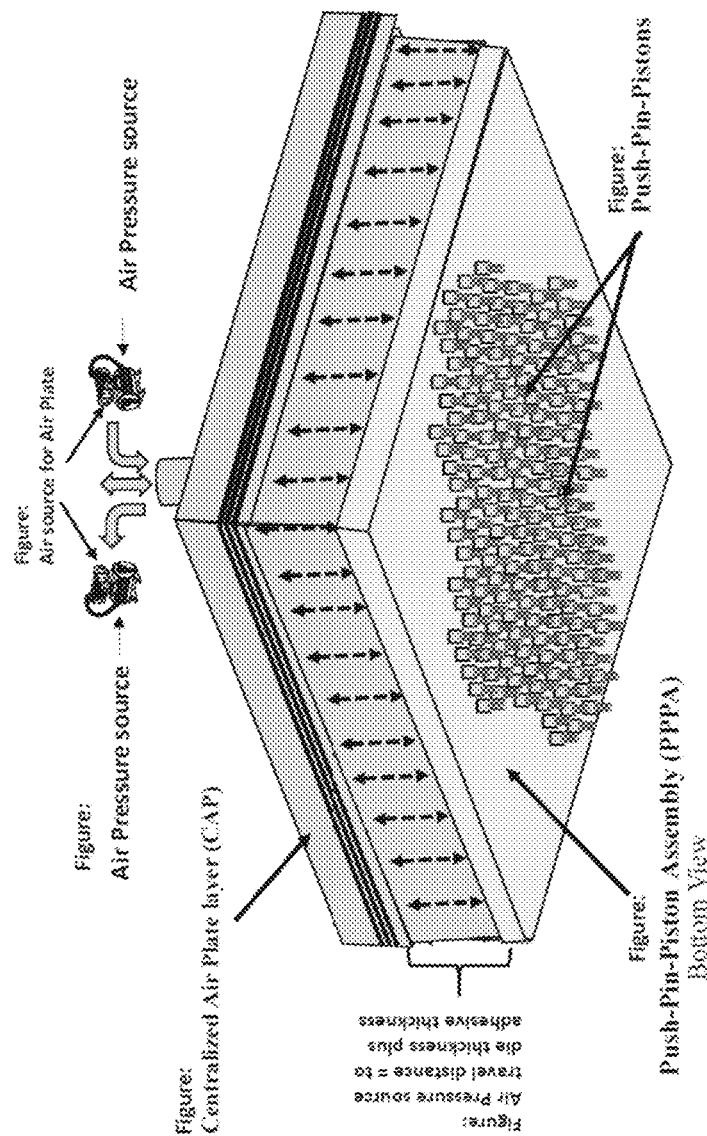
Figure 29:
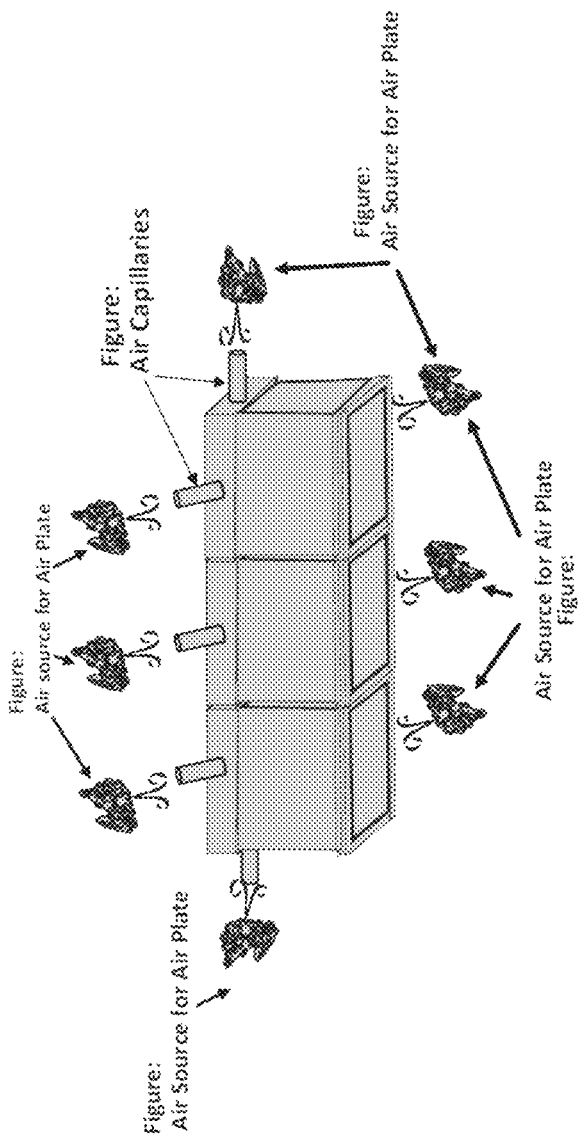
Figure 30:
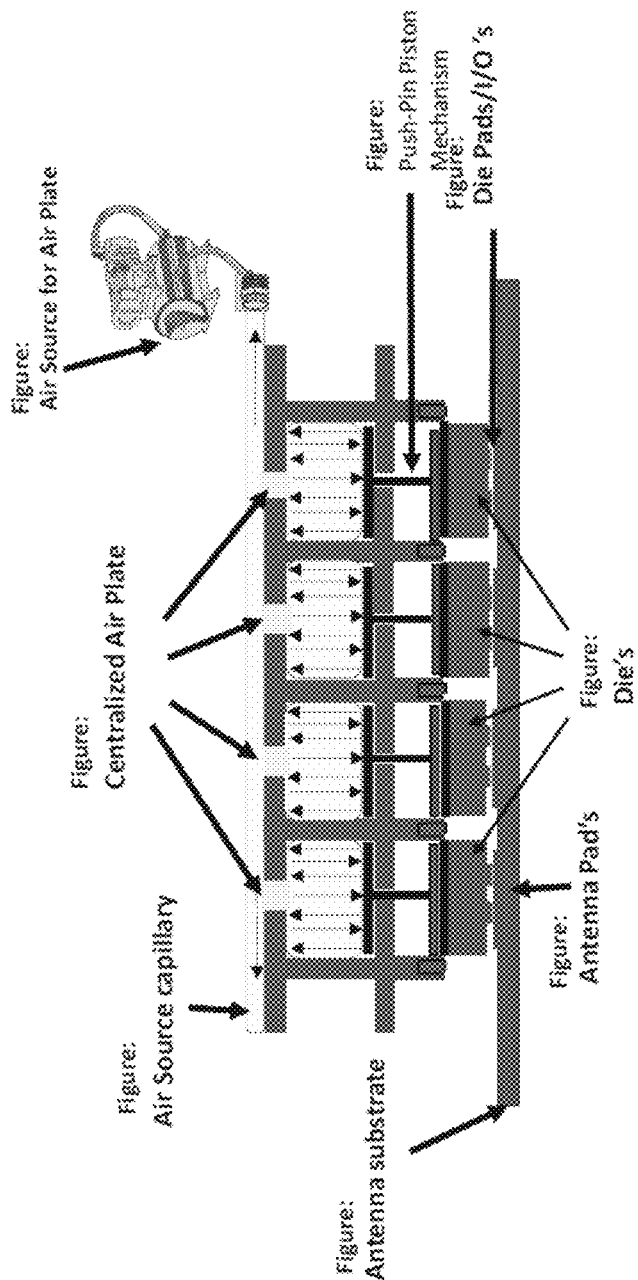
Figure 31:
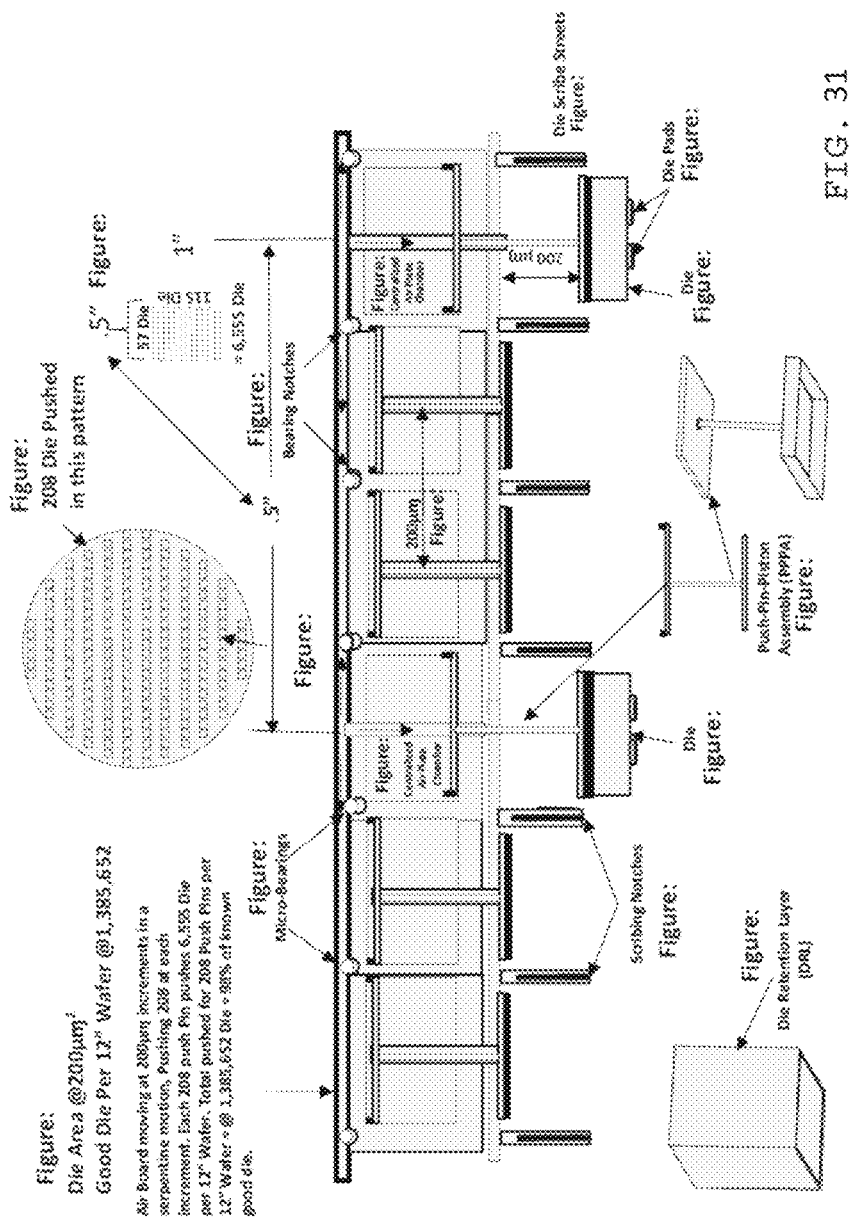
Figure 32:
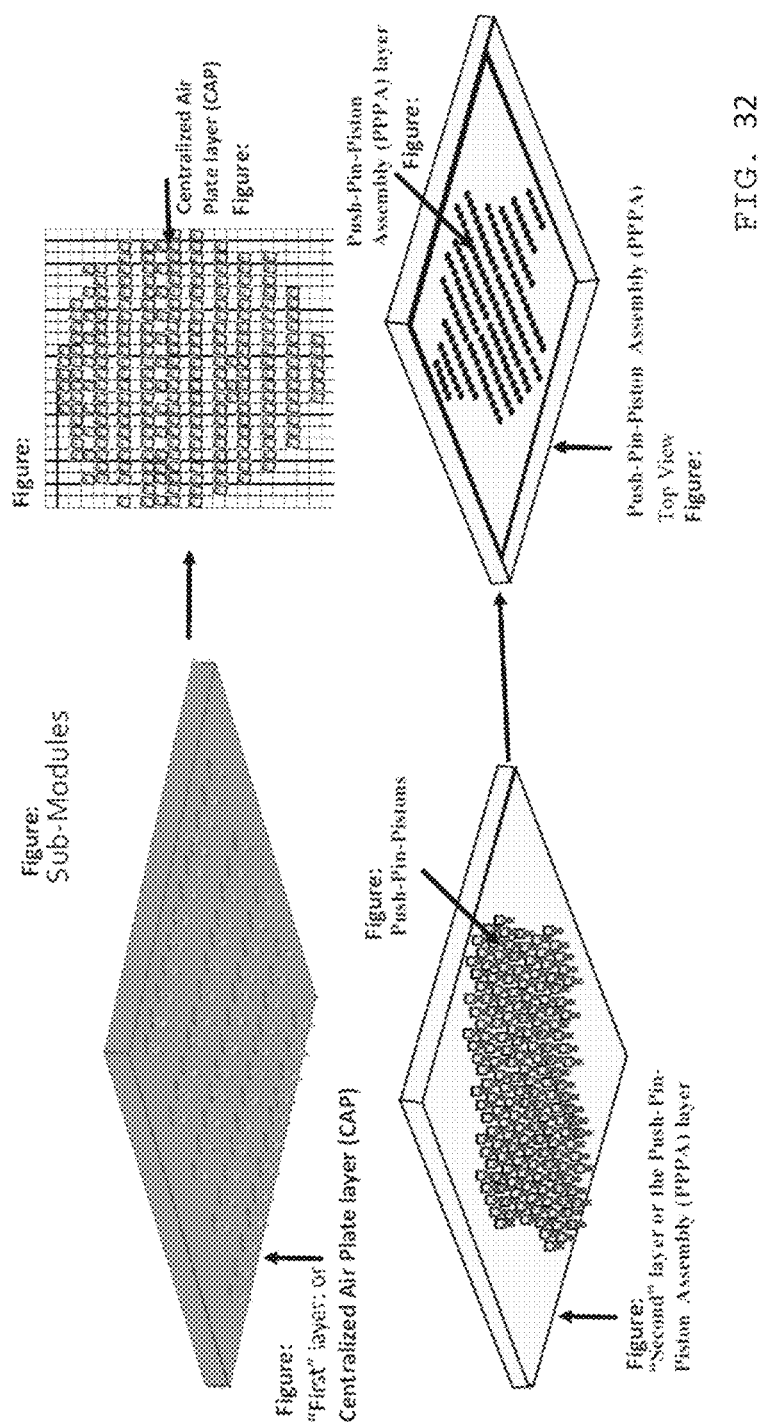
Figure 33:
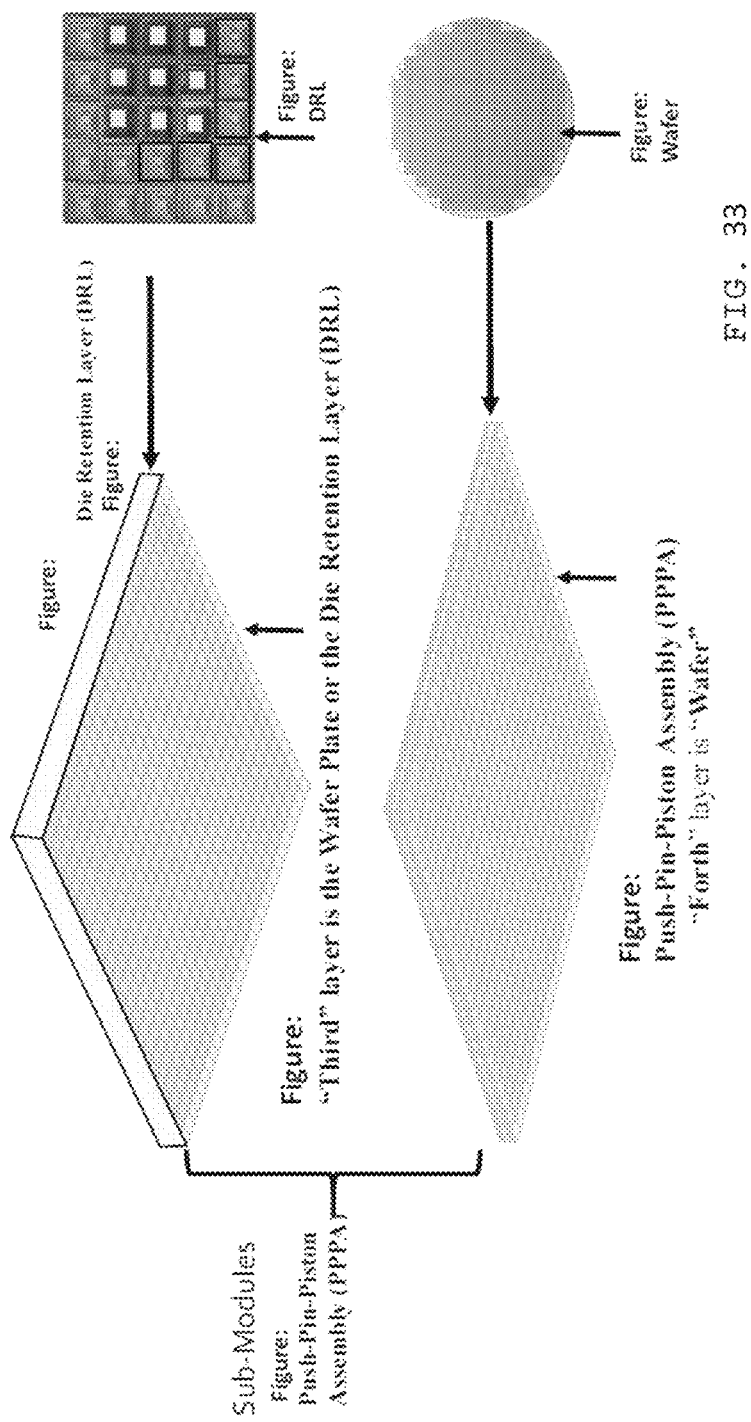
Figure 34:
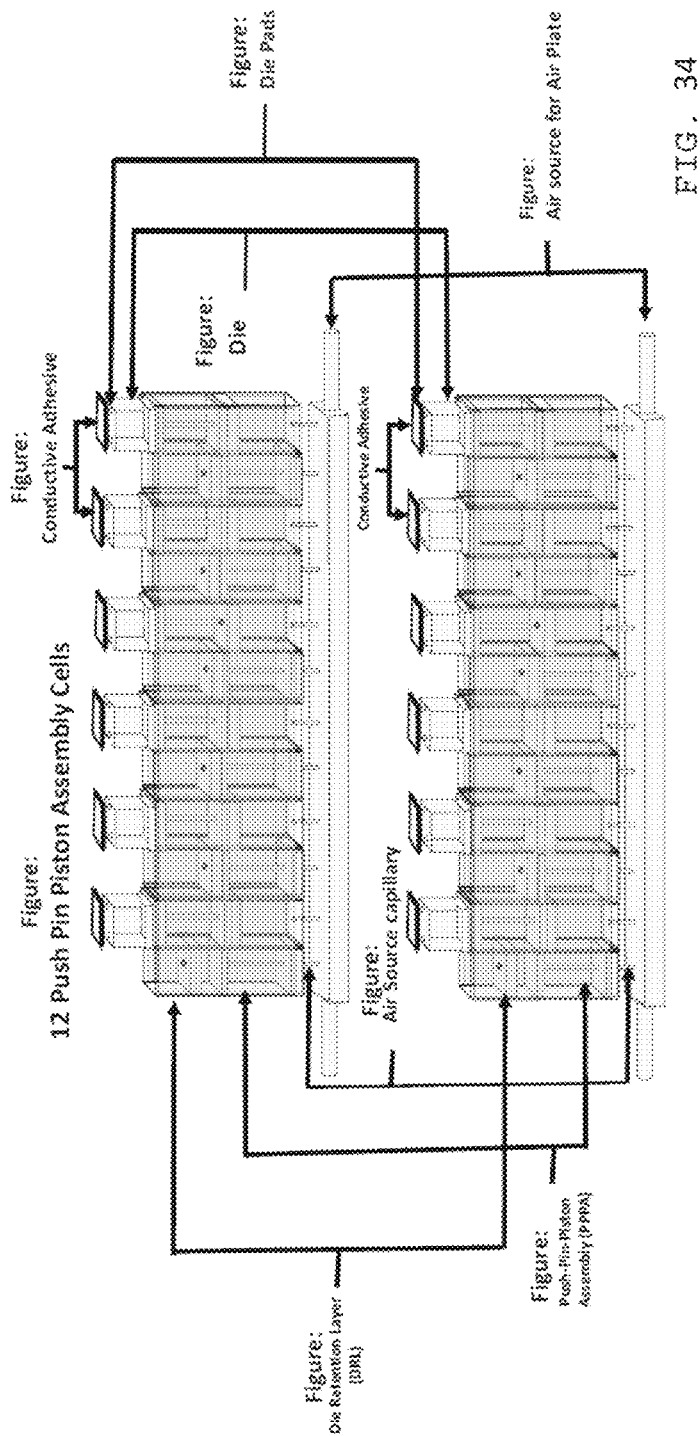
Figure 35:
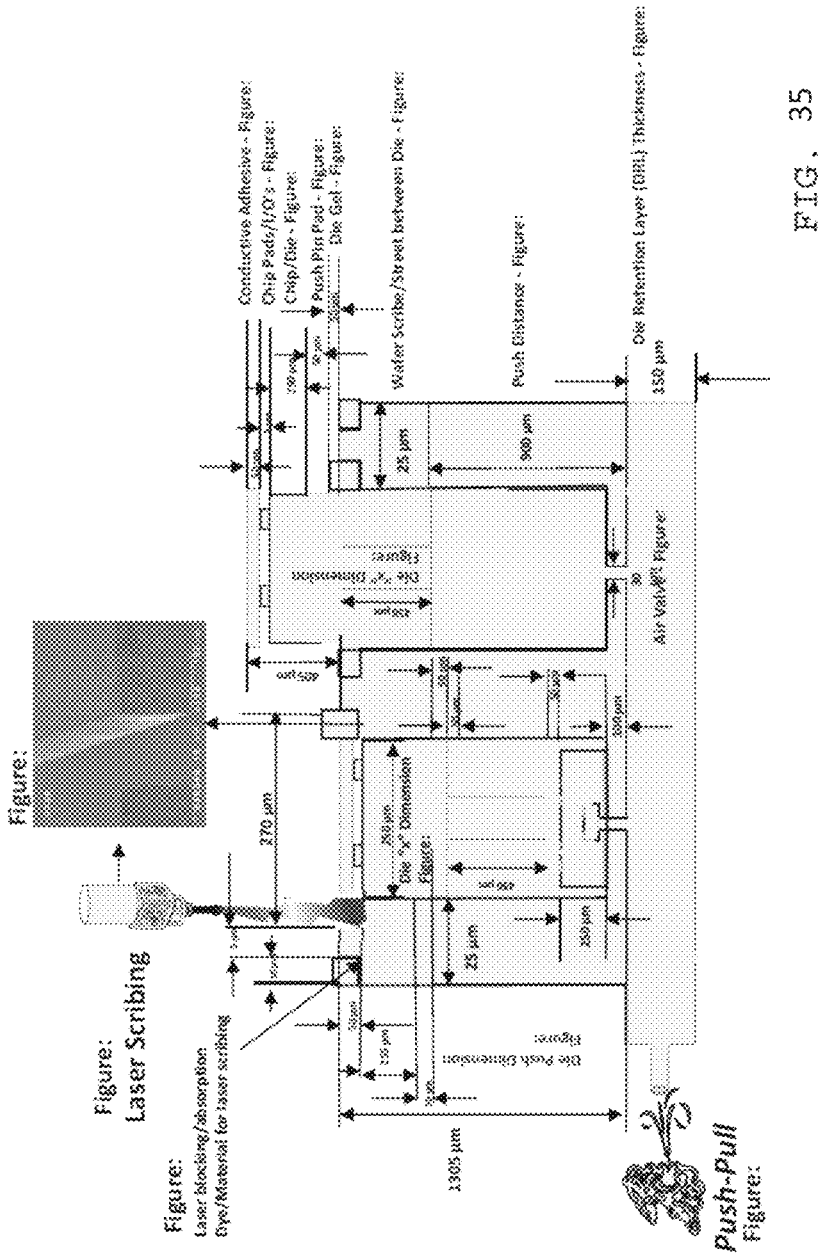
Figure 36:
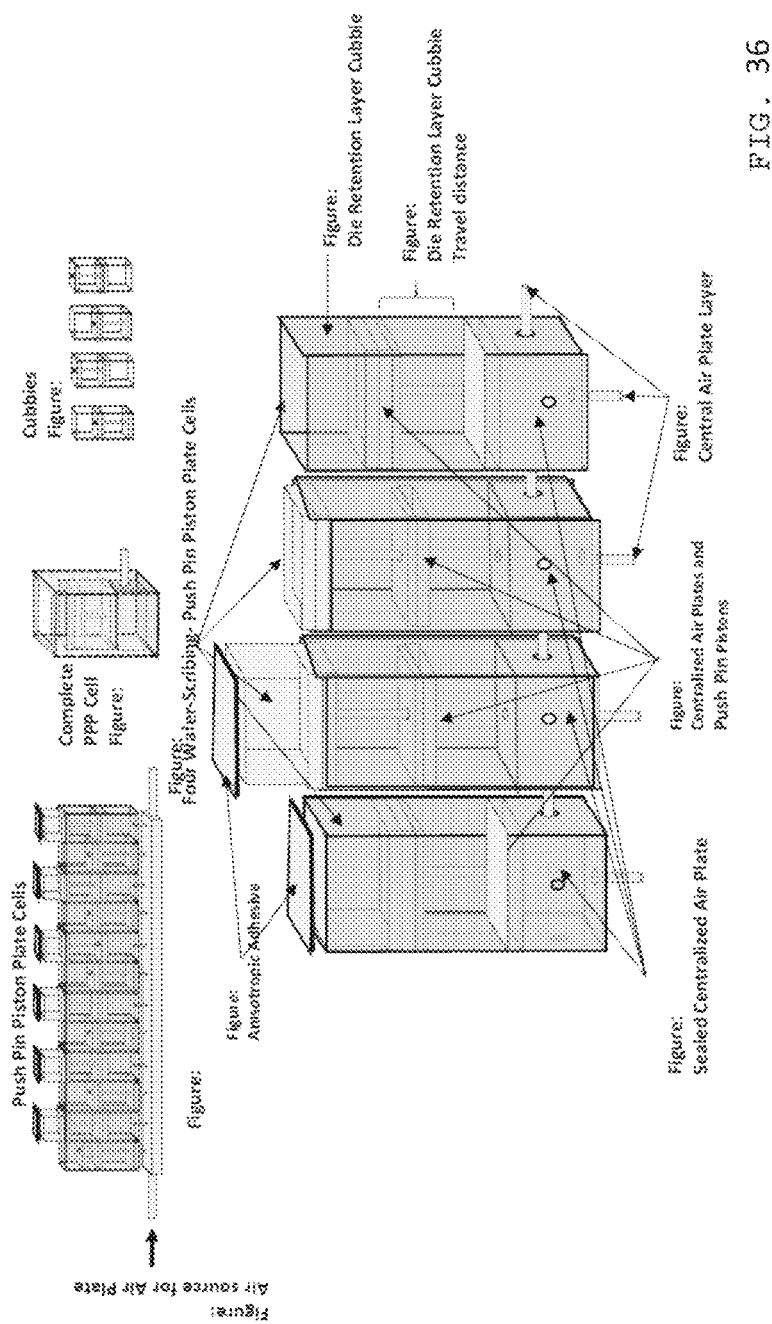
Figure 37:
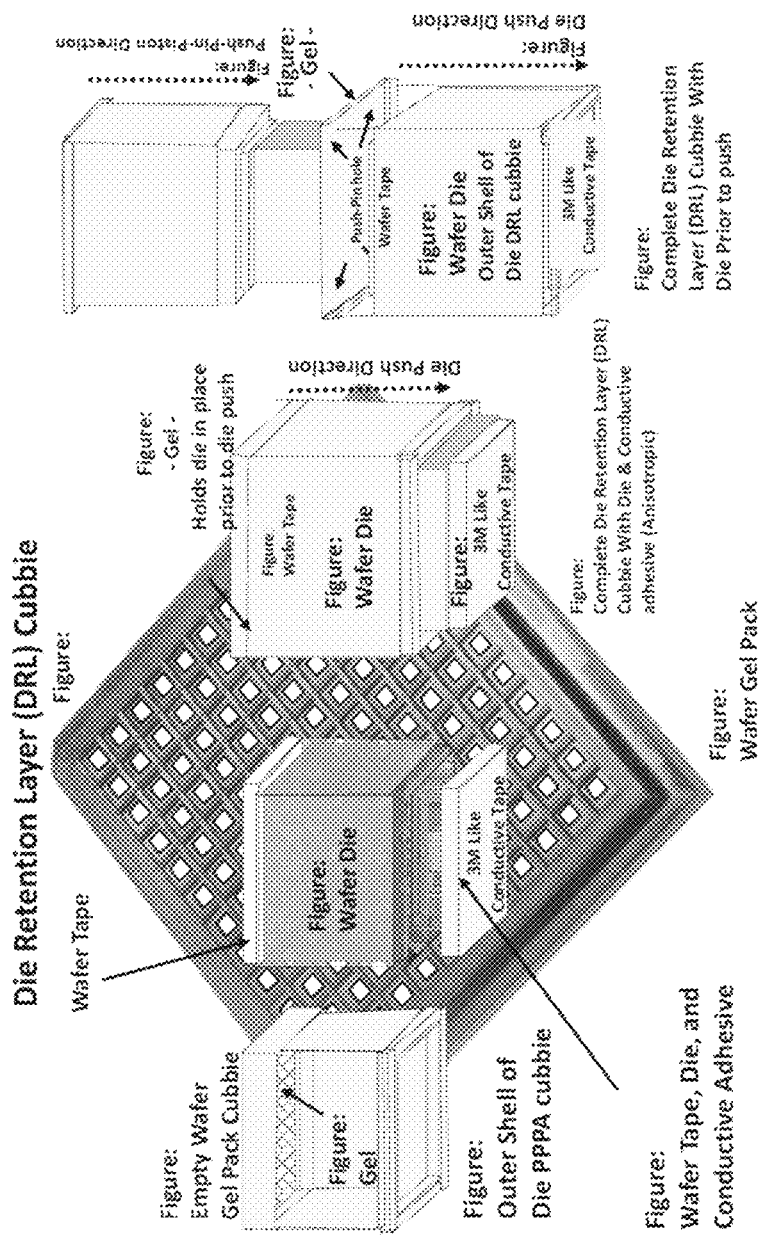
Figure 38:
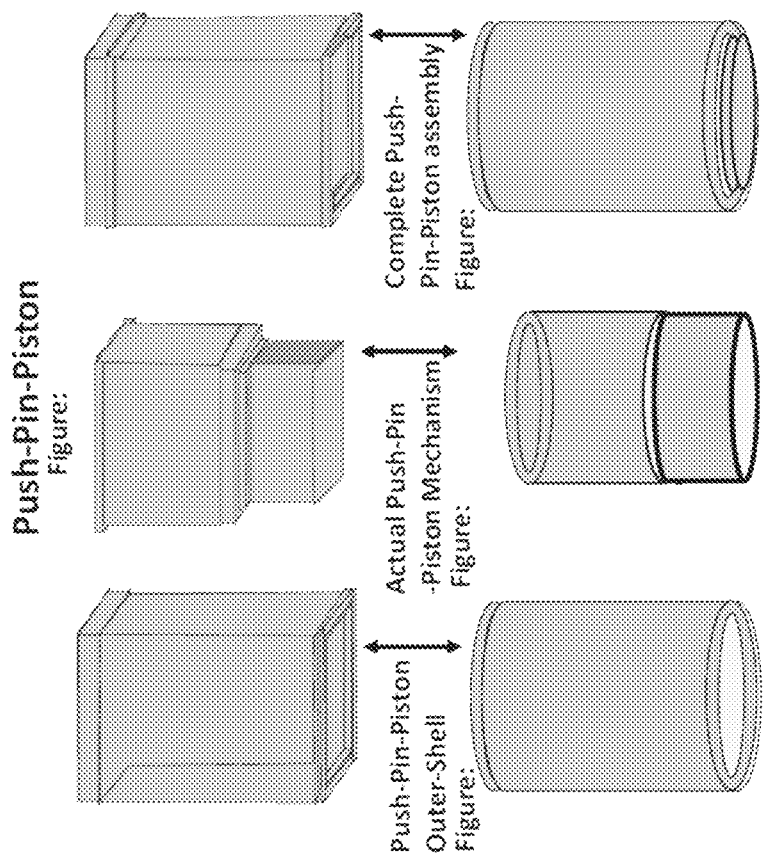
Figure 39:
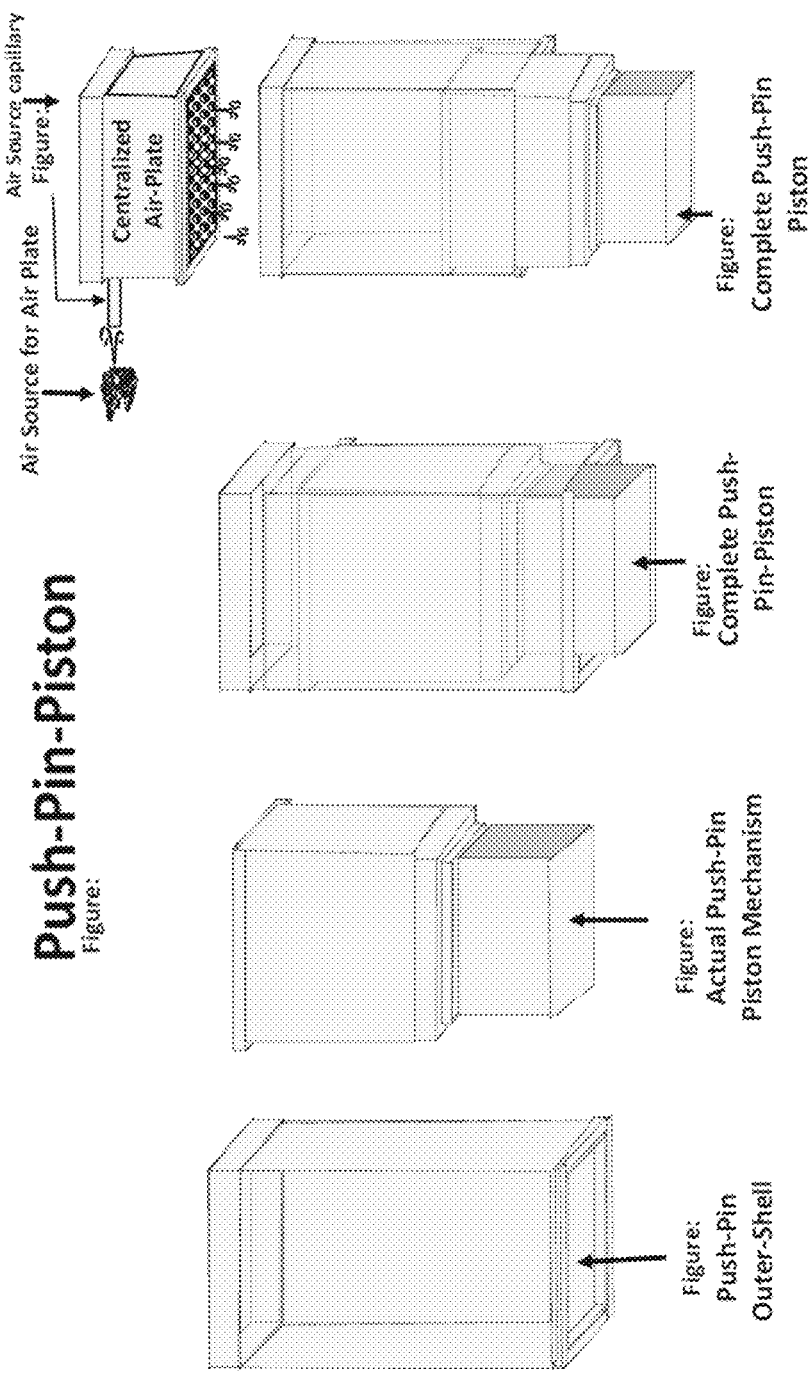
Figure 40:
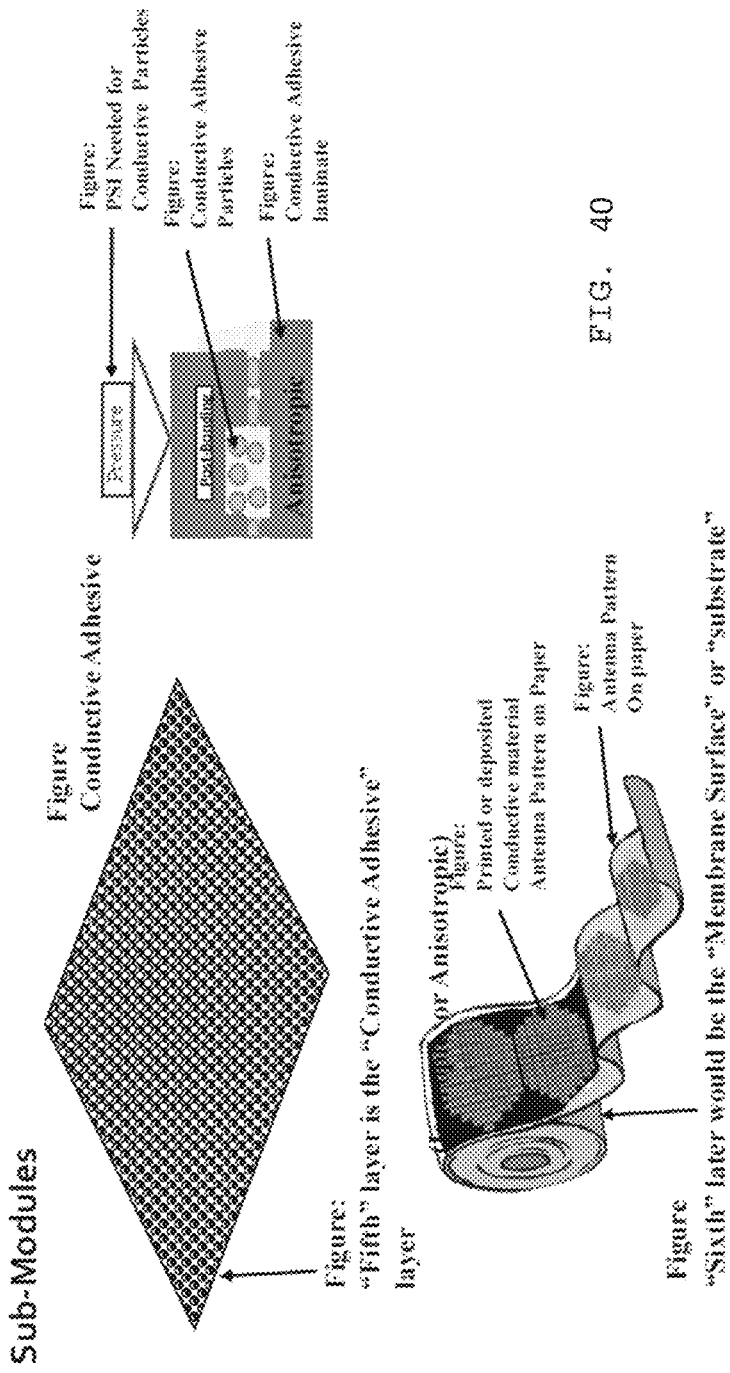
Figure 41:
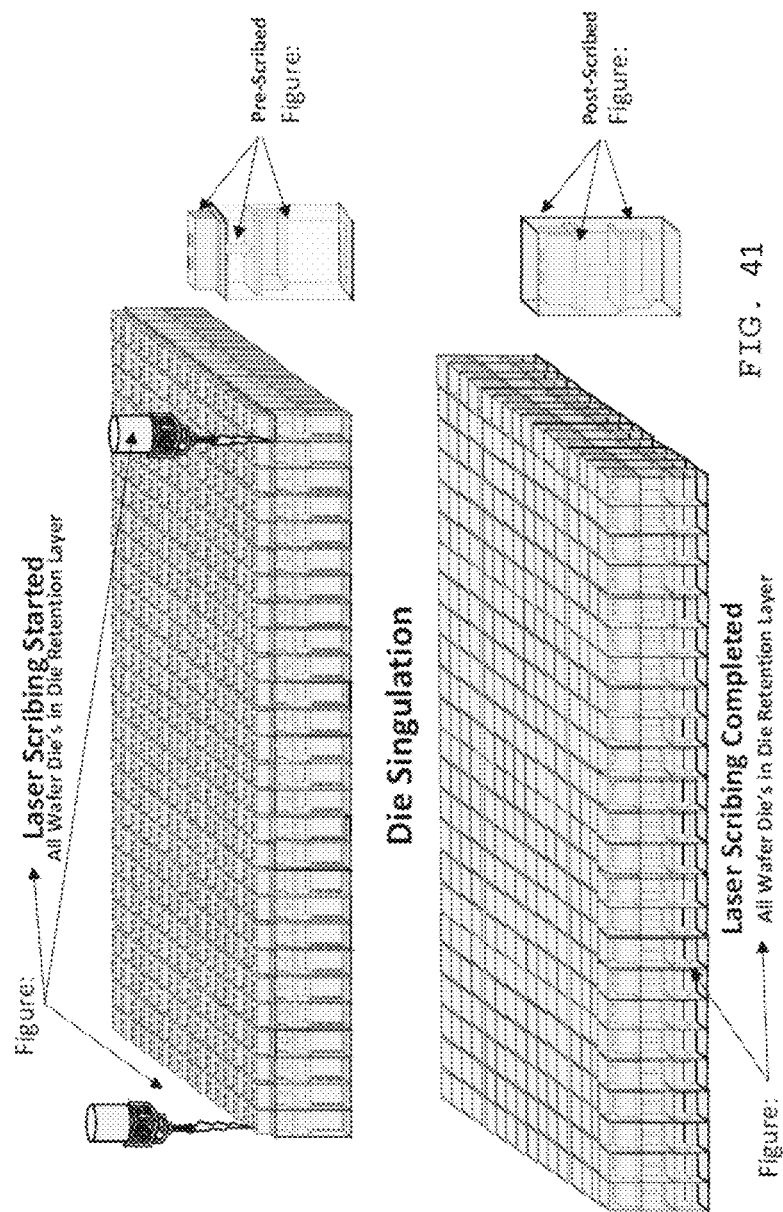
Figure 42:
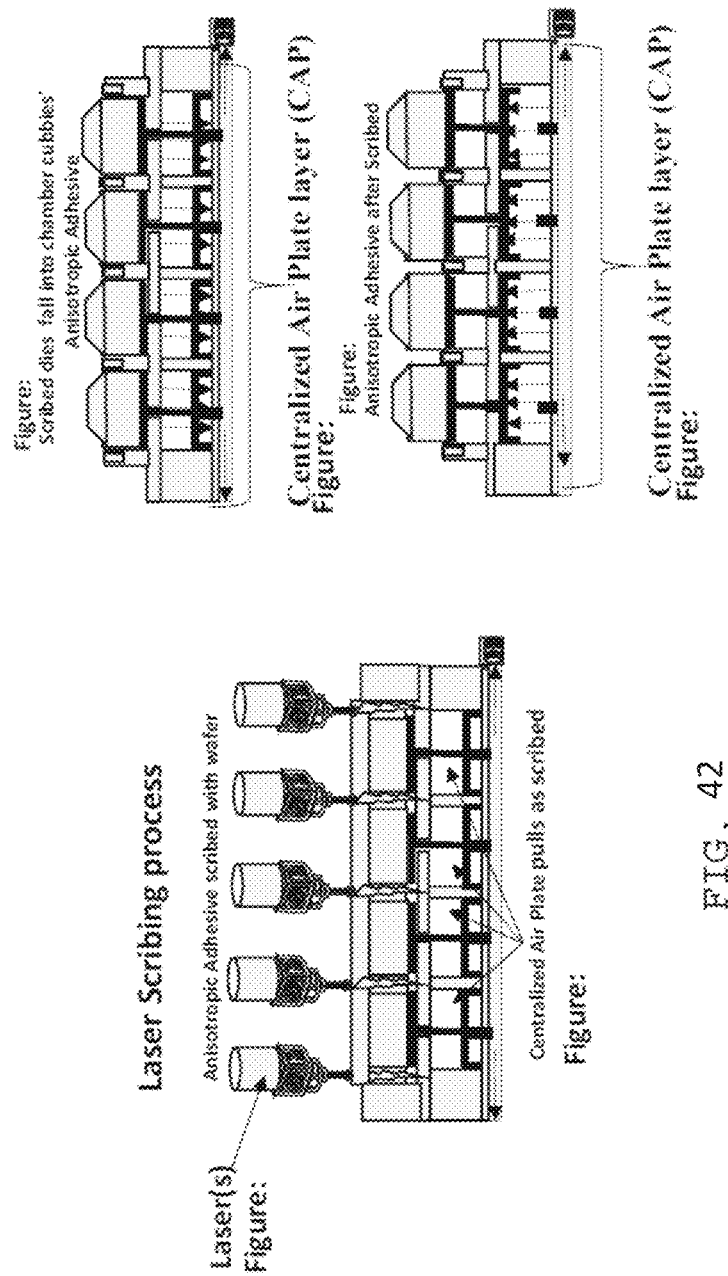
Figure 43:
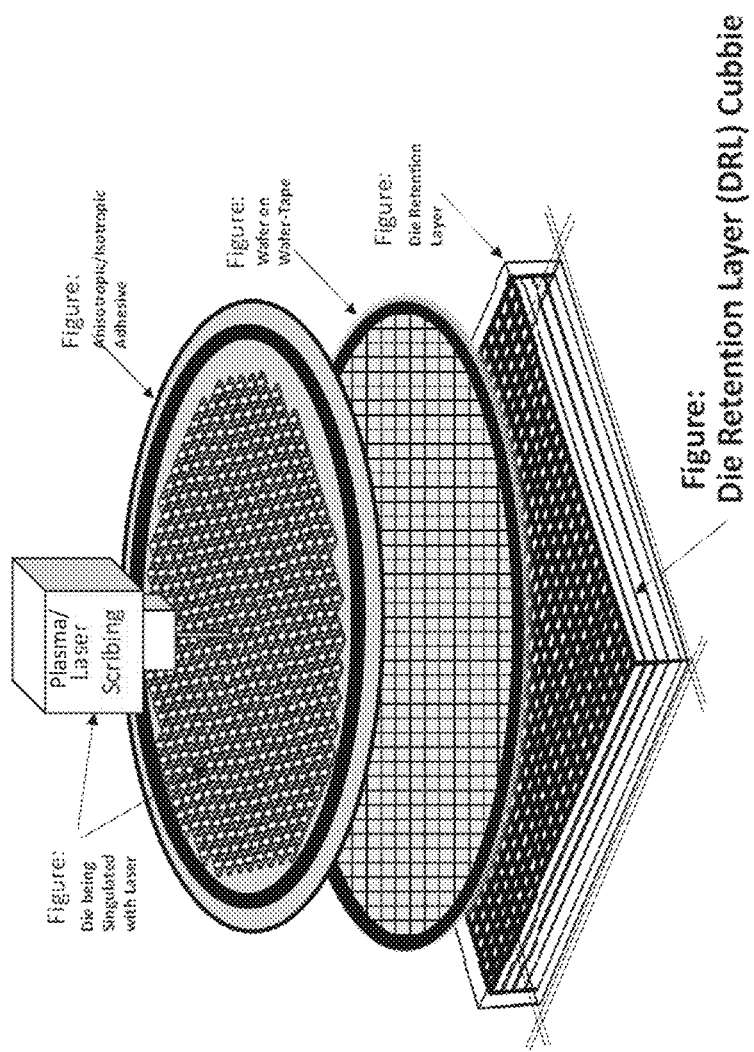
Figure 44:
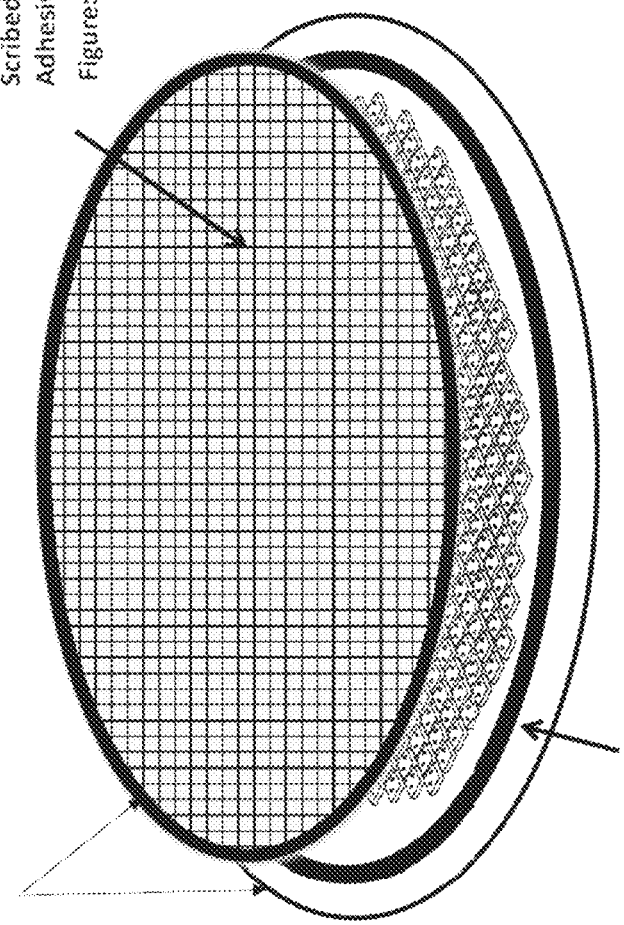
Figure 46:
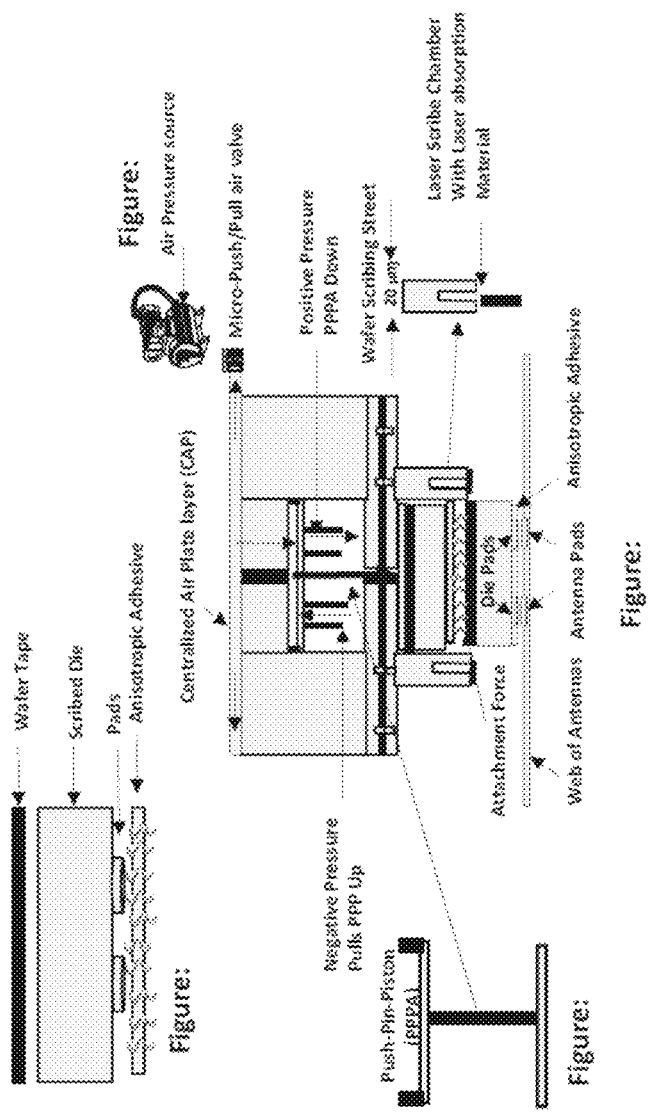
Figure 47:
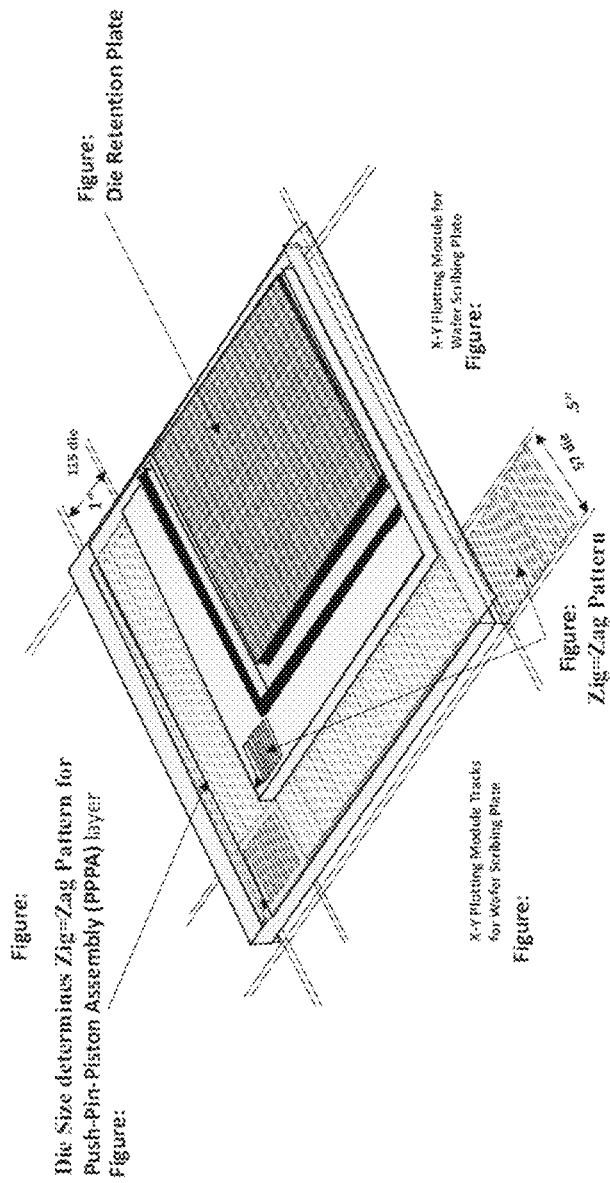
Figure 48:
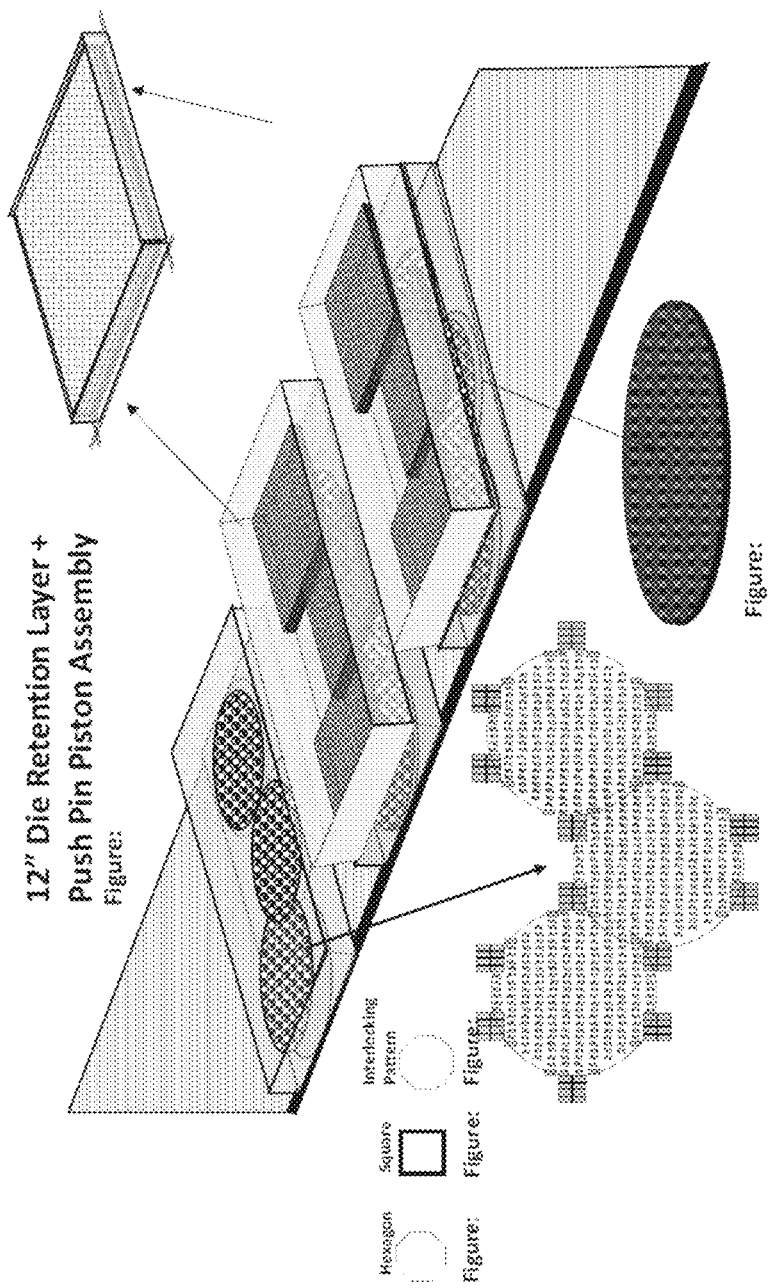
Figure 49:
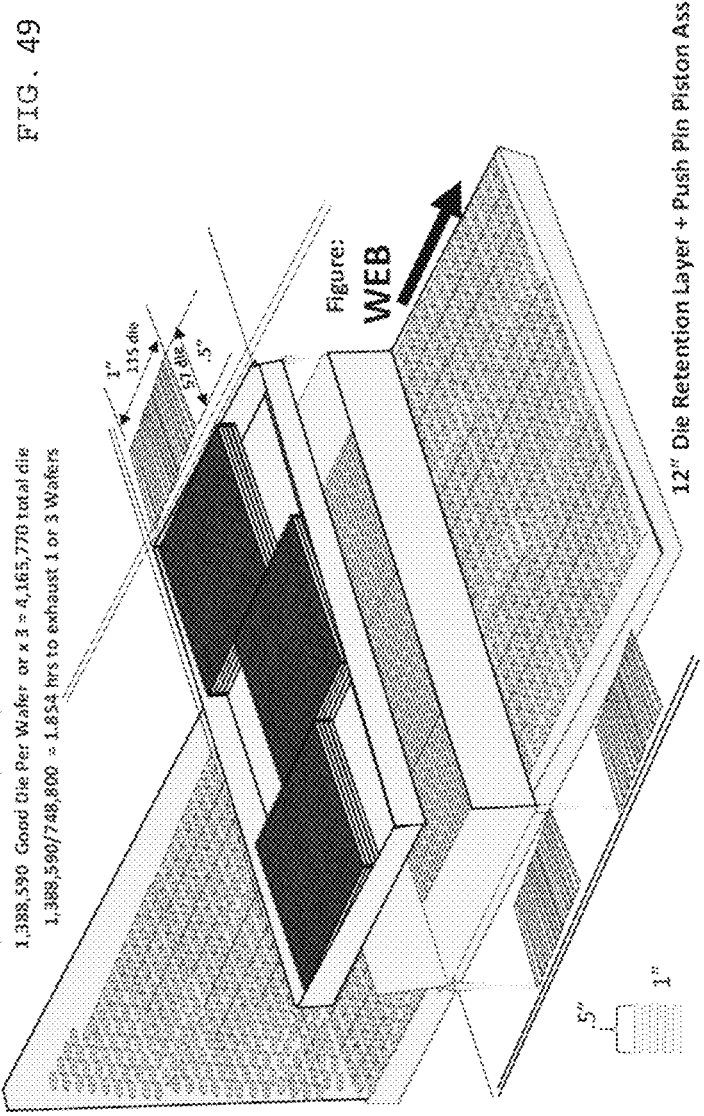
Figure 50:
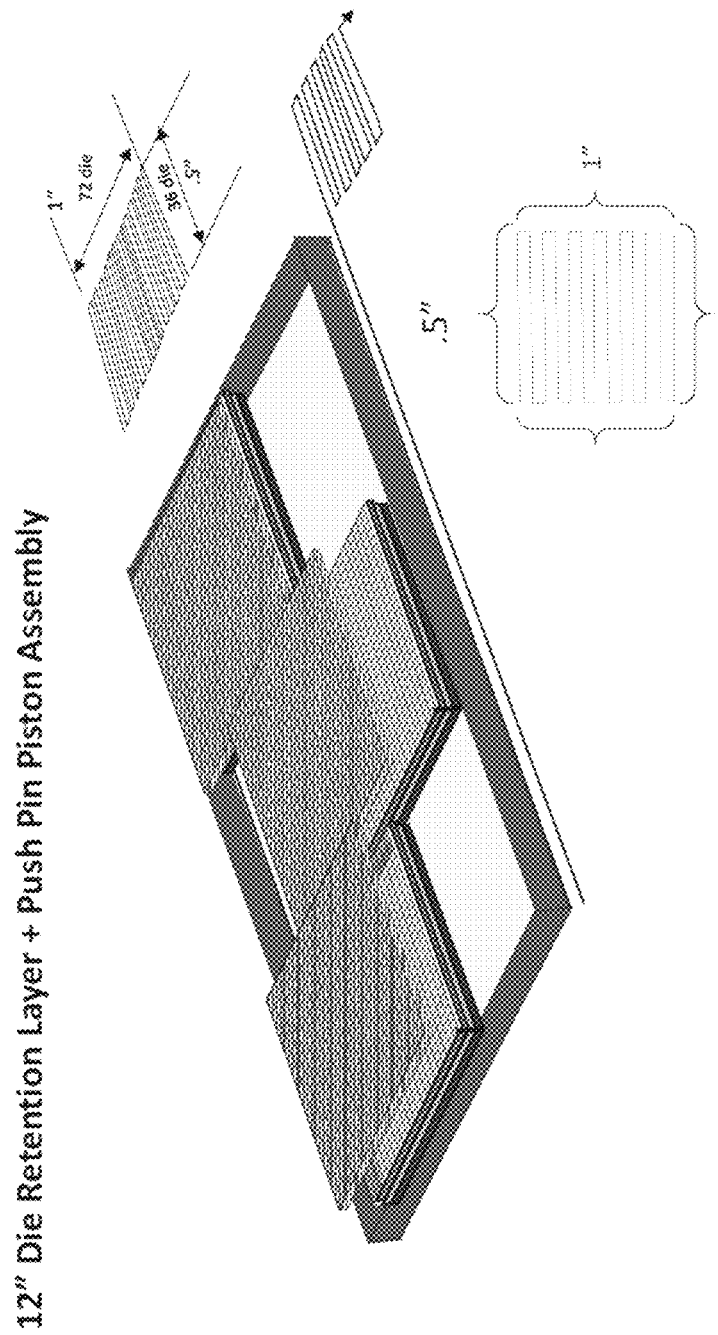
Figure 51:
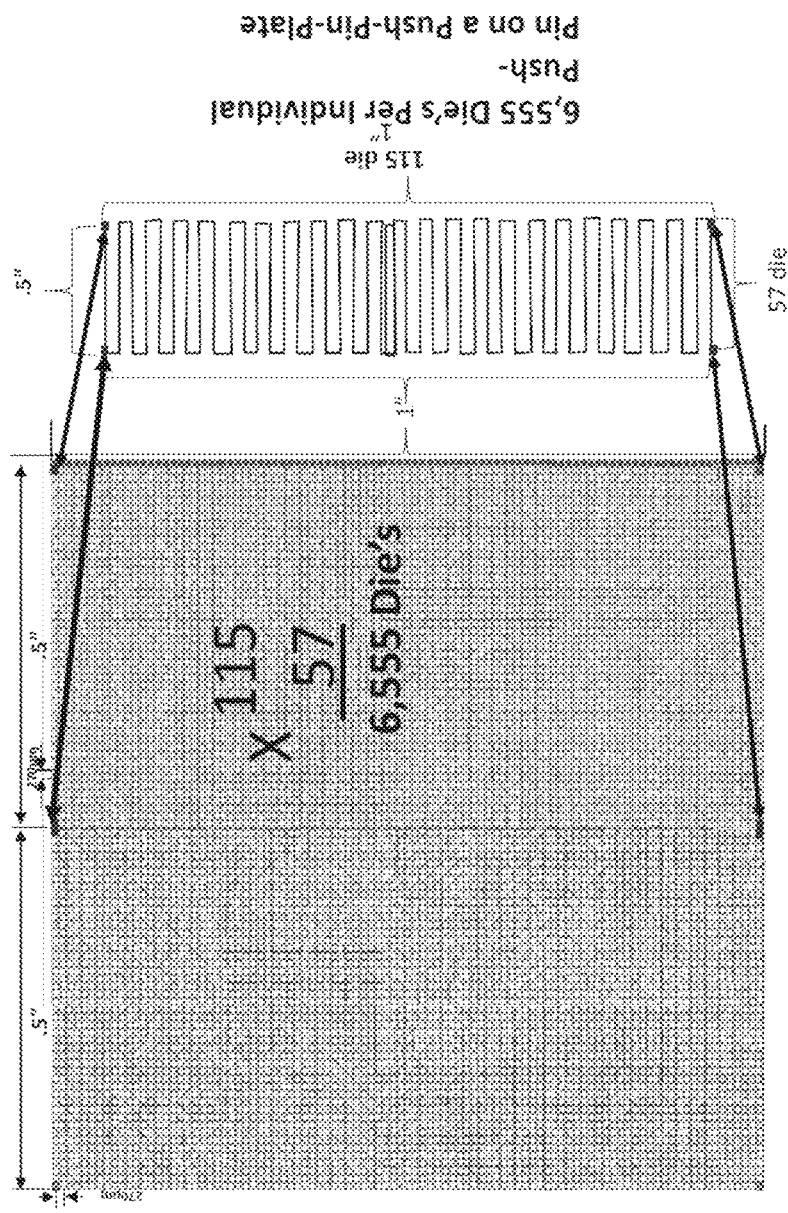
Figure 52:
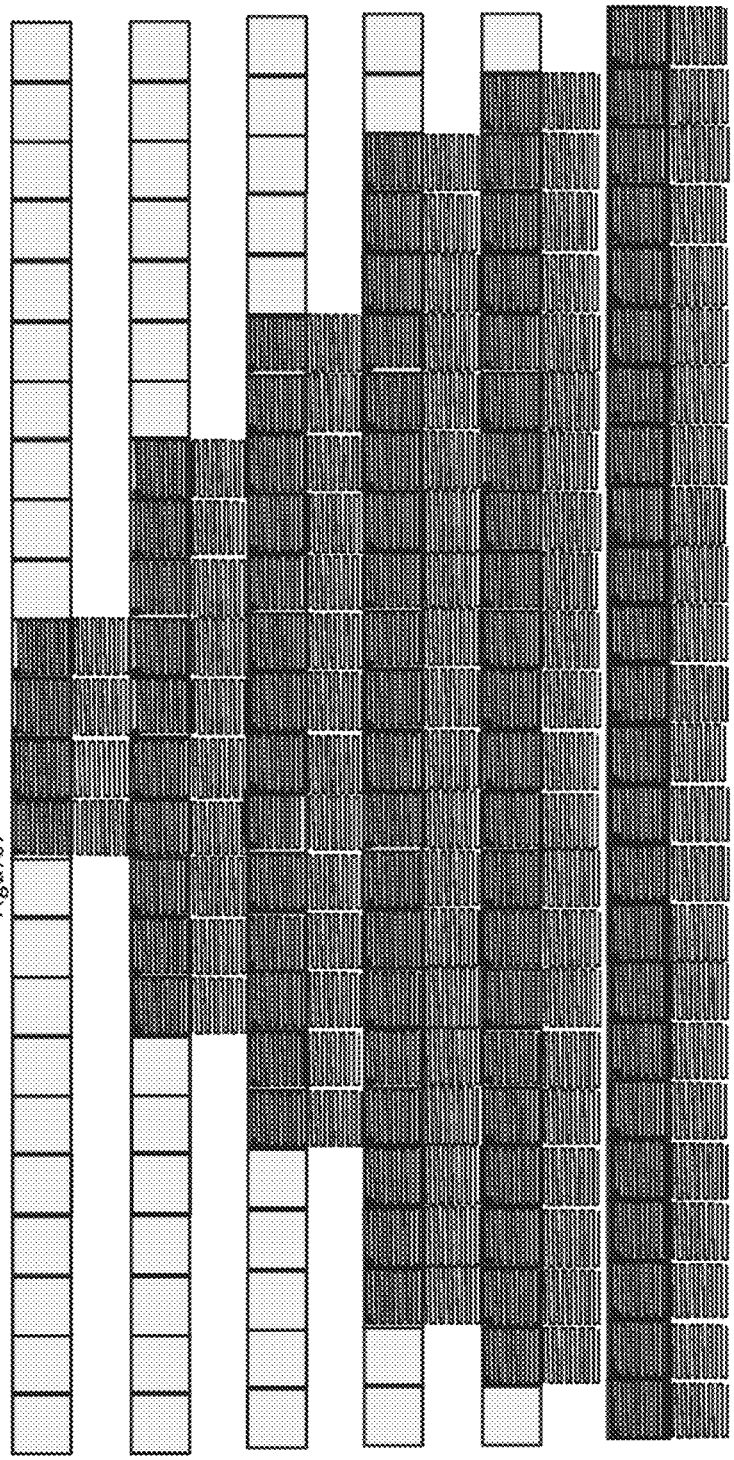
Figure 54:
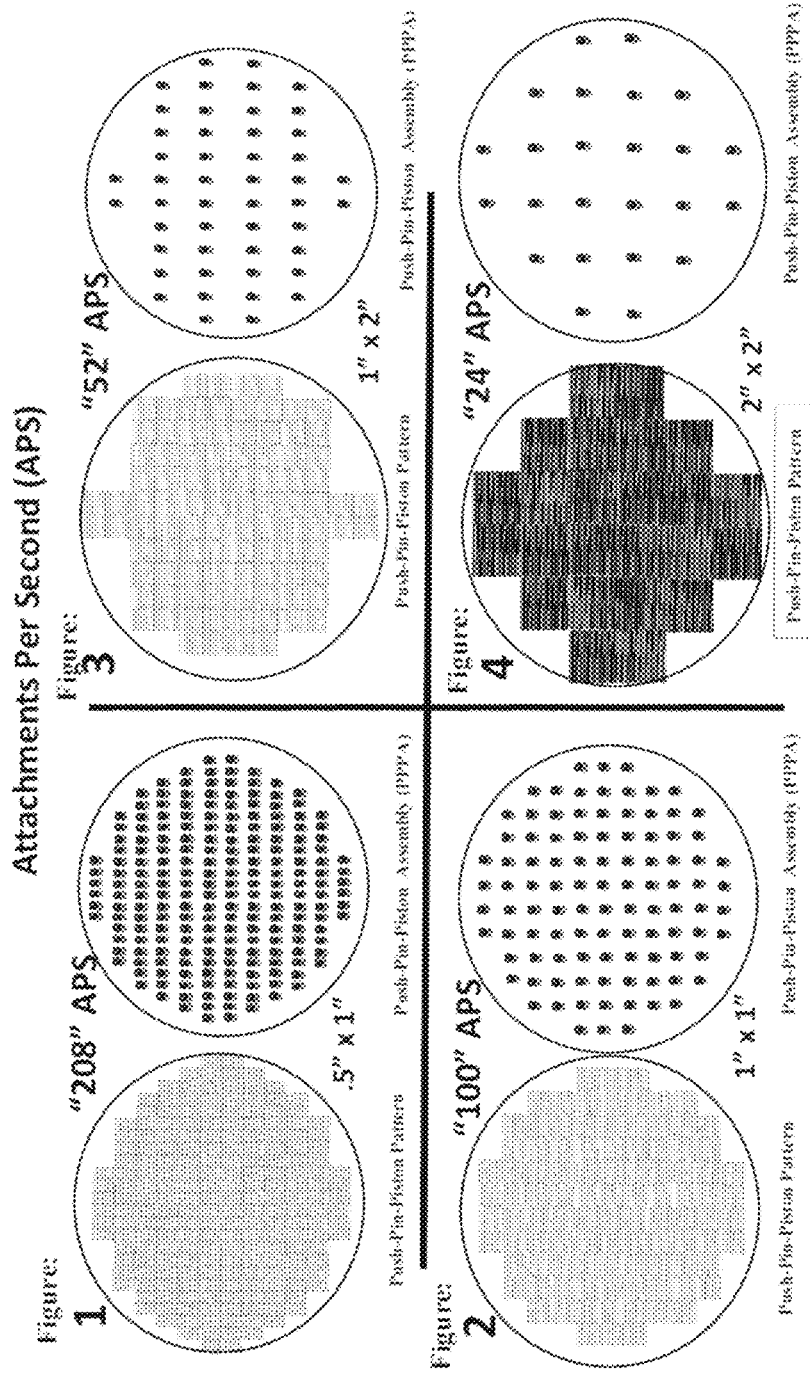
Figure 55:
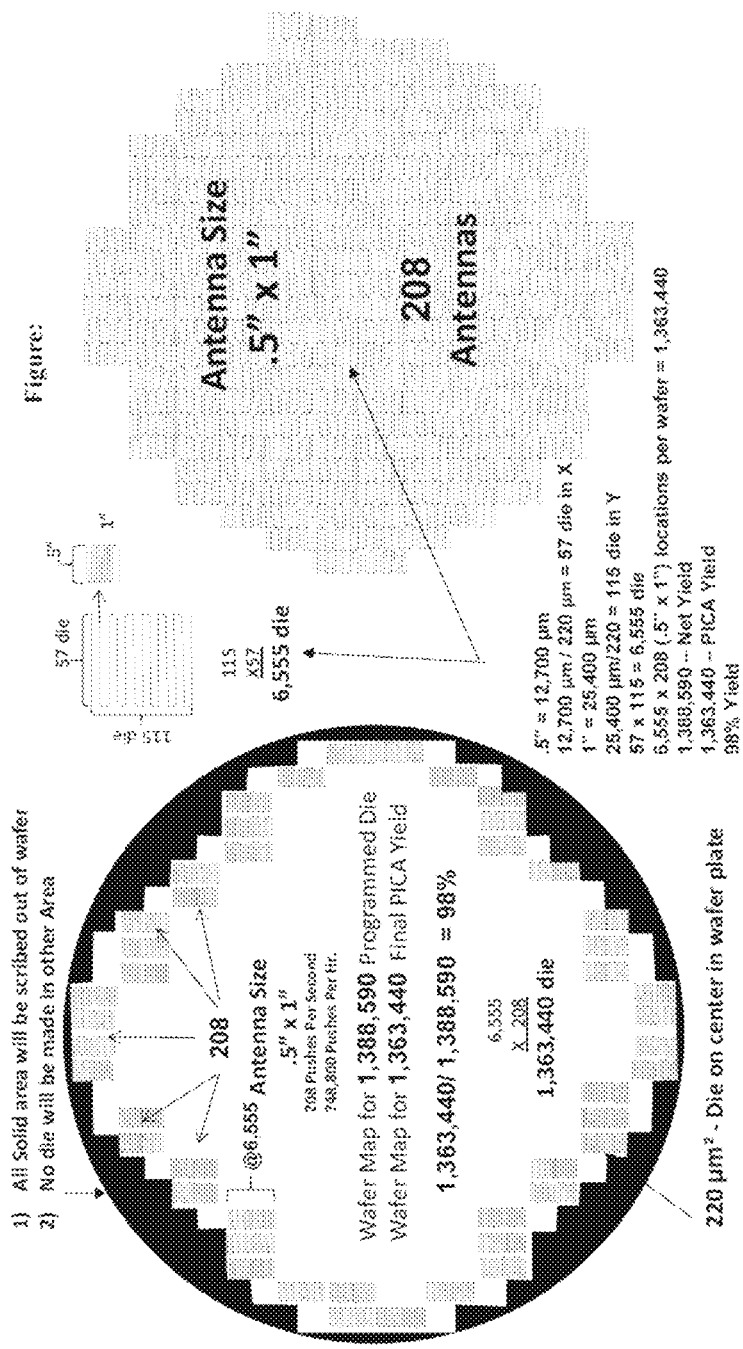
Figure 56:
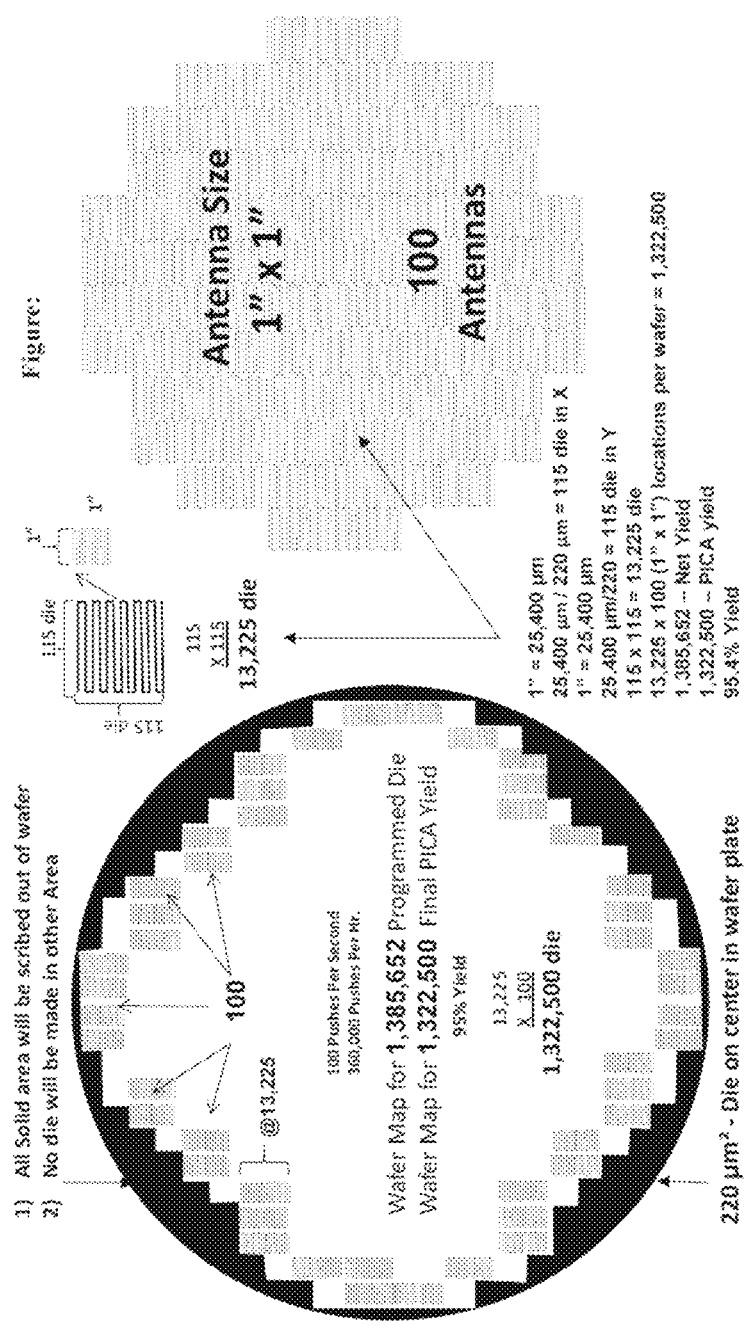
Figure 57:
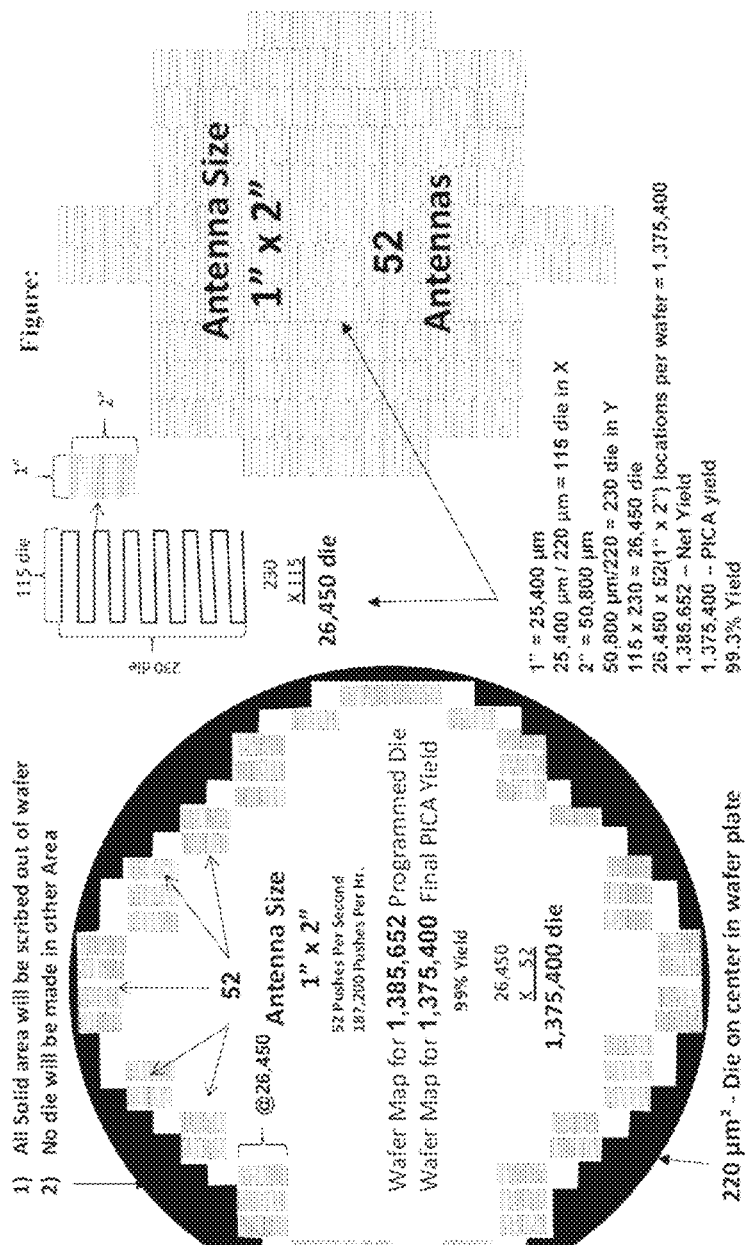
Figure 58:
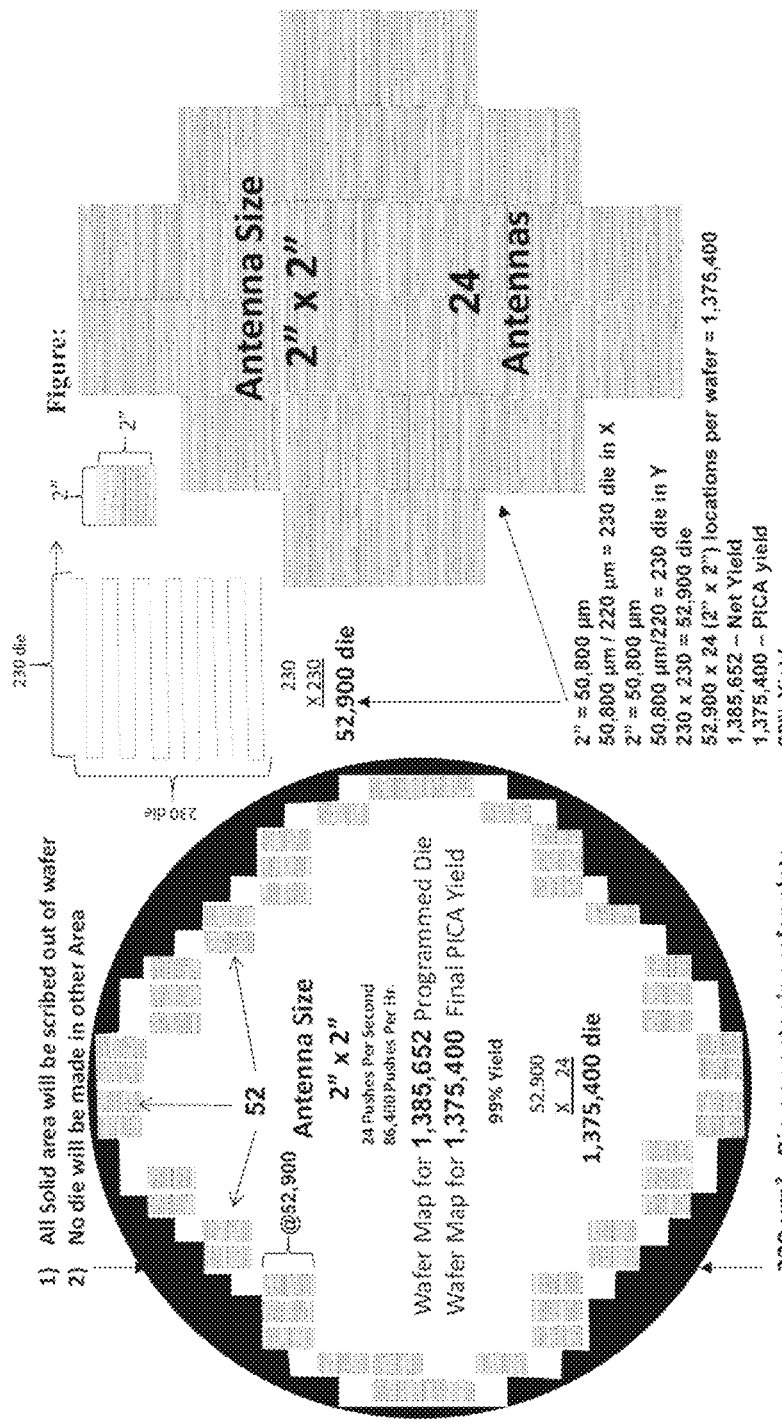
Figure 59:
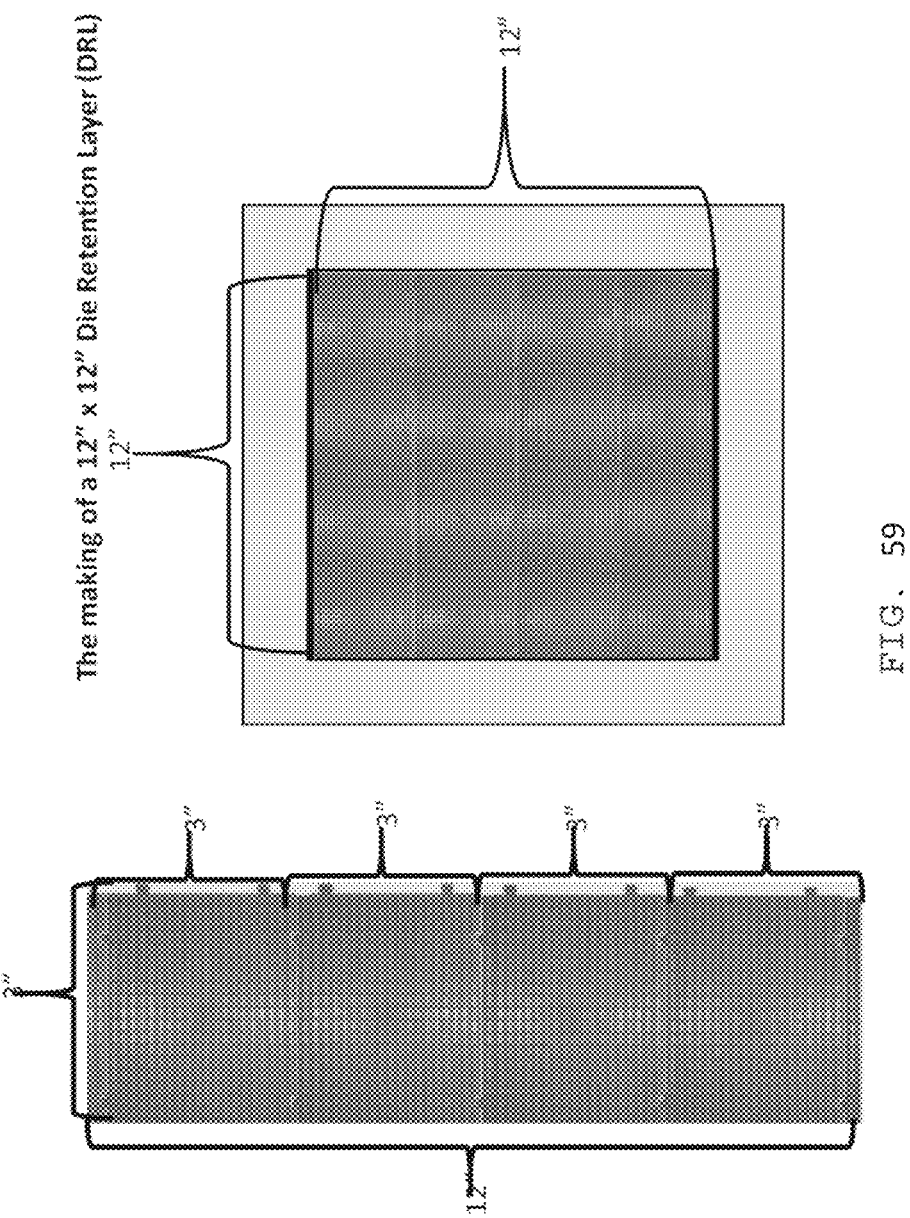
Figure 60:
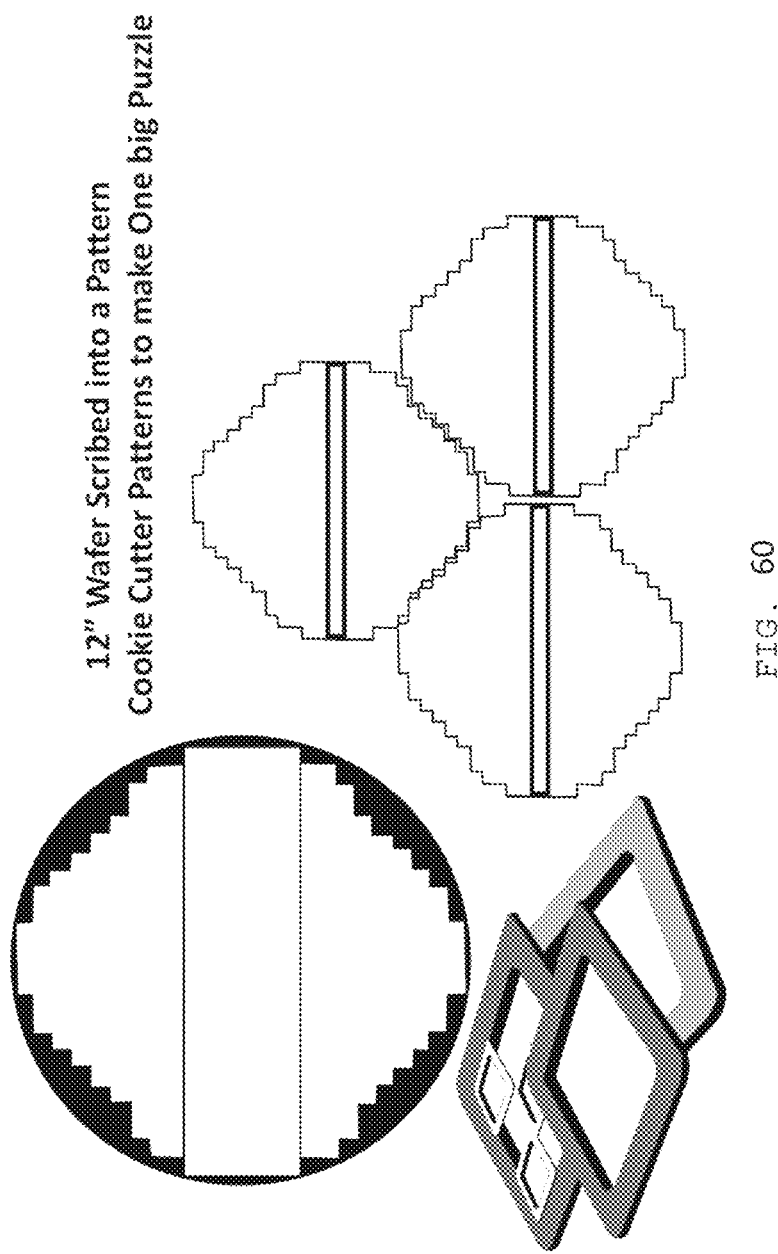
Figure 62:
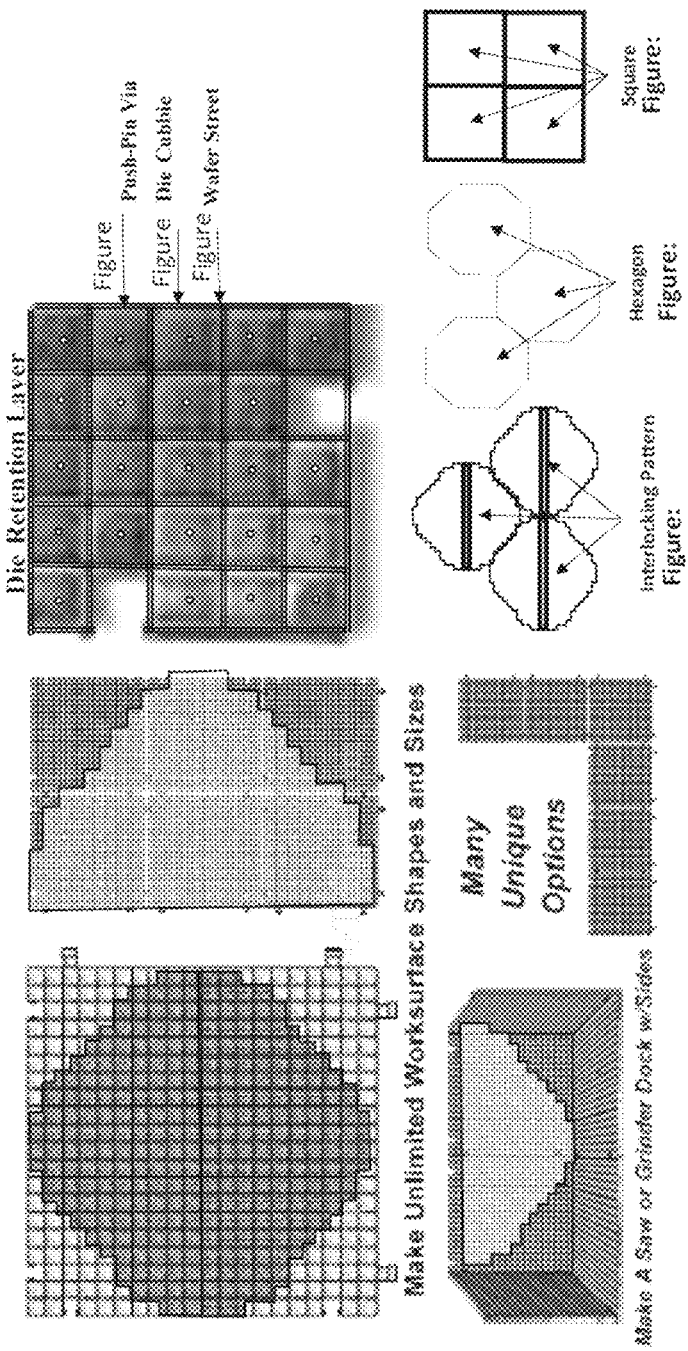
Figure 64:
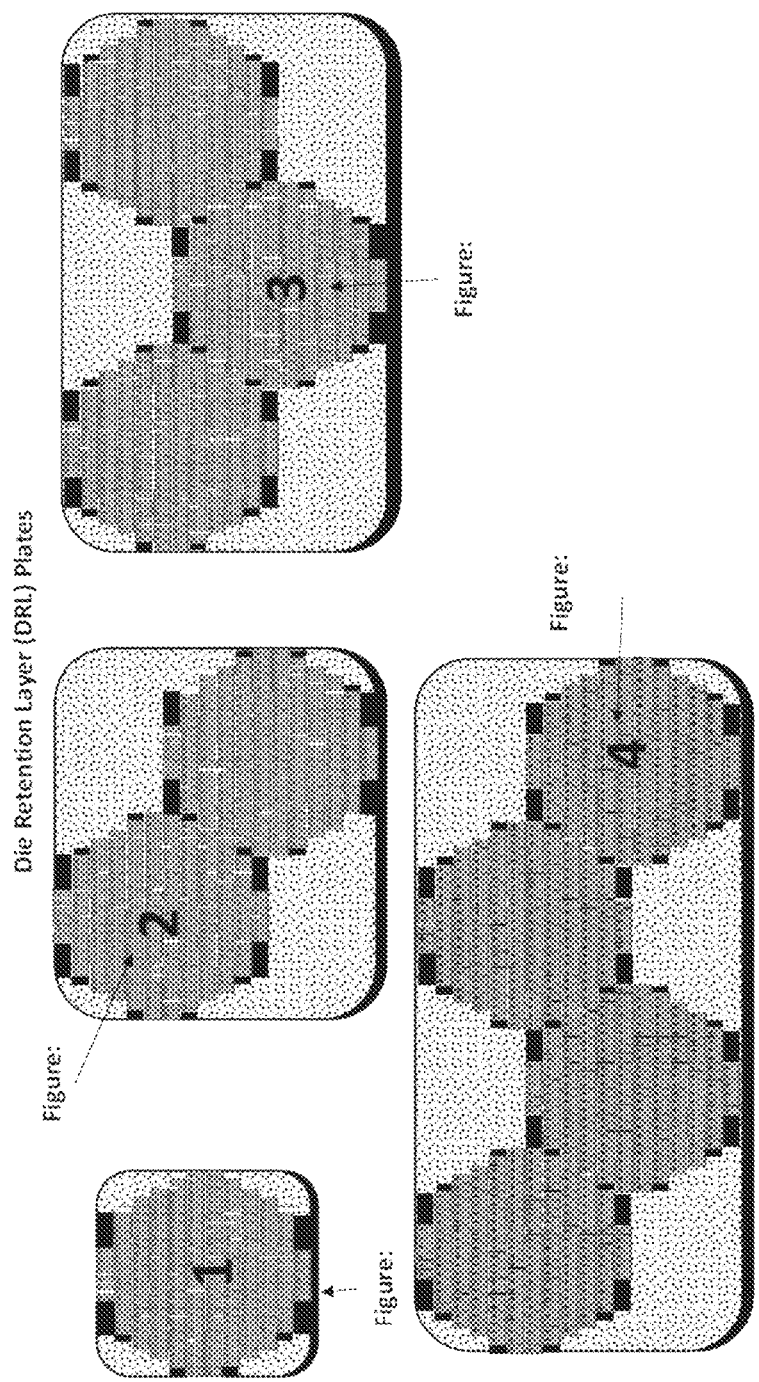
Figure 65:
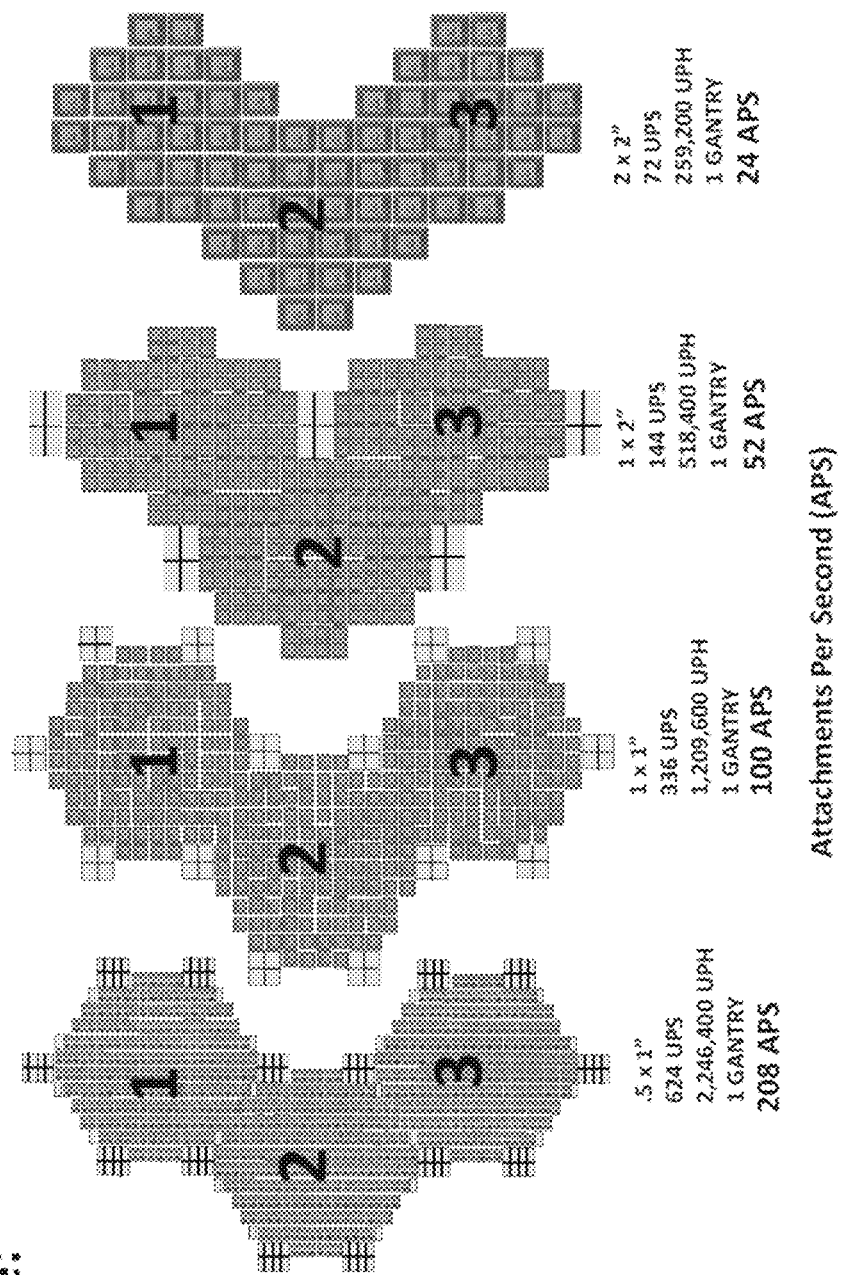
Figure 66:
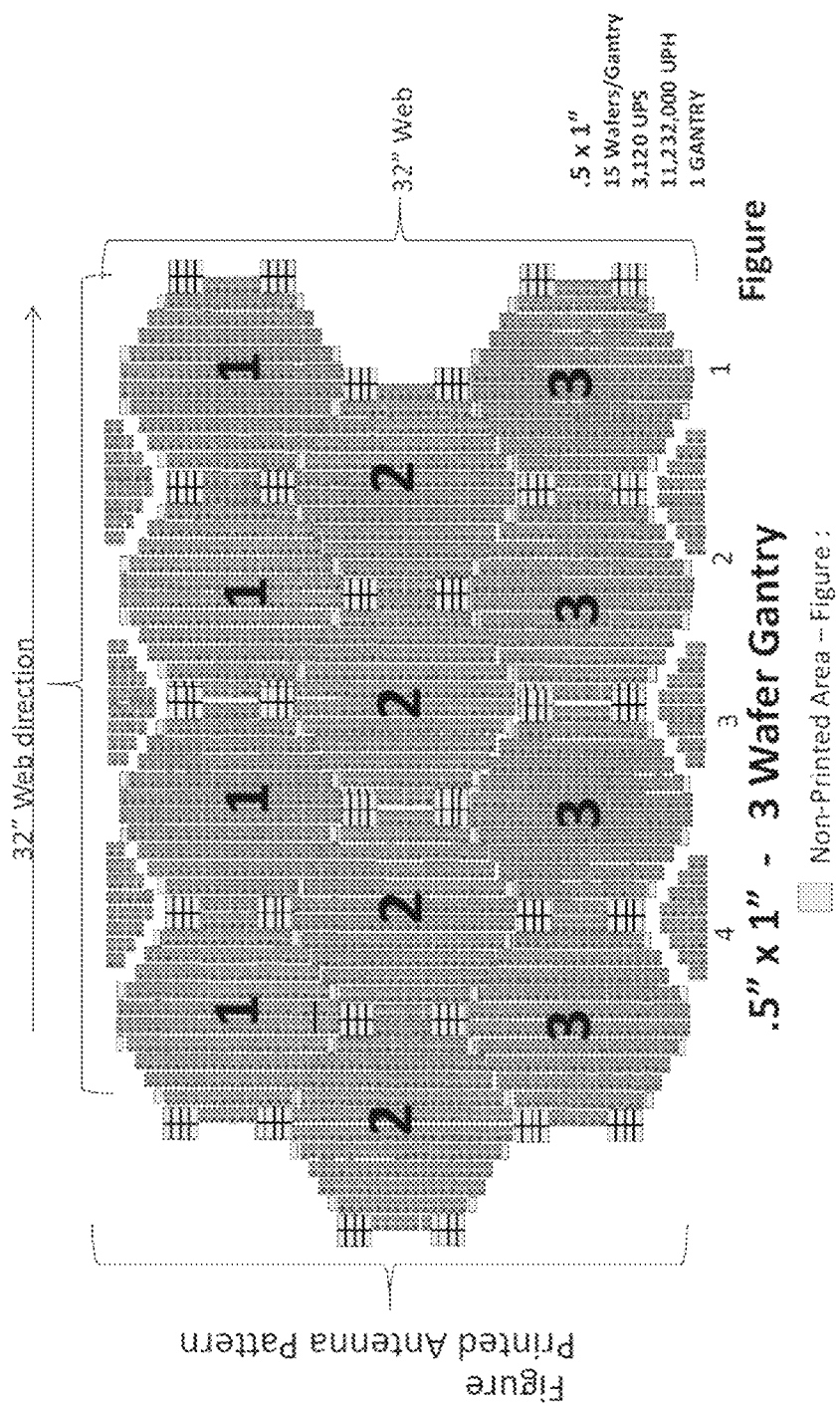
Figure 67:
Figure 68:
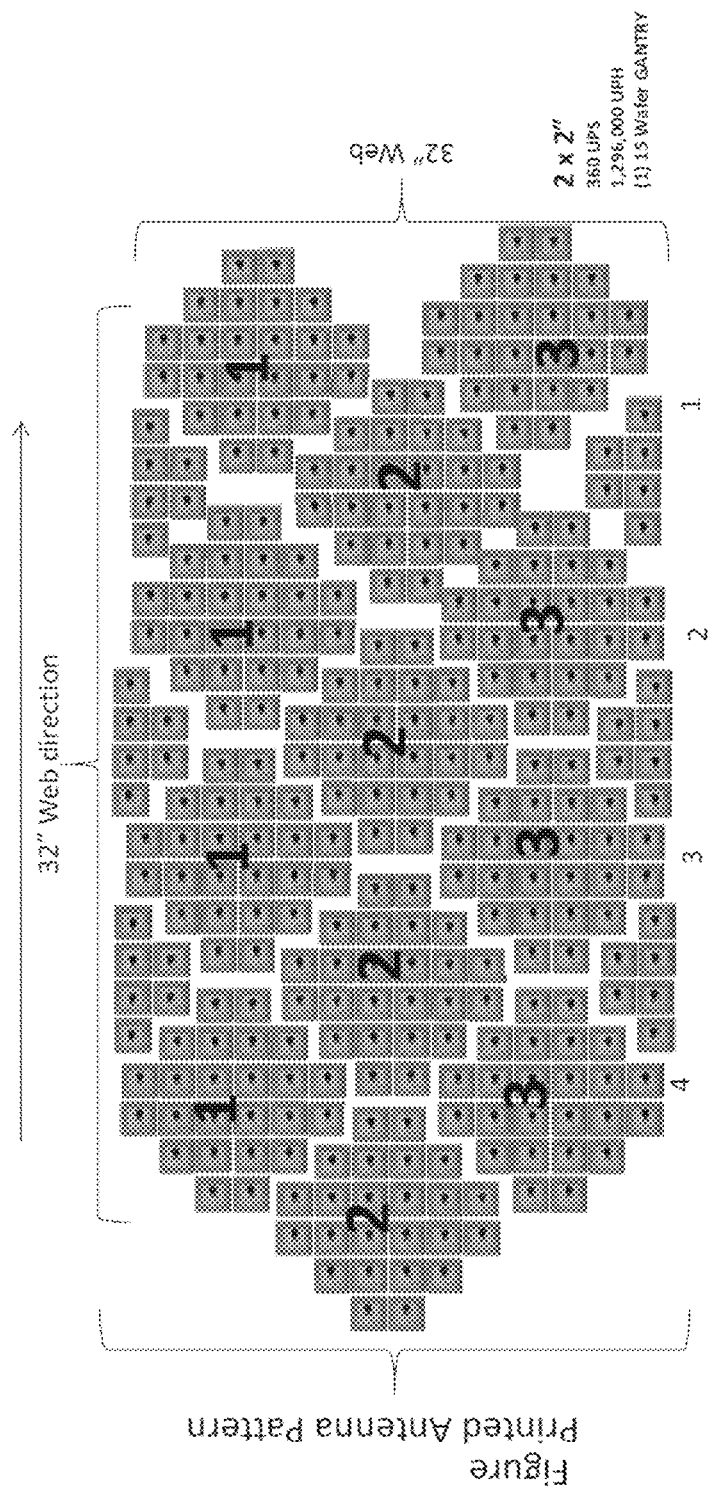
Figure 69:
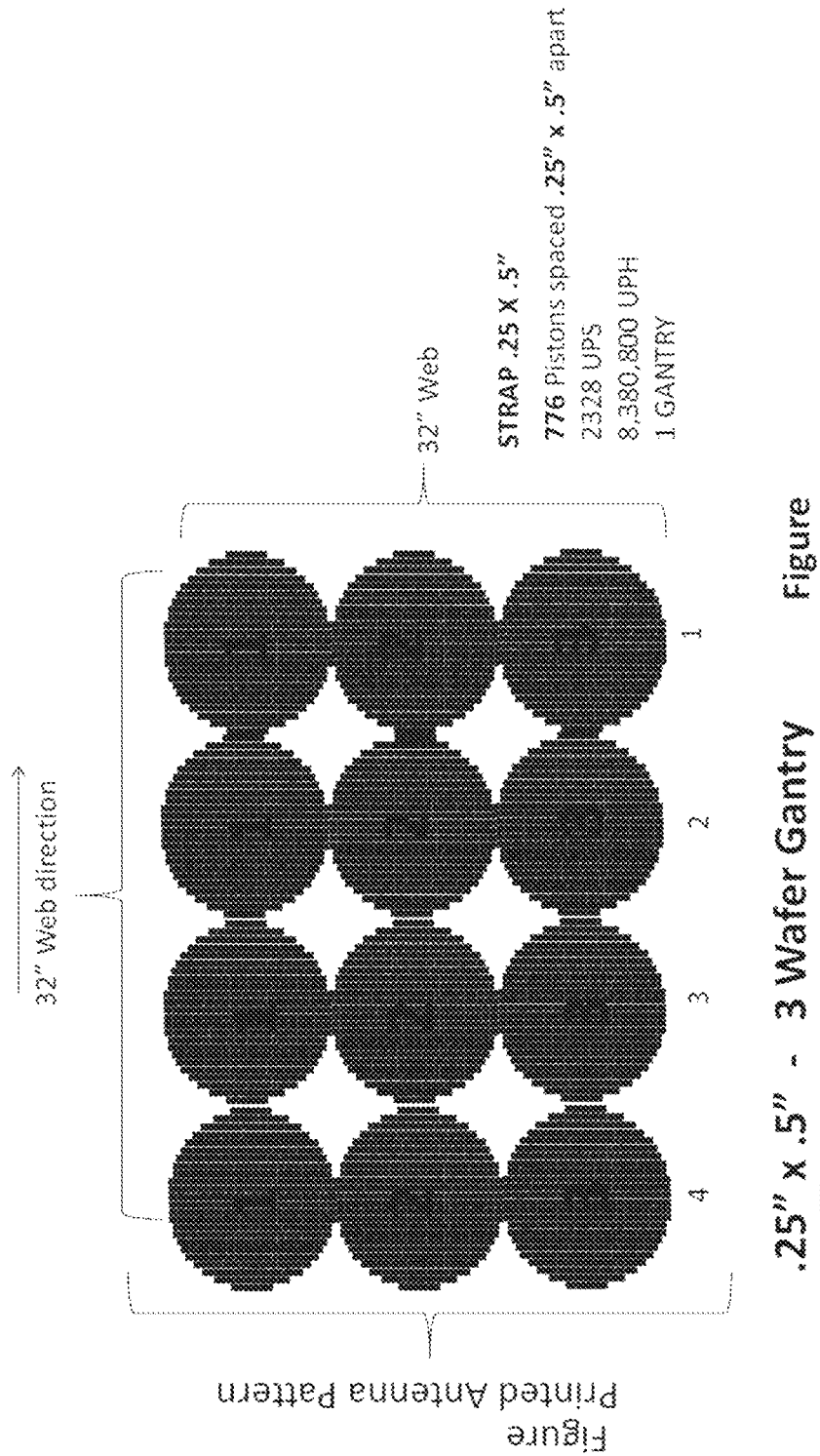
Figure 70:
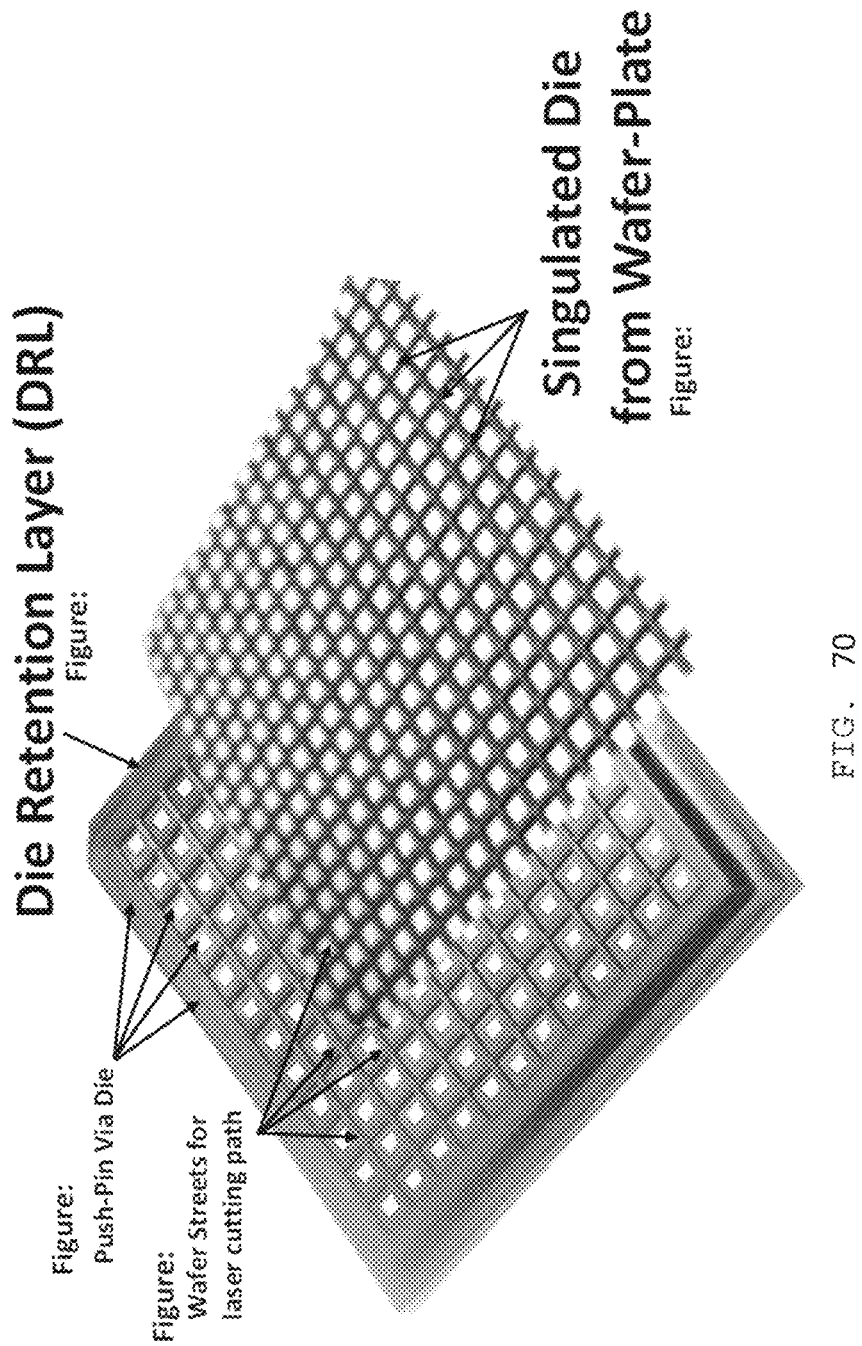
Figure 71:
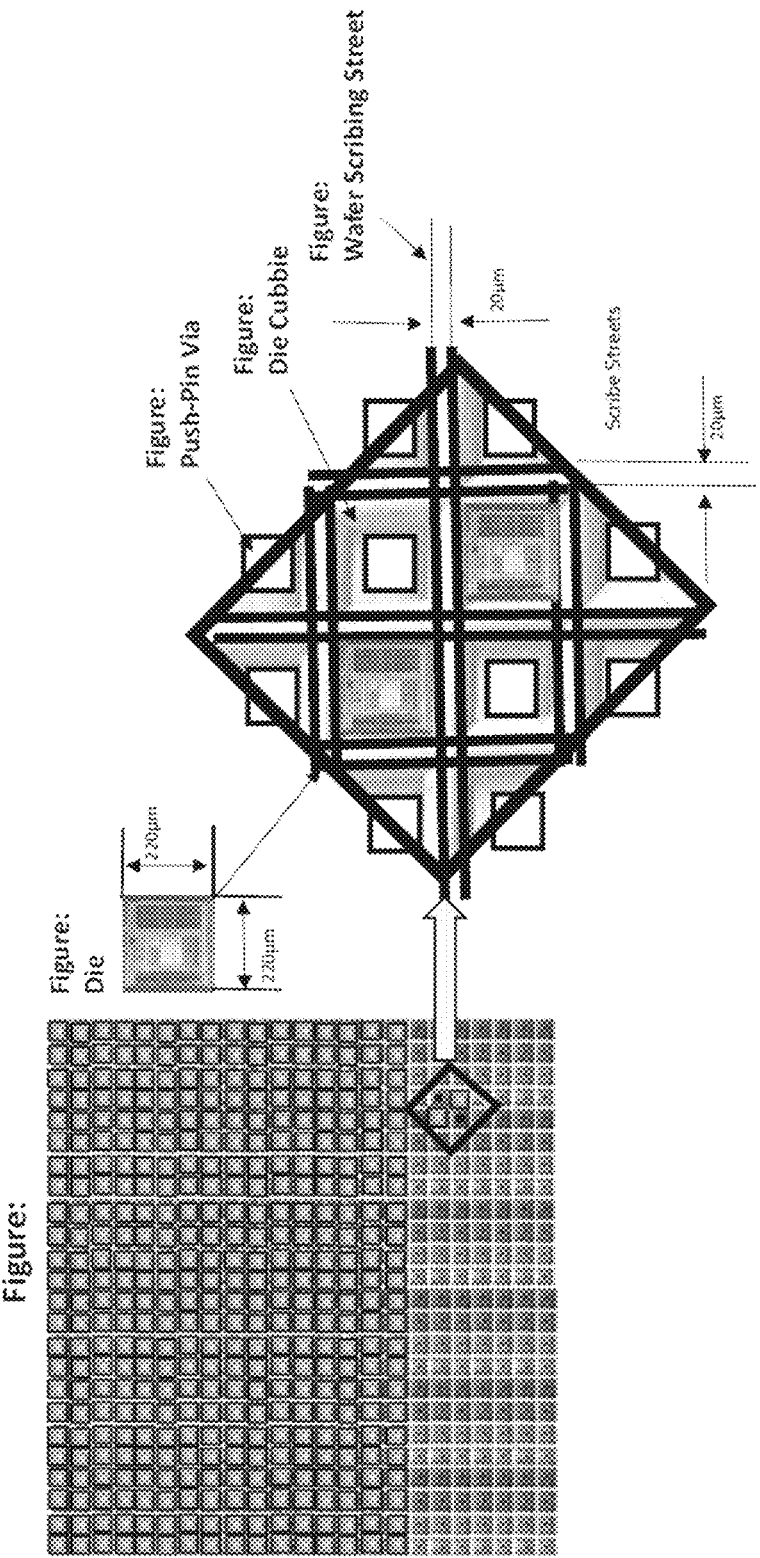
Figure 73:
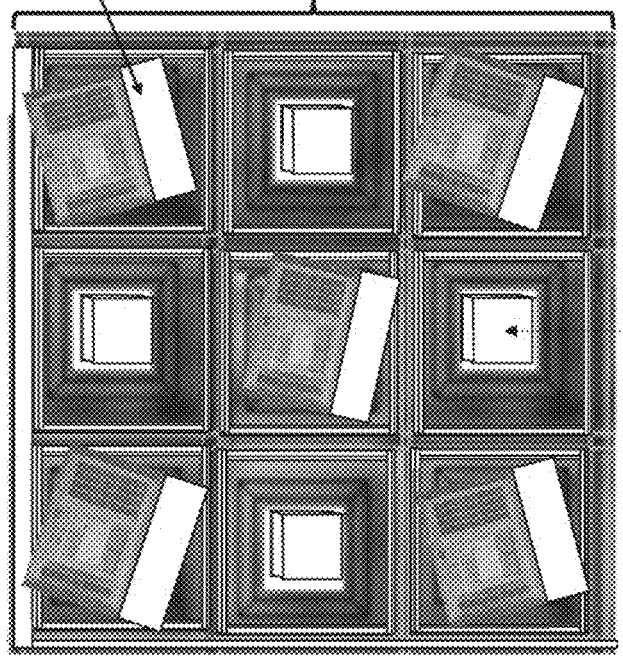
Figure 74:
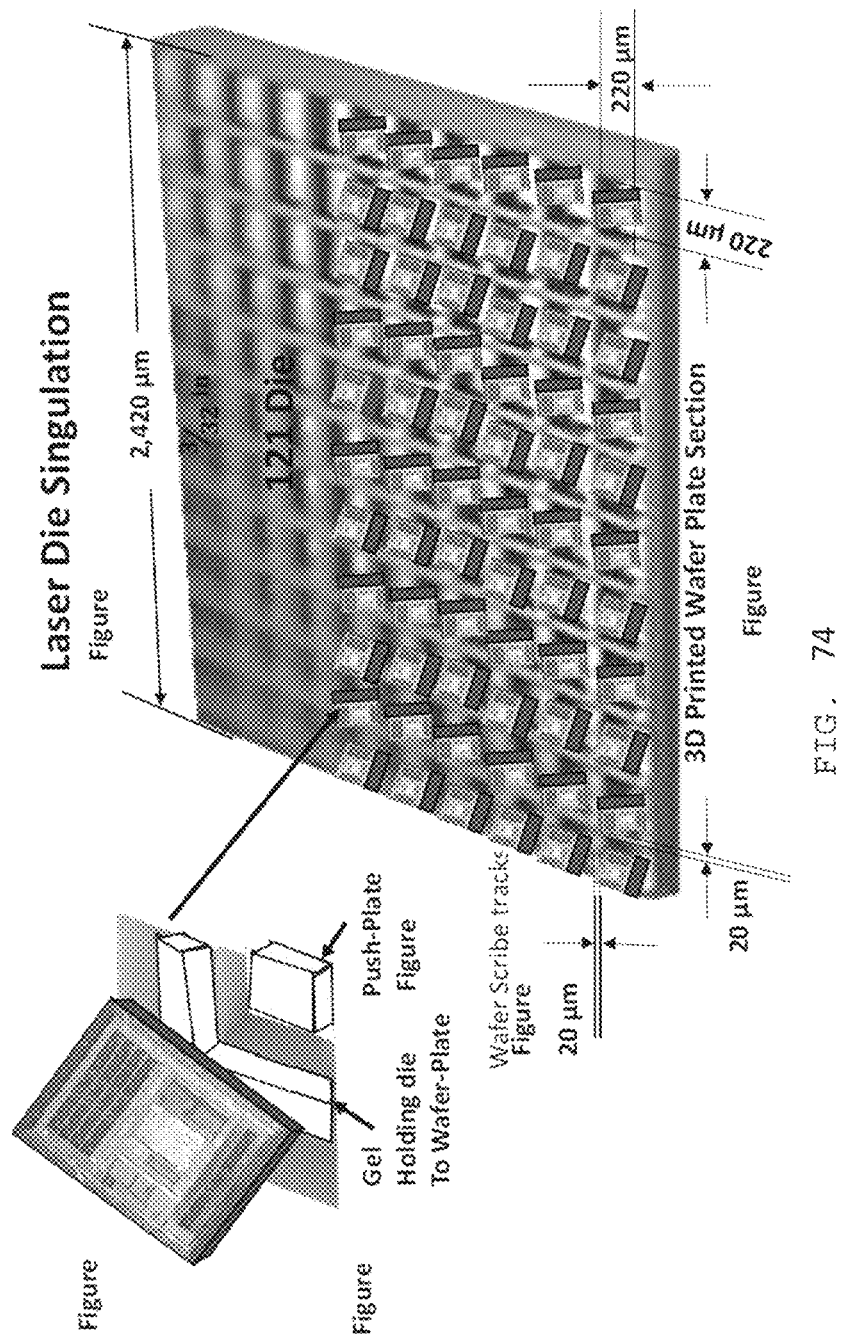
Figure 75:
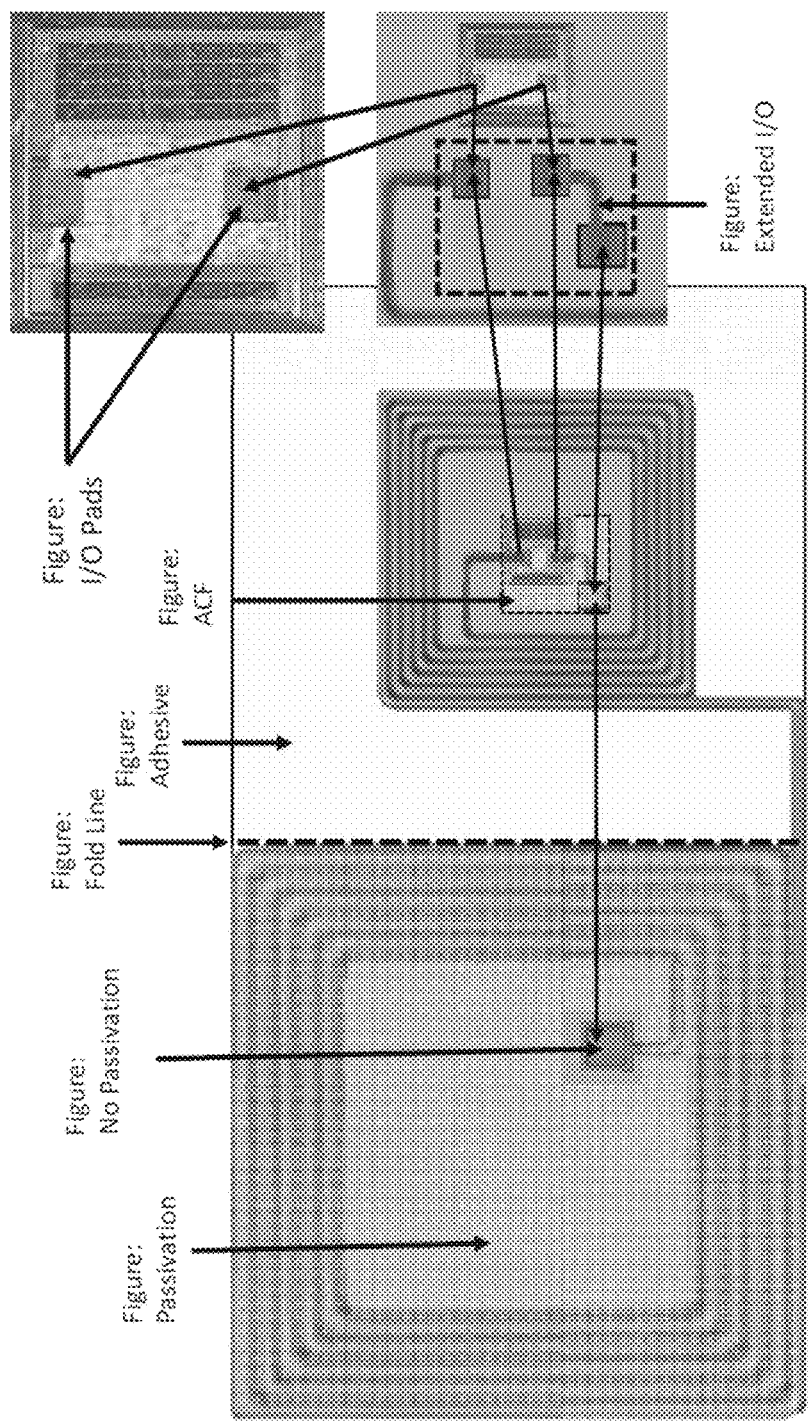
Figure 76:
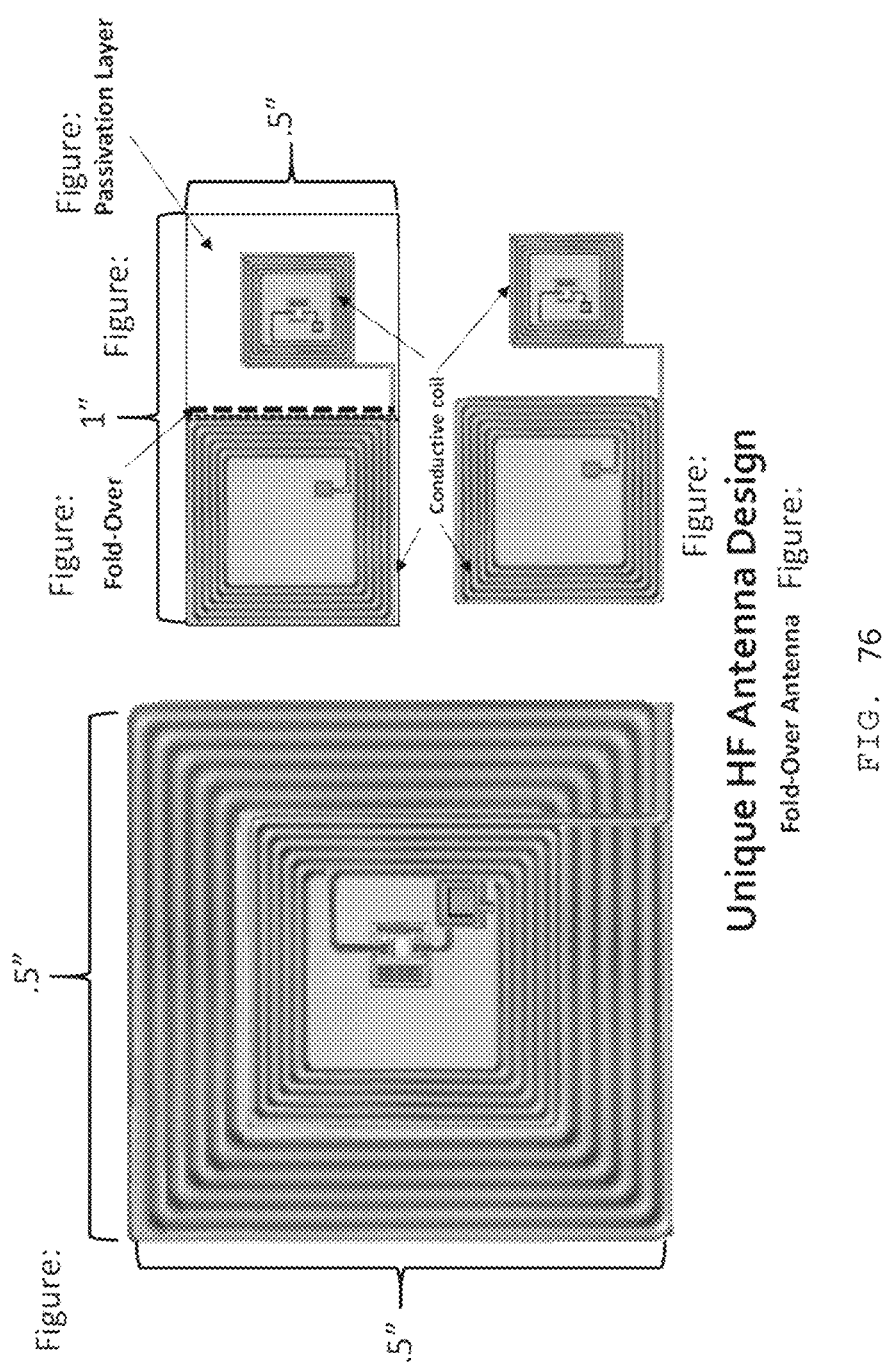
Figure 77:
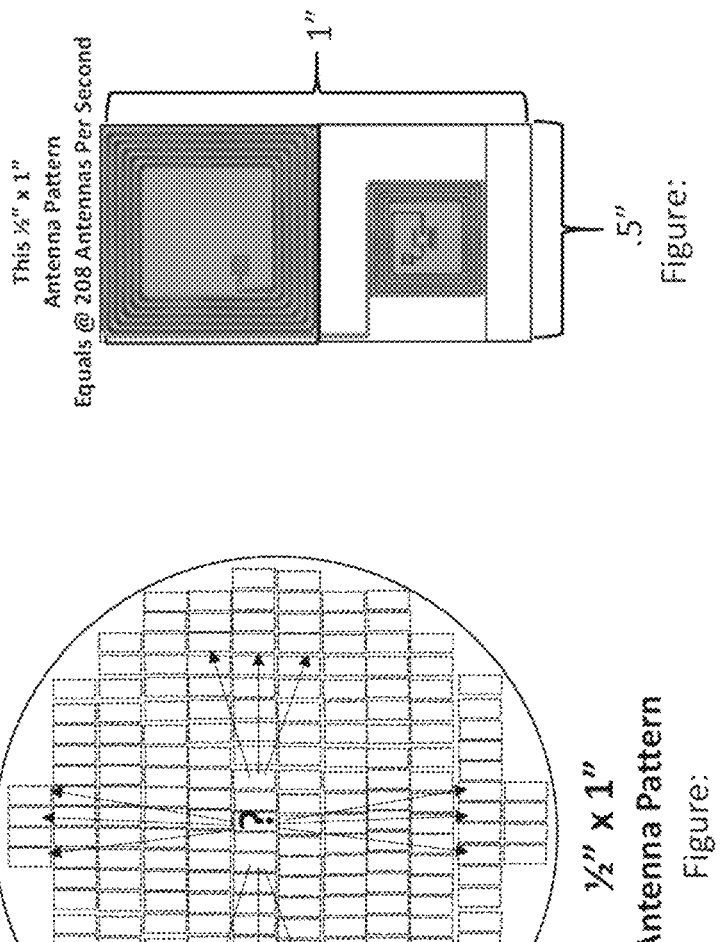
Figure 78:
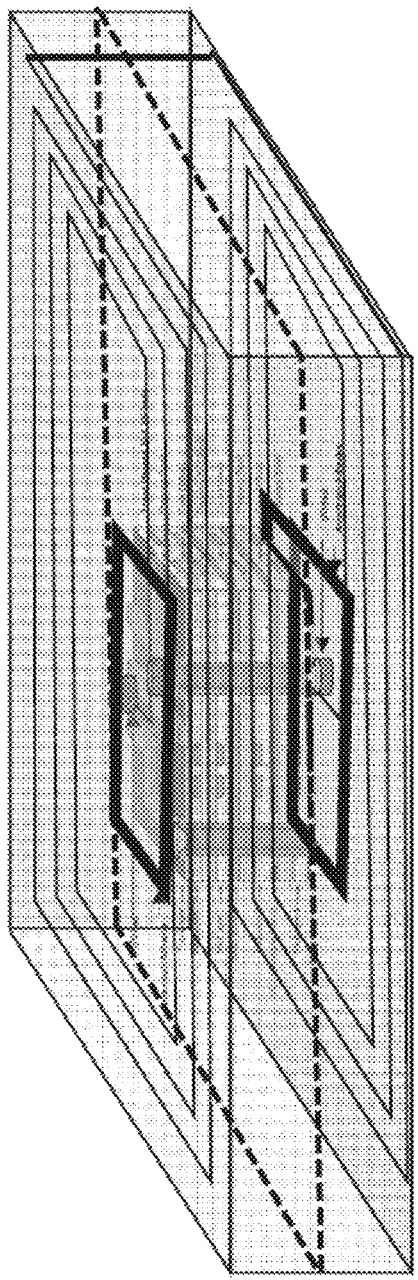
Figure 79:
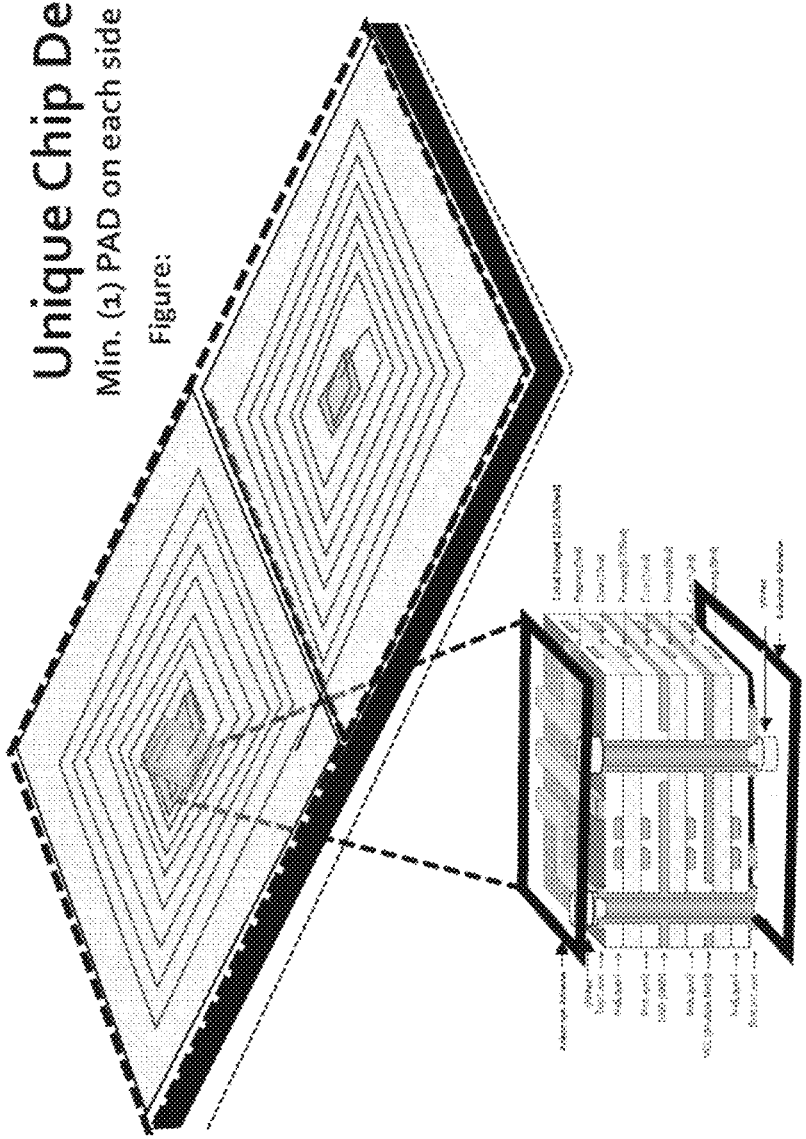
Figure 80:
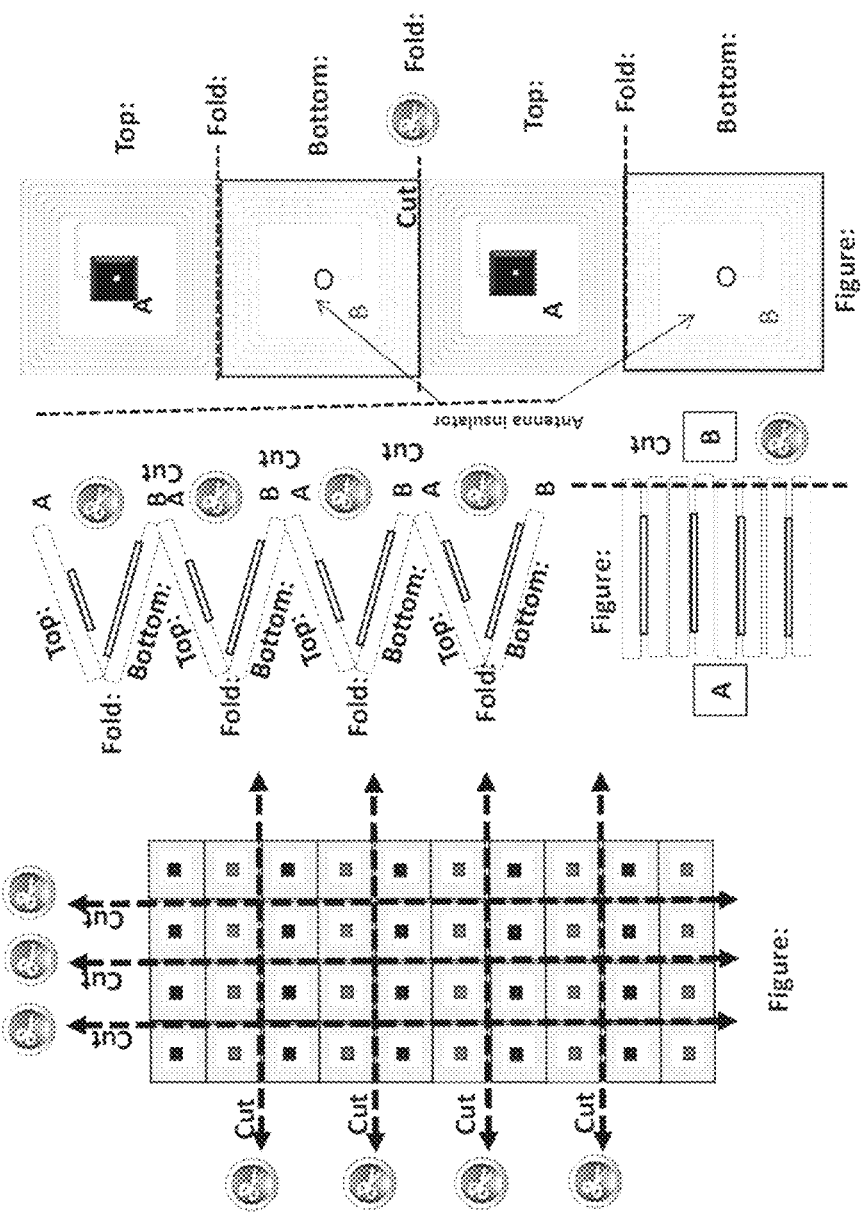
Figure 81:
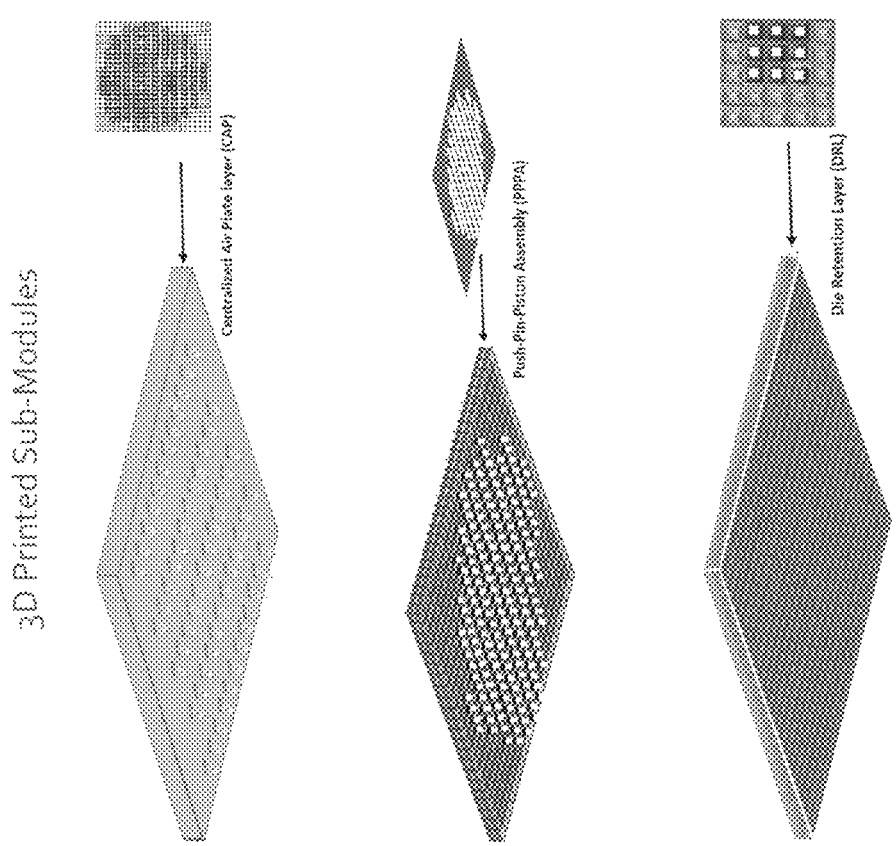
Figure 82:
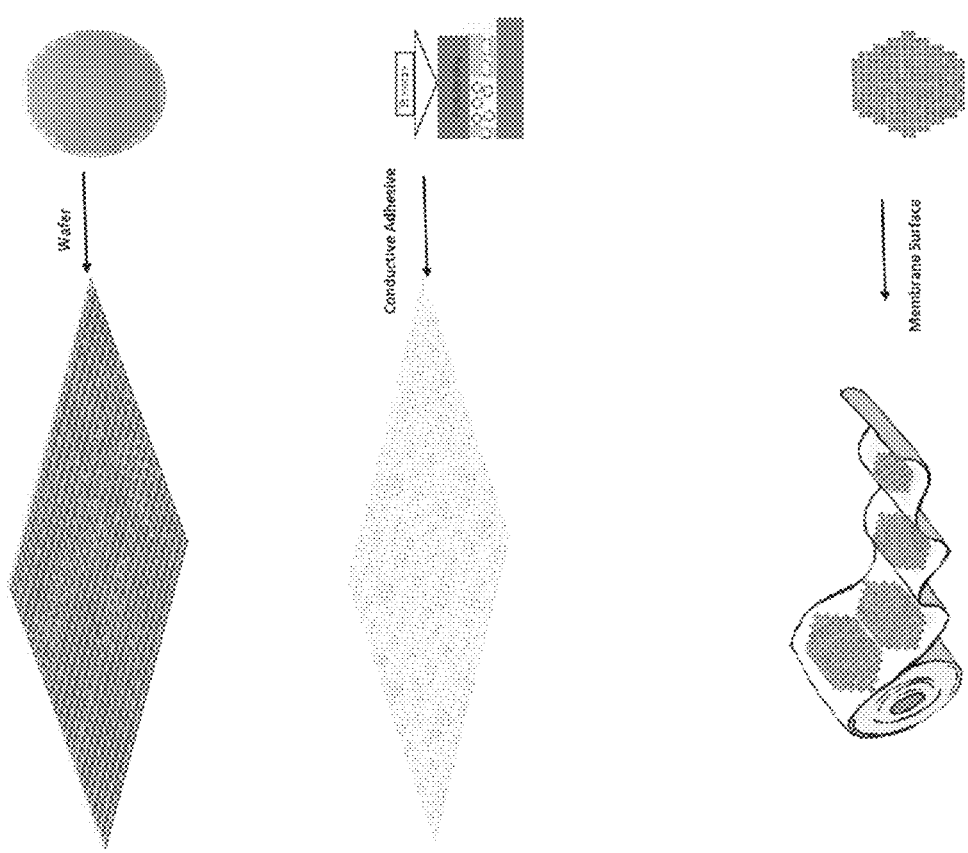
Figure 83:
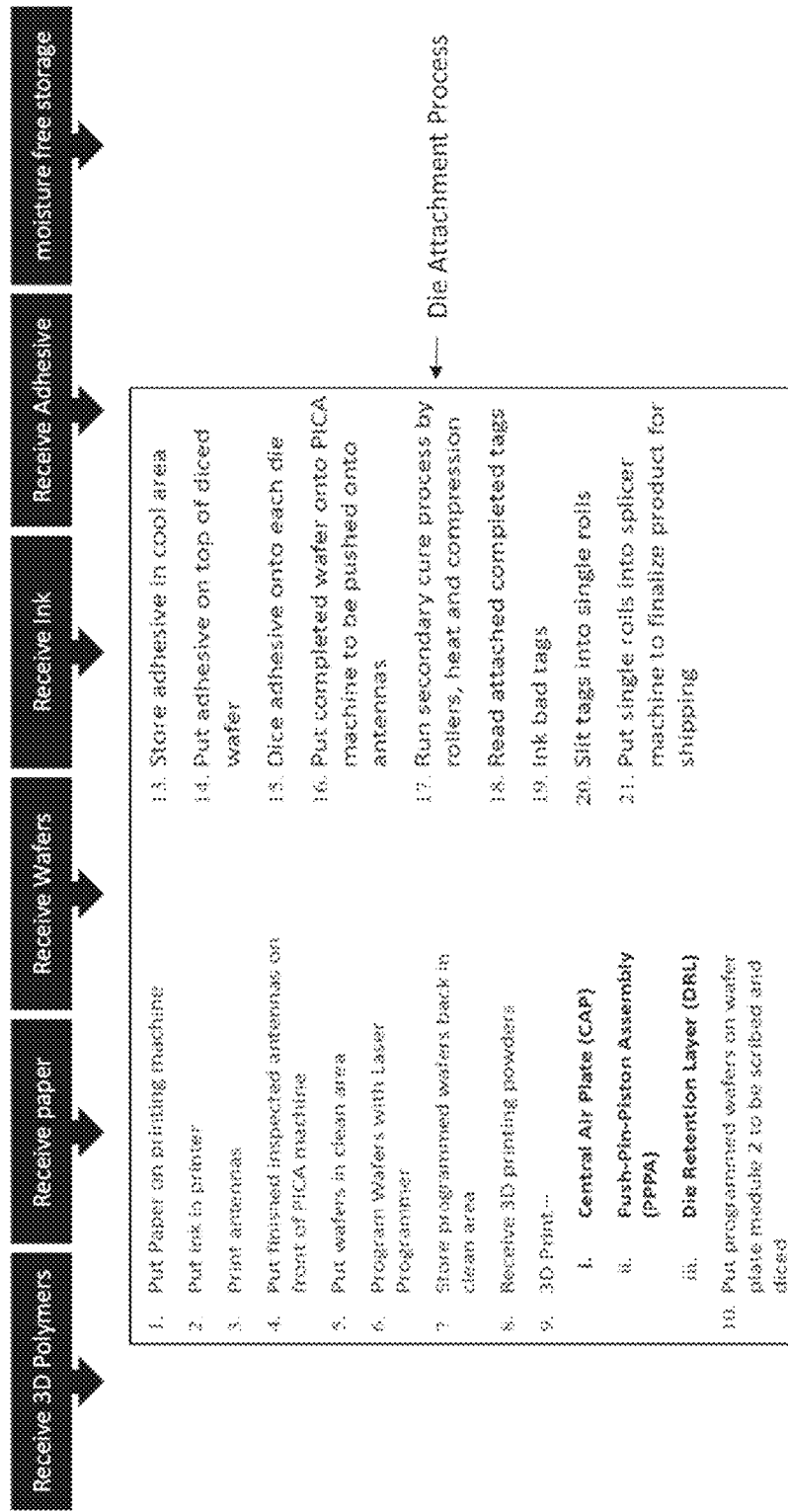
Figure 84:
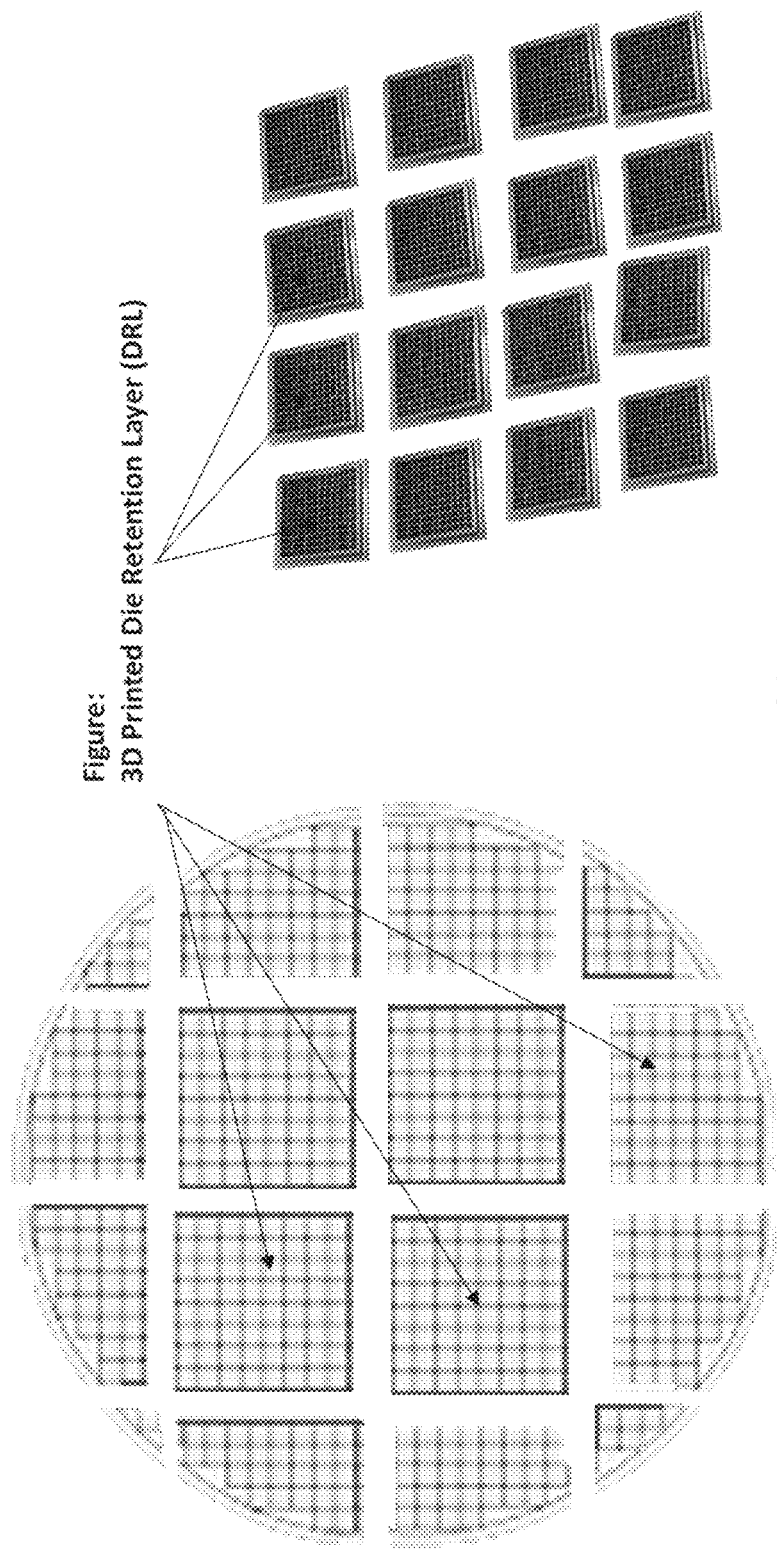
Figure 85:
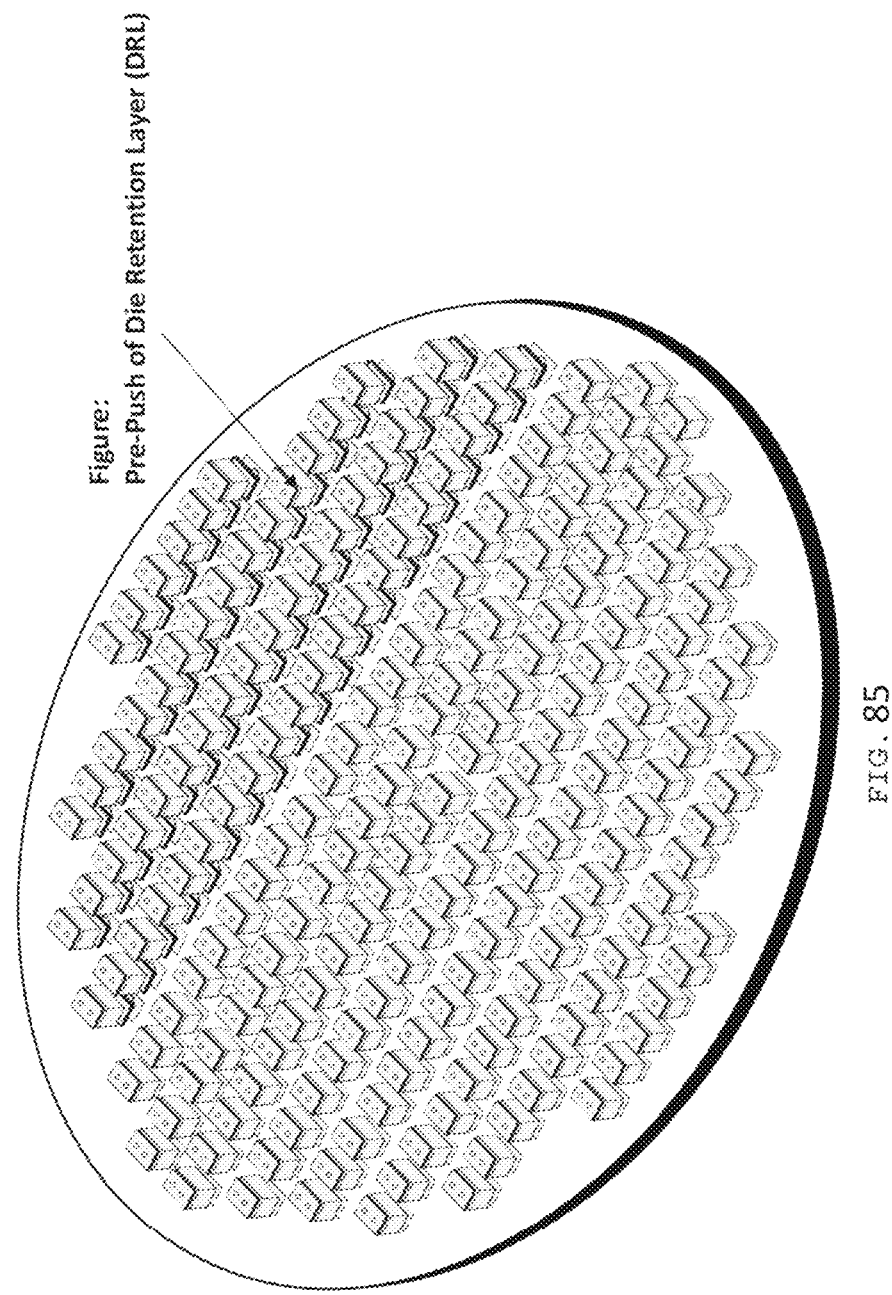
Figure 86:
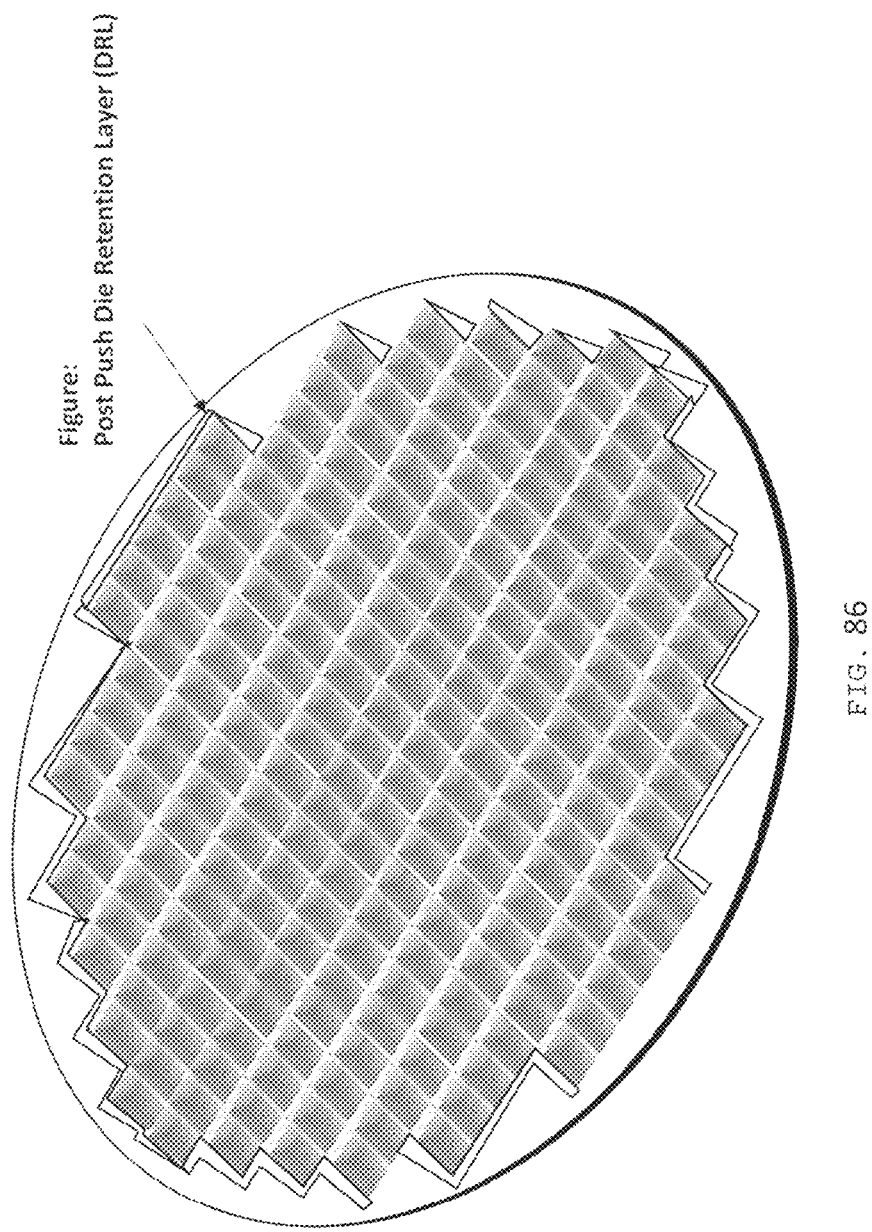
Figure 87:
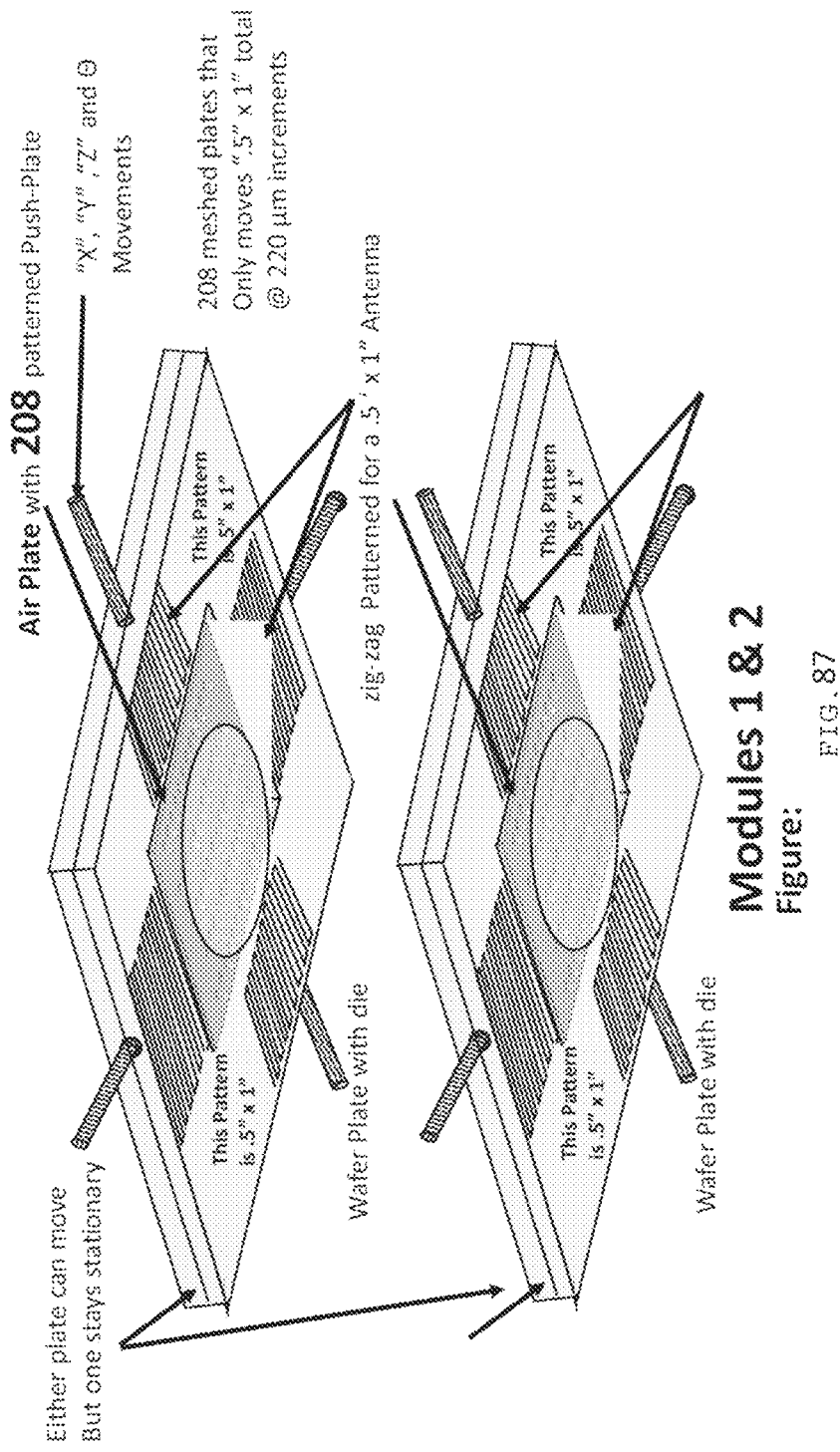
Figure 88:
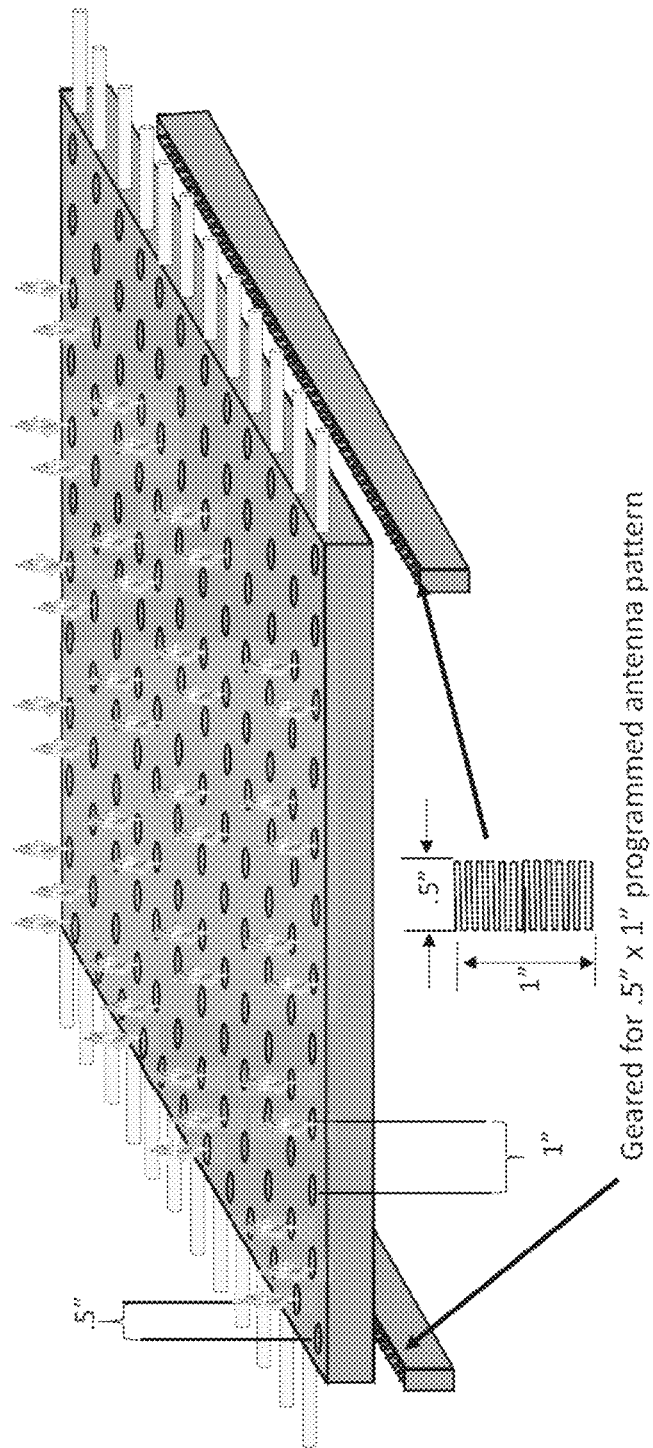
Figure 89:
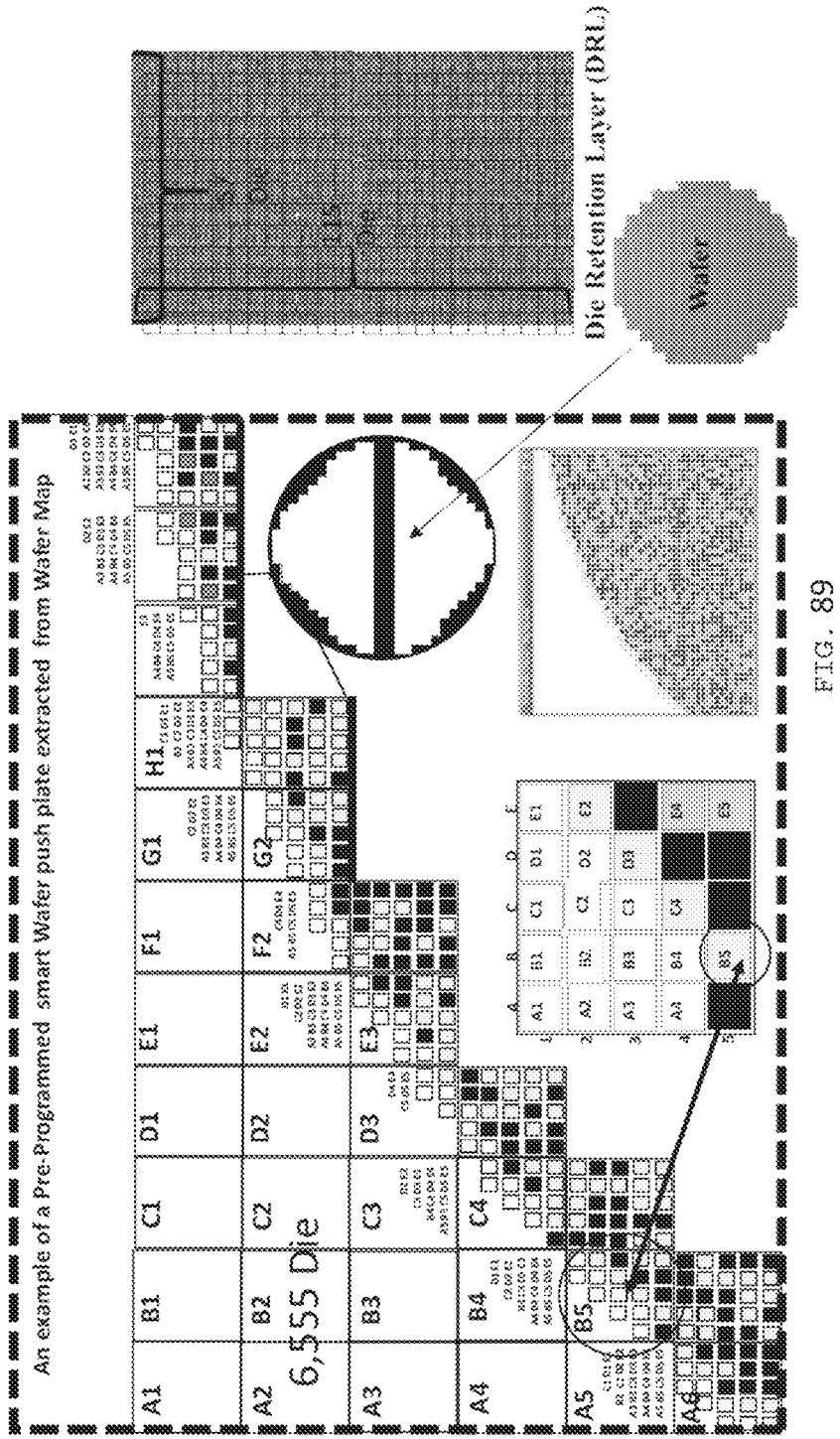
Figure 90:
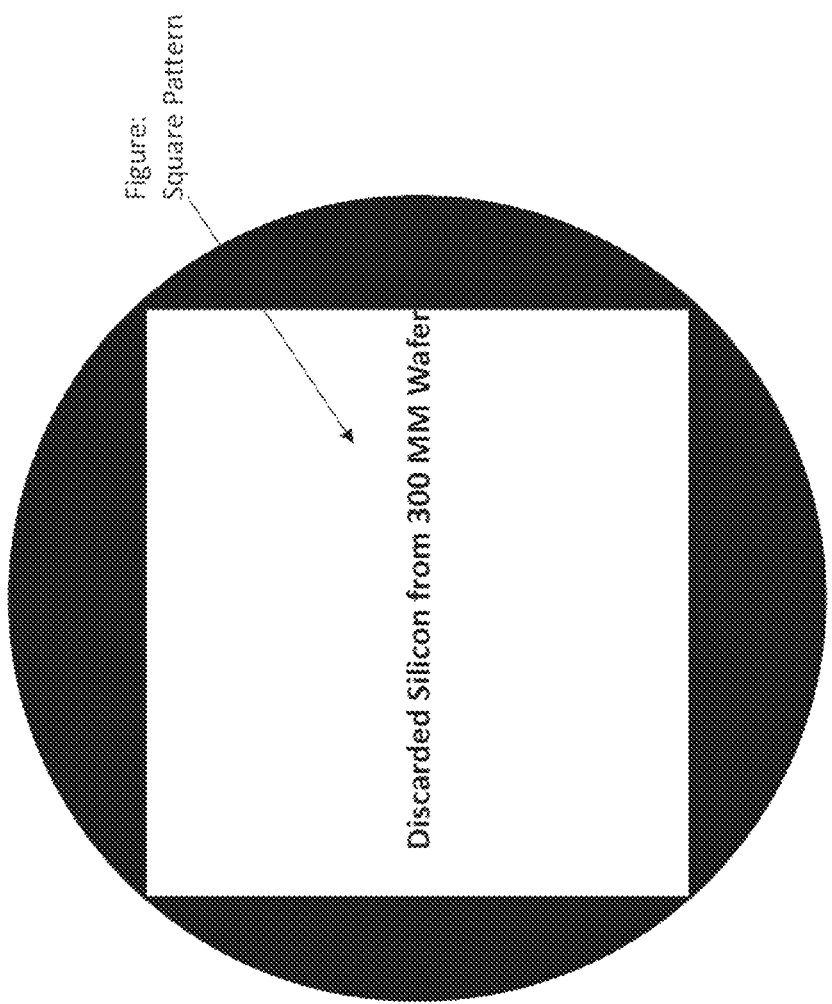
Figure 91:
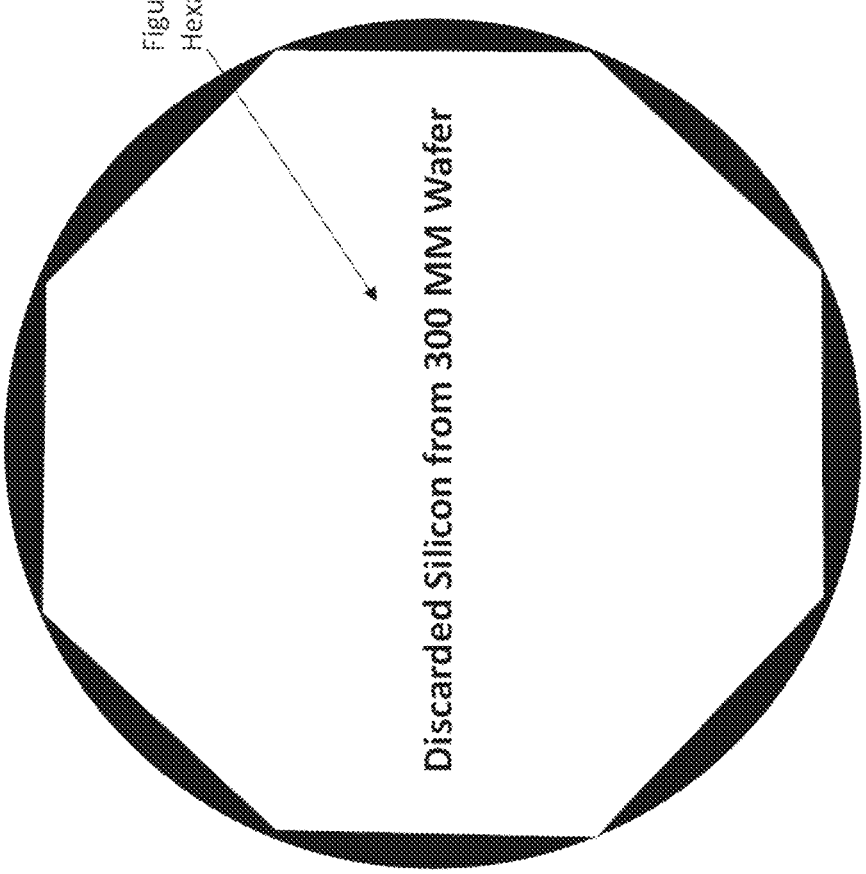
Figure 92:
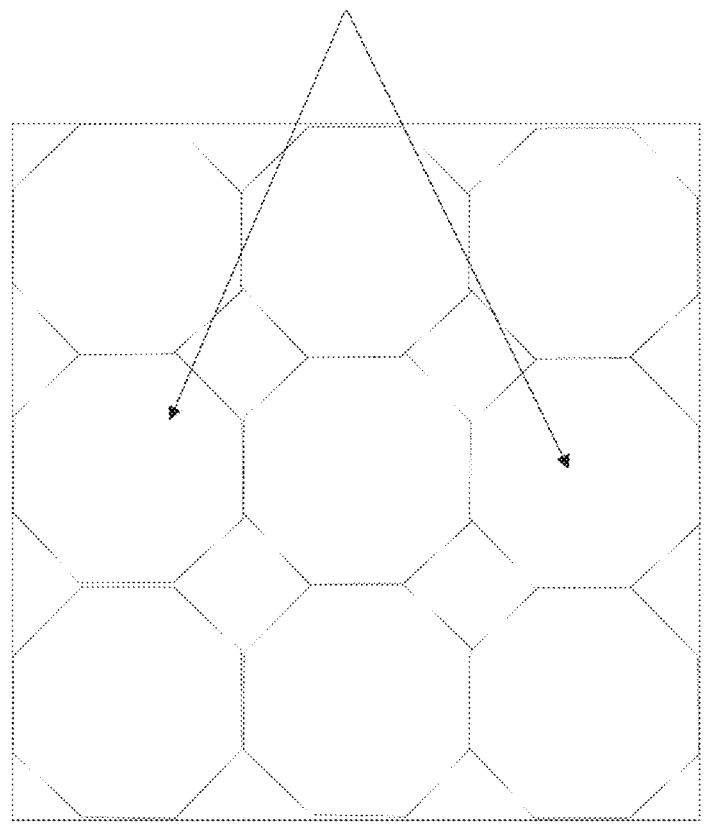
Figure 93:
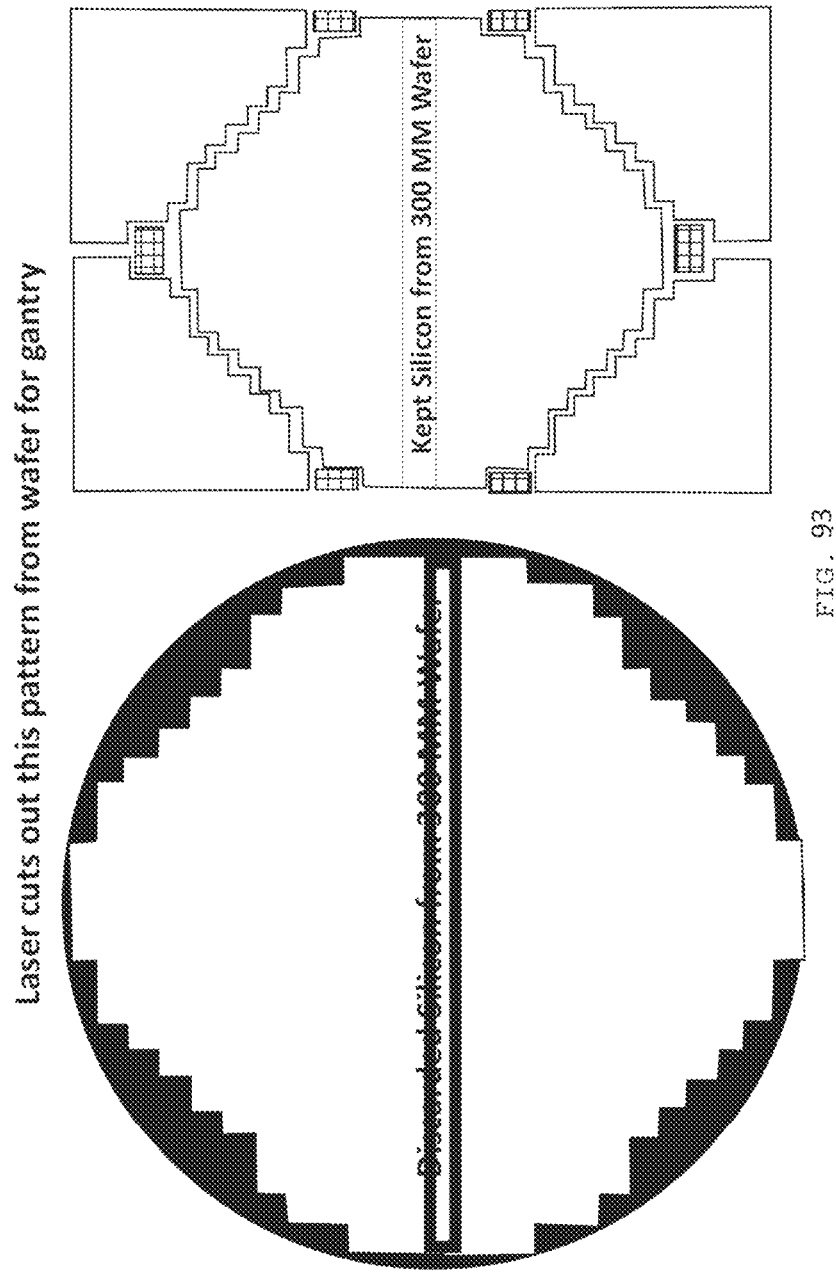

Air Chamber layer: This layer is a separate and moveable layer relative to the integrated cubby/piston chamber layer. It has air holes matched to those in the piston chamber layer, but at locations specific to the number of die to be ejected at any one time. For example, it may have air holes located to correspond to the bonding pad position of an underlying substrate, which require only a fraction of the total die to be ejected and bonded at a time. Once those dies are ejected, the integrated cubby/piston chamber layer is moved relative to the air chamber layer, such that filled cubbies are aligned to the air holes of the air chamber, for the next ejection of die onto a new segment of the substrate, which is on a reel, and advances to expose new bonding pad positions. The air chamber air holes and the corresponding piston chamber air holes may be male-to-female matched to provide an airtight fit when positioned together. The air chamber is a cavity with dimensions commensurate with the wafer, and some thickness dimension designed to provide uniform pressure throughout the chamber during cycles. An air hose connects this chamber to a pressure pump system to alternatively provide the negative and positive pressures. See FIG. 5. Purified nitrogen gas may be a preferred gas for this operation to prevent contamination and oxidation of interior surfaces, according to an embodiment. Alternatively, the air chamber layer may be integrated with the cubby/piston chamber layer. In this case, the chamber may be filled with channels that direct the gas flow to the specified piston chambers for a specific die ejection cycle, and then to different piston chambers for the next die ejection cycle. Computer controlled micro valves select which channels are employed for a specific push cycle. See FIGS. 1-94.

Alternatively, the cubby pistons may be activated by a mechanical piston layer, operated electro-magnetically with solenoids, such as is shown in one or more of FIGS. 1-94.

There may be individual solenoids, one for each antenna position, or just one that operates a pin plate, the pins positioned one for each antenna position. In either alternative, once a set of die are ejected, the integrated cubby/piston chamber layer is moved relative to the mechanical piston layer, such that filled cubbies are aligned to the pins, for the next ejection of die onto a new segment of the substrate.

The subject matter disclosed herein also includes a two-sided ID die which has bonding pads on both the top and bottom surfaces of the die, as shown in one or more of FIGS. 1-94. For such die, the die can be attached to one side of an antenna or other substrates as described above, or within a pre-embossed shape equal to that of the thickness of the 2 sided I/O bare die, said embossed shape may also have a via or not to allow for a connection to the opposite side of substrate when folded or just to connect to another substrate. After or before that attachment, a conductive adhesive (anisotropic, isotropic, or other) may be applied on the exposed top or bottom die surface, covering either bonding pad(s), as shown in one or more of FIGS. 1-94. After the antenna or other flexible substrate exits the ICCES stage, it may then be fan folded either over the die or back-to-back, a passivation covering may be applied between both antenna structures by Printing/Etching or other means as not to short out either or both antenna structures, but with the pad area exposed for connection to die I/O, so that bonding landings on the substrate match the adhesive covered top die surface and then brought into contact with pressure to form the bond attachment, as shown in one or more of FIGS. 1-94. Upon the completion of the fan folding one edge of the stack is then sliced to sever individual antennas which may then be read or authenticated for functioning/nonfunctioning. Said stack may be counted, and or packaged, as shown in one or more of FIGS. 1-94.

In an embodiment, a unique Integrated Circuit (IC) die ejection head assembly system is described, which utilizes one of many types of Three-Dimensional (3D) Printing/Etching technologies to achieve very high-resolution manufacturing to meet the precision tolerances required for very small IC die sizes. Hundreds of thousands to more than a million of randomly Laser programmed unique die are retained in this "First" assembly system until they are selectively ejected in a very controlled and precise way onto any various underlying web like substrates. These arbitrarily large number of die can be selected depending on a predetermined pattern and ejected all at the same time until eventually every die are ejected from the "First" assembly system. The Integrated Circuit Controlled Ejection System (ICCES) embodiments provide a new approach for MPICA. The current "6" layer embodiment is a complex die retention and ejection system that has the size and footprint of any standard silicon wafer on which IC die are fabricated. For a die size of 200 microns on a side, there are about 1,400,000 such die on a 12-inch wafer.

The ICCES system embodiments may have several components, or system layers that are described below:

The "First" layer: or the Centralized Air Plate layer (CAP) which like every other part is manufactured with a high-resolution 3D type Printing/Etching process. The CAP layer is further described elsewhere herein.

The "Second" layer or the Push-Pin-Piston Assembly (PPPA) layer provides a plate or individual "Push Pins" to extract die from wafer on the Wafer Plate, The PPPA layer is further described elsewhere herein.

The "Third" layer is the Wafer Plate or the Die Retention Layer (DRL) provides die retention "cubbies" with vias in which the wafer and randomly Laser programmed unique die reside until ejected onto an adjacent substrate. The DRL layer is further described elsewhere herein.

The "Forth" layer is "Wafer" itself which is of any size or part of any wafer. It is jigged to fit exactly over each "Cubby" and via as to be able to be ejected from the PPPA. The Wafer layer is further described elsewhere herein.

The "Fifth" layer is the "Conductive Adhesive" layer (Isotropic, or Anisotropic) which is applied over the complete "Wafer" and die cut exactly to the shape of that "Wafer", or can be a liquid that flows on the "Wafer" and presets and semi cures or cures enough so that either can be then scribed, diced or cut into the same size dimensions as the die ejected from the DRL. The Conductive layer is further described elsewhere herein.

The "Sixth" layer is the "Membrane Surface" or "substrate" to which the IC or die is being applied to create a circuit or connection. The Membrane layer is further described elsewhere herein.

The "First" Layer, the Centralized Air Plate layer (CAP) module provides the ICCES system to operate by providing either a continuous moving plate or individual air ports or vias with pre-determined pattern(s). For example, for a 12" wafer with a solid or continuous CAP moves like a 12"×12" piston moving up and down to a specified distance which is determined only by the thickness of the wafer. For a CAP with individual air ports or vias, air is pushed through the individual predetermined patterned holes. This CAP layer is a separate and moveable layer relative to the "Second" layer the Push-Pin-Piston Assembly (PPPA) layer.

The CAP may be a cavity with dimensions commensurate with the wafer, and some thickness dimension designed to provide uniform pressure throughout the chamber plate during cycles. An air hose connects this chamber to a pressure pump system to alternatively provide the negative and positive pressures, as is shown in one or more of FIGS. 1-94. Purified nitrogen gas may be a preferred gas for this operation to prevent contamination and oxidation of interior surfaces, according to an embodiment. Alternatively, the air chamber layer may be integrated with the cubby/piston chamber layer. In this case, the chamber may be filled with channels that direct the gas flow to the specified piston chambers for a specific die ejection cycle, and then to different piston chambers for the next die ejection cycle. Computer controlled micro valves select which channels are employed for a specific push cycle.

The airtight fit when positioned together create the air chamber or cavity with dimensions commensurate with the wafer, and some thickness dimension designed to provide uniform pressure throughout the chamber during cycles. The air hose connects this chamber to a pressure pump system to alternatively provide the negative and positive pressures.

Purified nitrogen gas may be a preferred gas for this operation to prevent contamination and oxidation of interior surfaces, according to an embodiment. Alternatively, the CAP layer may be integrated with as described above to a cubby/piston chamber layer. In this case, the chamber is filled with channels that direct the gas flow to the specified piston chambers for a specific die ejection cycle, and then to different piston chambers for the next die ejection cycle. Computer controlled micro valves may select which channels are employed for a specific push cycle.

The CAP is then attached to the "PPPA" becoming one subassembly and has the ability to move together in a specific pattern to allow for the complete wafer to be exhausted of every one of its die, as is shown in one or more of FIGS. 1-94. For example, for a 0.5"×1" antenna for an RFID tag the feasibility is such that one can push 208

200-micron sq. IC's per push, per second. After 1 set push the plate then move 200 microns in the "X" direction to initiate another push, then another, etc. until all die within each 208 patterns are completed. Roughly each pattern may have @ 57 die in the "X" direction and @115 die in the "Y" direction giving each push pin the ability to push 6,555 die and a total of 1,363,440 200 Micron sq. die pushed in 6,555 seconds or @ 1.8 hours, as is shown in one or more of FIGS. 1-94.

The "Second" layer, the Push-Pin-Piston Assembly (PPPA) layer provides a predetermined patterned plate with holes for "Push Pins", or predetermined patterned individual cavities each with holes for "Push Pins". This layer's individual cavities can have either round, rectangular, or square chambers, likewise the predetermined patterned plate may as well, or just simply be a lid like shape to create an air chamber with the predetermined pattern. One example is where the PPPA pin hole connects a chamber to its corresponding cubby on the Die Retention Layer (DRL). The chamber(s) may have pistons connected to these pins with their radius being of a specified predetermined dimension or pattern less than the radius of the chamber, or dimensions less than the rectangular or square dimensions of the chamber. The thickness of the PPPA is of some specified dimension of the chamber depth which is the sum of this dimension and the die thickness, as is shown in one or more of FIGS. 1-94. The PPPA manufactured assembly is made so that they each move freely up and down with their total excursion being the same as the die thickness.

When the target substrate, or "Membrane Surface" is brought into near contact proximity to the cubby surface As the CAP provides first positive pressure to push the PPPA down on to the DRL bottom surface, the action results in pushing either the cubby piston or plate down to meet the die underside surface. The defined positive air pressure which is applied and moves the chamber piston or plate down onto the cubby side, pushing the chamber piston or plate down and the die out of the DRL, ejecting it onto the "Membrane Surface" where it is attached by the "Conductive Adhesive" layer. The attachment force is designed to be sufficient to pull the die off of the PPPA. Then negative air pressure is induced to the CAP to withdraw the PPPA piston off the DRL cubby, leaving the die attached to the "Membrane Surface". This is the completion of one cycle.

Alternatively, the cubby pistons may be activated by a mechanical piston layer, operated electro-magnetically with solenoids, such as is shown in one or more of FIGS. 1-94. There may be individual solenoids, one for each antenna position, or just one that operates a pin plate, the pins positioned one for each antenna position. In either alternative, once a set of dice are ejected, the integrated cubby/piston chamber layer is moved relative to the mechanical piston layer, such that filled cubbies are aligned to the pins, for the next ejection of die onto a new segment of the substrate. Alternatively, the previous layers may be replaced by a single "pin plate" layer, FIG. 95-97, which is a plate with push pins formed upon it located in alignment with the sixth layer pattern onto which the die are to be pushed and attached.

The "Third" layer is the Wafer Plate or the Die Retention Layer (DRL) which simply provides for any size wafer with any size die pattern a pre-patterned wafer retention stencil with vias or holes patterned through each die location center. In another embodiment, each DRL may also have each and every die scribe line printed/Ablated to height as to create individual Cubby wall patterns for each die allowing for better die and wafer stabilization. The Cubby wall patterns can also allow for each die Singulation process an exact pattern to follow for either the scribing saw blade or the laser scribe.

The Die Retention Layer (DRL) is where the wafer and die reside until ejected onto an adjacent substrate. For example, it has holes located to correspond to the bonding die position of the Membrane Surface, the underlying substrate, which require or receives only a fraction of the total die to be ejected and bonded by the Conductive Adhesive at a time. This is determined by the predetermined pattern or antenna size. Once those die are ejected, the integrated CAP and PPPA layer is then moved together relative to the next predetermined pattern, as in one or more of FIGS. 1-94.

The "Forth" layer is the "Wafer" itself which is of inclusive of any size or part of any randomly Laser programmed unique wafers. It is attached to a pre-patterned wafer retention stencil with vias or holes patterned under each randomly Laser programmed unique die center and able to be ejected by the PPPA off the DRL. The randomly Laser programmed unique wafers can be whole 18", 12", 8", 6", or 4". They also can be cut out to a pattern that allows for multiple wafers to be put together like a puzzle creating one large continuous wafer and applied to one continuous Wafer plate or DRL. By doing this it allows for unused or nonfunctional die to be excised as to create 100% usable die, as is shown in one or more of FIGS. 1-94.

The "Fifth" layer is the "Conductive Adhesive" layer (Isotropic, Anisotropic or other) which is applied over the complete "Wafer" and die cut exactly to the shape of that "Wafer", or can be a liquid that flows on the "Wafer" and presets and semi cures or cures enough so that either can be then scribed, diced or cut into the same size dimensions as the die ejected from the DRL. Also, the adhesive can be stenciled over a select area or die to be attached, as is shown in one or more of FIGS. 1-94.

The "Sixth" layer is the "Membrane Surface" or "Target Substrate" to which the IC or die is being applied to create a circuit or connection. This layer is a Preprinted/Ablated/Ablated pattern on a continuous web, like that of a newspaper the continuous pattern if printed/Ablated or ablated to match the PPPA pattern.

The sixth layer Preprinted/Ablated/Ablated pattern can be an antenna, such as for a RFID tag, upon which the die is attached to form the tag. Or it can be what is known as an "interposer" or "strap" upon which the die is attached, FIG. 98-100. The strap has both "bonding pads" upon which the die is attached and "connecting pads" which enables the strap to be attached to some other substrate material to form an electrical circuit or device, which could be an antenna, such as for a RFID tag.

Figure 101:
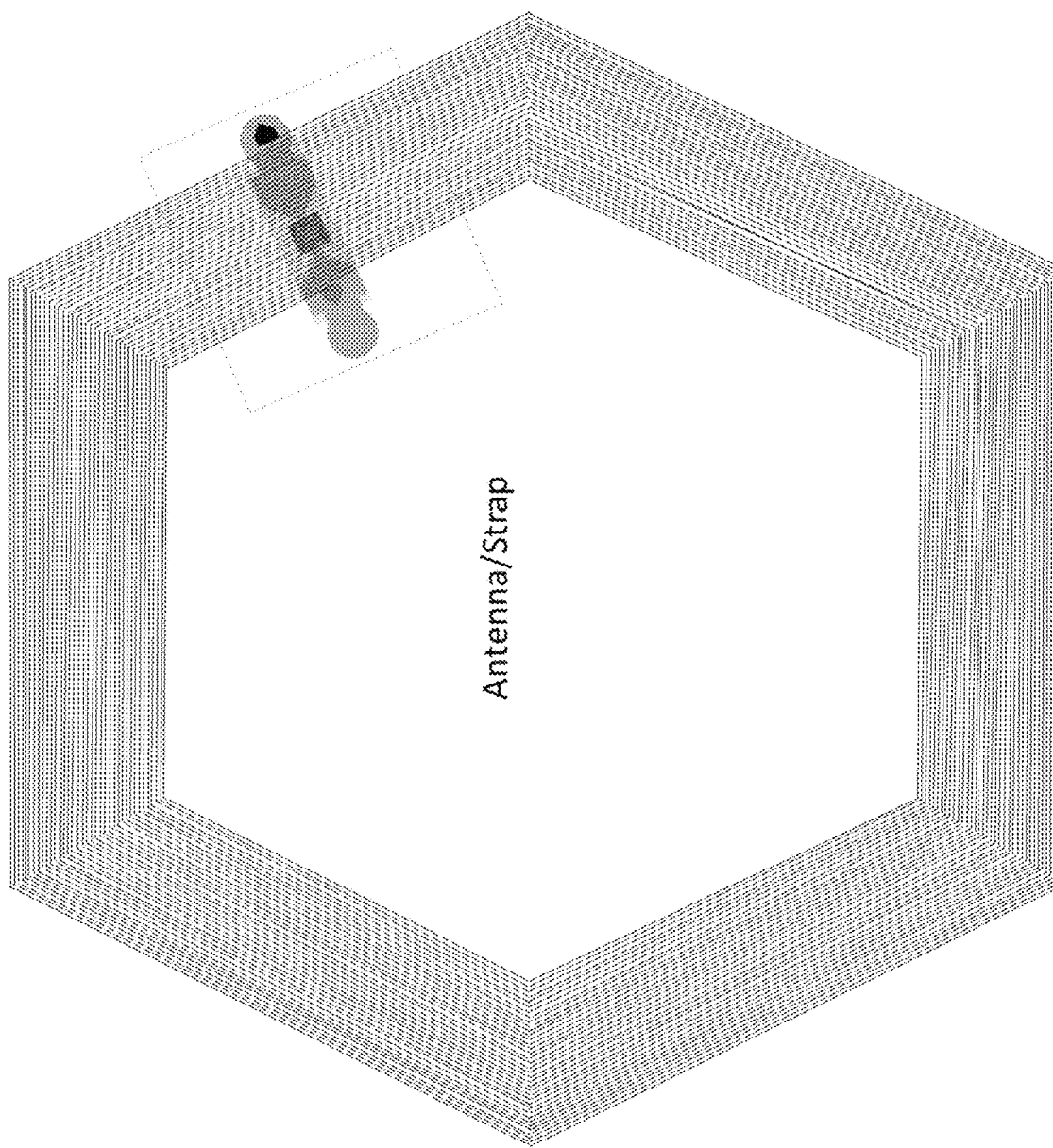
Figure 102:
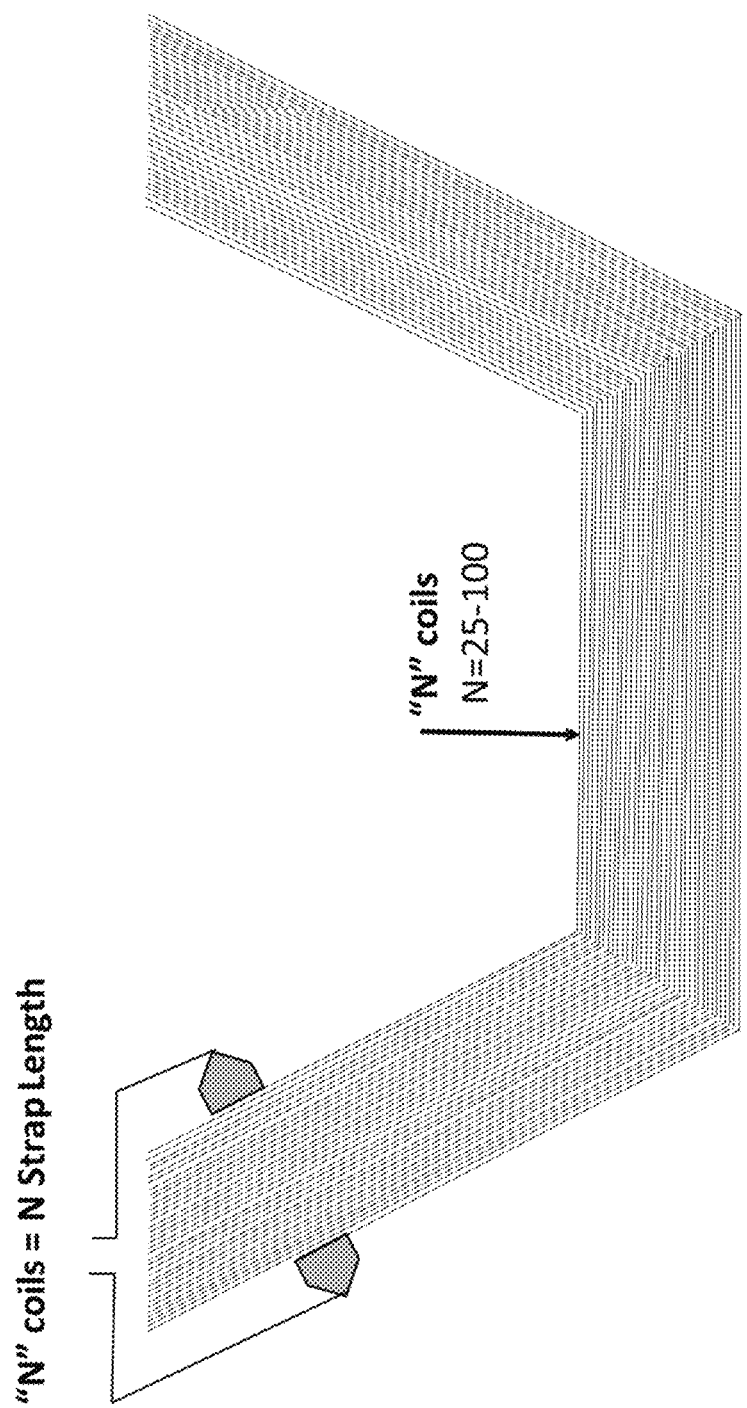
Figure 103:
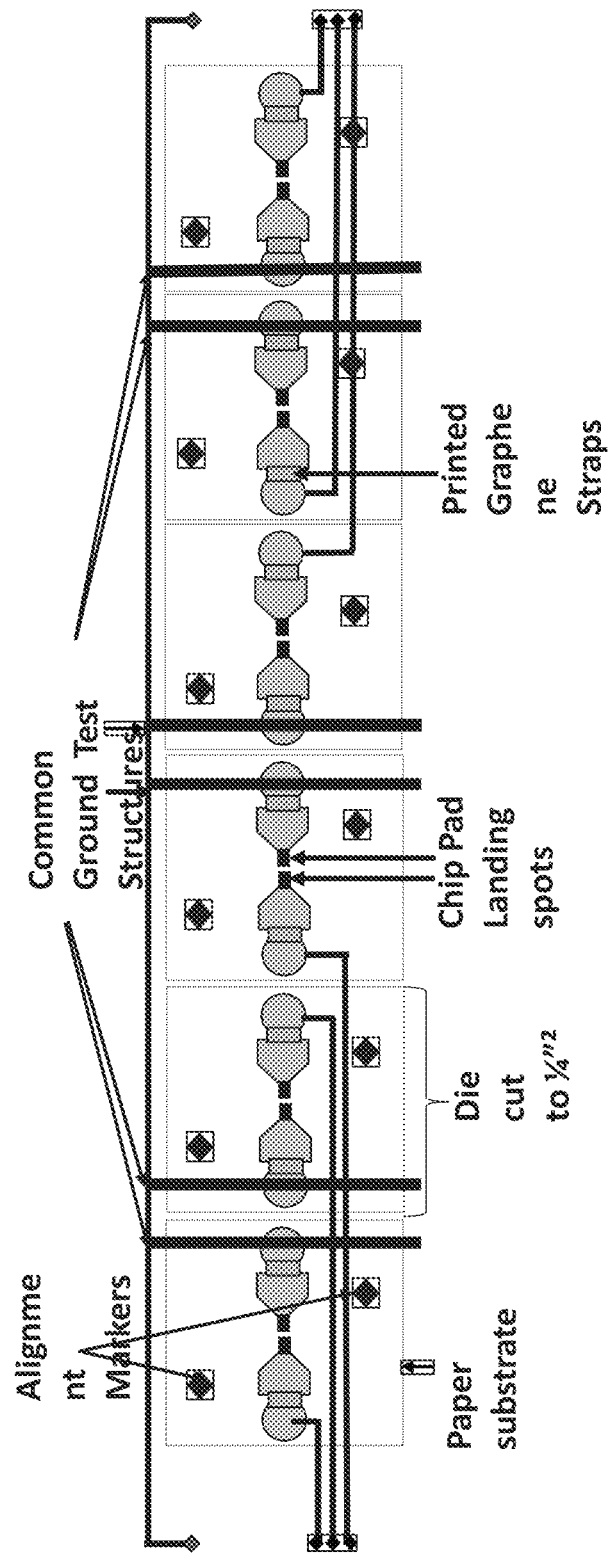
Figure 104:
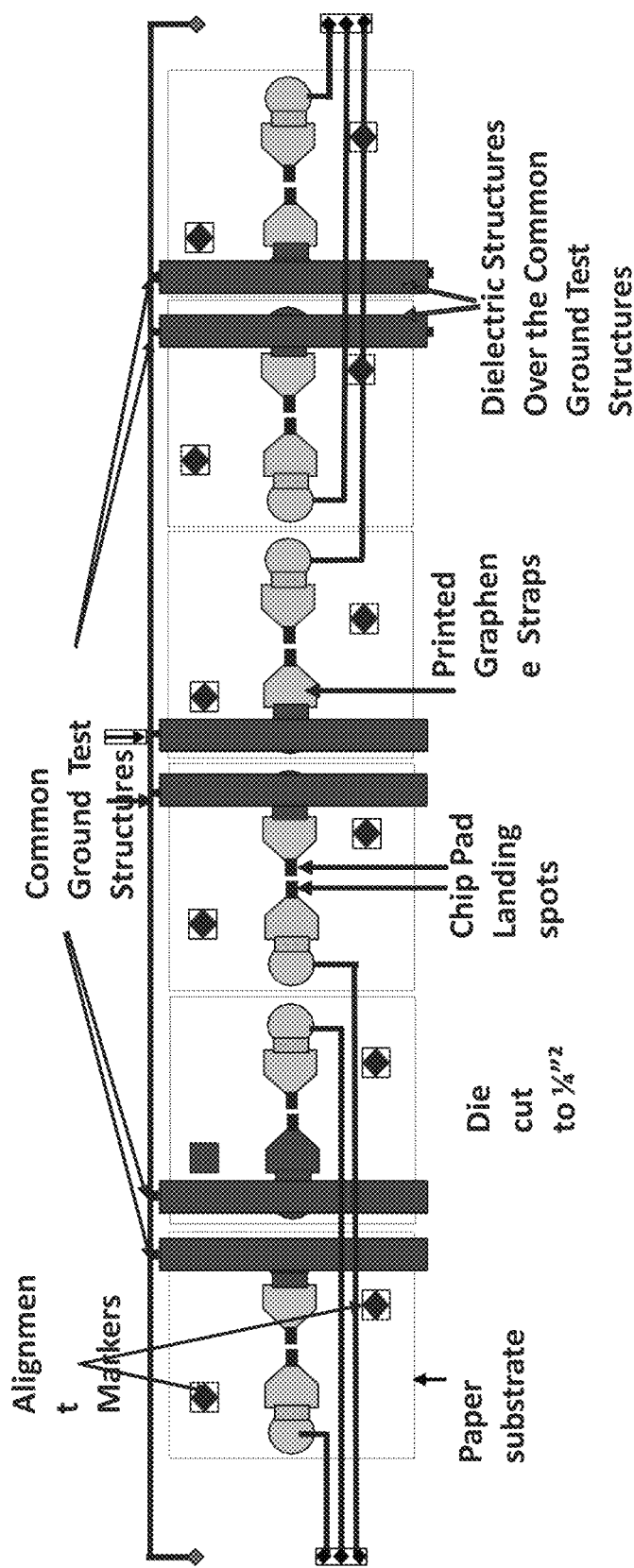
Figure 105:
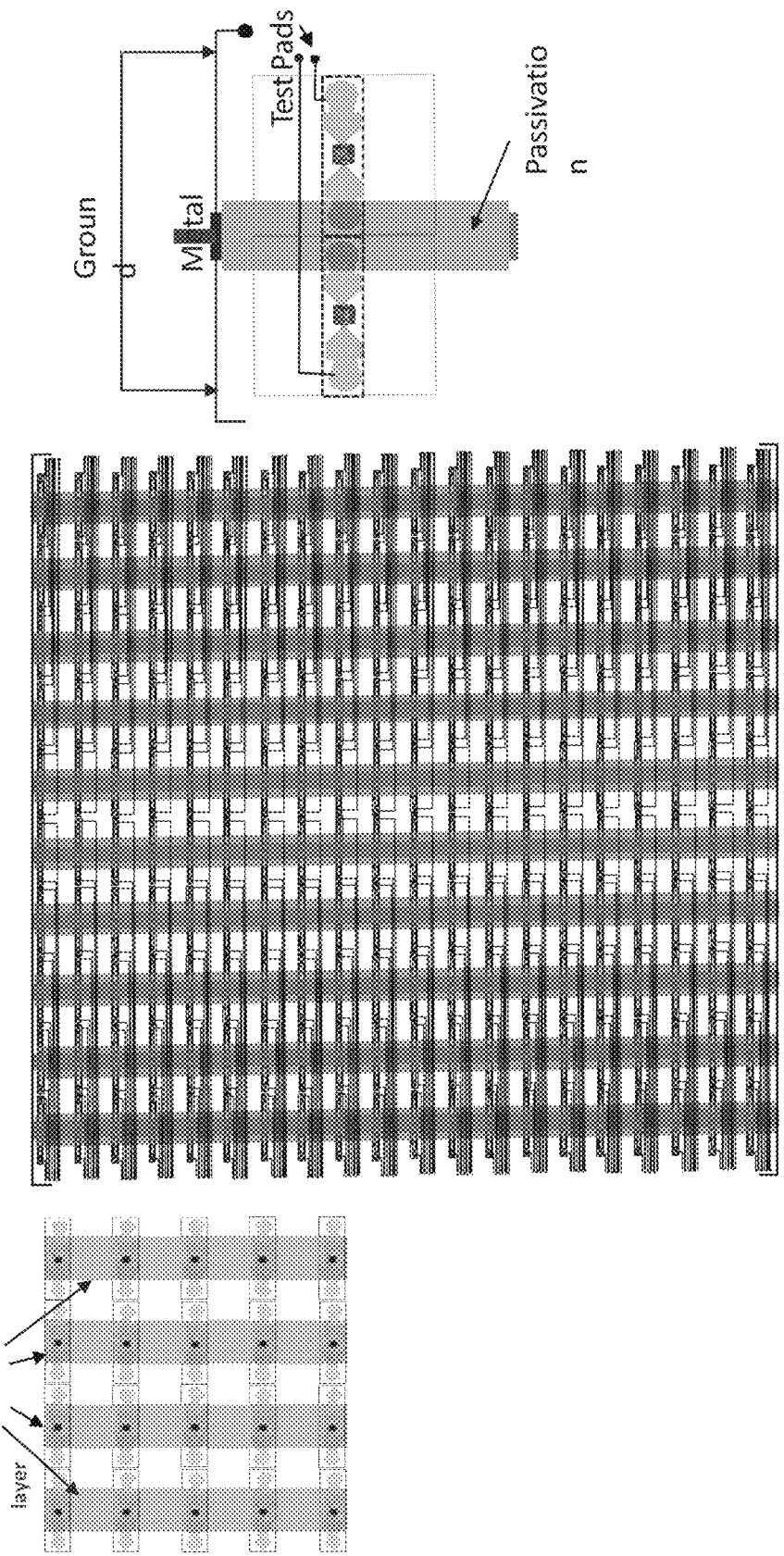
Figure 106:
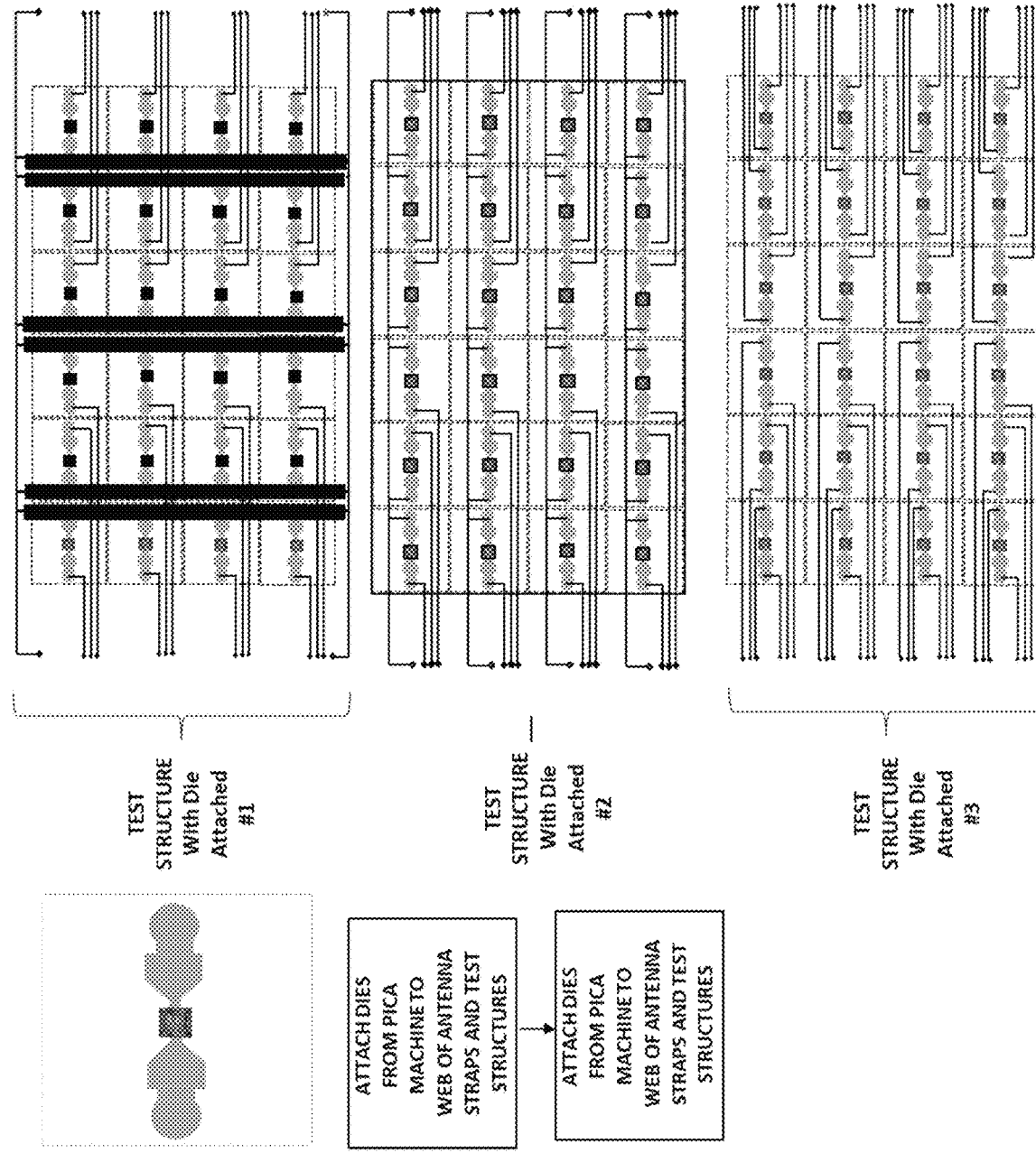
Figure 107:
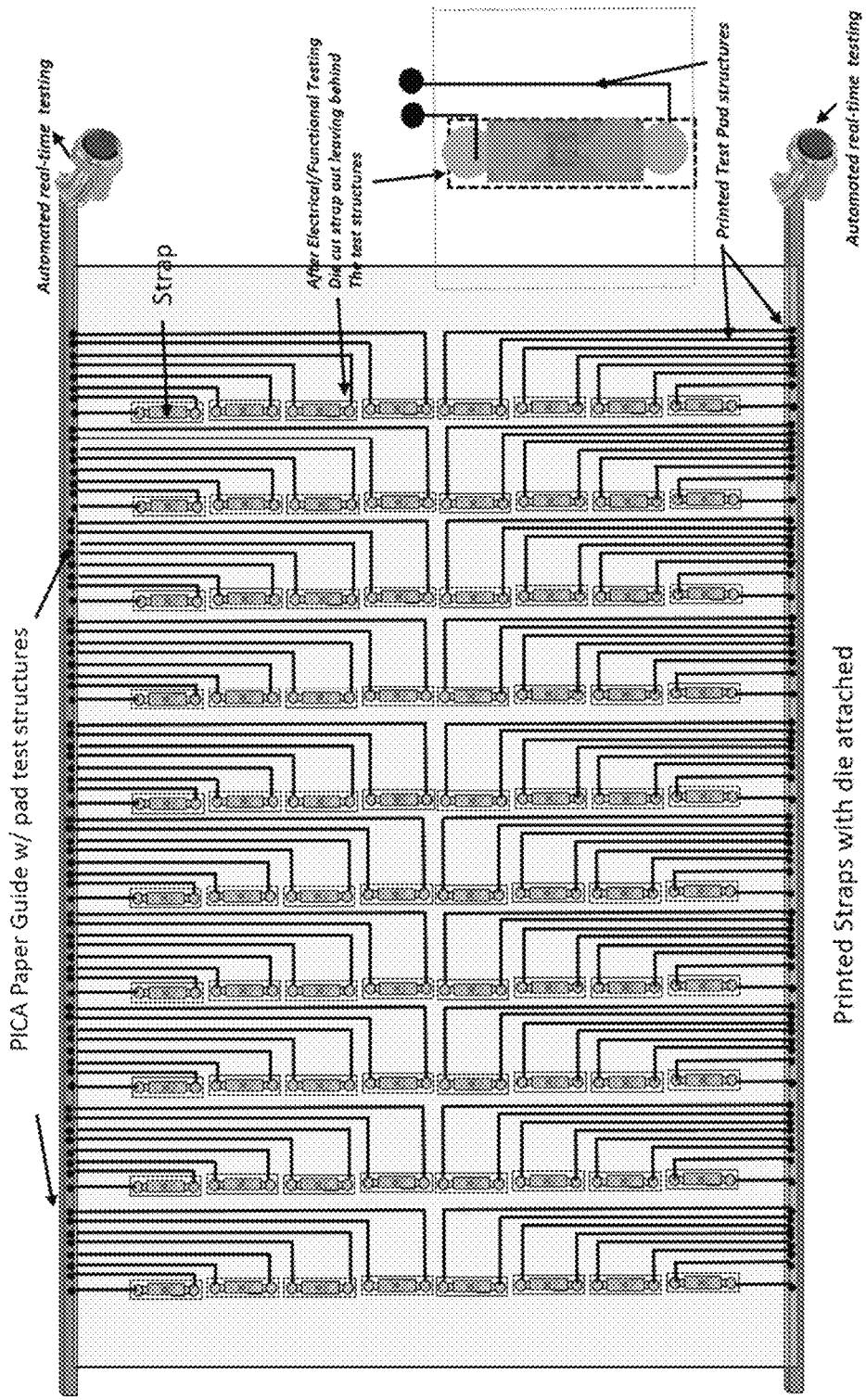
Figure 108:
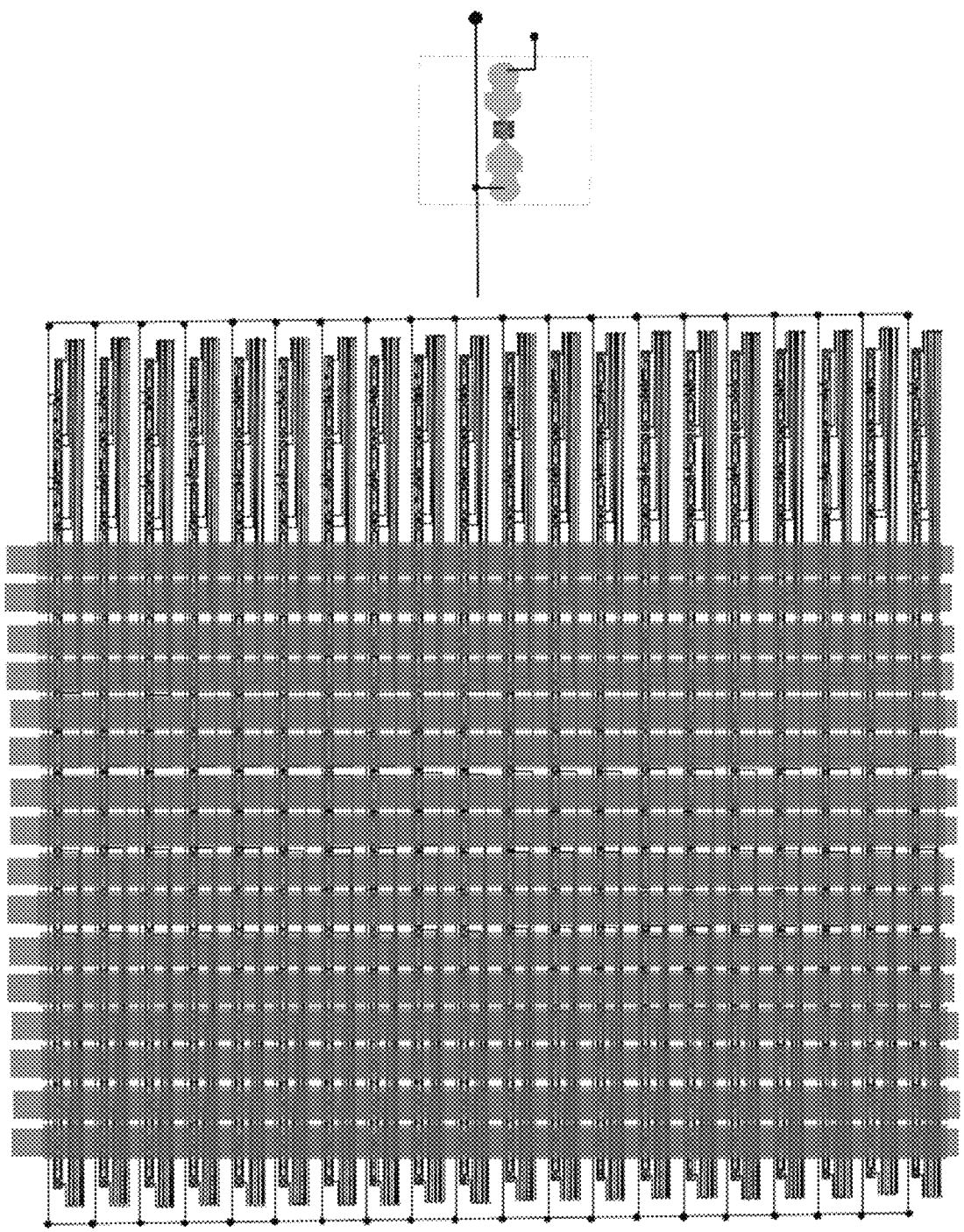
Figure 109:
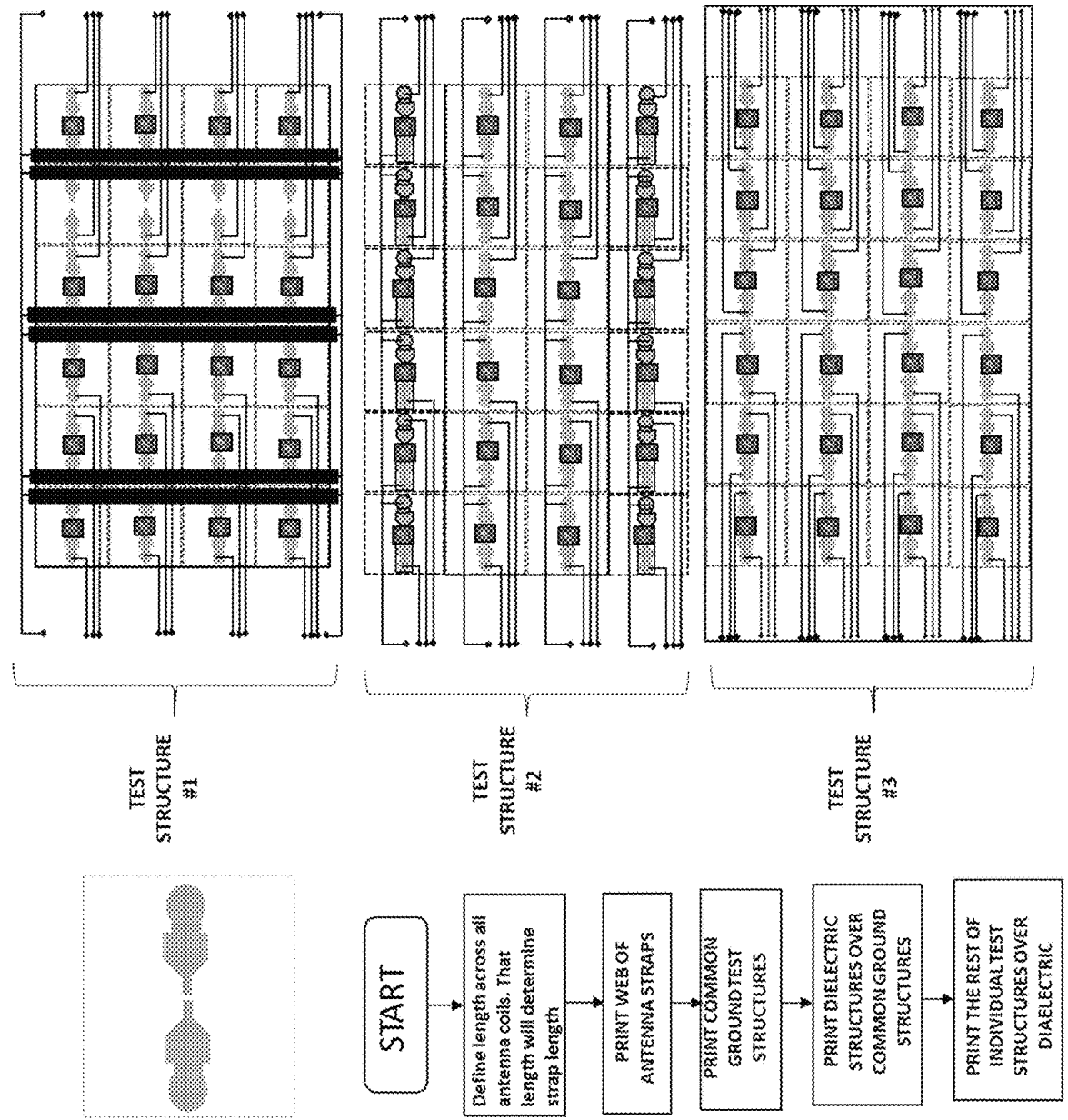
Figure 110:
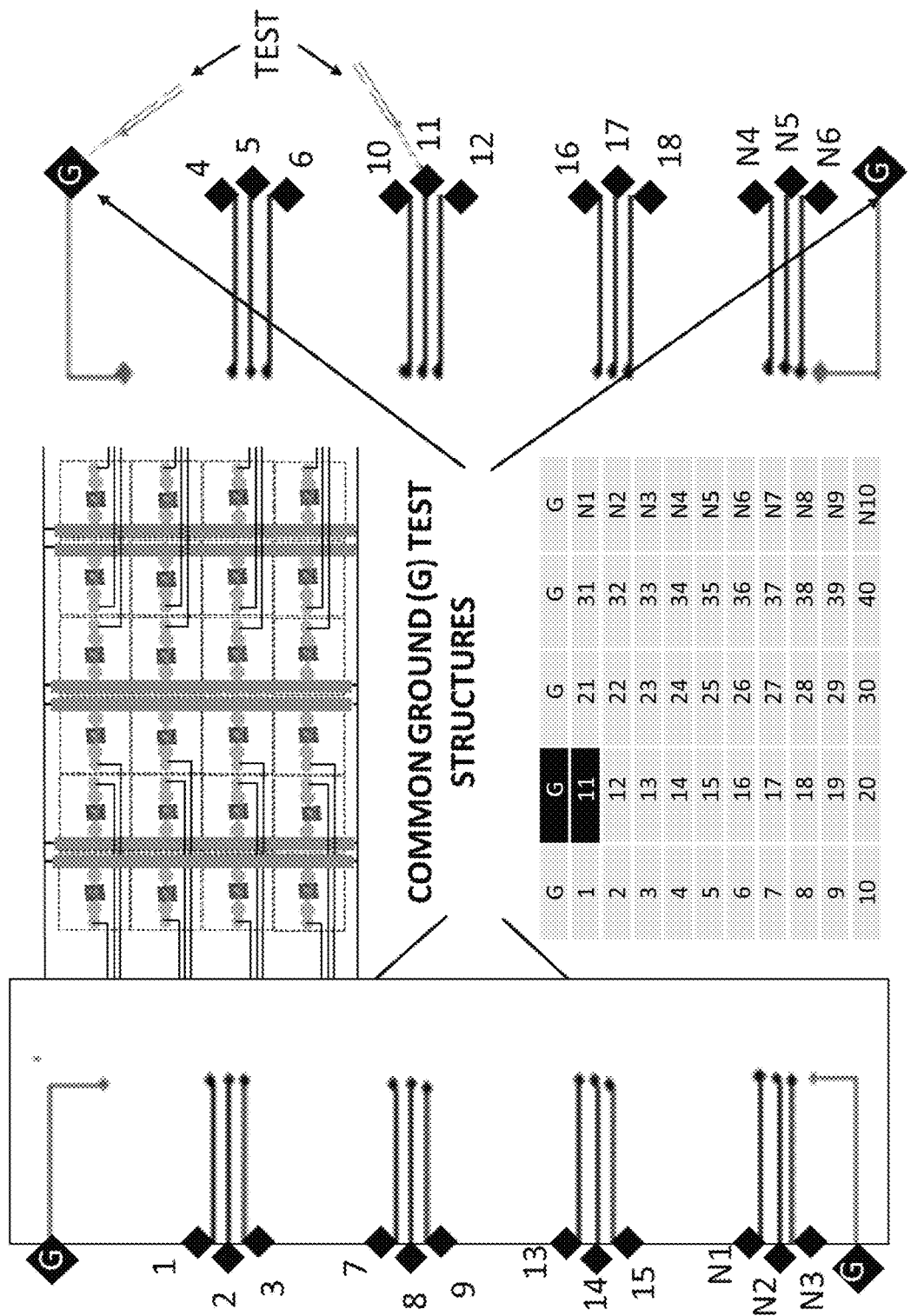
Figure 111:
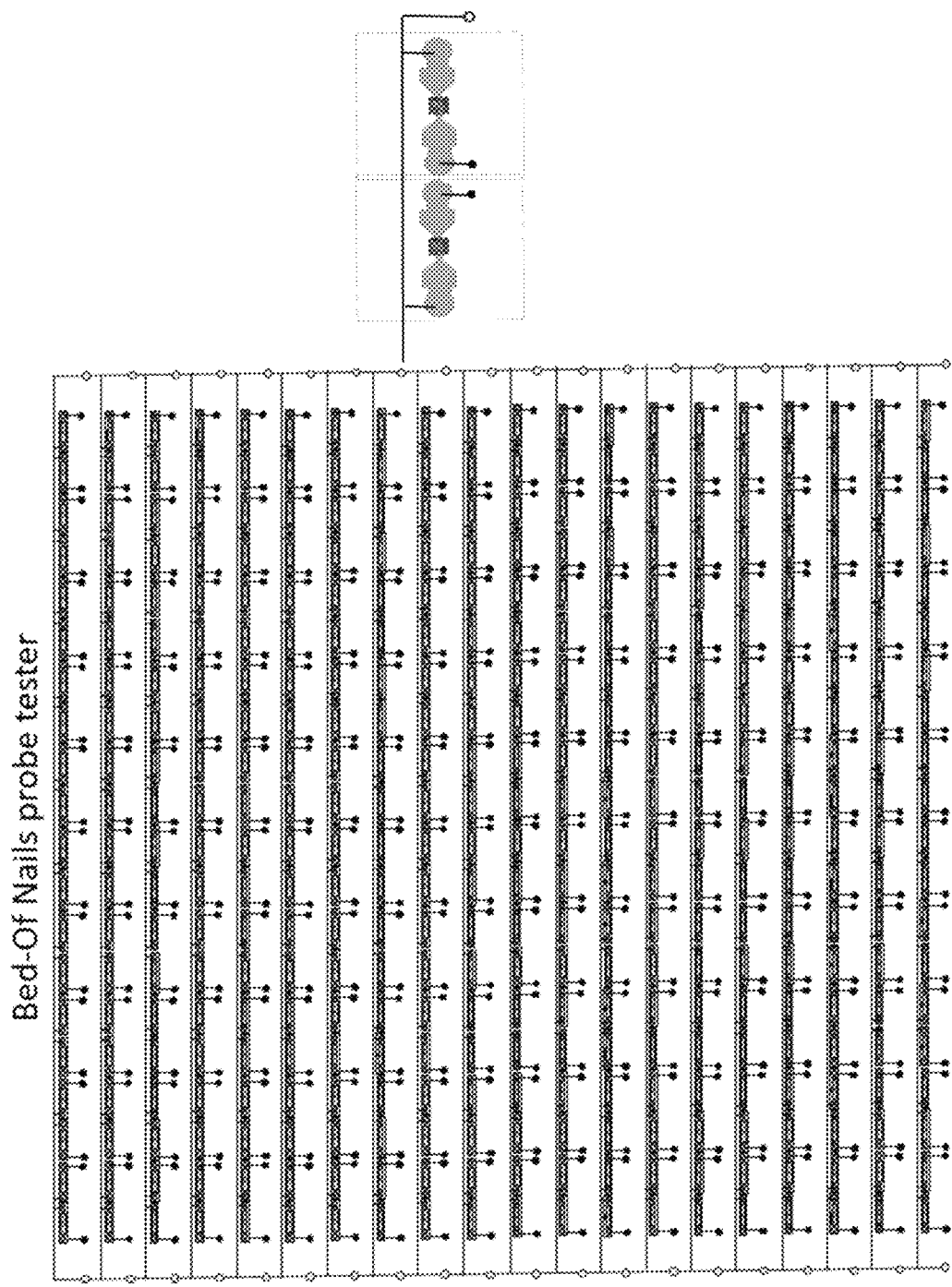
Figure 112:
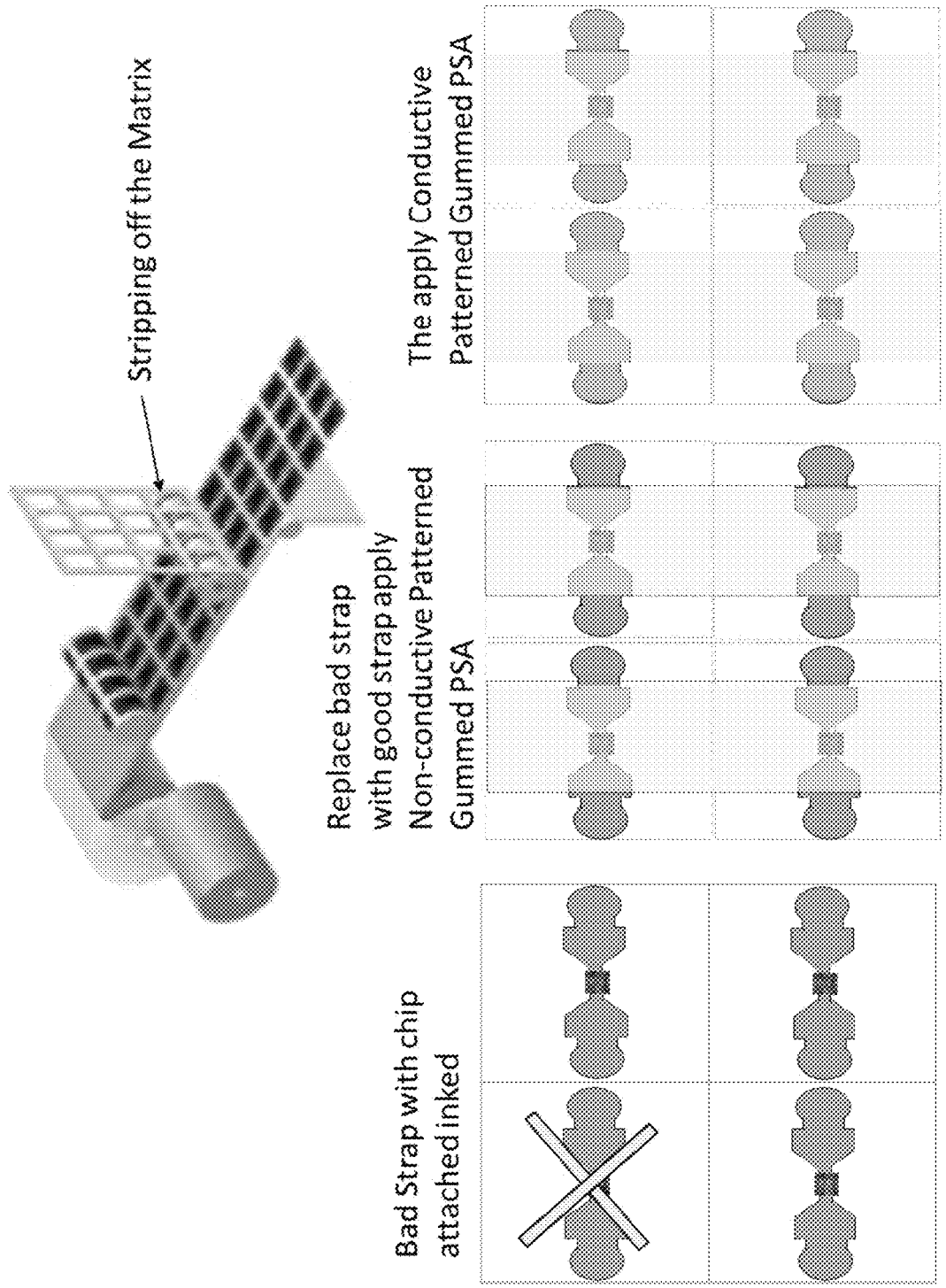
Figure 113:
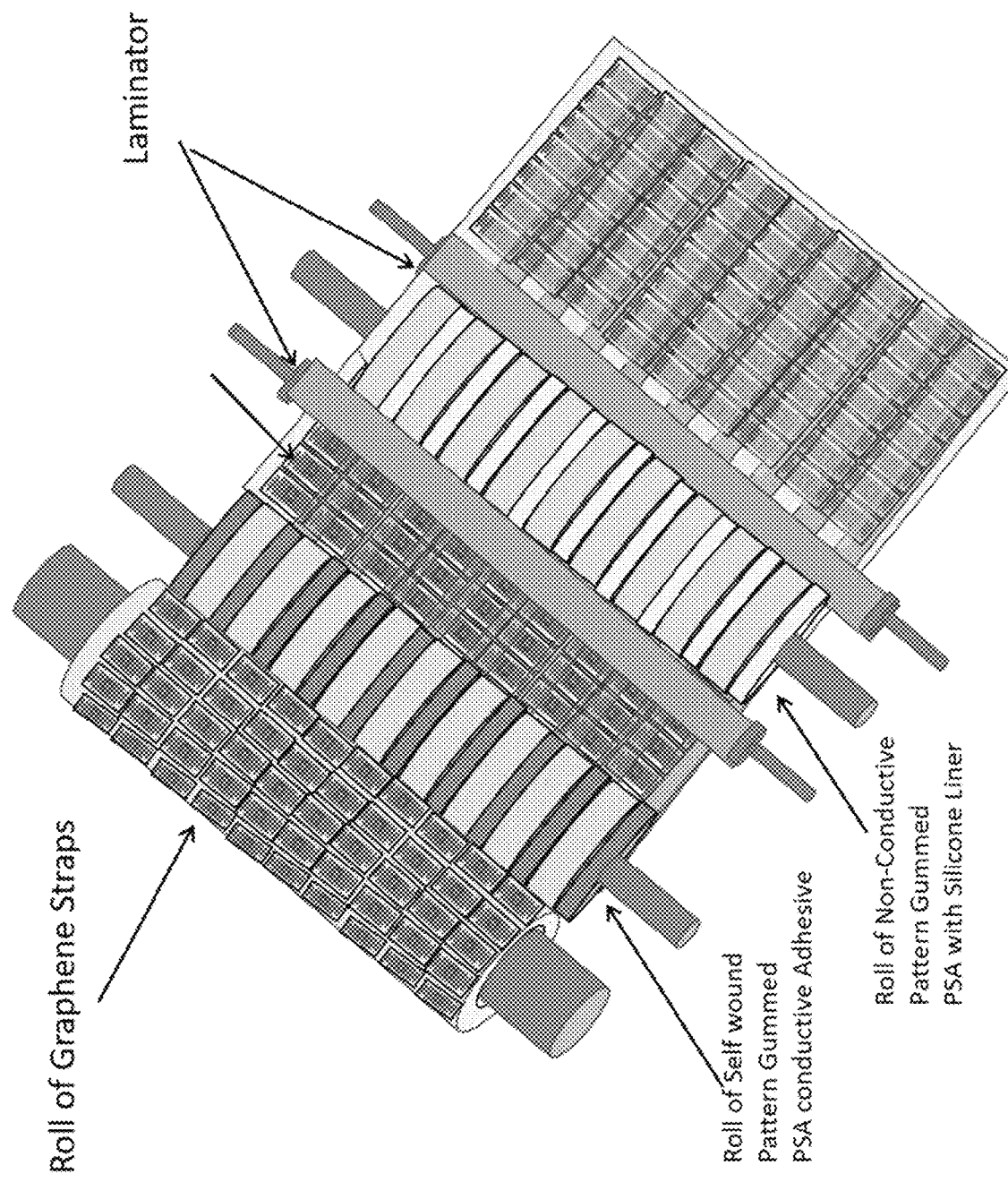
Figure 114:
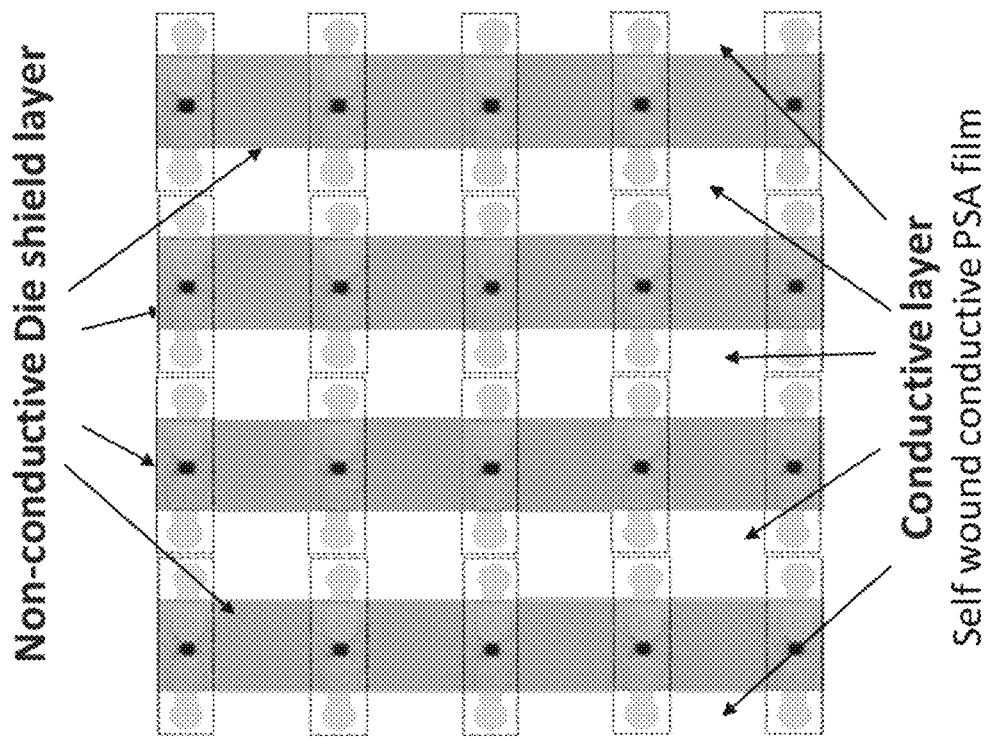
Figure 115:
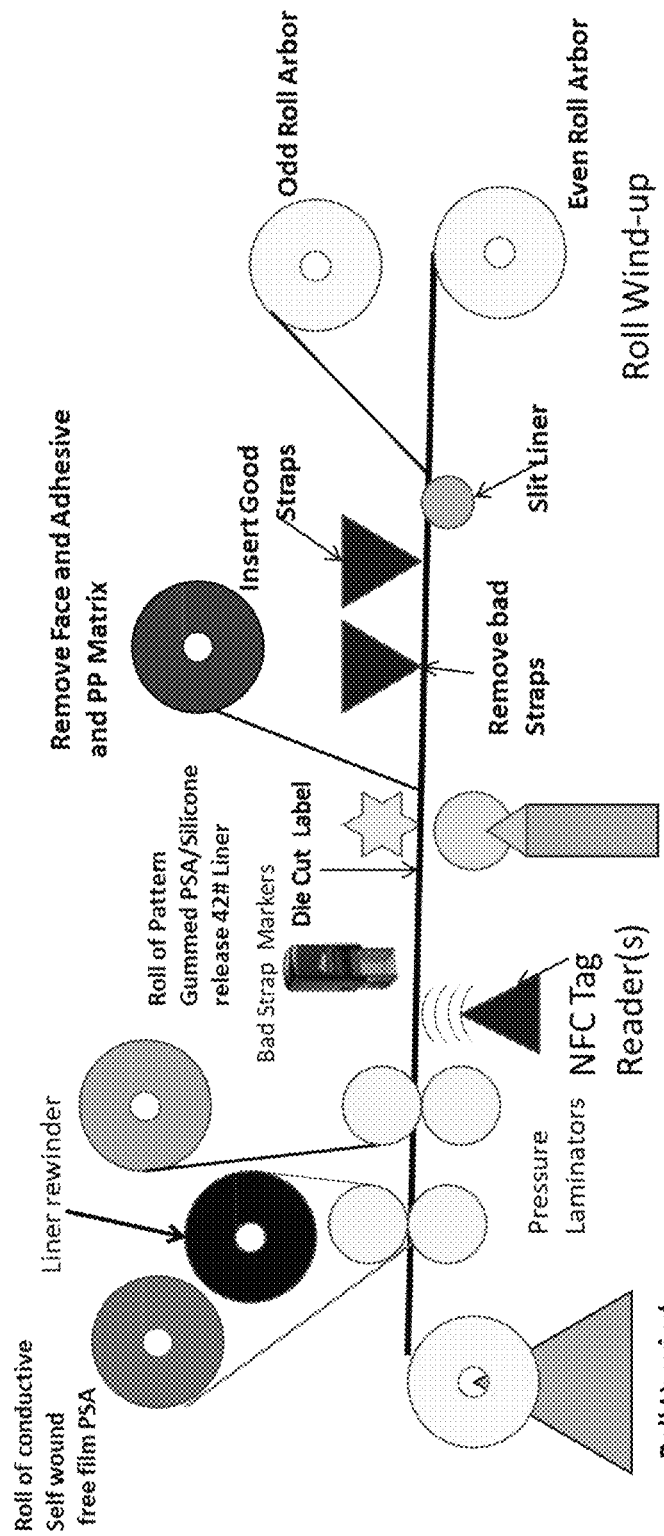
Figure 116:
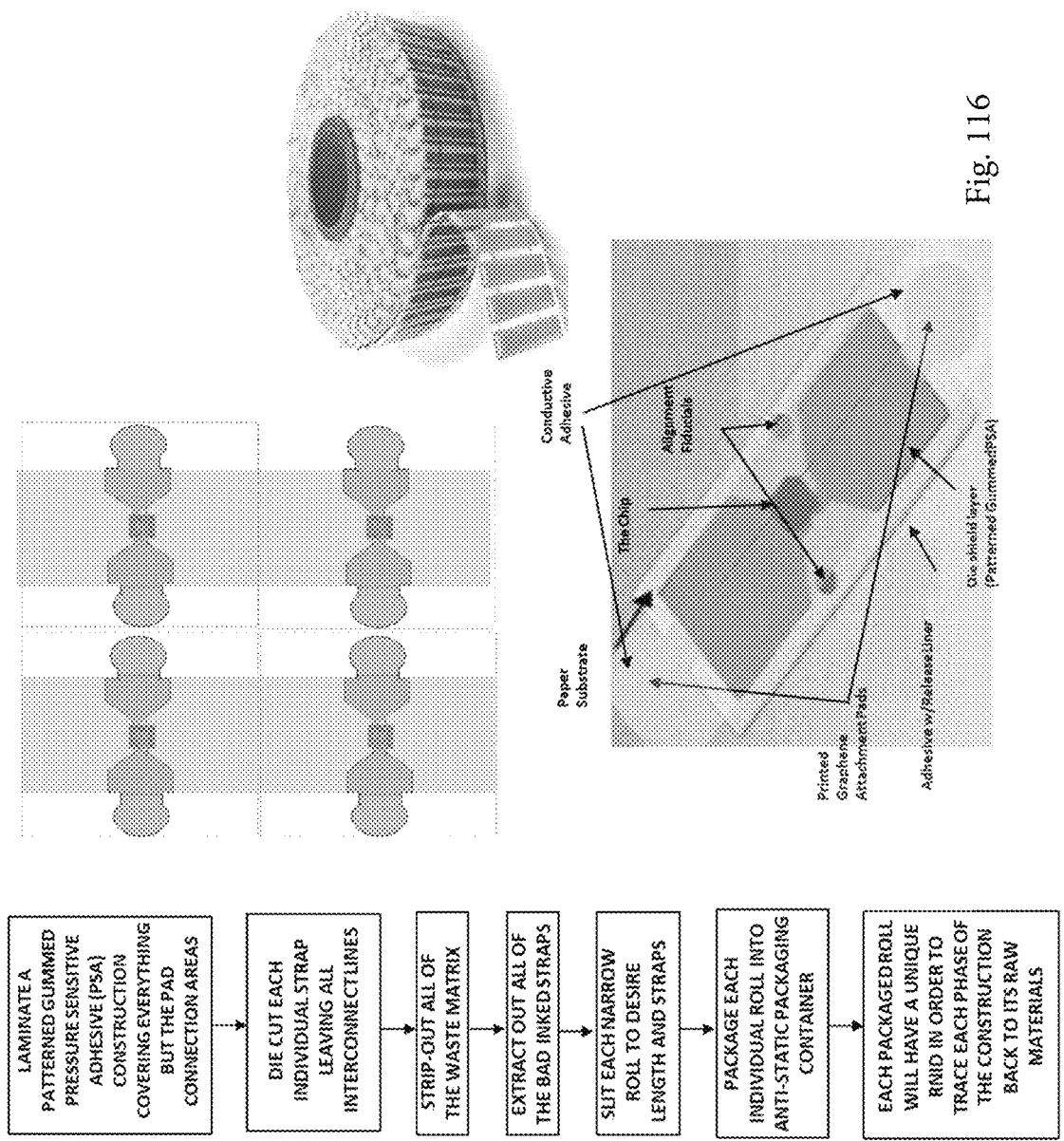
Figure 117:
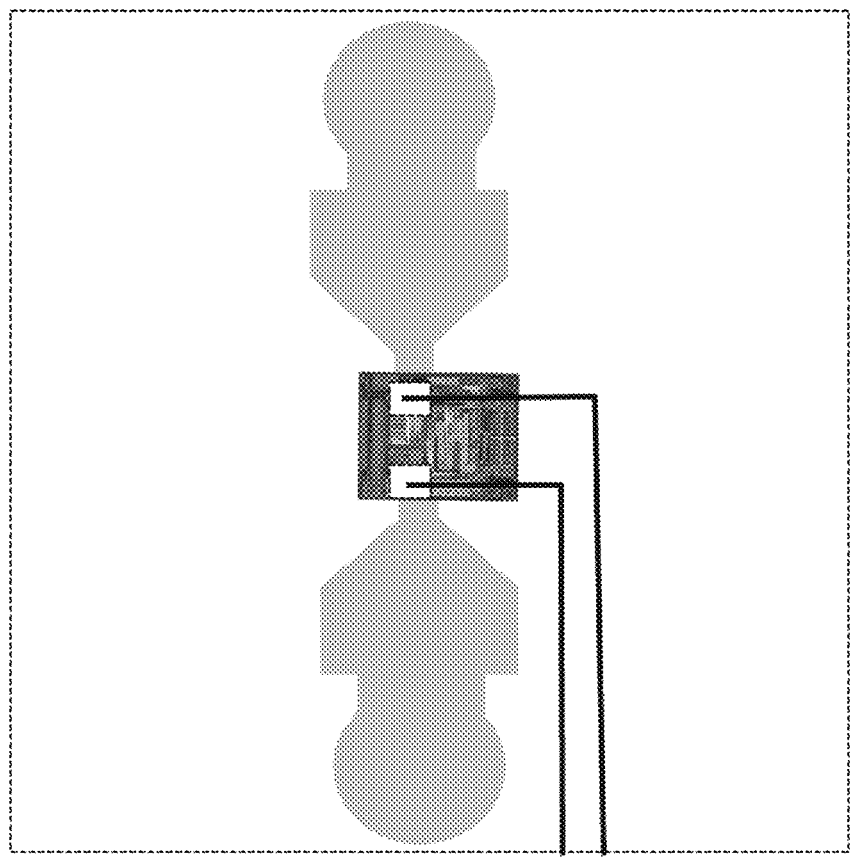
Figure 118:
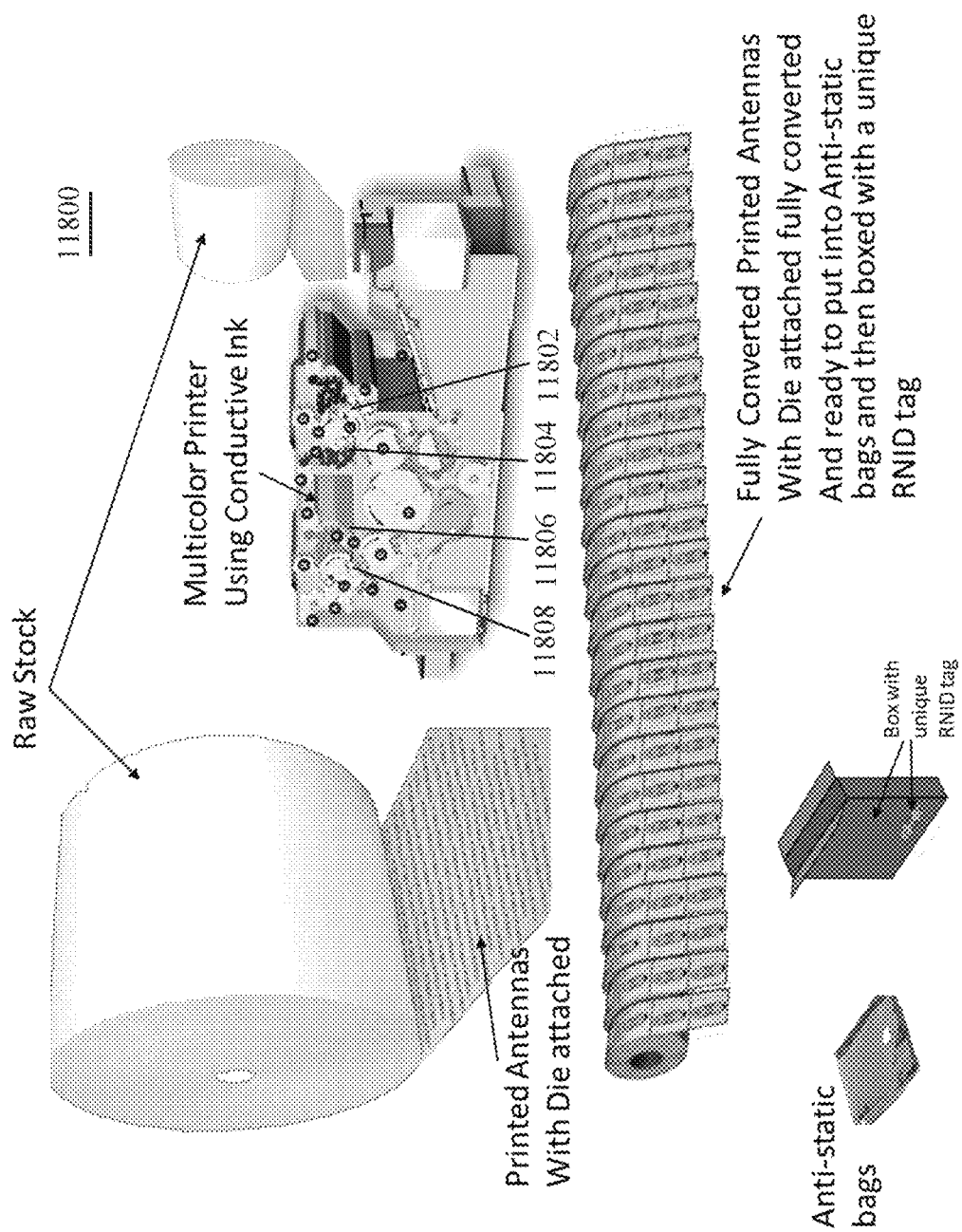
Figure 119:
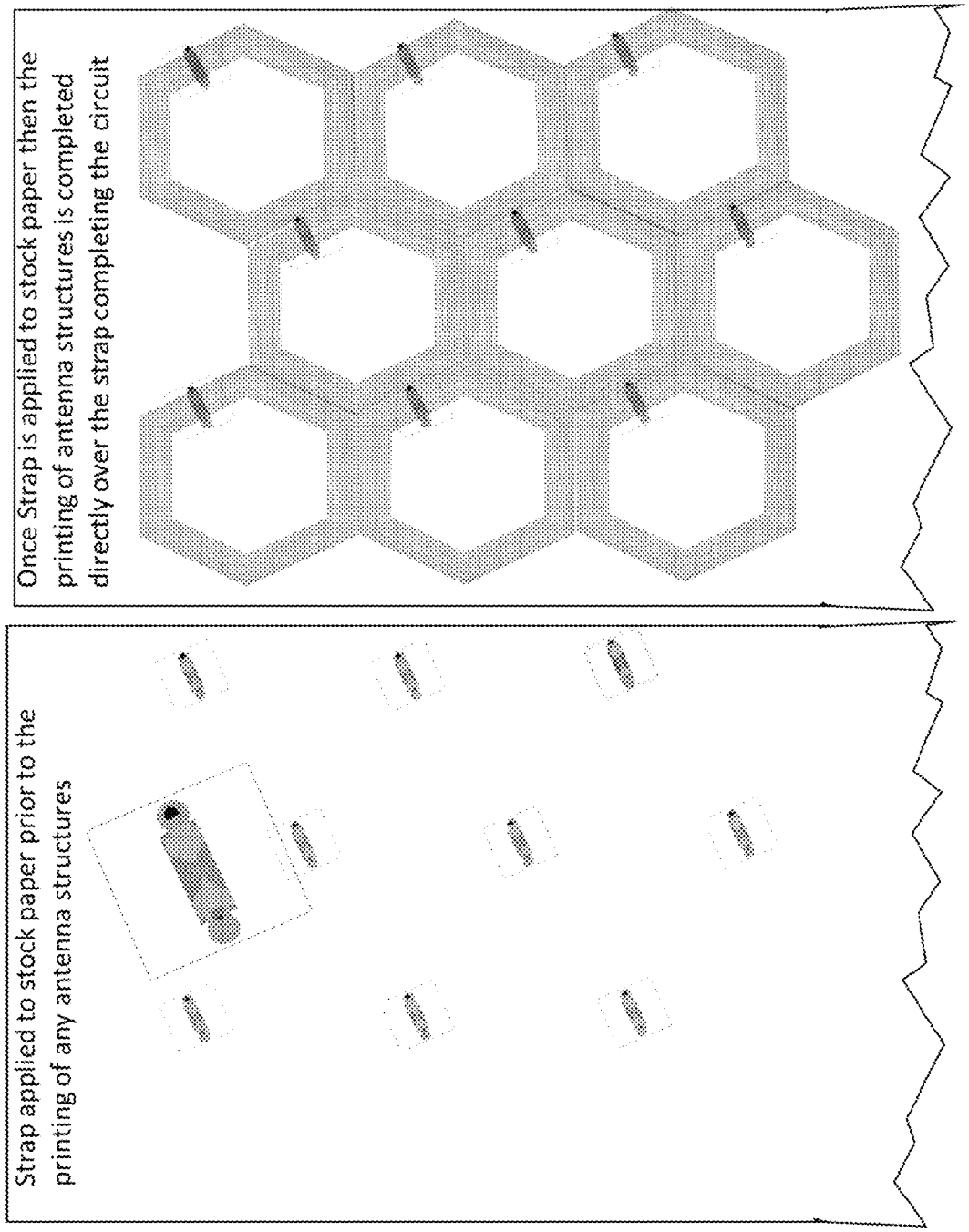
Figure 120:
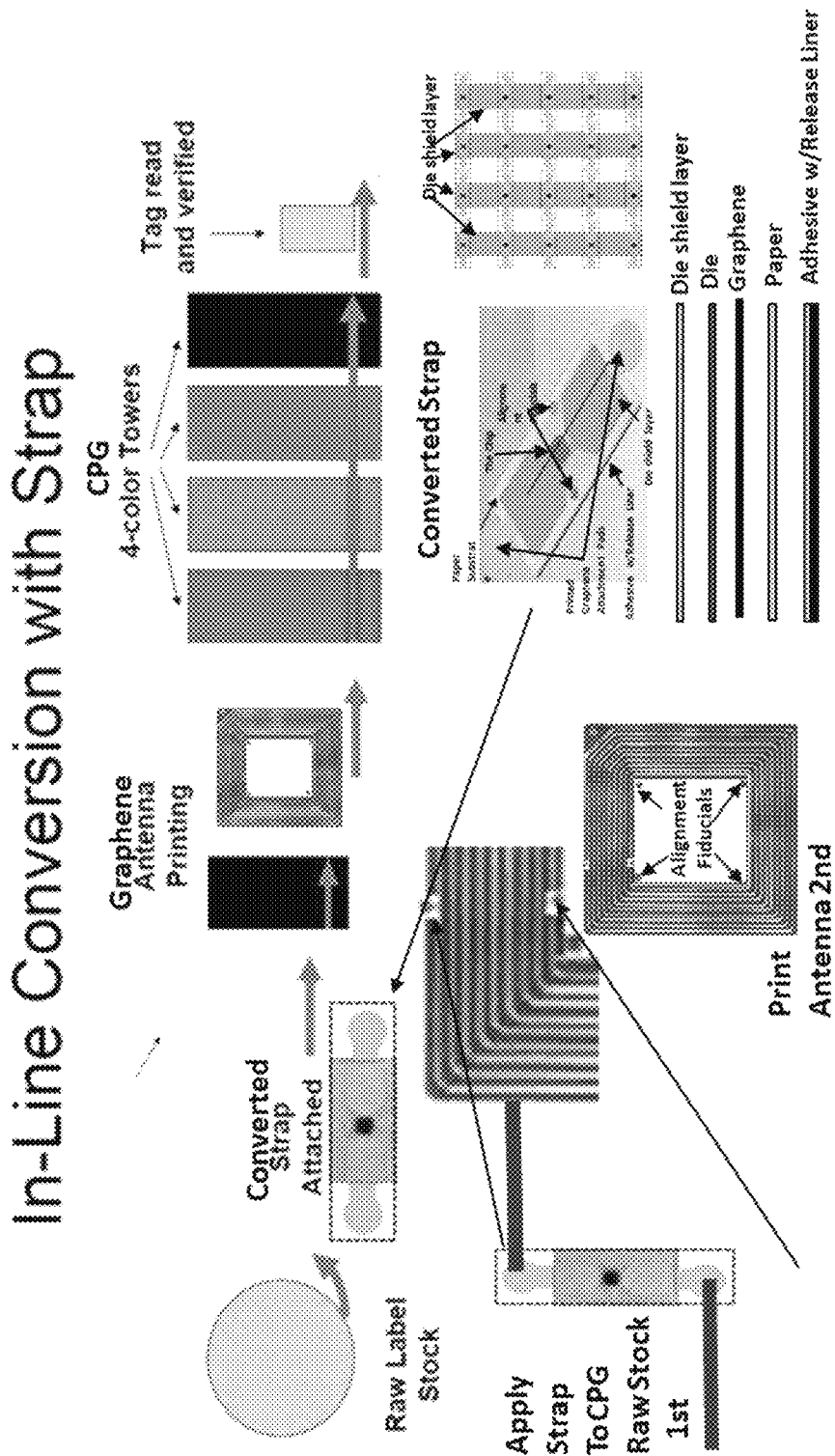
Figure 121:
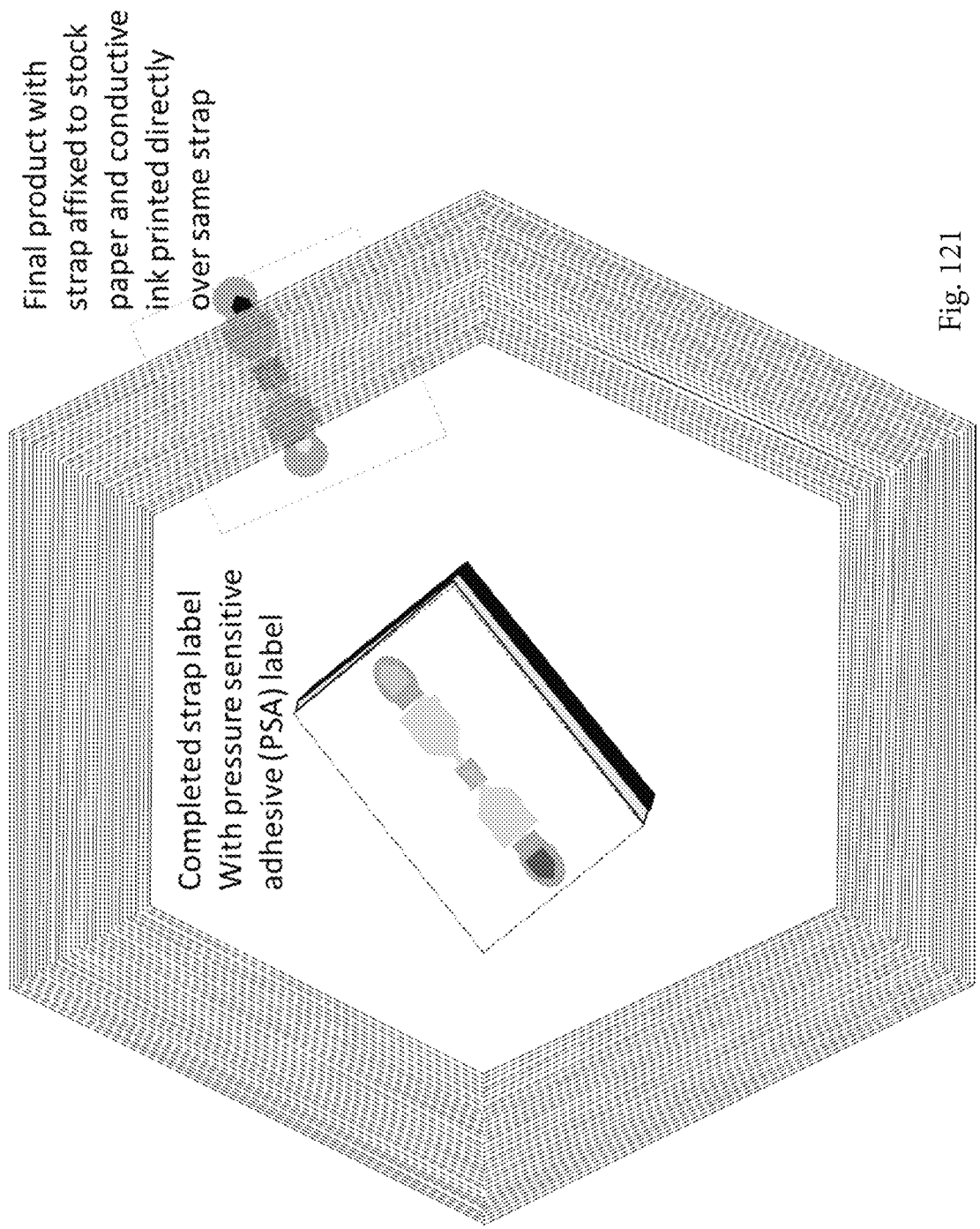
Figure 122:
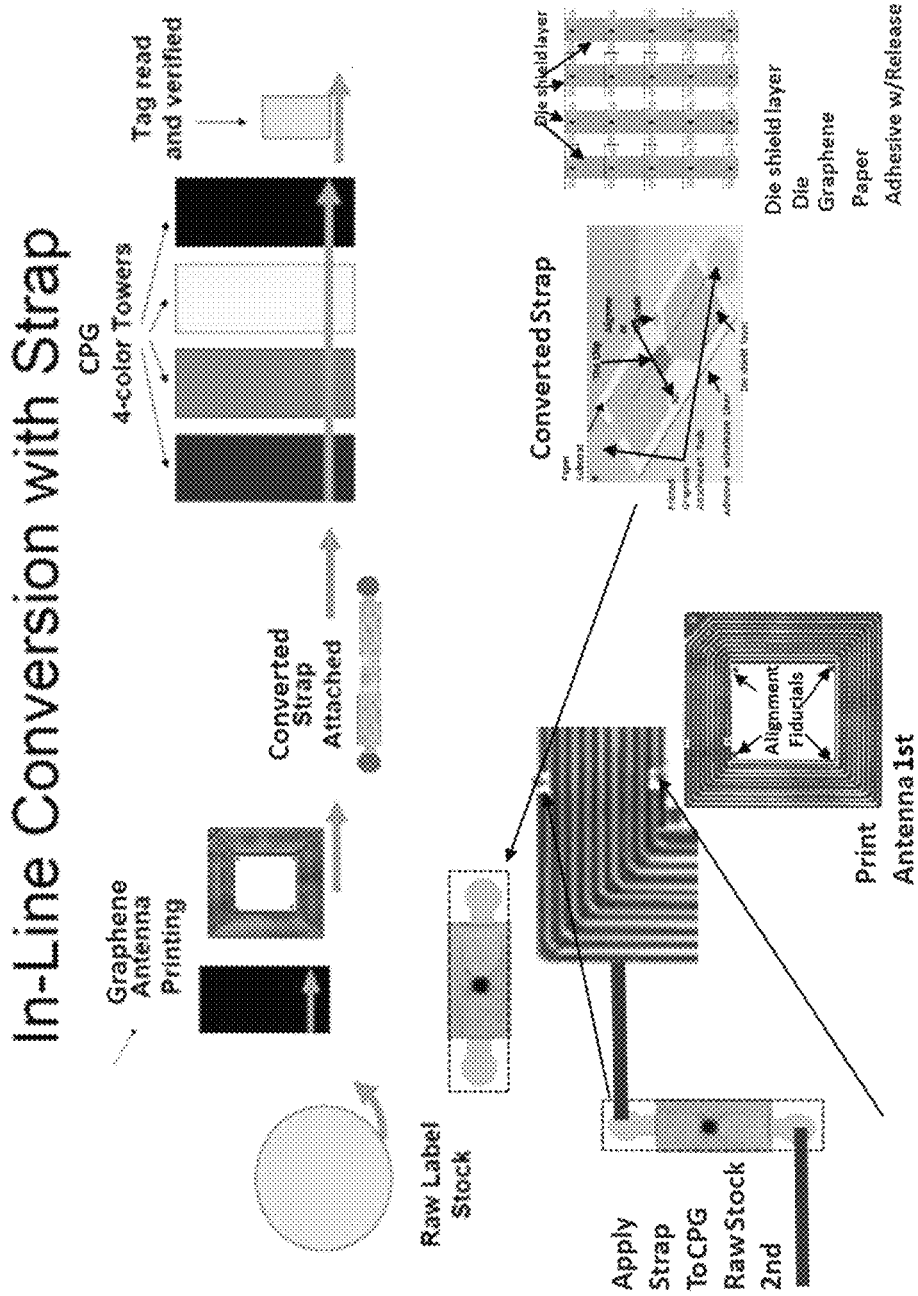
Figure 123:
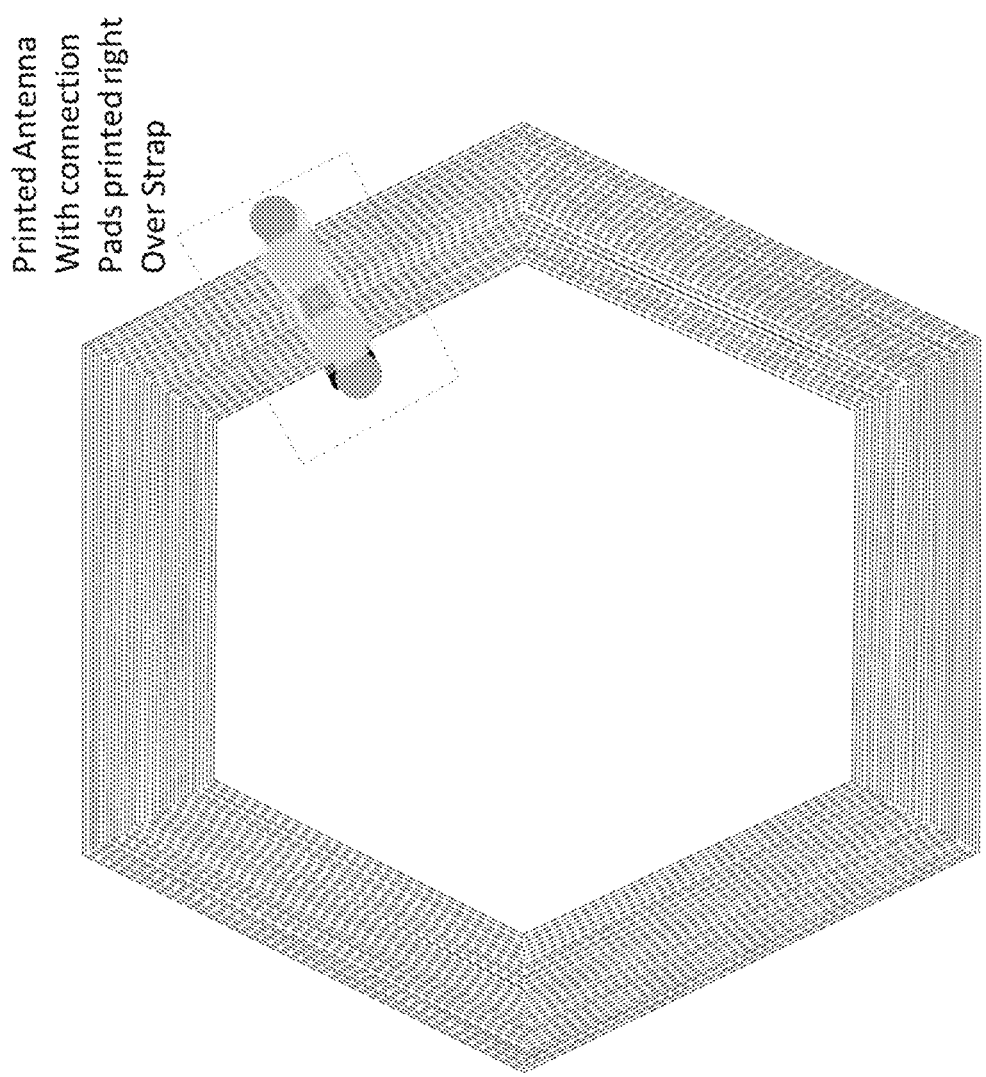
Figure 124:
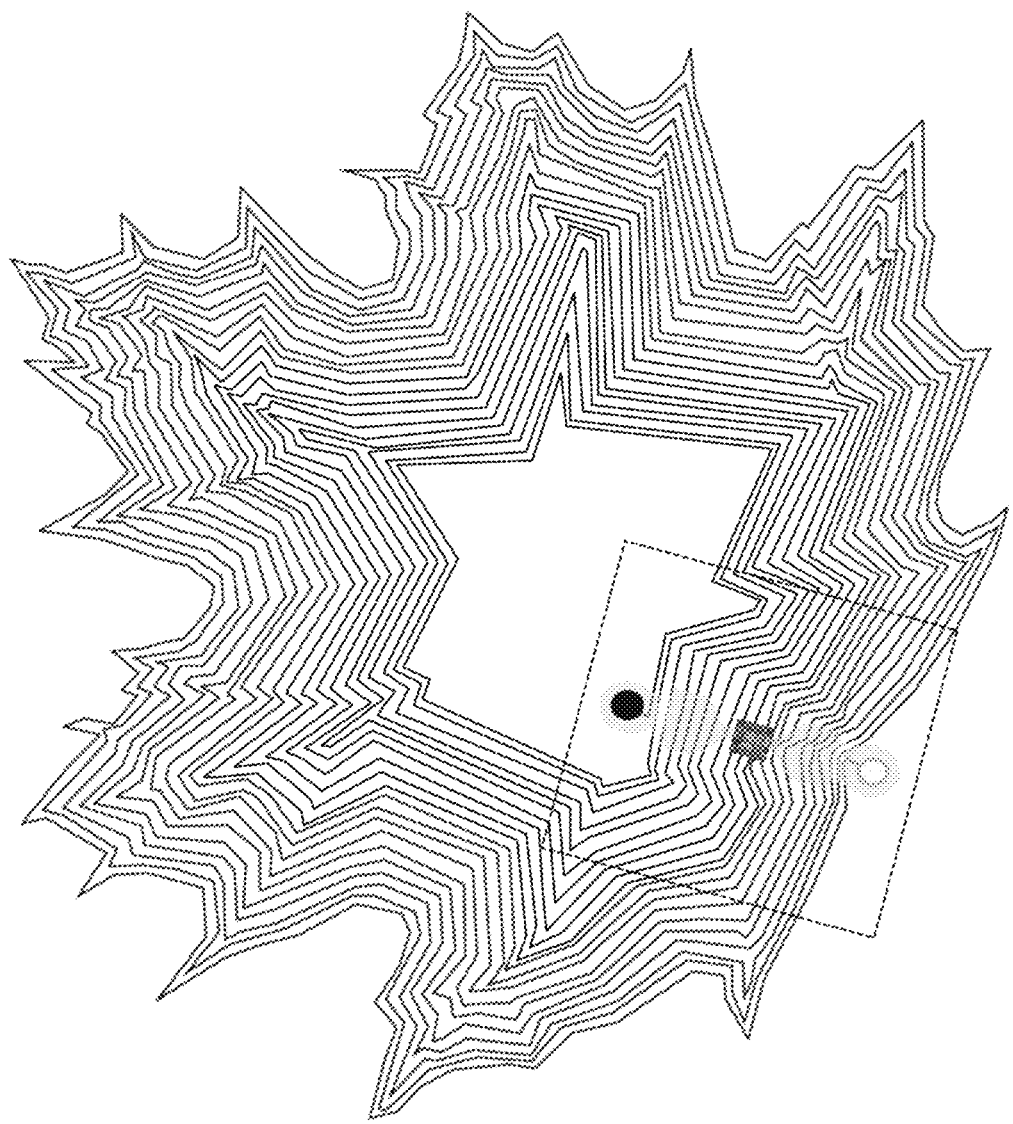
Figure 125:
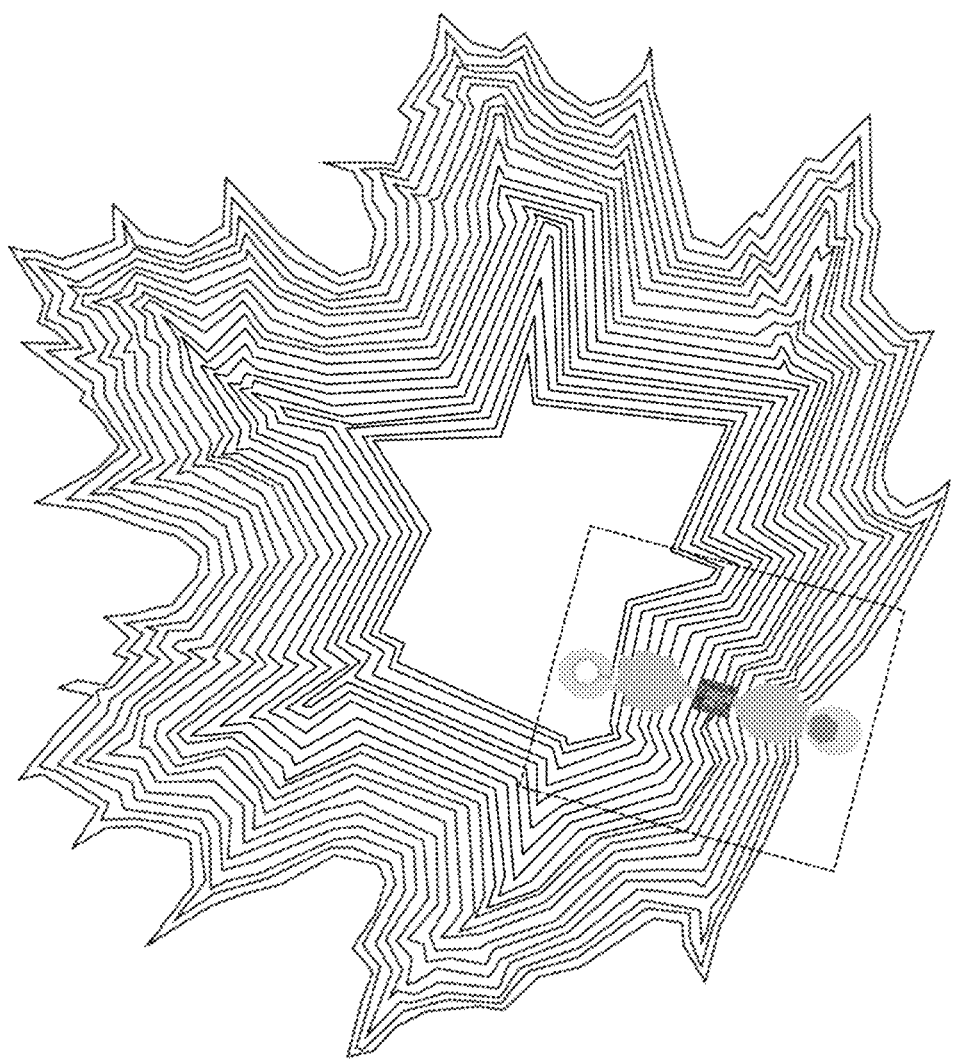
Figure 126:
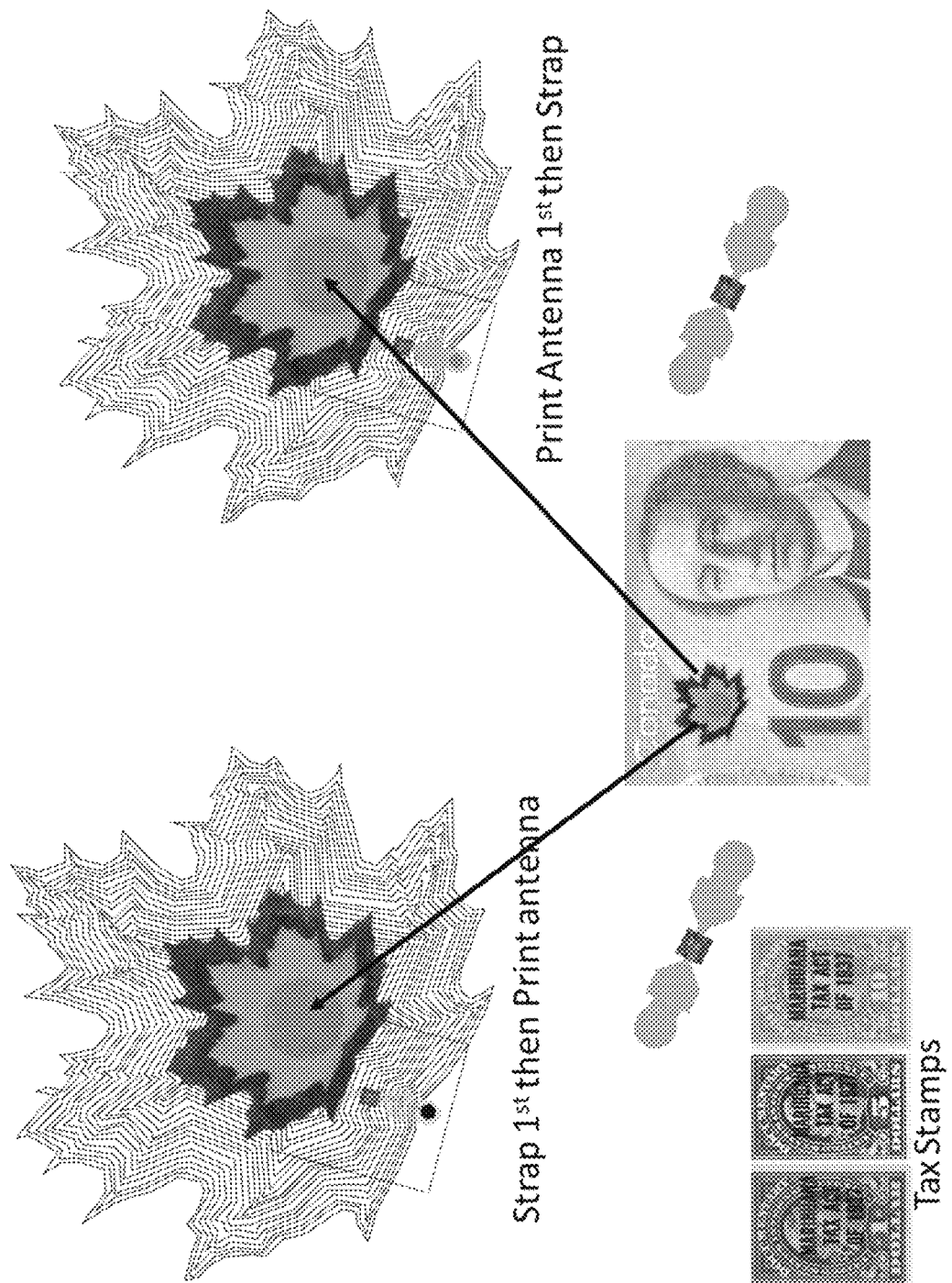
Figure 127:
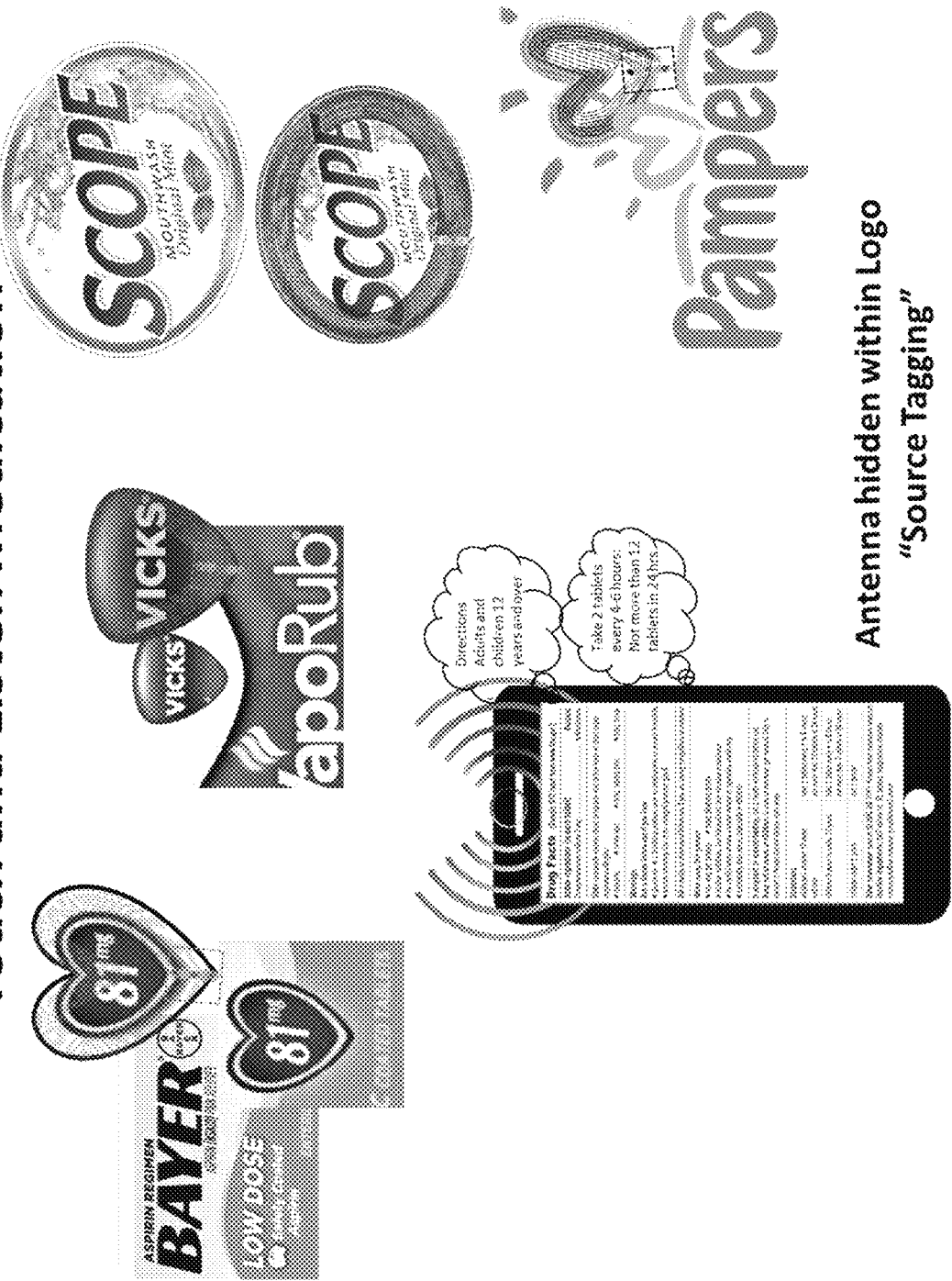
Figure 128:
Figure 129:
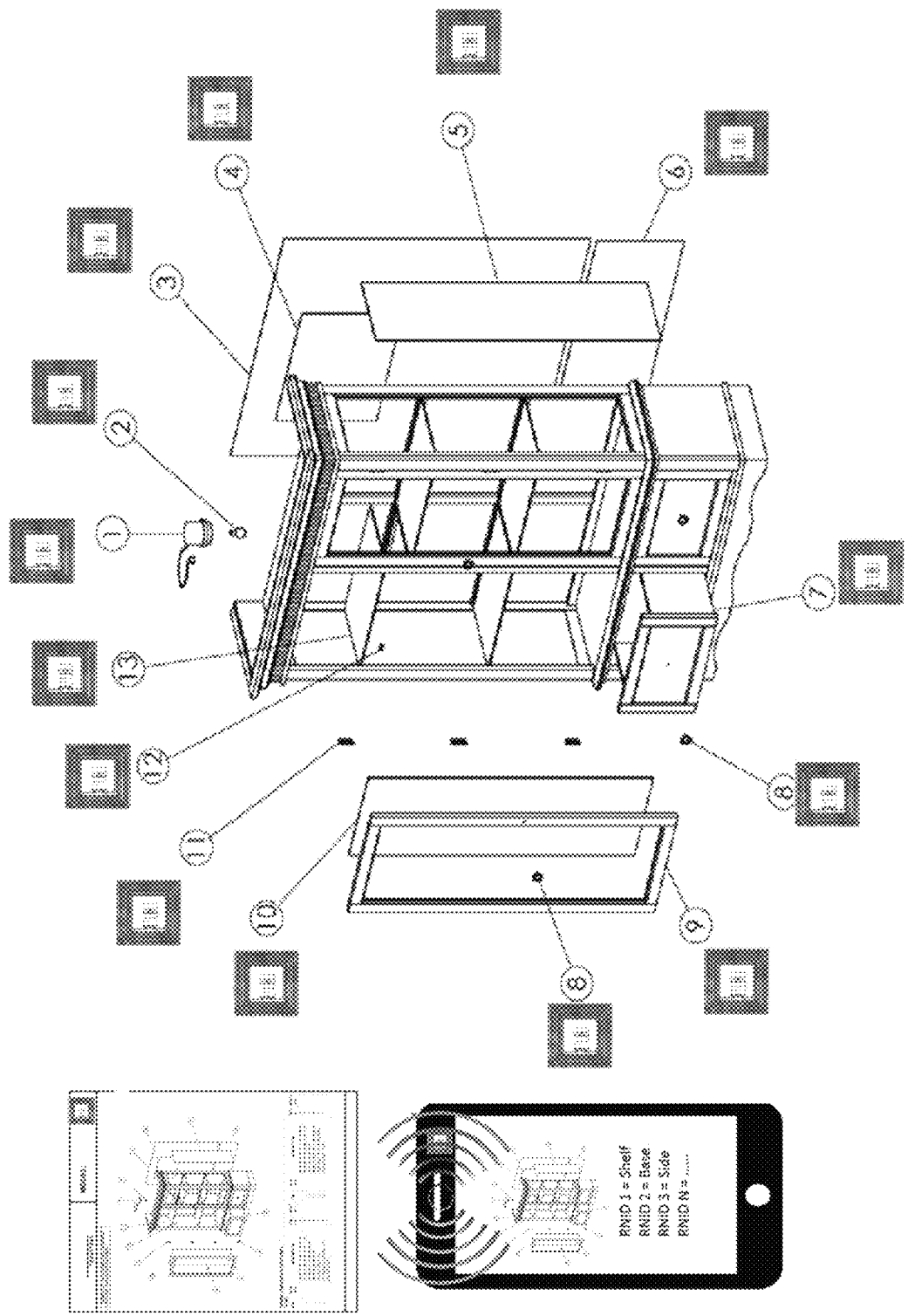
Figure 130:
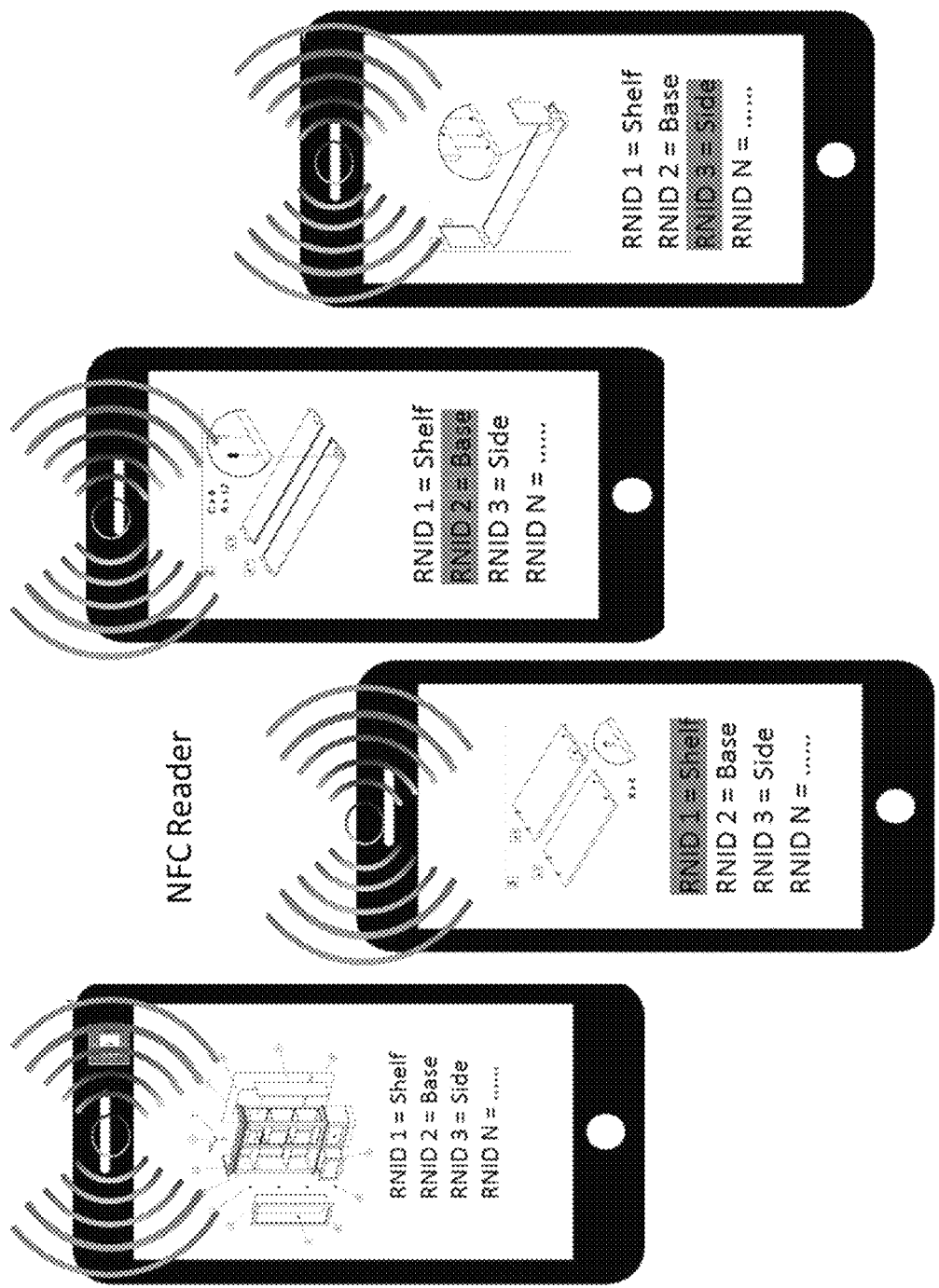
Figure 131:
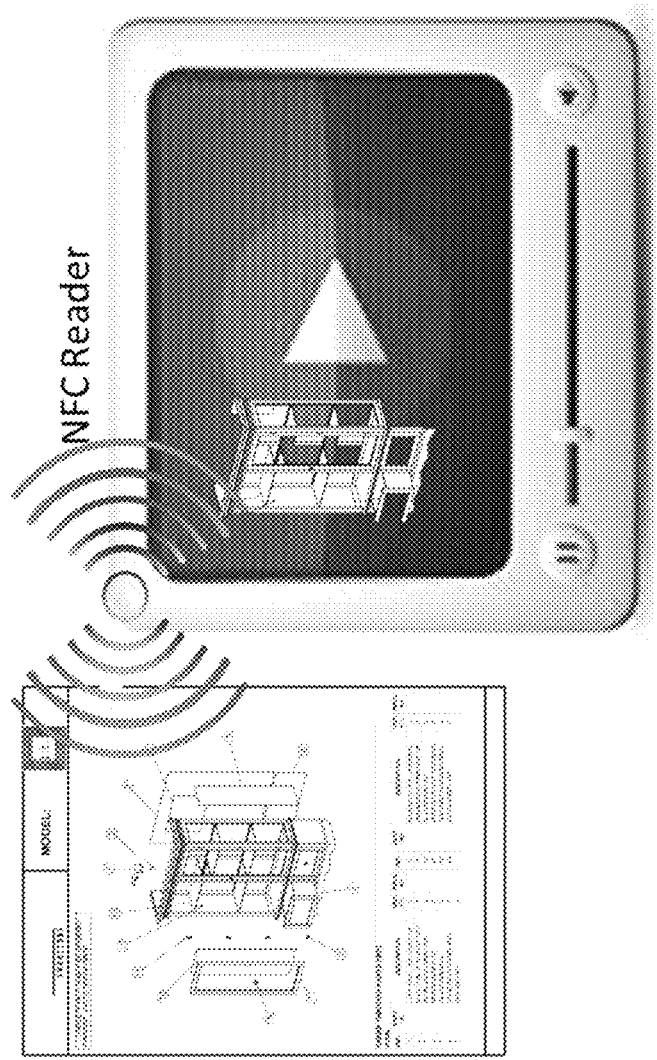
Figure 132:
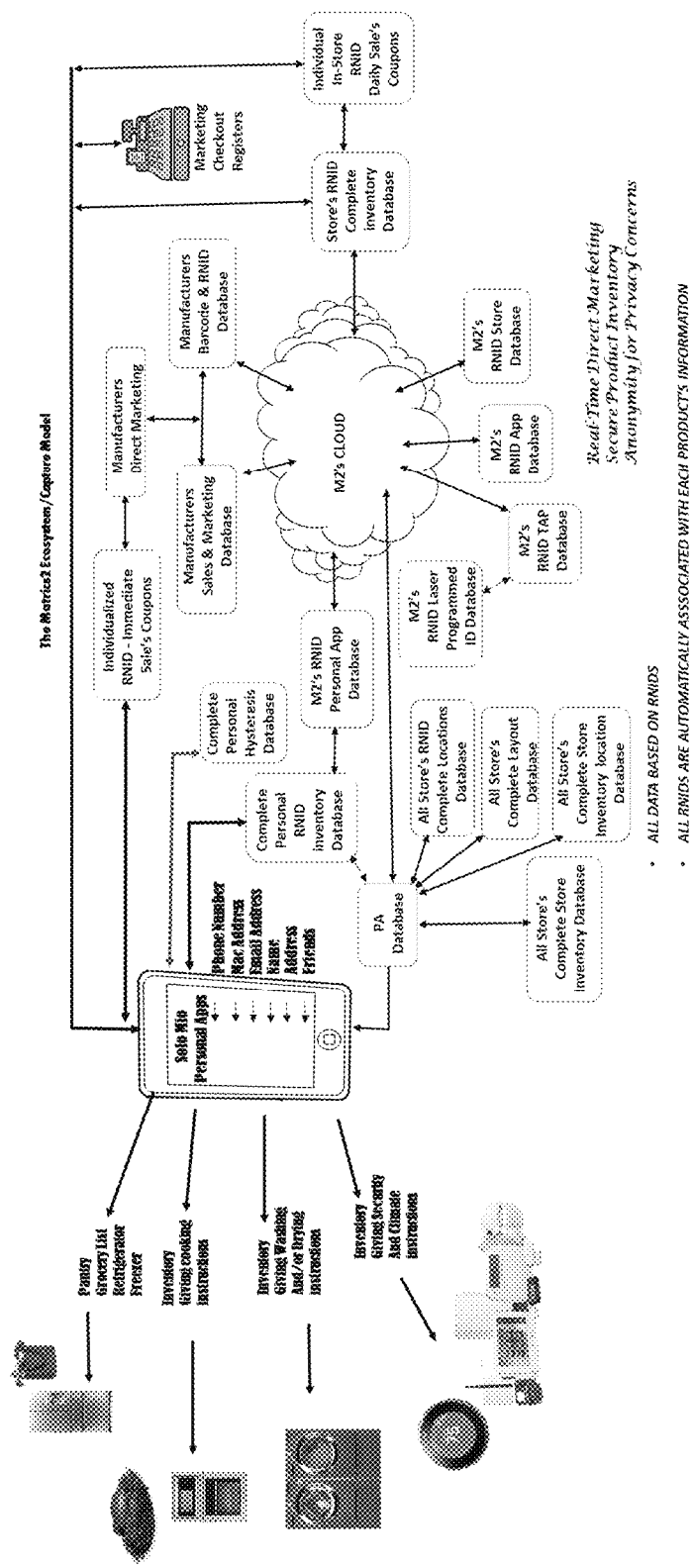
Figure 133:

A sample embodiment for a strap which is to be connected to a coil antenna substrate is shown in FIG. 101. In embodiments, an integrated circuit-controlled ejection system (IC-CES) for massively parallel integrated circuit assembly (MPICA) configured to form a target substrate with a strap-interposer is provided, e.g., in systems 9800 and 11800. The ICCES may include a first formation device 11802 configured to form the strap-interposer on the target substrate based on one or more dimensions of an antenna for the target substrate, and a second formation device 11804 configured to form a first portion of a common ground testing structure that is electrically coupled to the strap-interposer, the common ground testing structure configured to test functionality of an assembly. In embodiments, first, the strap length is determined by the length across all antenna coils, shown in FIG. 102. The web of antenna straps is then printed/Ablated (e.g., formed) along with common ground test structures, shown in FIG. 103. The ICCES may also include a third formation device 11806 configured to form a dielectric structure over the first portion of the common ground test structure and the strap-interposer. For example, dielectric structures are printed/Ablated over the common ground structures, shown in FIG. 104. The ICCES may also include a fourth formation device 11808 configured to form a completed target substrate by forming a second portion of the common ground testing structure over the dielectric structure and that is electrically coupled to the strap interposer, shown in FIG. 104-105. For instance, the rest of the individual test structures are printed/Ablated over the dielectric structures to form the completed strap "Target Substrate" upon which the die is attached. In embodiments, one or more of the formation devices described for the ICCES may be combined or part of a common formation device. The ICCES may also include a placement device 9800 configured to attach a die structure to the completed target substrate to complete formation of an assembly, as exemplarily shown in FIG. 106. The test structures allow the completed die/strap assemblage to be immediately tested for functionality as shown in FIGS. 105-111. Bad assemblages can then be marked in some manner for later removal as shown in FIG. 112. After testing and marking bad strap assemblages a lamination of patterned gummed pressure-sensitive adhesive (PSA) construction is applied covering everything but the connecting pad areas, as shown in FIGS. 113-116. This resulting assemblage is then die cut to separate individual straps but leaving all interconnect lines, as shown in FIG. 117. The resulting waste material is then striped out and the marked bad straps are extracted, as shown in FIG. 112. Then narrow rows are slit for straps of the desired length and width, which are packaged into an anti-static container, as shown in FIG. 118. Each such packaged roll will have its own unique ID, which could be a random number, to provide traceability for each phase of its construction back to its raw materials. The straps can then be applied to stock paper prior to the Printing/Etching of any antenna structures as shown in FIG. 119-120. Once the strap is applied to stock paper then the Printing/Etching of antenna structures is completed directly over the strap completing the strap/antenna circuit as shown in FIG. 121, or vice-versa the Printing/Etching of the antenna structure is completed as shown in FIGS. 122-123. Note that the printed/Ablated antenna can be incorporated into a security design feature, such as a hologram, on currency, postage stamps, or tax stamps, such as shown in FIGS. 124-126. They could also be incorporated into product labels as shown in FIGS. 127-128. Also, the completed tags can be applied on any number of varieties of objects for specific purposes, such as to aid the assembly of pre-cut furniture as shown in FIGS. 129-130. Here, the random number IDs on the tags are associated with each furniture piece they are attached to in a database, along with the assembly instructions for that piece with the others. Reading any of the tags would bring up a picture on the reading device of the piece in relationship with the others, along with instructions on how to assemble that piece into the whole and could link to instruction videos as shown in FIG. 131. This application is by way of example only, and any other application that can be envisioned using these embodied tags are included in this patent, such as with instruction on how to use smart appliances, verbal instructions to the blind, etc. as enable by the cloud ecosystem data base structure shown FIG. 132. The subject matter disclosed herein also includes a new design for a two sided randomly Laser programmed unique die IC die which has at least one bonding pad(s) on both the top and bottom surfaces of the die, as shown in one or more of FIGS. 1-94. For such a die, the die can be attached to either side of an antenna or other substrates, or within a pre-embossed shape equal to that of the thickness of the 2 sided I/O randomly Laser programmed unique bare die, said embossed shape may also have a via or not to allow for a connection to the opposite side of substrate when folded or just to connect to another substrate. After or before that attachment, a conductive adhesive (anisotropic, isotropic, or other) may be applied on the exposed top or bottom die surface, covering either bonding pad(s), as shown in one or more of FIGS. 1-94. After the antenna or other flexible substrate exits the ICCES stage, it may then be fan folded either over the die or back-to-back, a passivation covering may be applied between both antenna structures by Printing/Etching or other means as not to short out either or both antenna structures, but with the pad area exposed for connection to die I/O, so that bonding landings on the substrate match the adhesive covered top die surface and then brought into contact with pressure to form the bond attachment, as shown in one or more of FIGS. 1-94. Upon the completion of the fan folding one edge of the stack is then sliced to sever individual antennas which may then the randomly Laser programmed unique ID may be read or authenticated for functioning/nonfunctioning. Said stack may be counted, authenticated from the secure database on or off site and then packaged, as is shown in one or more of FIGS. 1-94. The die/antenna assemblage is known as a "tag".

When the tag antenna is energized by a reader, the die is powered up and immediately sends out its laser programmed unique ID repeatedly until the antenna is no longer energized by a reader. Alternatively, the die upon powering up could wait a certain amount of time to send out its ID only once, and then shut down. This is useful for reading multiple tags, where each tag sends out its ID at a different time. This can be accomplished by a random number generator on the die that upon die power-up randomly chooses a time slot out of a finite number of possible time slots, N, in which to send out its ID. The value of N can be determined by laser programming counter links on the die at the same time the unique ID is laser programmed. The value of N could be of any number depending on how many tags are to be expected to be read in a given time frame, including N=0 for immediate read of a single tag.

The subject matter herein provides die assembly production capabilities orders of magnitude greater than any currently available, which is required to achieve the goal of low-cost high-volume assembly.

The subject matter herein provides die assembly production capabilities orders of magnitude greater than any currently available, which is required to achieve the goal of low-cost high-volume assembly.

Various embodiments are now described by way of example and not limitation.

A method of operation for an integrated circuit-controlled ejection system (ICCES) for massively parallel integrated circuit assembly (MPICA) performed in accordance with any of the embodiments described or shown herein.

The method, further comprising: providing at least one die retention Cubbie, in a Die Retention Layer (DRL), in which at least one corresponding die resides until ejected onto an adjacent substrate.

The method, wherein the at least one Die Retention cubby performs a function in accordance with any of the embodiments described or shown herein.

The method, further comprising: providing at least one push piston, in a Push Pin Piston Assembly (PPPA), to eject at least one corresponding die into a membrane substrate.

The method, wherein the at least one push piston from the PPPA performs a function in accordance with any of the embodiments described or shown herein.

The method, further comprising: providing a Centralized Air Plate (CAP) that is separate and moveable with respect to at least one other layer of the ICCES MPICA.

The method, wherein the Centralized Air Plate (CAP) performs a function in accordance with any of the embodiments described or shown herein. The method, wherein the Centralized Air Plate (CAP) and the Push Pin Piston Assembly (PPPA) are one unit, to eject at least one corresponding die into a membrane substrate.

The method, further comprising: multiple wafers providing at least one push piston, in a Push Pin Piston Assembly (PPPA), to eject at least one corresponding die into a membrane substrate.

The method, further comprising: a minimum of one of many wafers which provides at least one push piston, in a Push Pin Piston Assembly (PPPA), to eject at least one corresponding die into a membrane substrate, wherein the corresponding die is programmed (i.e. ROM laser) with a unique ID to correspond to its Wafer Map and to be authenticated as an operational device.

The method for manufacturing a "strap" or "interposer".

A system for an integrated circuit-controlled ejection system (ICCES) for MPICA configured in accordance with any of the embodiments described or shown herein.

The system, further comprising: a die retention layer (DRL).

The system, wherein the Die Retention Layer (DRL) is configured in accordance with any of the embodiments described or shown herein.

The system, wherein the Die Retention Layer (DRL) includes one or more of: a plurality of die retention receptacles formed at a surface of the die retention layer by a three-dimensional printer; each Die Retention Receptacle having dimensions larger than a die size, and positioned to correspond to the placement of a corresponding die on a wafer; each Die Retention Receptacle having a bottom surface having a hole through which a pin is configured to extend, the pin attaching a piston having the die size, the piston included in a plurality of pistons; each die within the Die Retention Receptacle having a top and bottom surface with at least one pad allowing for the die to be attached up or down by the pin extending through the hole of the Die Retention Receptacle, the pin is attached to a piston or pin being smaller than the total area of the die, the piston or pin can include a plurality of pistons or pins; wherein a first tacky or adhesive material may be used on a backside of the wafer containing a plurality of dies including the die, the first tacky material is configured to provide a sticking force having a value less than a second tacky material secures to the target substrate; wherein a first surface of the wafer containing a plurality of dies including the die, the first is configured with air holes to provide a sticking or vacuum force holding or retaining die and wafer until a second tacky material secures the die to the target substrate; wherein the wafer is placed on the die retention surface with the die facing outward, the piston(s) are deployed upward to contact the first tacky layer to secure the die onto a surface of the piston(s); wherein the wafer is placed on the Die Retention Layer (DRL) surface with the die facing outward, the piston(s) form are deployed upward to contact with the air holes providing a sticking or vacuum force holding or retaining die and wafer to secure the die onto a surface of the piston(s); wherein the second adhesive material is an anisotropic adhesive or anisotropic film; wherein the Die Retention Layer (DRL), Wafer and Adhesive material are scribed by a laser to separate the dies of the wafer; or wherein the piston exerts a downward force that pulls on the separated die to pull the separated die into the die receptacle into contact with the anisotropic adhesive layer.

The system, further comprising: A Push Pin Piston layer (PPPL).

The system, wherein the Push Pin Piston Layer (PPPL) is configured in accordance with any of the embodiments described or shown herein.

The system, wherein the Push Pin Piston Layer includes at least one of: a plurality of chambers aligned with a plurality die receptacles of a die retention layer, each chamber including a first hole configured to receive a corresponding pin connected between a chamber and a corresponding die receptacle; each chamber including a piston connected to the corresponding pin, a radius of the pin being less than a dimension of the chamber, each piston configured to move up and down, a total excursion being the at least the same as the die thickness; each chamber including a second hole that opens from the Centralized Air Plate (CAP) configured to provide a first positive pressure to push the piston(s) or plate down to a die receptacle end, to push the piston or plate up to a die underside surface when a wafer that includes a plurality of dies are positioned adjacent to the die retention layer; the Centralized Air Plate (CAP) is configured to provide a negative pressure to pull the piston or piston plate up and away from the die receptacle end, to pull the piston/plate down to a bottom of the die receptacle to bring the die into the die receptacle; wherein, when a Membrane Surface (Target Substrate) is brought into near contact proximity to the die receptacle surface, a positive pressure is applied by the Centralized Air Plate (CAP) to move the piston/plate down to the die receptacle end, to push the chamber piston/plate up and the die out of the die receptacle, to eject the die onto the substrate surface where the die is attached by an anisotropic adhesive material; wherein, the Membrane Surface (Target Substrate) which is brought into near contact proximity to the die receptacle surface, a positive pressure is applied by the Centralized Air Plate (CAP) to move the piston/plate down to the die receptacle end, to push the chamber piston/plate up and the die out of the die receptacle, to eject the die onto the substrate surface where the die is attached by an anisotropic adhesive material can be a circuit, antenna, or any specific pattern known or later defined; wherein an attachment force of the anisotropic adhesive material is configured to pull the die off of the piston/plate; or wherein a negative air pressure is induced by the Centralized Air Plate (CAP) to withdraw the piston into the die receptacle to leave the die attached to the Target Substrate.

The system, further comprising: A Centralized Air Plate (CAP).

The system, wherein the Centralized Air Plate (CAP) layer is configured in accordance with any of the embodiments described or shown herein.

The system, wherein the Centralized Air Plate (CAP) layer includes at least one of: a plurality of air holes matched to a distribution of holes in a piston chamber layer, but at locations specific to a number of die of a wafer to be ejected at any one time, the number of die to be ejected at any one time being less than or equal to a total number of die of the wafer.

The system, wherein the Centralized Air Plate (CAP) layer and the at least one continuous piston chamber/plate layer and has predetermined 3D printed/Ablated, metal, plastic or other material(s) at specific predetermined locations to a specific number of die of a wafer to be ejected at any one time, the number of die to be ejected at any one time being less than or equal to a total number of die of the wafer.

The system, wherein the Centralized Air Plate (CAP) layer attaches to a Push-Pin-Piston Layer (PPPL) becoming one operating device with the predetermined 3D printed/Ablated, metal, plastic or other material(s) at specific predetermined locations to a specific number of die of a wafer to be ejected at any one time, the number of die to be ejected at any one time being less than or equal to a total number of die of the wafer.

The system, wherein the Centralized Air Plate (CAP) layer attaches to a Push-Pin-Piston Layer (PPPL) becoming one operating device with the predetermined 3D printed/Ablated, metal, plastic or other material(s) at specific predetermined locations to a specific number of die of a wafer to be ejected at any one time, the number of die to be ejected at any one time being less than or equal to a total number of die of the wafer, upon completion of an ejection cycle the cycle is repeated over and over again until each Pin location has exhausted every die within its boundary.

The System for manufacturing a "strap" or "interposer".

The system, wherein the Centralized Air Plate (CAP) layer attaches to a Push-Pin-Piston Layer (PPPL) becoming one operating device which has its own boundaries, and a Boundary is defined by the total number of dies being pushed, which is defined by the size of each Antenna, circuit or pattern defined by the Membrane Surface or Target Substrate.

A two-sided ID die configured in accordance with any of the embodiments described or shown herein.

The two-sided ID die, further comprising: a top surface that includes at least a one bonding pad; and a bottom surface that includes at least a one bonding pad.

The two-sided ID die, wherein at least one of the top surfaces or the bottom surface includes a conductive adhesive that covers the top surface or the bottom surface.

An Integrated Circuit (IC) die ejection head assembly system configured in accordance with any of the embodiments described or shown herein.

The IC die ejection head assembly system, wherein an IC die ejection head assembly system utilizes three-dimensional (3D) Printing/Etching to achieve very high-resolution manufacturing.

The IC die ejection head assembly system, wherein the IC die ejection head assembly system is configured to: retain at least 800,000 die; and eject a first portion of the at least 800,000 die while retaining a second portion of the at least 800,000 die.

The IC die ejection head assembly system, comprising subassemblies, the Centralized Air Plate (CAP) layer, and the Push Pin Piston layer (PPPL).

The IC die ejection system head assembly system, configured to eject the next die in the next defined movement until each defined die within each defined pattern of each defined push-pin exhaust every die on each defined wafer, as shown in one or more of FIGS. 1-94 The IC die ejection system head assembly system comprising multiple wafers which proceeds to eject the next die in the next defined movement until each defined die within each defined pattern of each defined push-pin exhaust every die on each defined wafer, as shown in one or more of FIGS. 1-94.

An Integrated Circuit (IC) die ejection head assembly system: configured in accordance with any of the embodiments described or shown herein; wherein the IC die ejection head assembly system utilizes three-dimensional (3D) Printing/Etching to achieve very high resolution manufacturing; and/or wherein the IC die ejection head assembly system is configured to: retain at least 800,000 die; and eject a first portion of the at least 800 k die while retaining a second portion of the at least 800 k die.

A target substrate with a strap-interposer assembled according to the methods of any embodiment herein is also described.

An integrated circuit-controlled ejection system (ICCES) for massively parallel integrated circuit assembly (MPICA) configured to form a target substrate with a strap-interposer is also described. The ICCES comprises a first formation device configured to form the strap-interposer on the target substrate based on one or more dimensions of an antenna for the target substrate, a second formation device configured to form a first portion of a common ground testing structure that is electrically coupled to the strap-interposer, the common ground testing structure configured to test functionality of an assembly, a third formation device configured to form a dielectric structure over the first portion of the common ground test structure and the strap-interposer, a fourth formation device configured to form a completed target substrate by forming a second portion of the common ground testing structure over the dielectric structure and that is electrically coupled to the strap interposer, and a placement device configured to attach a die structure to the completed target substrate to complete formation of an assembly.

Further Example Embodiments

A device, as defined herein, is a machine or manufacture as defined by 35 U.S.C. § 101. That is, as used herein, the term "device" refers to a machine or other tangible, manufactured object and excludes software and signals. Devices may be digital, analog or a combination thereof. Devices may include integrated circuits (ICs), one or more processors (e.g., central processing units (CPUs), microprocessors, digital signal processors (DSPs), etc.) and/or may be implemented with any semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other trans conductor or transistor technology device. Such devices may use the same or alternative configurations other than the configuration illustrated in embodiments presented herein.

Techniques, including methods, described herein may be implemented in hardware (digital and/or analog) or a combination of hardware and software and/or firmware. Techniques described herein may be implemented in one or more components. Embodiments may comprise computer program products comprising logic (e.g., in the form of program code or instructions as well as firmware) stored on any computer useable storage medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable storage media include, but are not limited to, a hard disk, a removable magnetic disk, a removable optical disk, flash memory cards, digital video disks, random access memories (RAMs), read only memories (ROM), and the like. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable storage media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Computer readable storage media are distinguished from and non-overlapping with communication media. Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wired media as well as wireless media such as acoustic, RF, infrared and other wireless media. Example embodiments are also directed to such communication media.

CONCLUSION

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments but should be defined only in accordance with the following claims and their equivalents.

What is claimed is:

1. A method of forming a target substrate with a strap-interposer, the method comprising:
    determining a length of the strap-interposer based on one or more dimensions of an antenna for a target substrate upon which the strap-interposer is to be placed;
    forming the strap-interposer on the target substrate based on the length;
    forming a first portion of a common ground testing structure that is electrically coupled to the strap-interposer, the first portion of the common ground testing structure configured to test functionality of an assembly;
    forming a dielectric structure over the first portion of the common ground test structure and the strap-interposer; and
    forming a completed target substrate by forming a second portion of the common ground testing structure over the dielectric structure and that is electrically coupled to the strap interposer.

2. The method of claim 1, further comprising:
    attaching a die structure to the completed target substrate to complete formation of the assembly; and
    affixing the completed target substrate across the antenna on another substrate.

3. The method of claim 1, further comprising:
    testing functionality of the assembly, marking the assembly as defective, and removing the assembly from a web.

4. The method of claim 1, wherein the antenna is a coil antenna of a radio frequency identification (RFID) tag that comprises the target substrate.

5. The method of claim 1, further comprising: a web of antenna strap-interposers that are printed or ablated with respective first portions of common ground test structures.

6. The method of claim 5, wherein the dielectric structures are printed or ablated over the respective first portions of the common ground structures.

7. The method of claim 6, further comprising: printing or ablating respective second portions of the common ground structures over the dielectric structures to form completed target substrates upon which die structures are attached.

8. The method of claim 7, further comprising: forming rolls of completed target substrates that have been successfully tested and individualized.

9. The method of claim 8, wherein the strap-interposer includes connect pad areas, the method further comprising: applying a lamination of patterned, gummed pressure-sensitive adhesive (PSA) construction that cover portions of the completed target substrates of the rolls and that leave the connecting pad areas of the completed target substrates uncovered.

10. The method of claim 9, further comprising separating individual ones of the completed target substrates of the rolls the resulting via die-cutting that leaves connections of the common ground testing structure intact.

11. The method of claim 1, wherein the antenna is configured in a pattern for incorporation into security features of at least one of currency, postage stamps, or tax stamps, or into product labels.

12. The method of claim 1, wherein the antenna is incorporated into product labels, or wherein the antenna is incorporated into materials of a roll that comprise the substrate.

13. The method of claim 1, wherein the method is performed by an integrated circuit-controlled ejection system (ICCES) for massively parallel integrated circuit assembly (MPICA).

14. A target substrate with a strap-interposer assembled according to the method of claim 1.

15. An integrated circuit-controlled ejection system (ICCES) for massively parallel integrated circuit assembly (MPICA) configured to form a target substrate with a strap-interposer, the ICCES comprising:
    a first formation device configured to form the strap-interposer on the target substrate based on one or more dimensions of an antenna for the target substrate;
    a second formation device configured to form a first portion of a common ground testing structure that is electrically coupled to the strap-interposer, the common ground testing structure configured to test functionality of an assembly;
    a third formation device configured to form a dielectric structure over the first portion of the common ground test structure and the strap-interposer;
    a fourth formation device configured to form a completed target substrate by forming a second portion of the common ground testing structure over the dielectric structure and that is electrically coupled to the strap interposer; and a placement device configured to attach a die structure to the completed target substrate to complete formation of an assembly.

\* \* \* \* \*

UNITED STATES PATENT AND TRADEMARK OFFICE
CERTIFICATE OF CORRECTION

PATENT NO. : 10,790,571 B2
APPLICATION NO. : 16/290561
DATED : September 29, 2020
INVENTOR(S) : Michael R. Arneson et al.

It is certified that error appears in the above-identified patent and that said Letters Patent is hereby corrected as shown below:

On the Title Page

In item (72), in Column 1, in "Inventor", Lines 2-3, delete "Gambrills, MN (US)" and insert -- Gambrills, MD (US) --, therefor.

In the Claims

In Column 17, Line 62, in Claim 1, delete "strap interposer." and insert -- strap-interposer. --, therefor.

In Column 18, Line 31, in Claim 10, delete "the resulting" and insert -- resulting --, therefor.

In Column 18, Lines 66-67, in Claim 15, delete "strap interposer;" and insert -- strap-interposer; --, therefor.

Signed and Sealed this
Fifth Day of January, 2021

Andrei Iancu
*Director of the United States Patent and Trademark Office*